(12) United States Patent
Mitsumori et al.

(10) Patent No.: US 10,910,576 B2
(45) Date of Patent: Feb. 2, 2021

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Satomi Mitsumori, Kanagawa (JP); Takeyoshi Watabe, Kanagawa (JP); Satoshi Seo, Kanagawa (JP); Yuko Kubota, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 16/875,562

(22) Filed: May 15, 2020

(65) Prior Publication Data

US 2020/0280012 A1    Sep. 3, 2020

Related U.S. Application Data

(62) Division of application No. 16/518,064, filed on Jul. 22, 2019, now Pat. No. 10,658,604, which is a
(Continued)

(30) Foreign Application Priority Data

May 20, 2016 (JP) ................................ 2016-101787

(51) Int. Cl.
*H01L 51/50* (2006.01)
*H01L 51/00* (2006.01)
(Continued)

(52) U.S. Cl.
CPC ........ *H01L 51/5016* (2013.01); *H01L 27/322* (2013.01); *H01L 51/0084* (2013.01);
(Continued)

(58) Field of Classification Search
None
See application file for complete search history.

(56) References Cited

U.S. PATENT DOCUMENTS 6,863,997 B2    3/2005    Thompson et al.
7,175,922 B2    2/2007    Jarikov et al.
(Continued)

FOREIGN PATENT DOCUMENTS

CN    103155201 A    6/2013
CN    103443950 A    12/2013
(Continued)

OTHER PUBLICATIONS

International Search Report re Application No. PCT/IB2017/052869, dated Aug. 22, 2017.
(Continued)

*Primary Examiner* — Mounir S Amer
(74) *Attorney, Agent, or Firm* — Husch Blackwell LLP

(57) ABSTRACT

A light-emitting element having low driving voltage and high emission efficiency is provided. In the light-emitting element, a combination of a guest material and a host material forms an exciplex. The guest material is capable of converting triplet excitation energy into light emission. Light emission from the light-emitting layer includes light emission from the guest material and light emission from the exciplex. The percentage of the light emission from the exciplex to the light emission from the light-emitting layer is greater than 0 percent and less than or equal to 60 percent. The energy after subtracting the energy of light emission from the exciplex from the energy of light emission from the guest material is greater than 0 eV and less than or equal to 0.23 eV.

7 Claims, 96 Drawing Sheets

Related U.S. Application Data division of application No. 15/598,586, filed on May 18, 2017, now Pat. No. 10,361,388.

(51) Int. Cl.
*H01L 27/32* (2006.01)
*H01L 51/52* (2006.01)

(52) U.S. Cl.
CPC ...... *H01L 51/0085* (2013.01); *H01L 51/0086* (2013.01); *H01L 51/0087* (2013.01); *H01L 51/0088* (2013.01); *H01L 51/5004* (2013.01); *H01L 51/5056* (2013.01); *H01L 51/5072* (2013.01); *H01L 27/3206* (2013.01); *H01L 27/3211* (2013.01); *H01L 51/5265* (2013.01); *H01L 51/5278* (2013.01); *H01L 2251/5384* (2013.01)

(56) References Cited

U.S. PATENT DOCUMENTS

| | | | |
|---|---|---|---|
| 7,183,010 | B2 | 2/2007 | Jarikov |
| 7,332,857 | B2 | 2/2008 | Seo et al. |
| 7,597,967 | B2 | 10/2009 | Kondakova et al. |
| 7,906,226 | B2 | 3/2011 | Matsuura et al. |
| 7,993,760 | B2 | 8/2011 | Komori et al. |
| 8,034,465 | B2 | 10/2011 | Liao et al. |
| 8,274,214 | B2 | 9/2012 | Ikeda et al. |
| 8,853,680 | B2 | 10/2014 | Yamazaki et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,082,994 | B2 | 7/2015 | Watabe et al. |
| 9,159,942 | B2 | 10/2015 | Seo et al. |
| 9,175,213 | B2 | 11/2015 | Seo et al. |
| 9,356,250 | B2 | 5/2016 | Ohsawa et al. |
| 9,391,290 | B2 | 7/2016 | Watabe et al. |
| 9,412,962 | B2 | 8/2016 | Hamada et al. |
| 9,604,928 | B2 | 3/2017 | Shitagaki et al. |
| 9,634,279 | B2 | 4/2017 | Seo et al. |
| 9,663,711 | B2 | 5/2017 | Takeda et al. |
| 10,096,658 | B2 * | 10/2018 | Watabe ............... H01L 51/5004 |
| 2003/0175553 | A1 | 9/2003 | Thompson et al. |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2007/0090756 | A1 | 4/2007 | Okada et al. |
| 2012/0217487 | A1 | 8/2012 | Yamazaki et al. |
| 2012/0242219 | A1 | 9/2012 | Seo et al. |
| 2013/0048964 | A1 | 2/2013 | Takeda et al. |
| 2014/0034929 | A1 | 2/2014 | Hamada et al. |
| 2014/0034932 | A1 | 2/2014 | Seo et al. |
| 2015/0069352 | A1 | 3/2015 | Kim et al. |
| 2016/0049607 | A1 | 2/2016 | Seo et al. |
| 2016/0343942 | A1 | 11/2016 | Hamada et al. |
| 2016/0372688 | A1 | 12/2016 | Seo et al. |
| 2017/0309687 | A1 | 10/2017 | Watabe et al. |

FOREIGN PATENT DOCUMENTS

| | | |
|---|---|---|
| CN | 104508850 A | 4/2015 |
| EP | 1 202 608 A2 | 5/2002 |
| JP | 2008-288344 A | 11/2008 |
| JP | 2010-182699 A | 8/2010 |
| JP | 2012-212879 A | 11/2012 |
| JP | 2014-029971 A | 2/2014 |
| JP | 2014-064026 A | 4/2014 |
| JP | 2014-197657 A | 10/2014 |
| JP | 2015-179855 A | 10/2015 |
| JP | 2015-233149 A | 12/2015 |
| JP | 2016-105493 A | 6/2016 |
| JP | 2016-106119 A | 6/2016 |
| JP | 2017-041648 A | 2/2017 |
| WO | WO 2012/127990 A1 | 9/2012 |
| WO | WO 2013/027846 A1 | 2/2013 |
| WO | WO 2014/021441 A1 | 2/2014 |
| WO | WO 2016/203350 A1 | 12/2016 |

OTHER PUBLICATIONS

Written Opinion re Application No. PCT/IB2017/052869, dated Aug. 22, 2017.

Yersin, H. et al., *Highly Efficient OLEDs with Phosphorescent Materials*, 2008, pp. 1-97,283-309, Wiley-VCH Verlag GmbH & Co.

Tokito, S. et al., "Improvement in Performance by Doping," Organic EL Display, Aug. 20, 2004, pp. 67-99, Ohmsha.

Jeon, W. et al., "Ideal Host and Guest System in Phosphorescent OLEDs," Organic Electronics, 2009, vol. 10, pp. 240-246, Elsevier.

Su, S. et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.

Rausch, A. et al., "Matrix Effects on the Triplet State of the OLED Emitter Ir(4,6-dFppy)2(pic)(Flrpic): Investigations by High-Resolution Optical Spectroscopy," Inorganic Chemistry, 2009, vol. 48, No. 5, pp. 1928-1937.

Gong, X. et al., "Phosphorescence from Iridium Complexes Doped into Polymer Blends," Journal of Applied Physics, Feb. 1, 2004, vol. 95, No. 3, pp. 948-953.

Zhao, Q. et al., "Synthesis and Photophysical, Electrochemical, and Electrophosphorescent Properties of a Series of Iridium(III) Complexes Based on Quinoline Derivatives and Different β-Diketonate Ligands," Organometallics, Jun. 14, 2006, vol. 25, No. 15, pp. 3631-3638.

Hino, Y. et al., "Red Phosphorescent Organic Light-Emitting Diodes Using Mixture System of Small-Molecule and Polymer Host," Japanese Journal of Applied Physics, Apr. 21, 2005, vol. 44, No. 4B, pp. 2790-2794.

Tsuboyama, A. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.

Kondakova, M. et al., "High-Efficiency, Low-Voltage Phosphorescent Organic Light-Emitting Diode Devices with Mixed Host," Journal of Applied Physics, Nov. 4, 2008, vol. 104, pp. 094501-1-094501-17.

Chen, F. et al., "Triplet Exciton Confinement in Phosphorescent Polymer Light-Emitting Diodes," Applied Physics Letters, Feb. 17, 2003, vol. 82, No. 7, pp. 1006-1008.

Lee, J. et al., "Stabilizing the Efficiency of Phosphorescent Organic Light-Emitting Diodes," SPIE Newsroom, Apr. 21, 2008, pp. 1-3.

Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.

Endo, A. et al., "Efficient Up-Conversion of Triplet Excitons Into a Singlet State and its Application for Organic Light Emitting Diodes," Applied Physics Letters, Feb. 24, 2011, vol. 98, No. 8, pp. 083302-1-083302-3.

Itano, K. et al., "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Loq Ionization Potentials," Applied Physics Letters, Feb. 9, 1998, vol. 72, No. 6, pp. 636-638.

Park, Y. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.

* cited by examiner

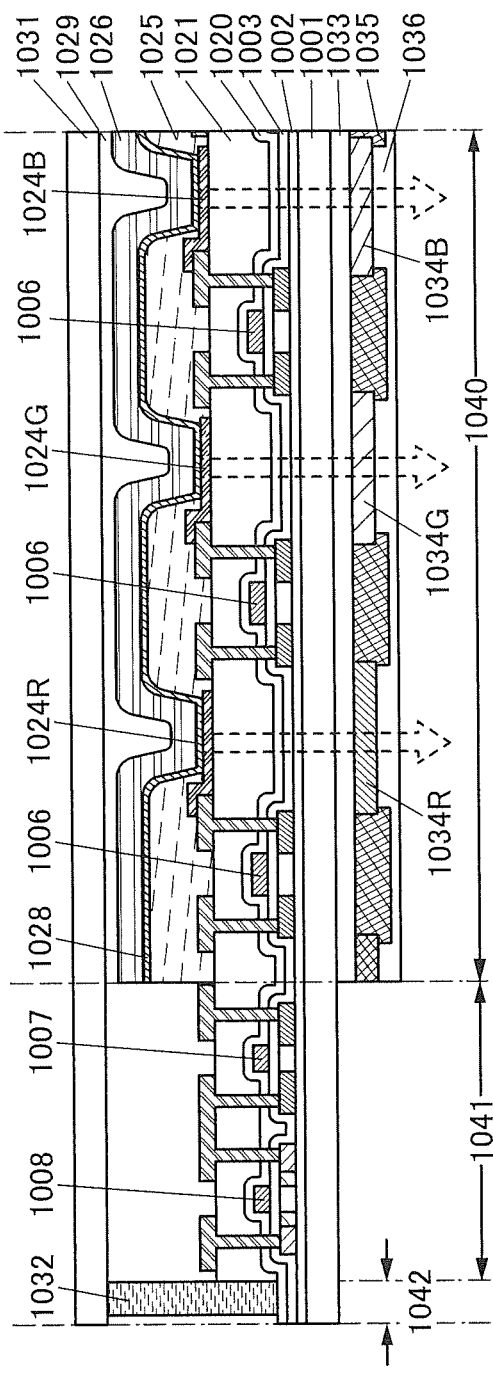
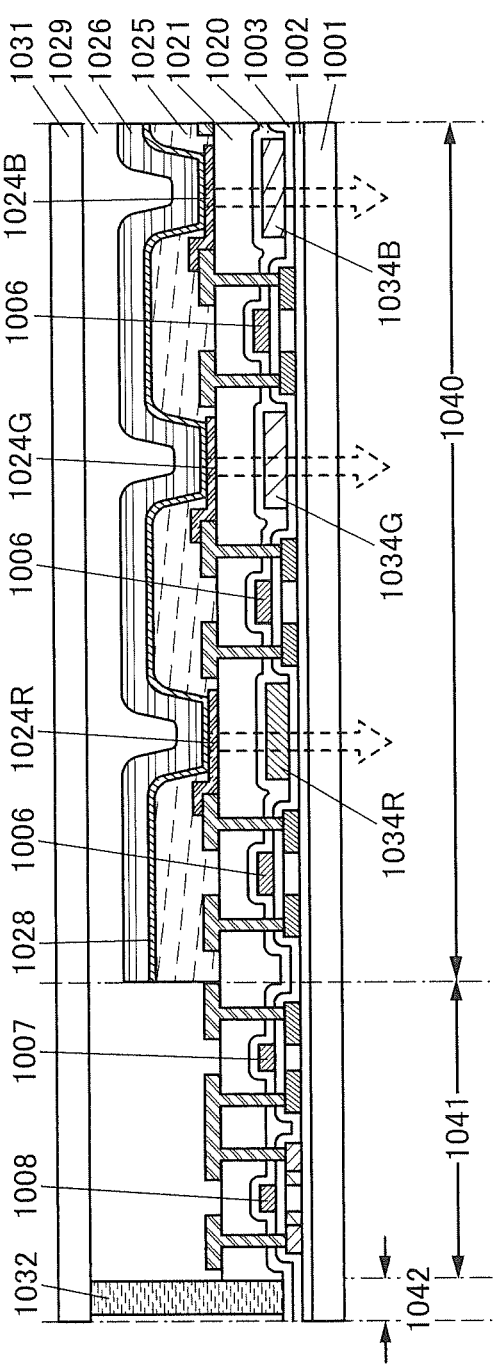
FIG. 9A
FIG. 9B

LIGHT-EMITTING ELEMENT, DISPLAY DEVICE, ELECTRONIC DEVICE, AND LIGHTING DEVICE

This application is a divisional of copending U.S. application Ser. No. 16/518,064, filed on Jul. 22, 2019 which is a divisional of U.S. application Ser. No. 15/598,586, filed on May 18, 2017 (now U.S. Pat. No. 10,361,388 issued Jul. 23, 2019), which are all incorporated herein by reference.

TECHNICAL FIELD

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

In recent years, research and development have been extensively conducted on light-emitting elements using electroluminescence (EL). In a basic structure of such a light-emitting element, a layer containing a light-emitting substance (an EL layer) is interposed between a pair of electrodes. By applying a voltage between the pair of electrodes of this element, light emission from the light-emitting substance can be obtained.

Since the above light-emitting element is of a self-luminous type, a display device using this light-emitting element has advantages such as high visibility, no necessity of a backlight, low power consumption, and the like. Furthermore, the display device also has advantages that it can be formed to be thin and lightweight, and has high response speed.

In a light-emitting element (e.g., an organic EL element) whose EL layer contains an organic compound as a light-emitting substance and is provided between a pair of electrodes, application of a voltage between the pair of electrodes causes injection of electrons from a cathode and holes from an anode into the EL layer having a light-emitting property and thus a current flows. By recombination of the injected electrons and holes, the organic compound having a light-emitting property is brought into an excited state to provide light emission.

Note that an excited state formed by an organic compound can be a singlet excited state (S*) or a triplet excited state (T*). Light emission from the singlet excited state is referred to as fluorescence, and light emission from the triplet excited state is referred to as phosphorescence. The formation ratio of S* to T* in the light-emitting element is 1:3. Thus, a light-emitting element containing a compound emitting phosphorescence (phosphorescent compound) has higher light emission efficiency than a light-emitting element containing a compound emitting fluorescence (fluorescent compound). Therefore, light-emitting elements containing phosphorescent compounds capable of converting energy of a triplet excited state into light emission has been actively developed in recent years (e.g., see Patent Document 1).

Energy for exciting an organic compound depends on an energy difference between the LUMO level and the HOMO level of the organic compound. The energy difference approximately corresponds to singlet excitation energy. In a light-emitting element including a phosphorescent compound, triplet excitation energy is converted into light emission energy. Accordingly, when the organic compound has a large difference between the singlet excitation energy and the triplet excitation energy, the energy for exciting the organic compound is higher than the light emission energy by the energy difference. The difference between the energy for exciting the organic compound and the light emission energy affects element characteristics of a light-emitting element: the driving voltage of the light-emitting element increases. For this reason, a method for reducing driving voltage has been searched (see Patent Document 2).

Among light-emitting elements including phosphorescent compounds, a light-emitting element that emits blue light has not been put into practical use yet because it is difficult to develop a stable compound having a high triplet excitation energy level. Accordingly, development of a highly reliable light-emitting element that is formed using a phosphorescent compound and has high emission efficiency is required.

REFERENCE

Patent Document

[Patent Document 1] Japanese Published Patent Application No. 2010-182699
[Patent Document 2] Japanese Published Patent Application No. 2012-212879

DISCLOSURE OF INVENTION

An iridium complex is known as a phosphorescent compound with high emission efficiency. An iridium complex including a nitrogen-containing five-membered heterocyclic skeleton as a ligand is known as an iridium complex with high light emission energy. The nitrogen-containing five-membered heterocyclic skeleton has high triplet excitation energy but has a lower electron-accepting property than a nitrogen-containing six-membered heterocyclic skeleton. Thus, the iridium complex including a nitrogen-containing five-membered heterocyclic skeleton as a ligand has a high LUMO level and to which electron carriers are not easily injected. For this reason, in the iridium complex including a nitrogen-containing five-membered heterocyclic skeleton as a ligand, excitation of carriers by direct carrier recombination is difficult, which means that efficient light emission is difficult. Furthermore, an iridium complex having a nitrogen-containing five-membered heterocyclic skeleton as a ligand tends to have a high HOMO level and interacts with another compound that has a low LUMO level, so that an exciplex is formed in some cases.

A nitrogen-containing six-membered heterocyclic skeleton has a high electron-accepting property. Thus, the iridium complex including a nitrogen-containing six-membered heterocyclic skeleton as a ligand has a low LUMO level and to which electron carriers are easily injected. Since the iridium complex including a nitrogen-containing six-membered heterocyclic skeleton as a ligand has a low LUMO level, the iridium complex including a nitrogen-containing six-membered heterocyclic skeleton as a ligand interacts with another compound that has a high HOMO level, so that an exciplex is formed in some cases.

When the iridium complex and another compound form an exciplex, problems such as a decrease in the emission efficiency of light emitted from the iridium complex or an increase in the driving voltage of a light-emitting element are caused. Thus, for a light-emitting element using an iridium complex, the development of a light-emitting element that has high emission efficiency and is driven at a low voltage is required.

In view of the above, an object of one embodiment of the present invention is to provide a light-emitting element having high emission efficiency. Another object of one embodiment of the present invention is to provide a light-emitting element with low power consumption. Another object of one embodiment of the present invention is to provide a light-emitting element with high reliability. Another object of one embodiment of the present invention is to provide a novel light-emitting element. Another object of one embodiment of the present invention is to provide a novel light-emitting device. Another object of one embodiment of the present invention is to provide a novel display device.

Note that the description of these objects does not disturb the existence of other objects. In one embodiment of the present invention, there is no need to achieve all the objects. Other objects are apparent from and can be derived from the description of the specification and the like.

Another embodiment of the present invention is a light-emitting element including a light-emitting layer. The light-emitting layer includes a first organic compound and a second organic compound. One of the first organic compound and the second organic compound has a LUMO level higher than or equal to the LUMO level of the other of the first organic compound and the second organic compound, and a HOMO level higher than or equal to the HOMO level of the other of the first organic compound and the second organic compound. A combination of the first organic compound and the second organic compound forms a first exciplex. The first organic compound is capable of converting triplet excitation energy into light emission. Light emission from the light-emitting layer includes light emission from the first organic compound and light emission from the first exciplex. The percentage of the light emission from the first exciplex to the light emission from the light-emitting layer is greater than 0% and less than or equal to 60%.

Another embodiment of the present invention is a light-emitting element including a light-emitting layer. The light-emitting layer includes a first organic compound and a second organic compound. One of the first organic compound and the second organic compound has a LUMO level higher than or equal to the LUMO level of the other of the first organic compound and the second organic compound, and a HOMO level higher than or equal to the HOMO level of the other of the first organic compound and the second organic compound. A combination of the first organic compound and the second organic compound forms a first exciplex. The first organic compound is capable of converting triplet excitation energy into light emission. When the energy of light emission from the first organic compound is $E_{G\_em}$ and the energy of light emission from the first exciplex is $E_{Ex\_em}$, the following relational expression is satisfied: $0 \text{ eV} < E_{G\_em} - E_{Ex\_em} \leq 0.23 \text{ eV}$.

In the above structure, $E_{G\_em}$ is preferably energy calculated from the wavelength of the emission peak on the shortest wavelength side of the emission spectrum of the first organic compound.

Another embodiment of the present invention is a light-emitting element including a light-emitting layer. The light-emitting layer includes a first organic compound and a second organic compound. One of the first organic compound and the second organic compound has a LUMO level higher than or equal to the LUMO level of the other of the first organic compound and the second organic compound, and a HOMO level higher than or equal to the HOMO level of the other of the first organic compound and the second organic compound. A combination of the first organic compound and the second organic compound forms a first exciplex. The first organic compound is capable of converting triplet excitation energy into light emission. When the transition energy calculated from the absorption edge of the absorption spectrum of the first organic compound is $E_{G\_abs}$ and the energy of light emission from the first exciplex is $E_{Ex\_em}$, the following relational expression is satisfied: $0 \text{ eV} < E_{G\_abs} - E_{Ex\_em} \leq 0.30 \text{ eV}$.

In each of the above structures, $E_{Ex\_em}$ is preferably energy calculated from the wavelength of the emission peak on the shortest wavelength side of the emission spectrum of the first exciplex.

Another embodiment of the present invention is a light-emitting element including a light-emitting layer. The light-emitting layer includes a first organic compound and a second organic compound. One of the first organic compound and the second organic compound has a LUMO level higher than or equal to the LUMO level of the other of the first organic compound and the second organic compound, and a HOMO level higher than or equal to the HOMO level of the other of the first organic compound and the second organic compound. The first organic compound is capable of converting triplet excitation energy into light emission. When the transition energy calculated from the absorption edge of the absorption spectrum of the first organic compound is $E_{G\_abs}$ and an energy difference between the HOMO level of the one of the first organic compound and the second organic compound and the LUMO level of the other of the first organic compound and the second organic compound is $\Delta E_{Ex}$, the following relational expression is satisfied: $0 \text{ eV} < E_{G\_abs} - \Delta E_{Ex} \leq 0.23 \text{ eV}$.

In the above structure, a combination of the first organic compound and the second organic compound preferably forms a first exciplex.

In each of the above structures, the lowest triplet excitation energy level of the second organic compound is preferably higher than or equal to the lowest triplet excitation energy level of the first organic compound, and the lowest triplet excitation energy level of the first organic compound is preferably higher than or equal to the lowest triplet excitation energy level of the first exciplex.

In each of the above structures, the light-emitting layer further preferably includes a third organic compound. One of the second organic compound and the third organic compound preferably has a LUMO level higher than or equal to the LUMO level of the other of the second organic compound and the third organic compound, and a HOMO level higher than or equal to the HOMO level of the other of the second organic compound and the third organic compound. A combination of the second organic compound and the third organic compound preferably forms a second exciplex.

In each of the above structures, the lowest triplet excitation energy level of the second organic compound and the lowest triplet excitation energy level of the third organic compound are preferably higher than or equal to the lowest triplet excitation energy level of the second exciplex. The lowest triplet excitation energy level of the second exciplex is preferably higher than or equal to the lowest triplet excitation energy level of the first organic compound.

In each of the above structures, one of the second organic compound and the third organic compound is preferably capable of transporting holes, and the other of the second organic compound and the third organic compound is preferably capable of transporting electrons. The one of the second organic compound and the third organic compound preferably includes at least one of a π-electron rich heteroaromatic ring skeleton and an aromatic amine skeleton, and the other of the second organic compound and the third organic compound preferably includes a re-electron deficient heteroaromatic ring skeleton.

In each of the above structures, light emission from the light-emitting layer includes light emission from the first organic compound and light emission from the first exciplex, and the light emission from the light-emitting layer preferably includes an emission component in which the time in which the emission intensity is reduced to lower than or equal to 1% is shorter than or equal to 37 μs.

In each of the above structures, it is preferable that the first organic compound include iridium. Furthermore, it is preferable that the first organic compound include a ligand coordinated to the iridium, and that the ligand include a nitrogen-containing five-membered heterocyclic skeleton. The second organic compound preferably includes a π-electron deficient heteroaromatic ring skeleton.

Another embodiment of the present invention is a display device including the light-emitting element having any of the above structures and at least one of a color filter and a transistor. Another embodiment of the present invention is an electronic device including the display device and at least one of a housing and a touch sensor. Another embodiment of the present invention is a lighting device including the light-emitting element having any of the above structures and at least one of a housing and a touch sensor. The category of one embodiment of the present invention includes not only a light-emitting device including a light-emitting element but also an electronic device including a light-emitting device. Accordingly, the light-emitting device in this specification refers to an image display device and a light source (e.g., a lighting device). The light-emitting device may include, in its category, a display module in which a connector such as a flexible printed circuit (FPC) or a tape carrier package (TCP) is connected to a light-emitting element, a display module in which a printed wiring board is provided on the tip of a TCP, or a display module in which an integrated circuit (IC) is directly mounted on a light-emitting element by a chip on glass (COG) method.

One embodiment of the present invention can provide a light-emitting element with high emission efficiency. Another embodiment of the present invention can provide a light-emitting element with low power consumption. Another embodiment of the present invention can provide a novel light-emitting element. Another embodiment of the present invention can provide a novel light-emitting device. Another embodiment of the present invention can provide a novel display device.

Note that the description of these effects does not disturb the existence of other effects. One embodiment of the present invention does not necessarily have all the effects described above. Other effects are apparent from and can be derived from the description of the specification, the drawings, the claims, and the like.

BRIEF DESCRIPTION OF DRAWINGS

In the accompanying drawings:

FIGS. 9A and 9B are schematic cross-sectional views each illustrating a display device of one embodiment of the present invention;

BEST MODE FOR CARRYING OUT THE INVENTION

Figure 1:
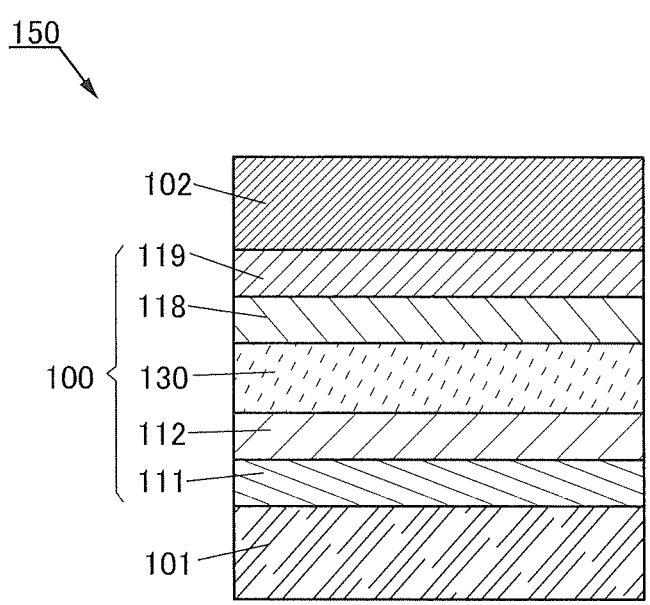
FIG. 1 is a schematic cross-sectional view of a light-emitting element of one embodiment of the present invention.

Embodiments of the present invention are described in detail below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like is not accurately represented in some cases for easy understanding. Therefore, the disclosed invention is not necessarily limited to the position, size, range, or the like as disclosed in the drawings and the like.

Note that the ordinal numbers such as "first" and "second" in this specification and the like are used for convenience and do not denote the order of steps or the stacking order of layers in some cases. Therefore, for example, description can be made even when "first" is replaced with "second" or "third", as appropriate. In addition, the ordinal numbers in this specification and the like are not necessarily the same as those which specify one embodiment of the present invention.

In the description of structures of the invention in this specification and the like with reference to the drawings, the same components in different diagrams are commonly denoted by the same reference numeral in some cases.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, a singlet excited state (S*) refers to a singlet state having excitation energy. An S1 level means the lowest level of the singlet-excitation energy level, that is, the excitation energy level of the lowest singlet excited state (S1 state). A triplet excited state (T*) refers to a triplet state having excitation energy. A T1 level means the lowest level of the triplet excitation energy level, that is, the excitation energy level of the lowest triplet excited state (T1 state). Note that in this specification and the like, simple expressions such as "singlet excited state" and "singlet-excitation energy level" mean the S1 state and the S1 level, respectively, in some cases. In addition, expressions such as "triplet excited state" and "triplet excitation energy level" mean the T1 state and the T1 level, respectively, in some cases.

In this specification and the like, a fluorescent compound refers to a compound that emits light in the visible light region when the relaxation from the singlet excited state to the ground state occurs. A phosphorescent compound refers to a compound that emits light in the visible light region at room temperature when the relaxation from the triplet excited state to the ground state occurs. That is, a phosphorescent compound refers to a compound that can convert triplet excitation energy into visible light.

Phosphorescence emission energy or triplet excitation energy can be obtained from a wavelength of an emission peak (the maximum value, or including a shoulder) or a wavelength of a rising portion on the shortest wavelength side of phosphorescence emission. Note that the phosphorescence emission of a compound that does not emit light at room temperature can be observed by time-resolved photoluminescence in a low-temperature (e.g., 10 K) environment. A thermally activated delayed fluorescence emission energy can be obtained from a wavelength of an emission peak (the maximum value, or including a shoulder) or a wavelength of a rising portion on the shortest wavelength side of thermally activated delayed fluorescence.

Note that in this specification and the like, "room temperature" refers to a temperature in the range of higher than or equal to 0° C. and lower than or equal to 40° C.

In this specification and the like, a wavelength range of blue refers to a wavelength range which is greater than or equal to 400 nm and less than 490 nm, and blue light has at least one peak in that wavelength range in an emission spectrum. A wavelength range of green refers to a wavelength range which is greater than or equal to 490 nm and less than 580 nm, and green light has at least one peak in that wavelength range in an emission spectrum. A wavelength range of red refers to a wavelength range which is greater than or equal to 580 nm and less than or equal to 680 nm, and red light has at least one peak in that wavelength range in an emission spectrum.

Embodiment 1

In this embodiment, a light-emitting element of one embodiment of the present invention is described below with reference to FIG. 1, FIGS. 2A to 2C, FIGS. 3A to 3C, and FIGS. 4A and 4B.

Structure Example 1 of Light-Emitting Element

First, a structure of a light-emitting element of one embodiment of the present invention is described below with reference to FIG. 1.

FIG. 1 is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1 includes functional layers such as a hole-injection layer 111, a hole-transport layer 112, an electron-transport layer 118, and an electron-injection layer 119, in addition to the light-emitting layer 130.

Although description is given assuming that the electrode 101 and the electrode 102 of the pair of electrodes serve as an anode and a cathode, respectively in this embodiment, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

Note that the structure of the EL layer 100 is not limited to the structure illustrated in FIG. 1, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

<Light Emission Mechanism 1 of Light-Emitting Element>

Next, the light emission mechanism of the light-emitting layer 130 is described below.

Figure 2A:
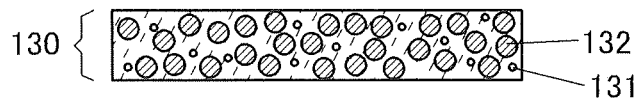
FIG. 2A is a schematic cross-sectional view of a light-emitting layer of a light-emitting element of one embodiment of the present invention.

FIG. 2A is a schematic cross-sectional view illustrating an example of the light-emitting layer 130 in FIG. 1. The light-emitting layer 130 illustrated in FIG. 2A includes a guest material 131 and a host material 132.

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. In other words, the probability of generation of singlet excitons is 25%, and the probability of generation of triplet excitons is 75%; thus, making triplet excitons contribute to the light emission is important for increasing the emission efficiency of the light-emitting element.

Therefore, a material having a function of converting triplet excitation energy into light emission is preferably used for the guest material 131 used in the light-emitting layer 130. Among compounds having a light-emitting property, a compound capable of exhibiting phosphorescence (hereinafter also referred to as phosphorescent compound) has a function of converting triplet excitation energy into light emission. Accordingly, it is preferable to use a phosphorescent compound for the guest material 131 of the light-emitting element 150. A structure in which a phosphorescent compound is used as the guest material 131 is described below. Note that the guest material 131 may be rephrased as the phosphorescent compound.

The phosphorescent compound preferably contains a heavy metal in order to efficiently convert triplet excitation energy into light emission. In the case where the phosphorescent compound contains a heavy metal, intersystem crossing between a singlet state and a triplet state is promoted by spin-orbit interaction (interaction between spin angular momentum and orbital angular momentum of an electron), and transition between a singlet ground state and a triplet excited state of the phosphorescent compound is allowed. This means that the probability of transition between the singlet ground state and the triplet excited state of the phosphorescent compound is increased; thus, the emission efficiency and the absorption probability which relate to the transition can be increased. Accordingly, the phosphorescent compound preferably contains a metal element with large spin-orbit interaction, specifically, a transition metal element. It is particularly preferable that a platinum group element (ruthenium (Ru), rhodium (Rh), palladium (Pd), osmium (Os), iridium (Ir), or platinum (Pt)), especially iridium, be contained because the probability of direct transition between a singlet ground state and a triplet excited state can be increased.

Excitation energy for exciting an organic compound depends on an energy difference between the lowest unoccupied molecular orbital (LUMO) level and the highest occupied molecular orbital (HOMO) level of the organic compound. The energy difference approximately corresponds to singlet excitation energy. In addition, according to Hund's rules, energy is more stable in a triplet excited state than in a singlet excited state. Thus, the guest material 131 can emit light having energy smaller than the energy difference between the LUMO level and the HOMO level of the guest material 131 ($\Delta E_G$). $\Delta E_G$ of the guest material 131 is larger than the light emission energy ($E_{G\_em}$) of the guest material 131 and the transition energy ($E_{G\_abs}$) obtained from the absorption spectrum; therefore, in the case where the guest material 131 is directly excited, high excitation energy that corresponds to $\Delta E_G$ is necessary and thus the driving voltage of the light-emitting element 150 is increased.

Thus, in one embodiment of the present invention, the guest material 131 is excited with excitation energy that is smaller than $\Delta E_G$, so that a light-emitting element that has high emission efficiency and is driven at a low voltage is provided. In the light-emitting element 150 of one embodiment of the present invention, the combination of the guest material 131 and the host material 132 preferably forms an exciplex (also denoted as Exciplex).

Although it is acceptable as long as the combination of the guest material 131 and the host material 132 can form an exciplex, it is preferable that one of them be a compound having a function of transporting holes (a hole-transport property) and the other be a compound having a function of transporting electrons (an electron-transport property). In that case, a donor-acceptor exciplex is formed easily; thus, efficient formation of an exciplex is possible. In the case where the combination of the guest material 131 and the host material 132 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:19 to 19:1. Since the carrier balance can be easily controlled with the structure, a carrier recombination region can also be controlled easily.

<<Correlation of Energy Levels>>

In order to efficiently form an exciplex, the combination preferably satisfies the following: the HOMO level of one of the guest material 131 and the host material 132 is higher than or equal to the HOMO level of the other of the guest material 131 and the host material 132, and the LUMO level of one of the guest material 131 and the host material 132 is higher than or equal to the LUMO level of the other of the guest material 131 and the host material 132.

Note that the LUMO levels and the HOMO levels of the compounds can be derived from the electrochemical characteristics (the reduction potentials and the oxidation potentials) of the compounds that are measured by cyclic voltammetry (CV).

Figure 2B:
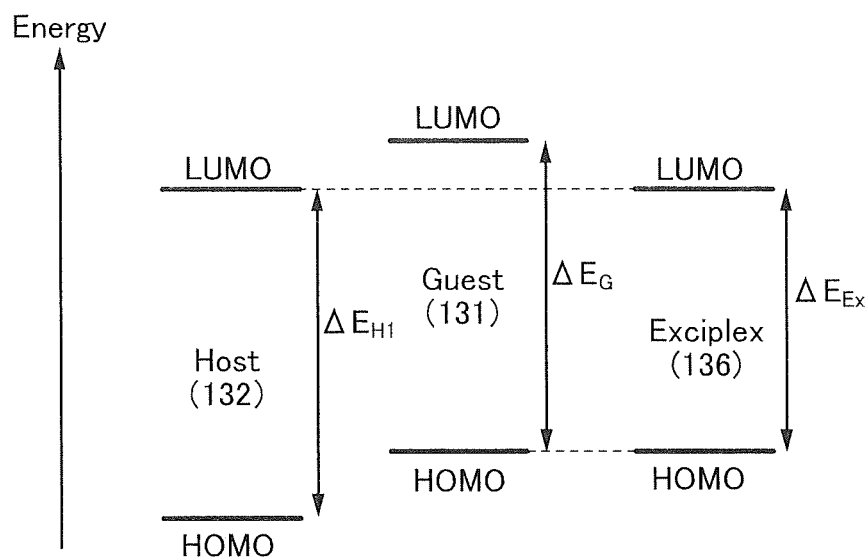
FIGS. 2B and 2C are diagrams each illustrating the correlation of energy levels.

For example, in the case where the guest material 131 has a hole-transport property and the host material 132 has an electron-transport property, the HOMO level of the guest material 131 is preferably higher than or equal to the HOMO level of the host material 132, and the LUMO level of the guest material 131 is preferably higher than or equal to the LUMO level of the host material 132, as shown in the energy band diagram in FIG. 2B. This is favorable because electrons and holes injected from the pair of electrodes (the electrode 101 and the electrode 102) are easily injected into the guest material 131 and the host material 132.

Note that in FIG. 2B, "Guest (131)" represents the guest material 131, "Host (132)" represents the host material 132, "Exciplex (136)" represents an exciplex 136 formed by the guest material 131 and the host material 132, $\Delta E_G$ represents the energy difference between the LUMO level and the HOMO level of the guest material 131, $\Delta E_{H1}$ represents the energy difference between the LUMO level and the HOMO level of the host material 132, and $\Delta E_{Ex}$ represents the energy difference between the LUMO level of the host material 132 and the HOMO level of the guest material 131.

Furthermore, in that case, the exciplex 136 formed by the guest material 131 and the host material 132 has the HOMO in the guest material 131 and the LUMO in the host material 132. The excitation energy of the exciplex 136 substantially corresponds to the energy difference between the LUMO level of the host material 132 and the HOMO level of the guest material 131 ($\Delta E_{Ex}$) and is smaller than the energy difference between the LUMO level and the HOMO level of the guest material 131 ($\Delta E_G$) and the energy difference between the LUMO level and the HOMO level of the host material 132 ($\Delta E_{H1}$). Thus, when the guest material 131 and the host material 132 form the exciplex 136, an excited state can be formed with lower excitation energy. Furthermore, since the exciplex 136 has lower excitation energy, the exciplex 136 can form a stable excited state.

Figure 2C:
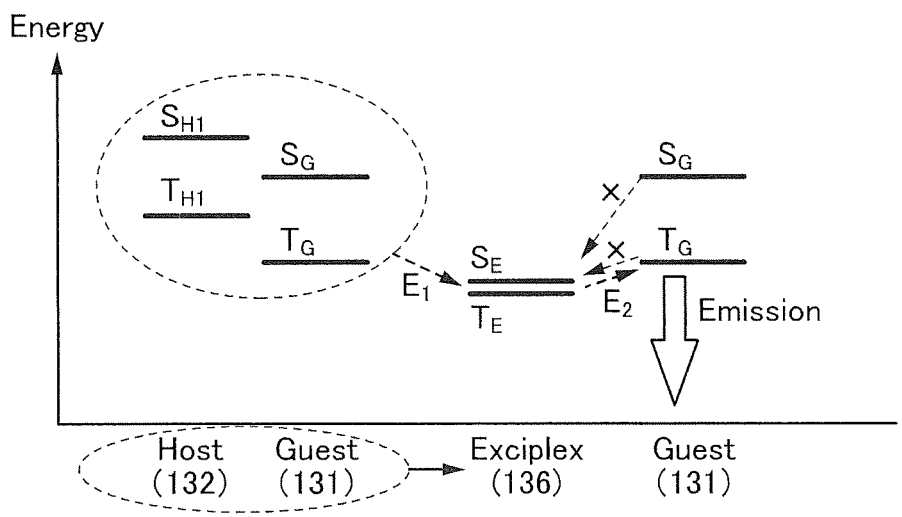

FIG. 2C shows a correlation of energy levels of the guest material 131 and the host material 132 in the light-emitting layer 130. The following explains what terms and signs in FIG. 2C represent:

Guest (131): the guest material 131 (phosphorescent compound);
Host (132): the host material 132;
$S_G$: an S1 level of the guest material 131;
$T_G$: a T1 level of the guest material 131;
$S_{H1}$: an S1 level of the host material 132;
$T_{H1}$: a T1 level of the host material 132;
$S_E$: an S1 level of the exciplex 136; and
$T_E$: a T1 level of the exciplex 136.

In the light-emitting element of one embodiment of the present invention, the exciplex 136 is formed by the guest material 131 and the host material 132 included in the light-emitting layer 130. The S1 level of the exciplex 136 ($S_E$) and the T1 level of the exciplex 136 ($T_E$) are close to each other (see Route $E_1$ in FIG. 2C). Specifically, the energy difference between the singlet excitation energy level ($S_E$) and the triplet excitation energy level ($T_E$) of the exciplex 136 is preferably larger than 0 eV and smaller than or equal to 0.2 eV, further preferably larger than 0 eV and smaller than or equal to 0.1 eV.

An exciplex is an excited state formed by two kinds of substances. In photoexcitation, the exciplex is formed by interaction between one substance in an excited state and another substance in a ground state. The two kinds of substances that have formed the exciplex return to a ground state by emitting light and then serve as the original two kinds of substances. In electrical excitation, when one substance is brought into an excited state, the one immediately interacts with the other substance to form an exciplex. Alternatively, one substance receives a hole and the other substance receives an electron, and they interact with each other to readily form an exciplex. Because the excitation energy levels ($S_E$ and $T_E$) of the exciplex 136 are lower than the S1 levels ($S_G$ and $S_{H1}$) of the substances (the guest material 131 and the host material 132) that form the exciplex 136, the excited state can be formed with lower excitation energy. Accordingly, the driving voltage of the light-emitting element 150 can be reduced.

Both the singlet excitation energy and the triplet excitation energy of the exciplex 136 are transferred from the S1 level ($S_E$) and the T1 level ($T_E$) of the exciplex 136 to the T1 level ($T_G$) of the guest material 131 (phosphorescent compound), so that light emission can be obtained from the guest material 131 (see Route $E_2$ in FIG. 2C).

In order to suppress deactivation of the exciplex 136, the T1 level ($T_E$) of the exciplex 136 is preferably lower than the T1 level ($T_{H1}$) of the host material 132. Note that in one embodiment of the present invention, reverse intersystem crossing from the triplet excitation energy to the singlet excitation energy of the exciplex 136 is not needed and the luminescence quantum yield from the singlet excitation energy level ($S_E$) is not necessarily high; thus, materials can be selected from a wide range of options.

Here, the present inventors have found that even in the case where the S1 level ($S_E$) and the T1 level ($T_E$) of the exciplex 136 formed by the guest material 131 and the host material 132 are lower than the T1 level ($T_G$) of the guest material 131, as long as the S1 level ($S_E$) and the T1 level ($T_E$) of the exciplex 136 and the T1 level ($T_G$) of the guest material 131 are close, excitation energy can be transferred from the exciplex 136 formed by the guest material 131 and the host material 132 to the guest material 131 by thermal activation, so that efficient light emission from the guest material 131 can be achieved. In addition, the present inventors have found that formation of the exciplex 136 makes the lifetime of the light-emitting element longer, and increases the reliability of the light-emitting element.

Since the guest material 131 is a phosphorescent compound, light emission of the guest material 131 is based on transition from the triplet excited state to the ground state of the guest material 131, and the absorption edge of the absorption spectrum of the guest material 131 is an absorption edge based on transition from the ground state to the triplet excited state of the guest material 131. The light emission of the exciplex 136 is based on transition from the singlet excited state to the singlet ground state of the exciplex, and the singlet excitation energy level and the triplet excitation energy level exciplex are close to each other.

Thus, the energy ($E_{G\_em}$) of the light emission from the guest material 131 and the energy ($E_{Ex\_em}$) of the light emission from the exciplex 136 are preferably close, or the transition energy ($E_{G\_abs}$) calculated from the absorption edge of the absorption spectrum of the guest material 131 and the energy ($E_{Ex\_em}$) of the light emission from the exciplex 136 are preferably close. Furthermore, to form an exciplex, $E_{Ex\_em}$ is preferably smaller than $E_{G\_em}$ and $E_{G\_abs}$. Thus, specifically, $E_{G\_em}-E_{Ex\_em}$ is preferably larger than 0 eV and smaller than or equal to 0.23 eV (0 eV<$E_{G\_em}-E_{Ex\_em}$≤0.23 eV), further preferably larger than 0 eV and smaller than or equal to 0.18 eV (0 eV<$E_{G\_em}-E_{Ex\_em}$≤0.18 eV). Furthermore, $E_{G\_abs}-E_{Ex\_em}$ is preferably larger than 0 eV and smaller than or equal to 0.30 eV (0 eV<$E_{G\_abs}-E_{Ex\_em}$≤0.30 eV), further preferably larger than 0 eV and smaller than or equal to 0.25 eV (0 eV<$E_{G\_abs}-E_{Ex\_em}$≤0.25 eV).

Note that the excitation energy of the exciplex 136 formed by the guest material 131 and the host material 132 substantially corresponds to an energy difference ($\Delta E_{Ex}$) between the LUMO level of the host material 132 and the HOMO level of the guest material 131. Thus, in the above structure, the transition energy ($E_{G\_abs}$) calculated from the absorption edge of the absorption spectrum of the guest material 131 and the energy difference ($\Delta E_{Ex}$) between the LUMO level of the host material 132 and the HOMO level of the guest material 131 are preferably close. Furthermore, to form an exciplex, $\Delta E_{Ex}$ is preferably smaller than $E_{G\_abs}$. Thus, specifically, $E_{G\_abs}-\Delta E_{Ex}$ is preferably larger than 0 eV and smaller than or equal to 0.23 eV (0 eV<$E_{G\_abs}-\Delta E_{Ex}$≤0.23 eV), further preferably larger than 0 eV and smaller than or equal to 0.18 eV (0 eV<$E_{G\_abs}-\Delta E_{Ex}$≤0.18 eV).

With the above-described energy relation, excitation energy can be transferred from the exciplex 136 formed by the guest material 131 and the host material 132 to the guest material 131, so that efficient light emission from the guest material 131 can be achieved.

In one embodiment of the present invention, the exciplex 136 is excited with excitation energy that corresponds to $\Delta E_{Ex}$ (that is smaller than $\Delta E_G$), and light emission from the guest material 131 can be obtained by energy transfer from the exciplex 136, so that light emission from the guest material 131 can be obtained with a low driving voltage. That is, one embodiment of the present invention is useful particularly in the case where $\Delta E_G$ is significantly larger than the light emission energy ($E_{G\_em}$) of the guest material 131 or the transition energy ($E_{G\_abs}$) calculated from the absorption edge of the absorption spectrum of the guest material 131 (for example, in the case where the guest material is a blue light-emitting material). Specifically, the energy difference between the LUMO level and the HOMO level of the guest material 131 ($\Delta E_G$) is preferably larger than the transition energy ($E_{G\_abs}$) calculated from the absorption edge of the absorption spectrum of the guest material 131 by 0.3 eV or more, further preferably larger than that by 0.4 eV or more. Since the light emission energy ($E_{G\_em}$) of the guest material 131 is equivalent to or smaller than $E_{G\_abs}$, the energy difference between the LUMO level and the HOMO level of the guest material 131 ($\Delta E_G$) is preferably larger than the light emission energy ($E_{G\_em}$) of the guest material 131 by 0.3 eV or more, further preferably larger than that by 0.4 eV or more. Note that the light emission energy ($E_{G\_em}$ and $E_{EX\_em}$) can be derived from a wavelength of an emission peak (the maximum value, or including a shoulder) on the shortest wavelength side or a wavelength of a rising portion of the emission spectrum.

Note that the shorter the emission wavelength of the guest material 131 is (the higher light emission energy ($E_{G\_em}$) is), the larger the energy difference between the LUMO level and the HOMO level of the guest material 131 ($\Delta E_G$) is, and accordingly, larger energy is needed for exciting the guest material 131. However, when the transition energy ($E_{G\_abs}$) calculated from the absorption edge of the absorption spectrum of the guest material 131 is greater than $\Delta E_{Ex}$ and smaller than or equal to $\Delta E_{Ex}$+0.23 eV ($\Delta E_{Ex}$<$E_{G\_abs}$≤$\Delta E_{Ex}$+0.23 eV), according to one embodiment of the invention, the guest material 131 can be excited with energy as small as $\Delta E_{Ex}$, which is smaller than $\Delta E_G$, whereby the power consumption of the light-emitting element can be reduced. Therefore, the effect of the light emission mechanism of one embodiment of the present invention is brought to the fore in the case where an energy difference between the transition energy ($E_{G\_abs}$) calculated from the absorption edge of the absorption spectrum of the guest material 131 and the energy difference between the LUMO level and the HOMO level of the guest material 131 ($\Delta E_G$) is large (i.e., particularly in the case where the guest material is a blue light-emitting material).

As the transition energy ($E_{G\_abs}$) calculated from the absorption edge of the absorption spectrum of the guest material 131 decreases, the light emission energy ($E_{G\_em}$) of the guest material 131 also decreases. In that case, light emission that needs high energy, such as blue light emission, is difficult to obtain. That is, when a difference between $E_{G\_abs}$ and $\Delta E_G$ is too large, high-energy light emission such as blue light emission is obtained with difficulty.

For these reasons, the energy difference between the LUMO level and the HOMO level of the guest material 131 ($\Delta E_G$) is preferably larger than the transition energy ($E_{G\_abs}$) calculated from the absorption edge of the absorption spectrum of the guest material 131 by 0.3 eV to 0.8 eV, further preferably by 0.4 eV to 0.8 eV, still further preferably by 0.5 eV to 0.8 eV. Since the light emission energy ($E_{G\_em}$) of the guest material 131 is smaller than or equal to $E_{G\_abs}$, the energy difference between the LUMO level and the HOMO level of the guest material 131 ($\Delta E_G$) is preferably larger than the light emission energy ($E_{G\_em}$) of the guest material 131 by 0.3 eV to 0.8 eV, further preferably by 0.4 eV to 0.8 eV, still further preferably by 0.5 eV to 0.8 eV.

In order that the guest material 131 can emit light with a high light emission energy (light of a short wavelength), the T1 level of the guest material 131 is preferably high. To make the T1 level of the guest material 131 high, a ligand coordinated to a heavy metal atom of the guest material 131 preferably has a high T1 level, a low electron-accepting property, and a high LUMO level.

Such a guest material tends to have a molecular structure having a high HOMO level and a high hole-accepting property. When the guest material 131 has a molecular structure having a high hole-accepting property, the HOMO level of the guest material 131 is sometimes higher than that of the host material 132.

In the case where the guest material 131 has a hole-transport property and the host material 132 has an electron-transport, moderate trapping of holes is preferable because moderate trapping of holes leads to easy control of carrier balance in the light-emitting layer and longer lifetime of the light-emitting element; however, when the HOMO level of the guest material 131 is too high, $\Delta E_{Ex}$ becomes small, which makes it difficult to transfer the excitation energy from the exciplex formed using the guest material 131 and the host material 132 to the guest material 131. Thus, a preferable difference between the HOMO level of the guest material 131 and the HOMO level of the host material 132 is larger than or equal to 0.05 eV and smaller than or equal to 0.4 eV. Furthermore, the energy difference between the LUMO level of the guest material 131 and the LUMO level of the host material 132 is preferably 0.05 eV or more, further preferably 0.1 eV or more, or still further preferably 0.2 eV or more. This is because electron carriers are easily injected to the host material 132 with such an energy level correlation.

A structure may be used in which the guest material 131 has an electron-transport property and the host material 132 has a hole-transport property. In this case, the HOMO level of the host material 132 is preferably higher than or equal to the HOMO level of the guest material 131, and the LUMO level of the host material 132 is preferably higher than or equal to the LUMO level of the guest material 131, as shown in the energy band diagram in FIG. 4A.

Furthermore, in this case, moderate trapping of holes is preferable because moderate trapping of electrons leads to easy control of carrier balance in the light-emitting layer and longer lifetime of the light-emitting element; however, when the LUMO level of the guest material 131 is too low, the above-described $\Delta E_{Ex}$ becomes small, which makes it difficult to transfer the excitation energy from the exciplex 136 to the guest material 131. Thus, a preferable difference between the LUMO level of the guest material 131 and the LUMO level of the host material 132 is larger than or equal to 0.05 eV and smaller than or equal to 0.4 eV Furthermore, the energy difference between the HOMO level of the guest material 131 and the HOMO level of the host material 132 is preferably 0.05 eV or more, further preferably 0.1 eV or more, or still further preferably 0.2 eV or more. This is because holes are easily injected to the host material 132 with such an energy level correlation.

Note that when the S1 level ($S_E$) and the T1 level ($T_E$) of the exciplex 136 is lower than the T1 level ($T_G$) of the guest material 131, part of excitation energy of the exciplex 136 is not transferred to the guest material 131 and the exciplex 136 emits light in some cases. When the light emission of the exciplex 136 is dominant, an excited state of the guest material 131 is less likely to be formed; thus, the emission efficiency of the light-emitting element 150 is decreased. Thus, in order to increase the efficiency of the light-emitting element 150, in the light emission from the light-emitting element 150, the light emission from the exciplex 136 is preferably smaller than the light emission from the guest material 131. Specifically, the percentage of the light emission from the exciplex 136 to the light emission from the light-emitting element 150 is preferably greater than 0% and less than or equal to 60%, further preferably greater than 0% and less than or equal to 40%.

Note that when a compound containing a heavy atom is used as one of the compounds that form an exciplex, intersystem crossing between a singlet state and a triplet state is promoted by spin-orbit interaction (interaction between spin angular momentum and orbital angular momentum of an electron). In other words, reverse intersystem crossing from a triplet excited state to a singlet excited state in an exciplex is promoted; thus, the generation probability of singlet excited states in the exciplex can be increased. Alternatively, the probability of transition from the triplet excited state to the singlet ground state can be increased. To achieve this, one of the compounds that form an exciplex preferably contains a metal element with large spin-orbit interaction, specifically, a transition metal element. It is particularly preferable that a platinum group element (ruthenium (Ru), rhodium (Rh), palladium (Pd), osmium (Os), iridium (Ir), or platinum (Pt)), especially iridium, be contained because intersystem crossing or transition between a singlet excited state and a triplet excited state in the exciplex can be increased.

In the case where a phosphorescent compound is used for the guest material 131, the T1 level ($T_G$) of the guest material 131 is preferably lower than the T1 level of another material included in the light-emitting layer 130 (e.g., the T1 level ($T_{H1}$) of the host material 132). In that case, deactivation of triplet excitation energy of the guest material 131 (phosphorescent compound) is less likely to occur, so that efficient light emission from the guest material 131 can be achieved.

Note that the exciplex only exists in an excited state, and the excitation energy levels ($S_E$ and $T_E$) of the exciplex 136 are only present in a state in which the exciplex 136 is formed; thus, direct transfer from the ground state of the substances (the guest material 131 or the host material 132) forming the exciplex 136 to the excited state of the exciplex 136 does not occur. Therefore, excitation energy transfer from the excitation energy levels ($S_G$ and $T_G$) of the guest material 131 alone or the excitation energy levels ($S_{H1}$ and $T_{H1}$) of the host material 132 alone to the excitation energy levels ($S_E$ and $T_E$) of the exciplex 136 does not occur. Thus, even in the case where the S1 level ($S_E$) and the T1 level ($T_E$) of the exciplex 136 is lower than the T1 level ($T_G$) of the guest material 131, efficient light emission from the guest material 131 can be achieved.

<<Energy Transfer Mechanism>>

Here, factors controlling the processes of the intermolecular energy transfer are described. As mechanisms of the intermolecular energy transfer, two mechanisms, i.e., FÖrster mechanism (dipole-dipole interaction) and Dexter mechanism (electron exchange interaction), have been proposed. Here, as to giving excitation energy from the first material in an excited state to the second material in a ground state, an energy transfer process between molecules of the first material in an excited state and the second material in a ground state is described; the same can be applied to the case where one of them is an exciplex.

<<FÖrster Mechanism>>

In FÖrster mechanism, energy transfer does not require direct contact between molecules and energy is transferred through a resonant phenomenon of dipolar oscillation between a first material and a second material. By the resonant phenomenon of dipolar oscillation, the first material provides energy to the second material, and thus, the first material in an excited state is brought to a ground state and the second material in a ground state is brought to an excited state. Note that the rate constant $k_{h^*\to g}$ of Förster mechanism is expressed by Formula (1).

[Formula 1]

$$k_{h^*\to g} = \frac{9000c^4 K^2 \phi \ln 10}{128\pi^5 n^4 N \tau R^6} \int \frac{f'_h(v)\varepsilon_g(v)}{v^4} dv \quad (1)$$

In Formula (1), v denotes a frequency, $f'_h(v)$ denotes a normalized emission spectrum of the first material (a fluorescent spectrum in the case where energy transfer from a singlet excited state is discussed, and a phosphorescent spectrum in the case where energy transfer from a triplet excited state is discussed), $\varepsilon_g(v)$ denotes a molar absorption coefficient of the second material, N denotes Avogadro's number, n denotes a refractive index of a medium, R denotes an intermolecular distance between the first material and the second material, τ denotes a measured lifetime of an excited state (fluorescence lifetime or phosphorescence lifetime), c denotes the speed of light, φ denotes an emission quantum yield (a fluorescence quantum yield in the case where energy transfer from a singlet excited state is discussed, and a phosphorescence quantum yield in the case where energy transfer from a triplet excited state is discussed), and $K^2$ denotes a coefficient (0 to 4) of orientation of a transition dipole moment between the first material and the second material. Note that $K^2$=2/3 in random orientation.

<<Dexter Mechanism>>

In Dexter mechanism, the first material and the second material are close to a contact effective range where their orbitals overlap, and the first material in an excited state and the second material in a ground state exchange their electrons, which leads to energy transfer. Note that the rate constant $k_{h^*\to g}$ of Dexter mechanism is expressed by Formula (2).

[Formula 2]

$$k_{h^*\to g} = \left(\frac{2\pi}{h}\right) K^2 \exp\left(-\frac{2R}{L}\right) \int f'_h(v)\varepsilon'_g(v) dv \quad (2)$$

In Formula (2), h denotes a Planck constant, K denotes a constant having an energy dimension, v denotes a frequency, $f'_h(v)$ denotes a normalized emission spectrum of the first material (the fluorescent spectrum in the case where energy transfer from a singlet excited state is discussed, and the phosphorescent spectrum in the case where energy transfer from a triplet excited state is discussed), $\varepsilon'_g(v)$ denotes a normalized absorption spectrum of the second material, L denotes an effective molecular radius, and R denotes an intermolecular distance between the first material and the second material.

Here, the efficiency of energy transfer from the first material to the second material (energy transfer efficiency $\phi_{ET}$) is expressed by Formula (3). In the formula, $k_r$ denotes a rate constant of a light-emission process (fluorescence in the case where energy transfer from a singlet excited state is discussed, and phosphorescence in the case where energy transfer from a triplet excited state is discussed) of the first material, $k_n$ denotes a rate constant of a non-light-emission process (thermal deactivation or intersystem crossing) of the second material, and τ denotes a measured lifetime of an excited state of the first material.

[Formula 3]

$$\phi_{ET} = \frac{k_{h^*\to g}}{k_r + k_n + k_{h^*\to g}} = \frac{k_{h^*\to g}}{\left(\frac{1}{\tau}\right) + k_{h^*\to g}} \quad (3)$$

According to Formula (3), it is found that the energy transfer efficiency $\phi_{ET}$ can be increased by increasing the rate constant $k_{h^*\to g}$ of energy transfer so that another competing rate constant $k_r+k_n$ (=1/τ) becomes relatively small.

<<Excitation Energy Transfer to Phosphorescent Compound or Exciplex>>

First, energy transfer by Förster mechanism is considered. When Formula (1) is substituted into Formula (3), τ can be eliminated. Thus, in Förster mechanism, the energy transfer efficiency $\phi_{ET}$ does not depend on the lifetime τ of the excited state of the first material. Furthermore, it can be said that high energy transfer efficiency $\phi_{ET}$ is obtained when emission quantum yield φ (the fluorescence quantum yield in the case where energy transfer from a singlet excited state is discussed, and the phosphorescence quantum yield in the case where energy transfer from a triplet excited state is discussed) is high.

Furthermore, it is preferable that the emission spectrum of the first material (the fluorescent spectrum in the case where energy transfer from a singlet excited state is discussed, and the phosphorescent spectrum in the case where energy transfer from a triplet excited state is discussed) largely overlap with the absorption spectrum of the second material (absorption corresponding to transition from the singlet ground state to the singlet excited state). Moreover, it is preferable that the molar absorption coefficient of the second material be also high. This means that the emission spectrum of the first material overlaps with the absorption band of the absorption spectrum of the second material which is on the longest wavelength side. Note that in the case of using a phosphorescent compound as the second material, as well as transition from a singlet ground state to a singlet excited state, transition from a singlet ground state to a triplet excited state is possible. In the case of using an exciplex as the second material, the molar absorption coefficient of the second material (exciplex) can be ignored because direct transition from a singlet ground state to a singlet excited state and direct transition from a singlet ground state to a triplet excited state are forbidden. Thus, the excitation energy transfer process from the first material to the second material(exciplex) by the Förster mechanism can be ignored.

Next, energy transfer by Dexter mechanism is considered. According to Formula (2), in order to increase the rate constant $k_{h^*\to g}$, it is preferable that the emission spectrum of the first material (the fluorescent spectrum in the case where energy transfer from a singlet excited state is discussed, and the phosphorescent spectrum in the case where energy transfer from a triplet excited state is discussed) largely overlap with an absorption spectrum of the second material (absorption corresponding to transition from a singlet ground state to a singlet excited state). Therefore, the energy transfer efficiency can be optimized by making the emission spectrum of the first material overlap with the absorption band of the absorption spectrum of the second material which is on the longest wavelength side. Also in this case, in the case of using a phosphorescent compound as the second material, as well as transition from a singlet ground state to a singlet excited state, transition from a singlet ground state to a triplet excited state is possible. When an exciplex is used for the second material, the absorption spectrum of the second material (exciplex) can be ignored, since direct transition from a singlet ground state to a singlet excited state and direct transition from a singlet ground state to a triplet excited state are forbidden. Thus, the excitation energy transfer process from the first material to the second material (exciplex) by the Dexter mechanism can be ignored.

Thus, in the case of using a phosphorescent compound as the second material, energy transfer occur due to the FÖrster mechanism and due to the Dexter mechanism in the energy transfer process from the first material to the second material (phosphorescent compound). In the case of using an exciplex as the second material, energy transfer does not occur due to the FÖrster mechanism or due to the Dexter mechanism in the energy transfer process from the first material to the second material (exciplex). That is, in the light-emitting element of one embodiment of the present invention, energy transfer from the exciplex 136 formed by the guest material 131 and the host material 132 to the guest material 131 occurs, whereas energy transfer from the guest material 131 to the exciplex 136 does not occur.

Note that when the direct carrier recombination process becomes dominant in the guest material 131, a process for forming the exciplex 136 by the guest material 131 and the host material 132 is less likely to occur, and the driving voltage of the light-emitting element 150 is increased. Thus, the guest material 131 preferably emits light through an energy transfer process after the formation process of the exciplex 136 (Route $E_1$ and Route $E_2$ in FIG. 2C). In order to achieve this, the weight ratio of the guest material 131 to the host material 132 is preferably low, specifically, preferably greater than or equal to 0.01 and less than or equal to 0.5, further preferably greater than or equal to 0.05 and less than or equal to 0.3.

To suppress the deactivation of excitation energy of the light-emitting layer 130, the emission lifetime of light emitted from the light-emitting layer 130 is preferably short. Specifically, the time in which the intensity of the light emission from the light-emitting layer 130 is reduced to lower than or equal to 1% is preferably longer than or equal to 10 ns and shorter than or equal to 37 µs, further preferably longer than or equal to 10 ns and shorter than or equal to 30 µs.

<Light Emission Mechanism 2 of Light-Emitting Element>

Next, a structural example different from that of the light-emitting layer illustrated in FIG. 2A is described below with reference to FIG. 3A.

Figure 3A:
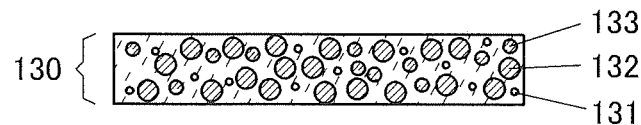
FIG. 3A is a schematic cross-sectional view of a light-emitting layer of a light-emitting element of one embodiment of the present invention.

FIG. 3A is a schematic cross-sectional view illustrating an example of the light-emitting layer 130 in FIG. 1. The light-emitting layer 130 in FIG. 3A includes the guest material 131, the host material 132, and a host material 133.

In the light-emitting layer 130, the host material 132 or the host material 133 is present in the highest proportion by weight, and the guest material 131 is dispersed in the host material 132 and the host material 133. Here, the guest material 131 is preferably a phosphorescent compound. Furthermore, the combination of the guest material 131 and the host material 132 preferably forms the exciplex 136.

In order to efficiently form the exciplex 136, the combination of the guest material 131 and the host material 132 preferably satisfies the following: the HOMO level of one of the guest material 131 and the host material 132 is the highest of the materials in the light-emitting layer 130, and the LUMO level of the other is the lowest of the materials in the light-emitting layer 130. In other words, the HOMO level of one of the guest material 131 and the host material 132 is preferably higher than or equal to the HOMO level of the other of the guest material 131 and the host material 132 and the HOMO level of the host material 133, and the LUMO level of the other of the guest material 131 and the host material 132 is preferably lower than or equal to the LUMO level of the one of the guest material 131 and the host material 132 and the LUMO level of the host material 133.

Figure 3B:
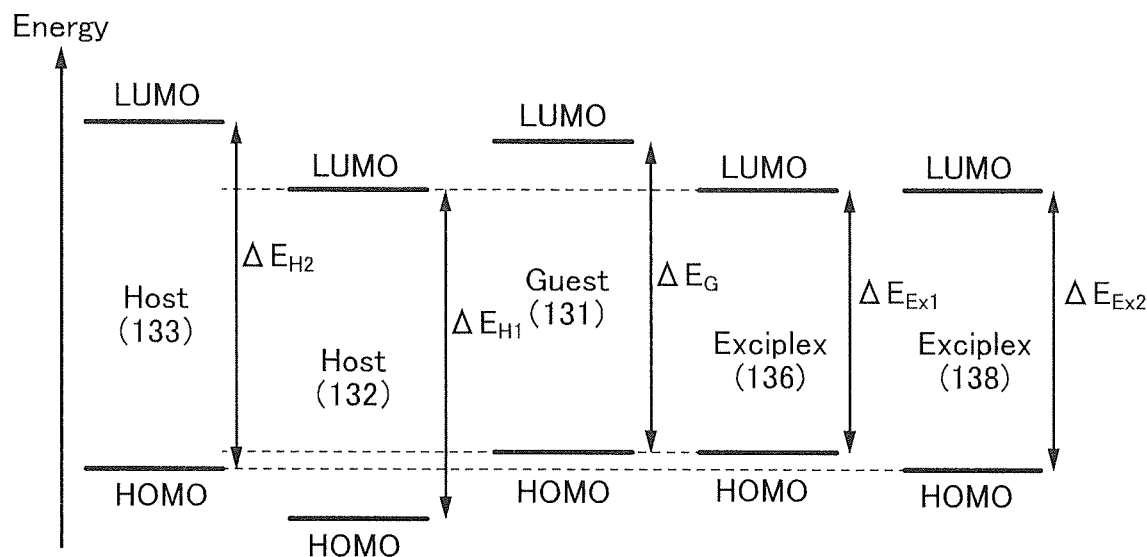
FIGS. 3B and 3C are diagrams each illustrating the correlation of energy levels.

In the case where, for example, the guest material 131 has a hole-transport property and the host material 132 has an electron-transport property, the HOMO level of the guest material 131 is preferably higher than or equal to the HOMO level of the host material 132 and the HOMO level of the host material 133, and the LUMO level of the host material 132 is preferably lower than or equal to the LUMO level of the guest material 131 and the LUMO level of the host material 133, as shown in the energy band diagram in FIG. 3B. In this case, the LUMO level of the host material 133 may be higher or lower than the LUMO level of the guest material 131.

Furthermore, the combination of the host material 132 and the host material 133 preferably forms an exciplex 138. Although it is acceptable as long as the combination of the host material 132 and the host material 133 can form an exciplex, it is preferable that one of them be a compound having a function of transporting holes (a hole-transport property) and the other be a compound having a function of transporting electrons (an electron-transport property). That is, for example, in the case where the host material 132 is a compound having an electron-transport property, the guest material 131 and the host material 133 are preferably compounds having hole-transport properties. In the case where the host material 132 is a compound having a hole-transport property, the guest material 131 and the host material 133 are preferably compounds having electron-transport properties. In the case where the combination of the host material 132 and the host material 133 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

In order to efficiently form the exciplex 138, the combination of the host material 132 and the host material 133 preferably satisfies the following: the HOMO level of one of the host material 132 and the host material 133 is higher than or equal to the HOMO level of the other of the host material 132 and the host material 133, and the LUMO level of the one of the host material 132 and the host material 133 is higher than or equal to the LUMO level of the other of the host material 132 and the host material 133.

For example, in the case where the host material 133 has a hole-transport property, the HOMO level of the host material 133 is preferably higher than or equal to the HOMO level of the host material 132, and the LUMO level of the host material 133 is preferably higher than or equal to the LUMO level of the host material 132, as shown in the energy band diagram in FIG. 3B. Specifically, the energy difference between the HOMO level of the host material 132 and the HOMO level of the host material 133 is preferably 0.1 eV or more, further preferably 0.2 eV or more, or still further preferably 0.3 eV or more. Furthermore, the energy difference between the LUMO level of the host material 132 and the LUMO level of the host material 133 is preferably 0.1 eV or more, further preferably 0.2 eV or more, or still further preferably 0.3 eV or more. In this case, the HOMO level of the host material 133 is preferably lower than or equal to the HOMO level of the guest material 131. In order that the exciplex 136 is formed by the guest material 131 and the host material 132 and the exciplex 138 is formed by the host material 132 and the host material 133, the energy difference between the HOMO level of the guest material 131 and the HOMO level of the host material 133 is preferably greater than or equal to 0 eV and smaller than or equal to 0.3 eV, further preferably greater than or equal to 0 eV and smaller than or equal to 0.2 eV, still further preferably greater than or equal to 0 eV and smaller than or equal to 0.1 eV.

Note that in FIG. 3B, "Guest (131)" represents the guest material 131, "Host (132)" represents the host material 132, "Host (133)" represents the host material 133, "Exciplex (136)" represents the exciplex 136 formed by the guest material 131 and the host material 132, "Exciplex (138)" represents the exciplex 138 formed by the host material 132 and the host material 133, $\Delta E_G$ represents the energy difference between the LUMO level and the HOMO level of the guest material 131, $\Delta E_{H1}$ represents the energy difference between the LUMO level and the HOMO level of the host material 132, $\Delta E_{H2}$ represents the energy difference between the LUMO level and the HOMO level of the host material 133, $\Delta E_{Ex1}$ represents the energy difference between the LUMO level of the host material 132 and the HOMO level of the guest material 131, and $\Delta E_{Ex2}$ represents the energy difference between the LUMO level of the host material 132 and the HOMO level of the host material 133.

Furthermore, in that case, excitation energy of the exciplex 136 formed by the guest material 131 and the host material 132 substantially corresponds to the energy difference between the LUMO level of the host material 132 and the HOMO level of the guest material 131 ($\Delta E_{Ex1}$) and is preferably smaller than the energy difference between the LUMO level and the HOMO level of the host material 133 ($\Delta E_{H2}$).

Furthermore, in that case, the exciplex 138 formed by the host material 132 and the host material 133 has the HOMO in the host material 132 and the LUMO in the host material 133. The excitation energy of the exciplex 138 substantially corresponds to the energy difference between the LUMO level of the host material 132 and the HOMO level of the host material 133 ($\Delta E_{Ex2}$) and is smaller than the energy difference between the LUMO level and the HOMO level of the guest material 131 ($\Delta E_G$), the energy difference between the LUMO level and the HOMO level of the host material 132 ($\Delta E_{H1}$), and the energy difference between the LUMO level and the HOMO level of the host material 133 ($\Delta E_{H2}$).

Thus, when the guest material 131 and the host material 132 form the exciplex 136 and the host material 132 and the host material 133 form the exciplex 138, an excited state can be formed with lower excitation energy. Furthermore, since the exciplex 136 and the exciplex 138 have lower excitation energy, the exciplex 136 and the exciplex 138 can form stable excited states.

Figure 3C:
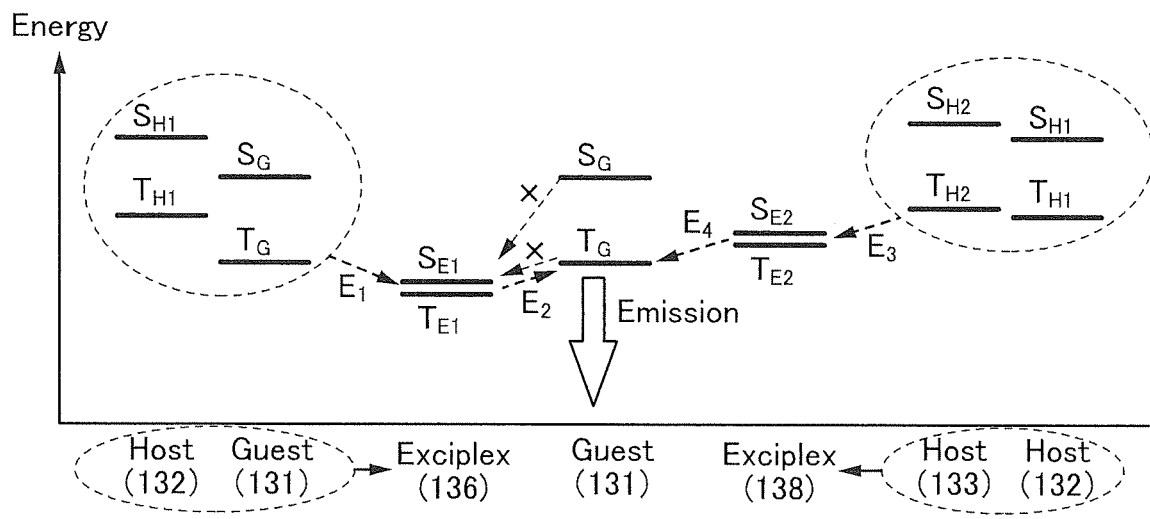
Figure 4A:
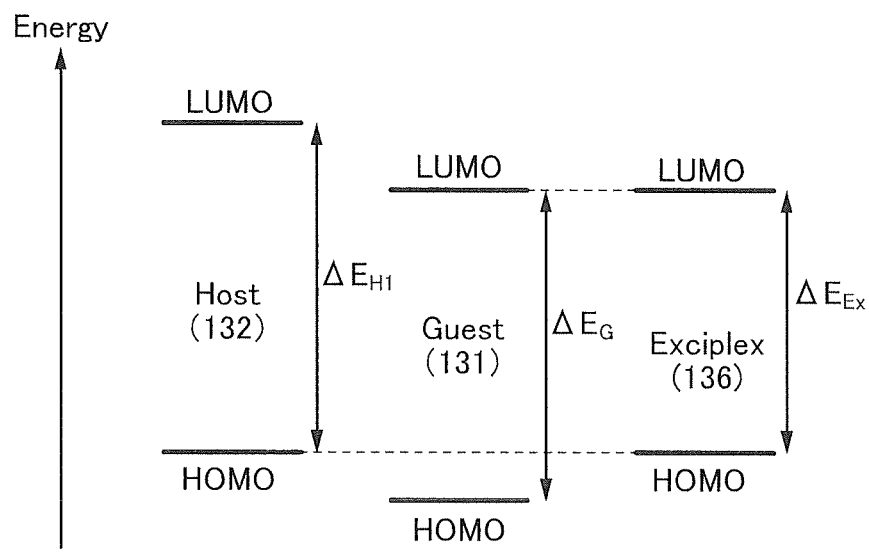
FIGS. 4A and 4B are diagrams each illustrating the correlation of energy levels of a light-emitting layer of a light-emitting element of one embodiment of the present invention.
Figure 4B:
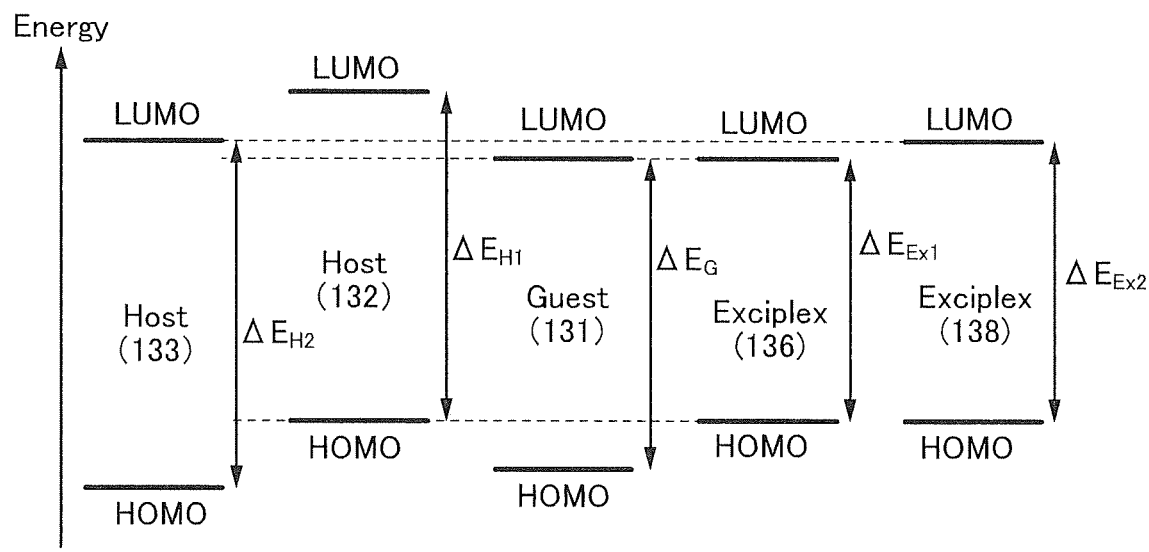

FIG. 3C shows the correlation between energy levels of the guest material 131, the host material 132, and the host material 133 in the light-emitting layer 130 illustrated in FIG. 3A. The following explains what terms and signs in FIG. 3C represent:

Guest (131): the guest material 131 (phosphorescent compound);
Host (132): the host material 132;
Host (133): the host material 133;
$S_G$: an S1 level of the guest material 131;
$T_G$: a T1 level of the guest material 131;
$S_{H1}$: an S1 level of the host material 132;
$T_{H1}$: a T1 level of the host material 132;
$S_{H2}$: an S1 level of the host material 133;
$T_{H2}$: a T1 level of the host material 133;
$S_{E1}$: an S1 level of the exciplex 136;
$T_{E1}$: a T1 level of the exciplex 136;
$S_{E2}$: an S1 level of the exciplex 138; and
$T_{E2}$: a T1 level of the exciplex 138.

In the light-emitting element of one embodiment of the present invention, the exciplex 136 is formed by the guest material 131 and the host material 132 included in the light-emitting layer 130 and the exciplex 138 is formed by the host material 132 and the host material 133 included in the light-emitting layer 130. The S1 level ($S_{E1}$) of the exciplex 136 and the T1 level ($T_{E1}$) of the exciplex 136 are close to each other (see Route $E_1$ in FIG. 3C). The S1 level ($S_{E2}$) of the exciplex 138 and the T1 level ($T_{E2}$) of the exciplex 138 are close to each other (see Route $E_3$ in FIG. 3C). Specifically, the energy difference between the singlet excitation energy level ($S_{E1}$) and the triplet excitation energy level ($T_{E1}$) of the exciplex 136 is preferably larger than 0 eV and smaller than or equal to 0.2 eV, further preferably larger than 0 eV and smaller than or equal to 0.1 eV, and the energy difference between the singlet excitation energy level ($S_{E2}$) and the triplet excitation energy level ($T_{E2}$) of the exciplex 138 is preferably larger than 0 eV and smaller than or equal to 0.2 eV, further preferably larger than 0 eV and smaller than or equal to 0.1 eV.

Because the excitation energy levels ($S_{E1}$ and $T_{E1}$) of the exciplex 136 are lower than the S1 levels ($S_G$ and $S_{H1}$) of the substances (the guest material 131 and the host material 132) that form the exciplex 136 and the excitation energy levels ($S_{E2}$ and $T_{E2}$) of the exciplex 138 are lower than the S1 levels ($S_{H1}$ and $S_{H2}$) of the substances (the host material 132 and the host material 133) that form the exciplex 138, the excited state can be formed with lower excitation energy. Accordingly, the driving voltage of the light-emitting element 150 can be reduced.

Both the singlet excitation energy and the triplet excitation energy of the exciplex 136 are transferred from the S1 level ($S_{E1}$) and the T1 level ($T_{E1}$) of the exciplex 136 to the T1 level ($T_G$) of the guest material 131 (phosphorescent compound) and both the singlet excitation energy and the triplet excitation energy of the exciplex 138 are transferred from the S1 level ($S_{E2}$) and the T1 level ($T_{E2}$) of the exciplex 138 to the T1 level ($T_G$) of the guest material 131 (phosphorescent compound), so that light emission can be obtained from the guest material 131 (see Route $E_2$ and Route $E_4$ in FIG. 3C).

The T1 level ($T_{H1}$) of the host material 132 and the T1 level ($T_{H2}$) of the host material 133 are preferably higher than or equal to the T1 level ($T_{E2}$) of the exciplex 138 formed by the host material 132 and the host material 133. Furthermore, the T1 level ($T_{E2}$) of the exciplex 138 formed by the host material 132 and the host material 133 is preferably higher than or equal to the T1 level ($T_G$) of the guest material 131. In that case, the excitation energy of the exciplex 138 formed by the host material 132 and the host material 133 is less likely to be quenched by the host material 132 and the host material 133, so that excitation energy can be transferred efficiently from the exciplex 138 to the guest material 131. Additionally, since quenching of the excitation energy of the guest material 131 is also less likely to occur, efficient light emission from the guest material 131 can be obtained. Note that in one embodiment of the present invention, reverse intersystem crossing from the triplet excitation energy of the exciplex 138 to the singlet excitation energy of the exciplex 138 is not needed and the luminescence quantum yield from the singlet excitation energy level ($S_{E2}$) is not necessarily high; thus, materials can be selected from a wide range of options.

Note that when the direct carrier recombination process becomes dominant in the guest material 131, a process for forming the exciplex 136 by the guest material 131 and the host material 132 and a process for forming the exciplex 138 by the host material 132 and the host material 133 are less likely to occur, and the driving voltage of the light-emitting element 150 is increased. Thus, the guest material 131 preferably emits light through an energy transfer process (Route $E_1$ to Route $E_4$ in FIG. 3C) after the formation process of the exciplex 136 and the exciplex 138. In order to achieve this, the weight ratio of the guest material 131 to the total amount of the host material 132 and the host material 133 is preferably low, specifically, preferably greater than or equal to 0.01 and less than or equal to 0.5, further preferably greater than or equal to 0.05 and less than or equal to 0.3.

Note that a structure may be used in which the guest material 131 has an electron-transport property and the host material 132 has a hole-transport property. In that case, the HOMO level of the host material 132 is preferably higher than or equal to the HOMO level of the guest material 131 and the HOMO level of the host material 133, and the LUMO level of the guest material 131 is preferably lower than or equal to the LUMO level of the host material 132 and the LUMO level of the host material 133, as shown in the energy band diagram in FIG. 4B. In this case, the HOMO level of the host material 133 may be higher or lower than the HOMO level of the guest material 131.

The HOMO level of the host material 133 is preferably lower than or equal to the HOMO level of the host material 132, and the LUMO level of the host material 133 is preferably lower than or equal to the LUMO level of the host material 132. Specifically, the energy difference between the HOMO level of the host material 132 and the HOMO level of the host material 133 is preferably 0.1 eV or more, further preferably 0.2 eV or more, or still further preferably 0.3 eV or more. Furthermore, the energy difference between the LUMO level of the host material 132 and the LUMO level of the host material 133 is preferably 0.1 eV or more, further preferably 0.2 eV or more, or still further preferably 0.3 eV or more. In this case, the LUMO level of the host material 133 is preferably higher than or equal to the LUMO level of the guest material 131. In order that the exciplex 136 is formed by the guest material 131 and the host material 132 and the exciplex 138 is formed by the host material 132 and the host material 133, the energy difference between the LUMO level of the guest material 131 and the LUMO level of the host material 133 is preferably larger than 0 eV and smaller than or equal to 0.3 eV, further preferably larger than 0 eV and smaller than or equal to 0.2 eV, still further preferably larger than 0 eV and smaller than or equal to 0.1 eV.

Note that in FIGS. 3B and 3C, portions having functions similar to those of portions in FIGS. 2B and 2C are denoted by the same reference numerals, and a detailed description of the portions is omitted in some cases. In that case, the above description can be referred to.

<Material>

Next, components of a light-emitting element of one embodiment of the present invention are described below in detail.

<<Light-Emitting Layer>>

Materials that can be used for the light-emitting layer 130 are described below.

Although there is no particular limitation on the material of the host material 132 as long as the combination of the guest material 131 and the host material 132 can form an exciplex, it is preferable that one of the guest material 131 and the host material 132 have a function of transporting electrons and the other have a function of transporting holes.

When the host material 132 has a function of transporting holes, the host material 132 preferably includes at least one of a π-electron rich heteroaromatic skeleton and an aromatic amine skeleton.

As the π-electron rich heteroaromatic skeleton included in the host material 132, one or more of a furan skeleton, a thiophene skeleton, and a pyrrole skeleton are preferable because of their high stability and reliability. As a furan skeleton, a dibenzofuran skeleton is preferable. As a thiophene skeleton, a dibenzothiophene skeleton is preferable. Note that as a pyrrole skeleton, an indole skeleton, a carbazole skeleton, or a 3-(9-phenyl-9H-carbazol-3-yl)-9H-carbazole skeleton is preferable. Each of these skeletons may further have a substituent.

As the aromatic amine skeleton included in the host material 132, tertiary amine not including an NH bond, in particular, a triarylamine skeleton is preferably used. As an aryl group of a triarylamine skeleton, a substituted or unsubstituted aryl group having 6 to 13 carbon atoms included in a ring is preferably used and examples thereof include a phenyl group, a naphthyl group, a fluorenyl group, a phenanthrenyl group, a triphenylenyl group, and the like.

A structure including a π-electron rich heteroaromatic skeleton and an aromatic amine skeleton, which has an excellent hole-transport property and thus is stable and highly reliable, is particularly preferred. An example of such a structure is a structure including a carbazole skeleton and an arylamine skeleton.

As examples of the above-described π-electron rich heteroaromatic skeleton and aromatic amine skeleton, skeletons represented by the following General Formulae (101) to (117) are given. Note that X in the General Formulae (115) to (117) represents an oxygen atom or a sulfur atom.

[Chemical Formula 1]

(101)

(102)

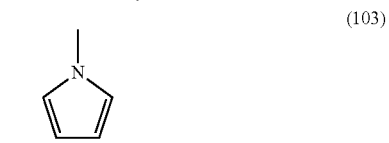

(103)

(104) 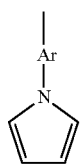

(105) 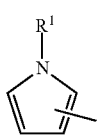

(106) 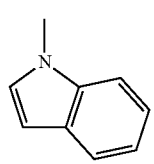

(107) 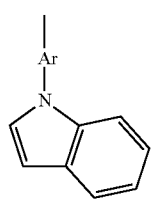

(108) 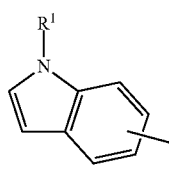

(109) 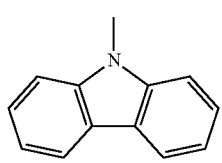

(110) 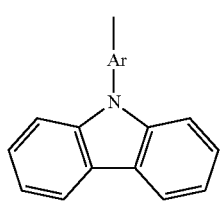

(111) 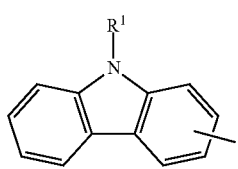

(112) 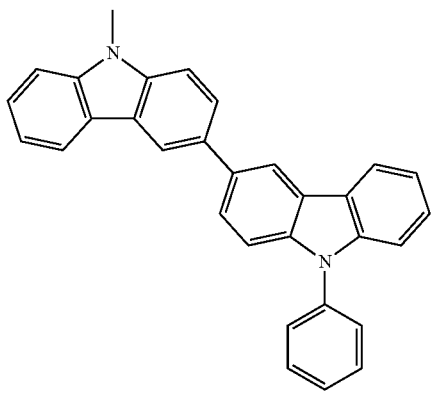

(113) 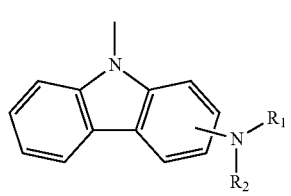

(114) 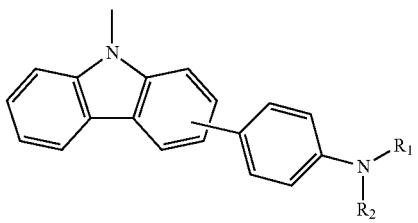

(115) 

(116) 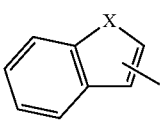

(117) 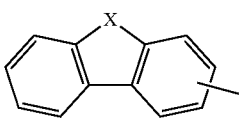

Furthermore, when the host material 132 has a function of transporting electrons, the host material 132 preferably includes a π-electron deficient heteroaromatic skeleton. As the π-electron deficient heteroaromatic skeleton, a pyridine skeleton, a diazine skeleton (a pyrimidine skeleton, a pyrazine skeleton, or a pyridazine skeleton), or a triazine skeleton is preferable; in particular, the diazine skeleton or the triazine skeleton is preferable because of its high stability and reliability.

As examples of the above-described π-electron deficient heteroaromatic skeleton, skeletons represented by the following General Formulae (201) to (218) are given. Note that X in the General Formulae (209) to (211) represents an oxygen atom or a sulfur atom.

[Chemical Formula 2]
(201) 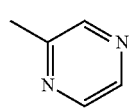
(202) 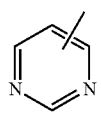
(203) 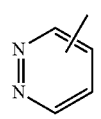
(204) 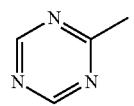
(205) 
(206) 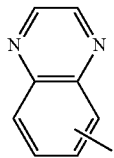
(207) 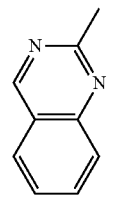
(208) 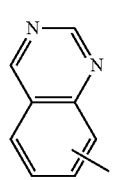
(209) 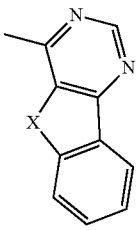
(210) 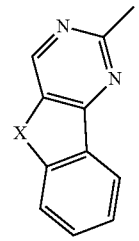
(211) 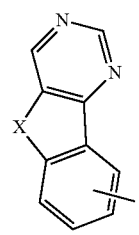
(212) 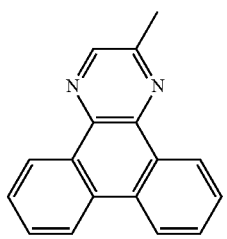
(213) 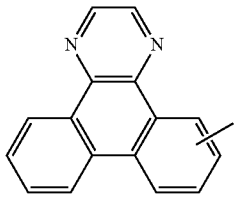
(214) 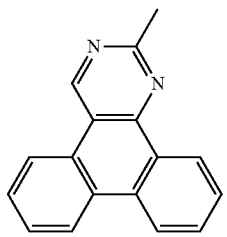
(215) 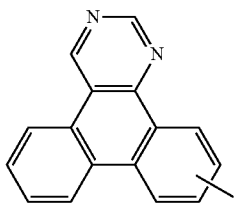
(216) 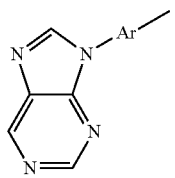

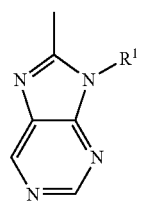 (217)

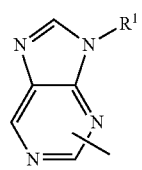 (218)

Alternatively, a compound may be used in which a skeleton having a hole-transport property (e.g., at least one of a π-electron rich heteroaromatic skeleton and an aromatic amine skeleton) and a skeleton having an electron-transport property (e.g., a π-electron deficient heteroaromatic skeleton) are bonded to each other directly or through an arylene group. Note that examples of the arylene group include a phenylene group, a biphenyldiyl group, a naphthalenediyl group, a fluorenediyl group, and the like.

As examples of a bonding group which bonds the above skeleton having a hole-transport property and the above skeleton having an electron-transport property, skeletons represented by the following General Formulae (301) to (315) are given.

[Chemical Formula 3]

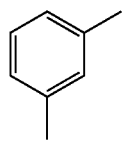 (301)

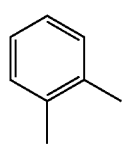 (302)

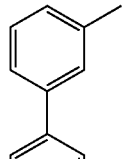 (303)

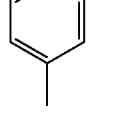 (304)

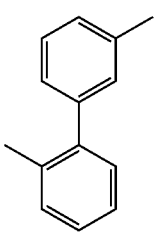 (305)

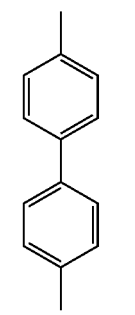 (306)

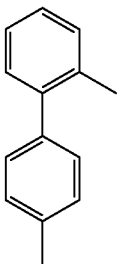 (307)

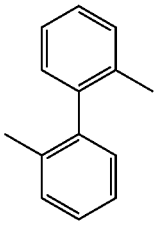 (308)

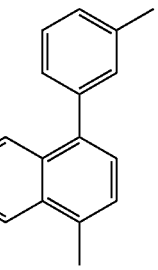 (309)

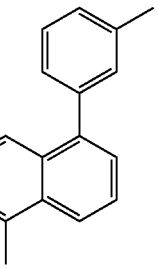 (310)

-continued

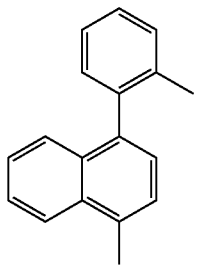
(311)

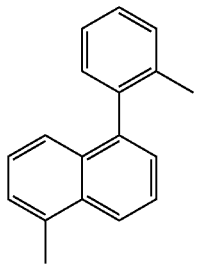
(312)

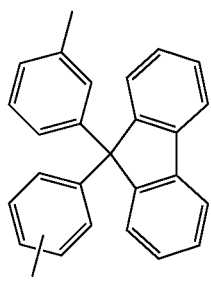
(313)

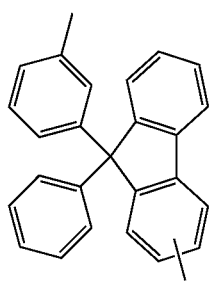
(314)

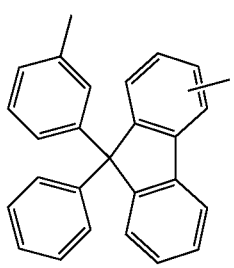
(315)

The above aromatic amine skeleton (e.g., the triarylamine skeleton), the above π-electron rich heteroaromatic ring skeleton (e.g., a ring including the furan skeleton, the thiophene skeleton, or the pyrrole skeleton), and the above π-electron deficient heteroaromatic ring skeleton (e.g., a ring including the diazine skeleton or the triazine skeleton) or the above general formulae (101) to (115), (201) to (218), and (301) to (315) may each have a substituent. As the substituent, an alkyl group having 1 to 6 carbon atoms, a cycloalkyl group having 3 to 6 carbon atoms, or a substituted or unsubstituted aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a substituted or unsubstituted phenyl group, a substituted or unsubstituted naphthyl group, a substituted or unsubstituted biphenyl group, and the like. The above substituents may be bonded to each other to form a ring. For example, in the case where a carbon atom at the 9-position in a fluorene skeleton has two phenyl groups as substituents, the phenyl groups are bonded to form a spirofluorene skeleton. Note that an unsubstituted group has an advantage in easy synthesis and an inexpensive raw material.

Furthermore, Ar represents a single-bond arylene group or an arylene group having 6 to 13 carbon atoms. The arylene group may include one or more substituents and the substituents may be bonded to each other to form a ring. For example, a carbon atom at the 9-position in a fluorenyl group has two phenyl groups as substituents and the phenyl groups are bonded to form a spirofluorene skeleton. Specific examples of the arylene group having 6 to 13 carbon atoms are a phenylene group, a naphthalenediyl group, a biphenyldiyl group, a fluorenediyl group, and the like. In the case where the arylene group has a substituent, as the substituent, an alkyl group having 1 to 6 carbon atoms, a cycloalkyl group having 3 to 6 carbon atoms, or an aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like.

As the arylene group represented by Ar, for example, groups represented by structural formulae (Ar-1) to (Ar-18) below can be used. Note that the group that can be used as Ar is not limited to these.

[Chemical Formula 4]

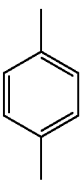
(Ar-1)

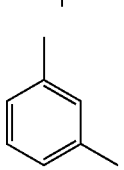
(Ar-2)

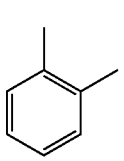
(Ar-3)

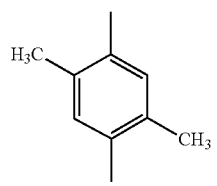 (Ar-4)
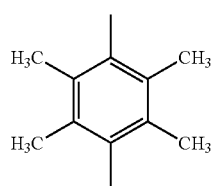 (Ar-5)
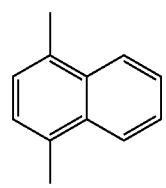 (Ar-6)
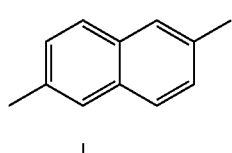 (Ar-7)
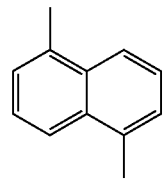 (Ar-8)
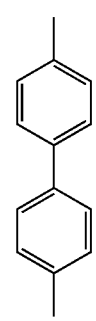 (Ar-9)
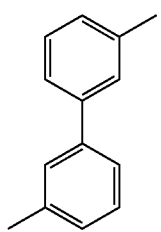 (Ar-10)
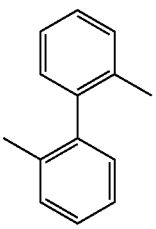 (Ar-11)
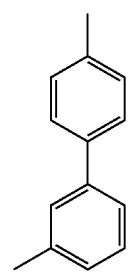 (Ar-12)
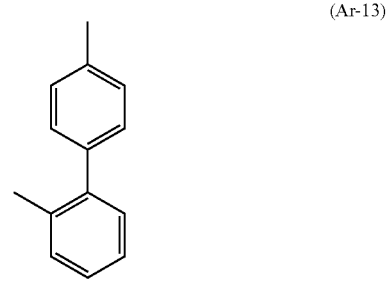 (Ar-13)
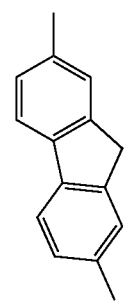 (Ar-14)
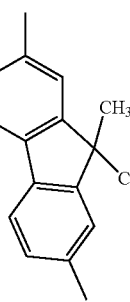 (Ar-15)

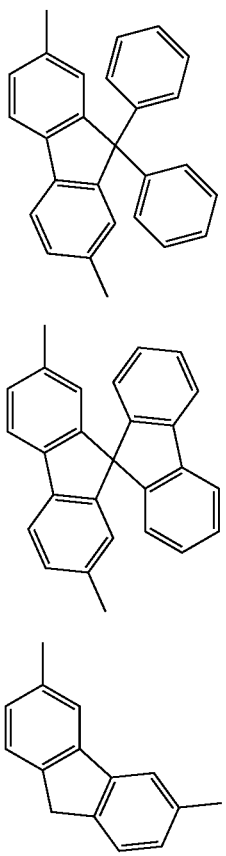

(Ar-16)

(Ar-17)

(Ar-18)

Furthermore, $R^1$ and $R^2$ each independently represent any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms are a phenyl group, a naphthyl group, a biphenyl group, a fluorenyl group, and the like. The above aryl group or phenyl group may include substituents, and the substituents may be bonded to each other to form a ring. As the substituent, an alkyl group having 1 to 6 carbon atoms, a cycloalkyl group having 3 to 6 carbon atoms, or an aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms include a phenyl group, a naphthyl group, a biphenyl group, and the like.

For example, groups represented by Structural Formulae (R-1) to (R-29) below can be used as the alkyl group or aryl group represented by $R^1$ and $R^2$. Note that the group which can be used as an alkyl group or an aryl group is not limited thereto.

[Chemical Formula 5]

(R-1)

(R-2)

(R-3)

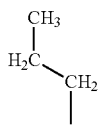

(R-4)

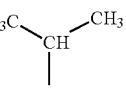

(R-5)

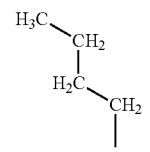

(R-6)

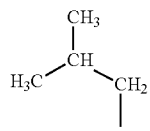

(R-7)

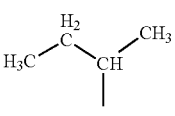

(R-8)

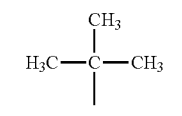

(R-9)

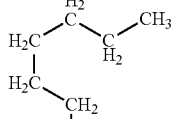

(R-10)

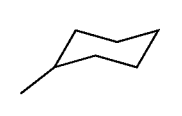

(R-11)

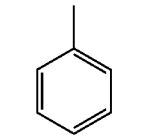

(R-12)

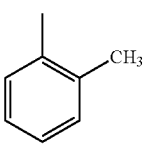

(R-13)

(R-14) 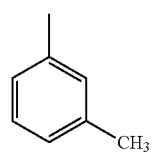
(R-15) 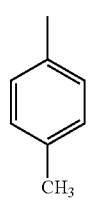
(R-16) 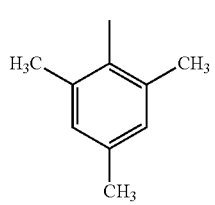
(R-17) 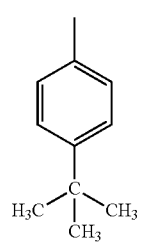
(R-18) 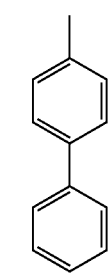
(R-19) 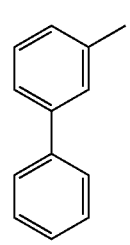
(R-20) 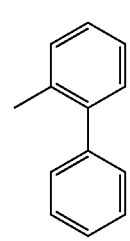
(R-21) 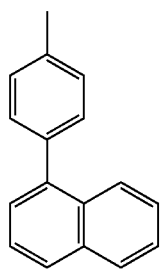
(R-22) 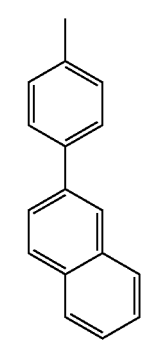
(R-23) 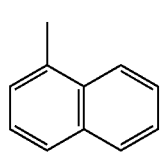
(R-24) 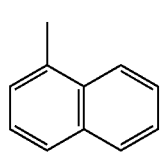
(R-25) 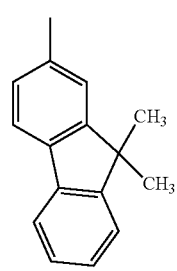
(R-26) 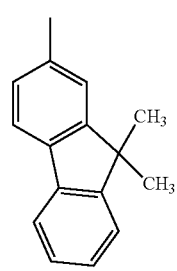

-continued (R-27)
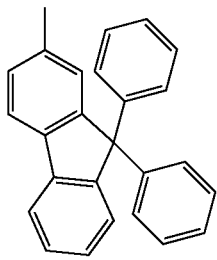

(R-28)
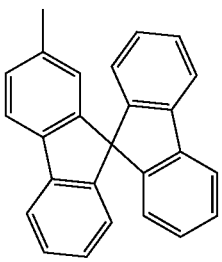

(R-29)
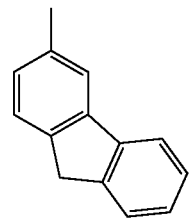

As a substituent that can be included in the General Formulae (101) to (117), (201) to (218), and (301) to (315), Ar, $R^1$, and $R^2$, the alkyl group or aryl group represented by the above Structural Formulae (R-1) to (R-24) can be used, for example. Note that the group which can be used as an alkyl group or an aryl group is not limited thereto.

As the host material 132, any of the following hole-transport materials and electron-transport materials can be used, for example.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, or the like can be used. Furthermore, the hole-transport material may be a high molecular compound.

Examples of the material having a high hole-transport property are aromatic amine compounds such as N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{(4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 1,4-bis[4-(N-carbazolyl)phenyl]-2,3,5,6-tetraphenylbenzene, and the like.

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: m-MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen- 4-yl)-benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances listed here are mainly ones that have a hole mobility of $1 \times 10^{-6}$ cm$^2$/Vs or higher. Note that other than these substances, any substance that has a property of transporting more holes than electrons may be used.

A material having a property of transporting more electrons than holes can be used as an electron-transport material, and a material having an electron mobility of $1 \times 10^{-6}$ cm$^2$/Vs or higher is preferable. A π-electron deficient heteroaromatic compound such as a nitrogen-containing heteroaromatic compound, or a zinc- or aluminum-based metal complex can be used as the material which easily accepts electrons (the material having an electron-transport property). Examples of the metal complex include a metal complex having a quinoline ligand, a benzoquinoline ligand, an oxazole ligand, and a thiazole ligand. Furthermore, an oxadiazole derivative, a triazole derivative, a phenanthroline derivative, a pyridine derivative, a bipyridine derivative, a pyrimidine derivative, a triazine derivative, and the like can be given as the π-electron deficient heteroaromatic compound.

Examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq) and bis(8-quinolinolato)zinc(II) (abbreviation: Znq), and the like. Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), bathocuproine (abbreviation: BCP), and 2,9-bis(naphthalen-2-yl)-4,7-diphenyl-1,10-phenanthroline (abbreviation: NBPhen); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl]pyridine (abbreviation: 35DCzPPy) and 1,3,5-tri[3-(3-pyridyl)-phenyl]benzene (abbreviation: TmPyPB); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances listed here are mainly ones that have an electron mobility of $1 \times 10^{-6}$ cm$^2$/Vs or higher. However, any substance other than the above-described substances may be used as long as it is a substance whose electron-transport property is higher than the hole-transport property.

<<Specific Example of Pyrimidine Derivative>>

As examples of the pyrimidine derivative, compounds represented by Structural Formulae (500) to (502) can be given. The compounds represented by Structural Formulae (500) to (502) can be favorably used for the host material 132 used in the light-emitting element of one embodiment of the present invention. Note that the pyrimidine derivative is not limited to the following examples.

[Chemical Formula 6]

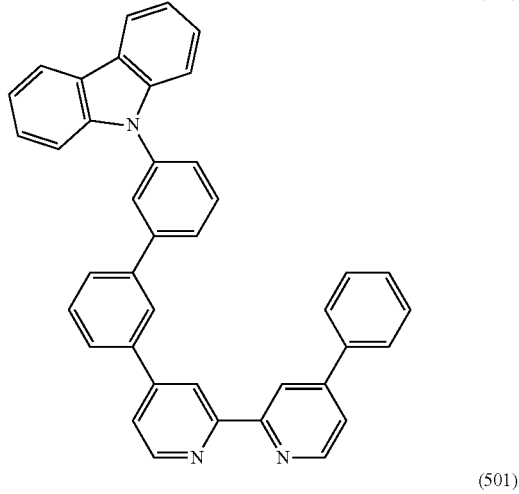

(500)

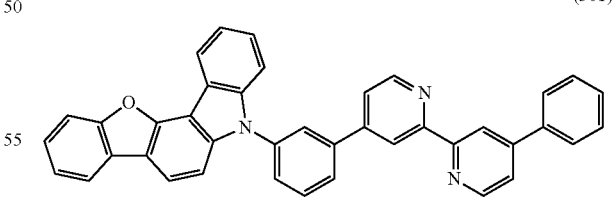

(501)

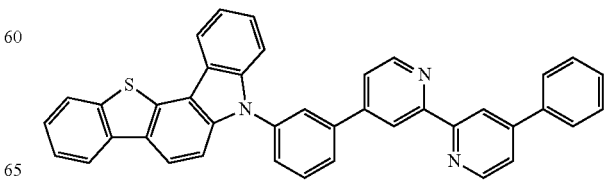

(502)

The guest material 131 preferably has a function of converting triplet excitation energy into light emission. In the case where the guest material 131 includes a heavy metal, intersystem crossing between a singlet state and a triplet state is promoted by spin-orbit interaction (interaction between spin angular momentum and orbital angular momentum of an electron), and transition between a singlet ground state and a triplet excited state of the guest material 131 is allowed. Therefore, the emission efficiency and the absorption probability which relate to the transition between the singlet ground state and the triplet excited state of the guest material 131 can be increased. Accordingly, the guest material 131 preferably includes a metal element with large spin-orbit interaction, specifically a platinum group element (ruthenium (Ru), rhodium (Rh), palladium (Pd), osmium (Os), iridium (Ir), or platinum (Pt)). In particular, iridium is preferred because the transition probability that relates to direct transition between a singlet ground state and a triplet excited state can be increased.

As the guest material 131 (phosphorescent compound), an iridium-, rhodium-, or platinum-based organometallic complex or metal complex can be used. Furthermore, a platinum complex having a porphyrin ligand, an organoiridium complex, and the like can be given; specifically, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. In this case, the guest material 131 (phosphorescent compound) has an absorption band based on triplet metal to ligand charge transfer (MLCT) transition.

Furthermore, the combination of the guest material 131 (phosphorescent compound) and the host material 132 preferably forms an exciplex. With this structure, a light-emitting element with high emission efficiency and low driving voltage can be provided.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN²]phenyl-κC}iridium(III) (abbreviation: Ir(mpptz-dmp)₃), tris(5-methyl-3,4-diphenyl-4H-1,2,4-triazolato)iridium(III) (abbreviation: Ir(Mptz)₃), tris[4-(3-biphenyl)-5-isopropyl-3-phenyl-4H-1,2,4-triazolato]iridium(III) (abbreviation: Ir(iPrptz-3b)₃), and tris[3-(5-biphenyl)-5-isopropyl-4-phenyl-4H-1,2,4-triazolato]iridium(III) (abbreviation: Ir(iPr5btz)₃); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)₃) and tris(1-methyl-5-phenyl-3-propyl-1H-1,2,4-triazolato)iridium(III) (abbreviation: Ir(Prptz1-Me)₃); organometallic iridium complexes having an imidazole skeleton, such as fac-tris[1-(2,6-diisopropylphenyl)-2-phenyl-1H-imidazole]iridium(III) (abbreviation: Ir(iPrpmi)₃) and tris[3-(2,6-dimethylphenyl)-7-methylimidazo[1,2-J]phenanthridinato]iridium(III) (abbreviation: Ir(dmpimpt-Me)₃); and organometallic iridium complexes in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²'}iridium(III) picolinate (abbreviation: Ir(CF₃ppy)₂(pic)), and bis[2-(4',6'-difluorophenyl)pyridinato-N,C²']iridium(III) acetylacetonate (abbreviation: FIr(acac)). Among the materials given above, the organic metal iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)₃), tris(4-t-butyl-6-phenylpyrimidinato)iridium(III) (abbreviation: Ir(tBuppm)₃), (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetylacetonato)bis[4-(2-norbornyl)-6-phenylpyrimidinato]iridium(III) (abbreviation: Ir(nbppm)₂(acac)), (acetylacetonato)bis[5-methyl-6-(2-methylphenyl)-4-phenylpyrimidinato]iridium(III) (abbreviation: Ir(mpmppm)₂(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)₂(acac)), (acetylacetonato)bis(4,6-diphenylpyrimidinato)iridium(III) (abbreviation: Ir(dppm)₂(acac)); organometallic iridium complexes having a pyrazine skeleton, such as (acetylacetonato)bis(3,5-dimethyl-2-phenylpyrazinato)iridium(III) (abbreviation: Ir(mppr-Me)₂(acac)) and (acetylacetonato)bis(5-isopropyl-3-methyl-2-phenylpyrazinato)iridium(III) (abbreviation: Ir(mppr-iPr)₂(acac)); organometallic iridium complexes having a pyridine skeleton, such as tris(2-phenylpyridinato-N,C²')iridium(III) (abbreviation: Ir(ppy)₃), bis(2-phenylpyridinato-N,C²')iridium(III) acetylacetonate (abbreviation: Ir(ppy)₂(acac)), bis(benzo[h]quinolinato)iridium(III) acetylacetonate (abbreviation: Ir(bzq)₂(acac)), tris(benzo[h]quinolinato)iridium(III) (abbreviation: Ir(bzq)₃), tris(2-phenylquinolinato-N,C²')iridium(III) (abbreviation: Ir(pq)₃), and bis(2-phenylquinolinato-N,C²')iridium(III) acetylacetonate (abbreviation: Ir(pq)₂(acac)); organometallic iridium complexes such as bis(2,4-diphenyl-1,3-oxazolato-N,C²')iridium(III) acetylacetonate (abbreviation: Ir(dpo)₂(acac)), bis{2-[4'-(perfluorophenyl)phenyl]pyridinato-N, C²'}iridium(III) acetylacetonate (abbreviation: Ir(p-PF-ph)₂(acac)), and bis(2-phenylbenzothiazolato-N,C²')iridium(III) acetylacetonate (abbreviation: Ir(bt)₂(acac)); and a rare earth metal complex such as tris(acetylacetonato) (monophenanthroline)terbium(III) (abbreviation: Tb(acac)₃(Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)₂(dibm)), bis[4,6-bis(3-methylphenyl)pyrimidinato](dipivaloylmethanato)iridium(III) (abbreviation: Ir(5mdppm)₂(dpm)), and (dipivaloylmethanato)bis[4,6-di(naphthalen-1-yl)pyrimidinato]iridium(III) (abbreviation: Ir(d1npm)₂(dpm)); organometallic iridium complexes having a pyrazine skeleton, such as (acetylacetonato)bis(2,3,5-triphenylpyrazinato)iridium(III) (abbreviation: Ir(tppr)₂(acac)), bis(2,3,5-triphenylpyrazinato)(dipivaloylmethanato)iridium(III) (abbreviation: Ir(tppr)₂(dpm)), and (acetylacetonato)bis[2,3-bis(4-fluorophenyl)quinoxalinato]iridium(III) (abbreviation: Ir(Fdpq)₂(acac)); organometallic iridium complexes having a pyridine skeleton, such as tris(1-phenylisoquinolinato-N, $C^{2'}$)iridium(III) (abbreviation: Ir(piq)$_3$) and bis(1-phenylisoquinolinato-N,$C^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato] (monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Furthermore, the organometallic iridium complexes having a pyrazine skeleton can provide red light emission with favorable chromaticity.

The above-described organometallic iridium complexes that have a nitrogen-containing five-membered heterocyclic skeleton such as a 4H-triazole skeleton, a 1H-triazole skeleton, and an imidazole skeleton and the above-described iridium complexes that have a pyridine skeleton have ligands with a low electron-accepting property and easily have a high HOMO level; therefore, those complexes are suitable for one embodiment of the present invention.

Among the above organometallic iridium complexes that have a nitrogen-containing five-membered heterocyclic skeleton, at least the iridium complexes that have a substituent including a cyano group can be suitably used for the light-emitting element of one embodiment of the present invention because they have appropriately lowered LUMO and HOMO levels owing to a high electron-withdrawing property of the cyano group. Furthermore, since the iridium complex has a high triplet excitation energy level, a light-emitting element including the iridium complex can emit blue light with high emission efficiency. Since the iridium complex is highly resistant to repetition of oxidation and reduction, a light-emitting element including the iridium complex can have a long driving lifetime.

Note that the iridium complex preferably includes a ligand in which an aryl group including a cyano group is bonded to the nitrogen-containing five-membered heterocyclic skeleton, and the number of carbon atoms of the aryl group is preferably 6 to 13 in terms of stability and reliability of the element characteristics. In that case, the iridium complex can be vacuum-evaporated at a relatively low temperature, and accordingly is unlikely to deteriorate due to pyrolysis or the like at evaporation.

The iridium complex including a ligand in which a cyano group is bonded to a nitrogen atom of a nitrogen-containing five-membered heterocyclic skeleton through an arylene group can keep high triplet excitation energy level, and thus can be preferably used in a light-emitting element emitting high-energy light such as blue light. The light-emitting element including the iridium complex including a ligand to which a cyano group is bonded can emit high-energy light such as blue light with high emission efficiency as compared with a light-emitting element that does not include a cyano group. Moreover, by bonding a cyano group to a particular site as described above, a highly reliable light-emitting element emitting high-energy light such as blue light can be obtained. Note that it is preferable that the nitrogen-containing five-membered heterocyclic skeleton and the cyano group be bonded through an arylene group such as a phenylene group.

When the number of carbon atoms of the arylene group is 6 to 13, the iridium complex is a compound with a relatively low molecular weight and accordingly suitable for vacuum evaporation (capable of being vacuum-evaporated at a relatively low temperature). In general, a lower molecular weight compound tends to have lower heat resistance after film formation. However, even with a low molecular weight of a ligand, the iridium complex has an advantage in that sufficient heat resistance can be ensured because the iridium complex includes a plurality of ligands.

That is, the iridium complex has a feature of a high triplet excitation energy level, in addition to the ease of evaporation and electrochemical stability. Therefore, it is preferable to use the iridium complex as a guest material in a light-emitting layer in a light-emitting element of one embodiment of the present invention, particularly in a blue light-emitting element.

<<Example of Iridium Complex>>

This iridium complex is represented by General Formula (G1).

[Chemical Formula 7]

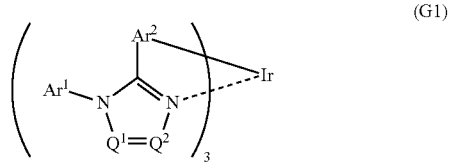

(G1)

In General Formula (G1), each of $Ar^1$ and $Ar^2$ independently represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of the aryl groups represented by $Ar^1$ and $Ar^2$ and the aryl group represented by R includes a cyano group.

An iridium complex that can be favorably used for a light-emitting element of one embodiment of the present invention is preferably an ortho-metalated complex. This iridium complex is represented by General Formula (G2).

[Chemical Formula 8]

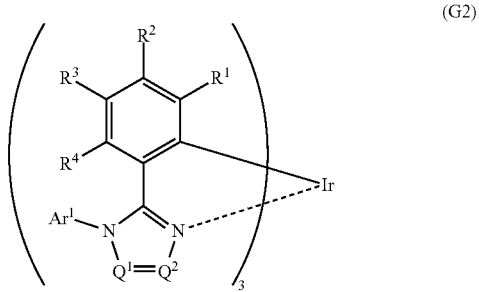

(G2)

In General Formula (G2), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^4$ and R includes a cyano group.

An iridium complex that can be favorably used for a light-emitting element of one embodiment of the present invention includes a 4H-triazole skeleton as a ligand, which is preferable because the iridium complex can have a high triplet excitation energy level and can be suitably used in a light-emitting element emitting high-energy light such as blue light. This iridium complex is represented by General Formula (G3).

[Chemical Formula 9]

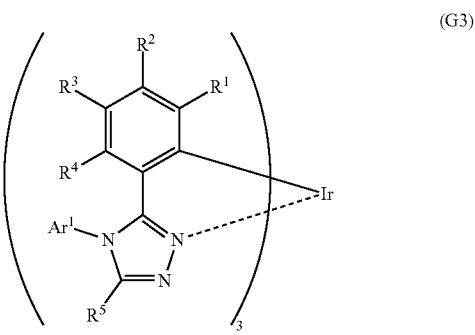

(G3)

In General Formula (G3), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^5$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^5$ includes a cyano group.

An iridium complex that can be favorably used for a light-emitting element of one embodiment of the present invention includes an imidazole skeleton as a ligand, which is preferable because the iridium complex can have a high triplet excitation energy level and can be suitably used in a light-emitting element emitting high-energy light such as blue light. This iridium complex is represented by General Formula (G4).

[Chemical Formula 10]

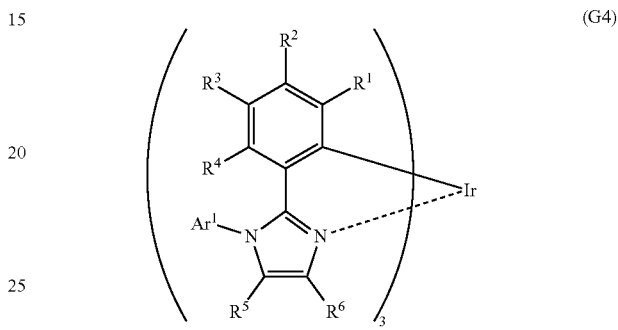

(G4)

In General Formula (G4), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^6$ includes a cyano group.

An iridium complex that can be favorably used for a light-emitting element of one embodiment of the present invention includes a nitrogen-containing five-membered heterocyclic skeleton, and an aryl group bonded to nitrogen of the skeleton is preferably a substituted or unsubstituted phenyl group. In that case, the iridium complex can be vacuum-evaporated at a relatively low temperature and can have a high triplet excitation energy level, and accordingly can be used in a light-emitting element emitting high-energy light such as blue light. The iridium complex is represented by General Formula (G5) or (G6).

[Chemical Formula 11]

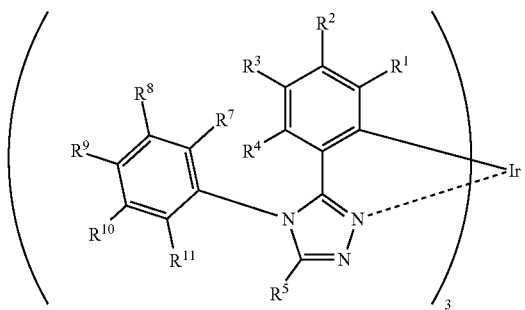

(G5)

In General Formula (G5), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^5$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

[Chemical Formula 12]

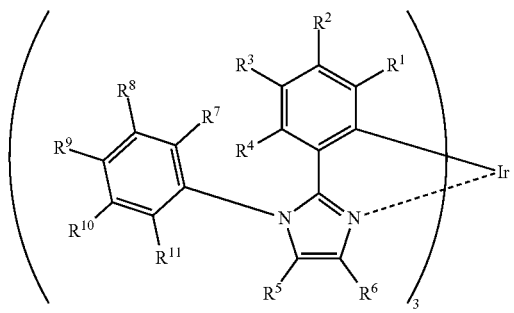

(G6)

In General Formula (G6), each of $R^7$ and $R^1$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

An iridium complex that can be favorably used for a light-emitting element of one embodiment of the present invention includes a 1H-triazole skeleton as a ligand, which is preferable because the iridium complex can have a high triplet excitation energy level and can be suitably used in a light-emitting element emitting high-energy light such as blue light. This iridium complex is represented by General Formula (G7) or (G8).

[Chemical Formula 13]

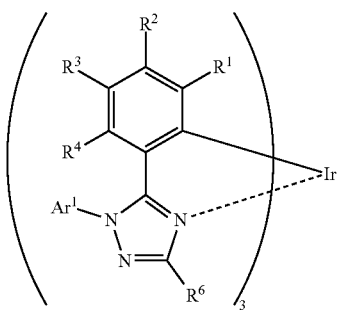

(G7)

In General Formula (G7), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^6$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$, $R^1$ to $R^4$, and $R^6$ includes a cyano group.

[Chemical Formula 14]

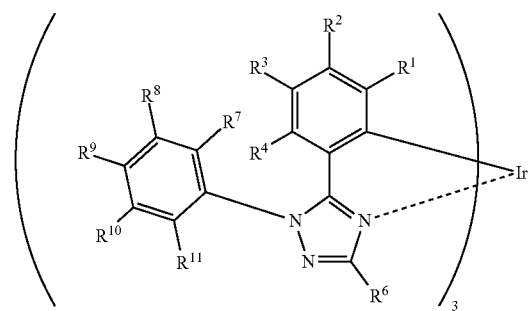

(G8)

In General Formula (G8), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^6$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

As an alkyl group and an aryl group represented by $R^1$ to $R^4$ in General Formulae (G2) to (G8), for example, groups represented by Structural Formulae (R-1) to (R-29) that are described above can be used. Note that groups that can be used as the alkyl group and the aryl group are not limited thereto.

For example, groups represented by Structural Formulae (R-12) to (R-29) can be used as an aryl group represented by $Ar^1$ in General Formulae (G1) to (G4) and (G7) and an aryl group represented by $Ar^2$ in General Formula (G1). Note that groups that can be used as $Ar^1$ and $Ar^2$ are not limited to these groups.

For example, the groups represented by Structural Formulae (R-1) to (R-10) can be used as alkyl groups represented by $R^7$ and $R^{11}$ in General Formulae (G5), (G6), and (G8). Note that groups that can be used as the alkyl group are not limited to these groups.

As the alkyl group or substituted or unsubstituted phenyl group represented by $R^8$ to $R^{10}$ in General Formulae (G5), (G6), and (G8), groups represented by Structure Formulae (R-1) to (R-22) above can be used, for example. Note that groups which can be used as the alkyl group or the phenyl group are not limited thereto.

For example, groups represented by Structural Formulae (R-1) to (R-29) and Structural Formulae (R-30) to (R-37) can be used as an alkyl group, an aryl group, and a haloalkyl group represented by $R^5$ in General Formulae (G3) to (G6) and $R^6$ in General Formulae (G4) and (G6) to (G8). Note that a group that can be used as the alkyl group, the aryl group, or the haloalkyl group is not limited to these groups.

[Chemical Formula 15]

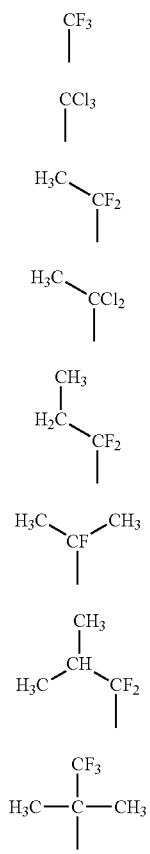

<<Specific Examples of Iridium Complexes>>

Specific examples of structures of the iridium complexes represented by General Formulae (G1) to (G8) are compounds represented by Structural Formulae (300) to (334). Note that the iridium complexes represented by General Formulae (G1) to (G8) are not limited the examples shown below.

[Chemical Formula 16]

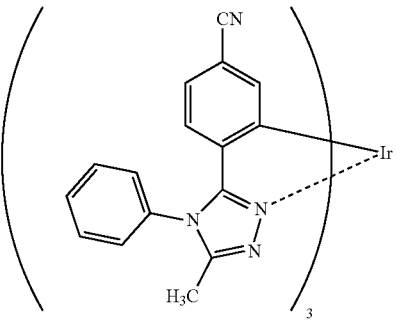

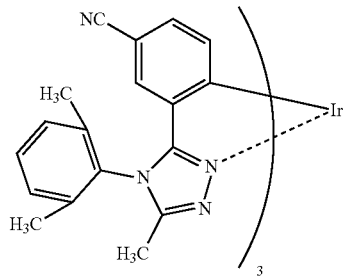

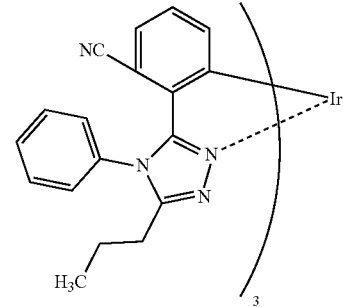

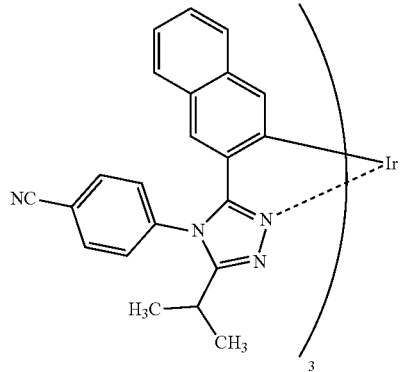

-continued
(304) 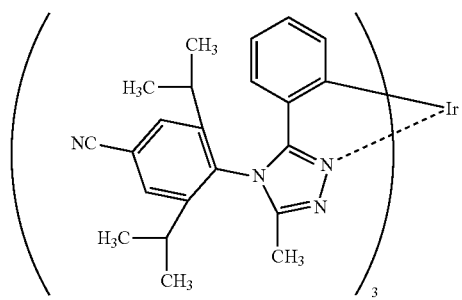
(305) 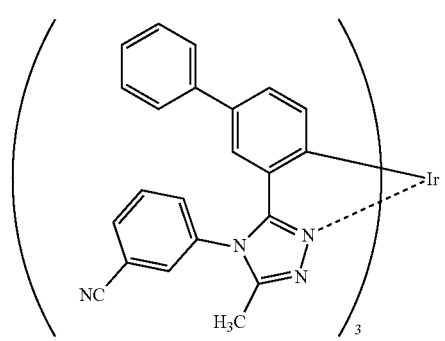
[Chemical Formula 17]
(306) 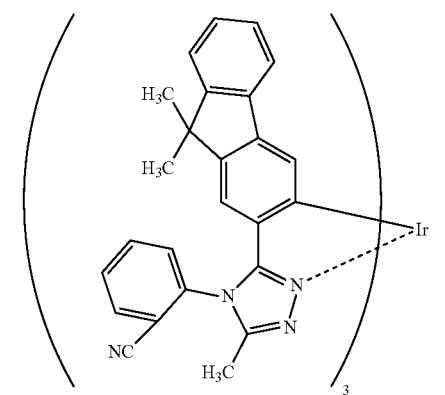
(307) 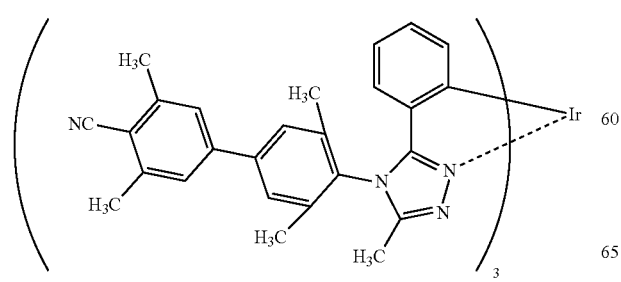
-continued
(308) 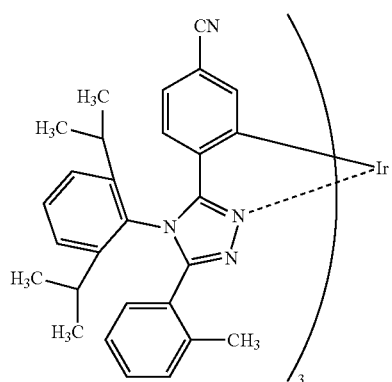
(309) 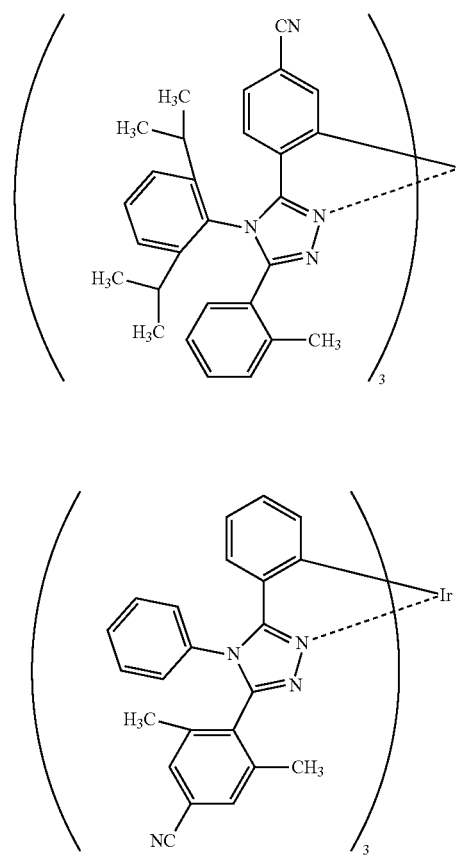
(310) 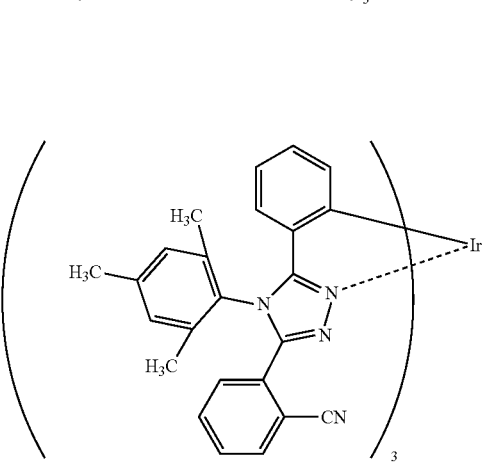
(311) 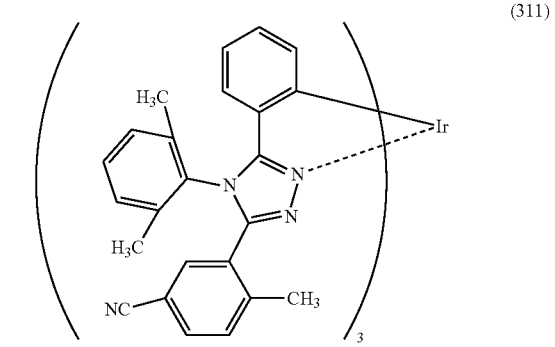

[Chemical Formula 18]
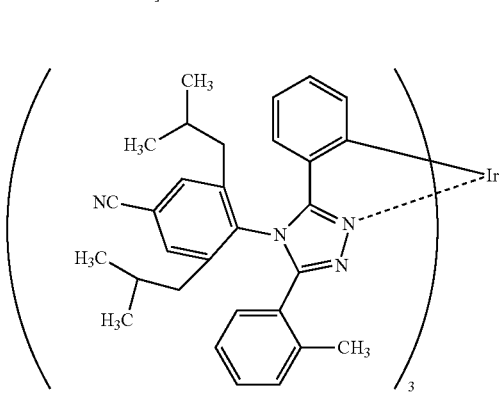 (312)
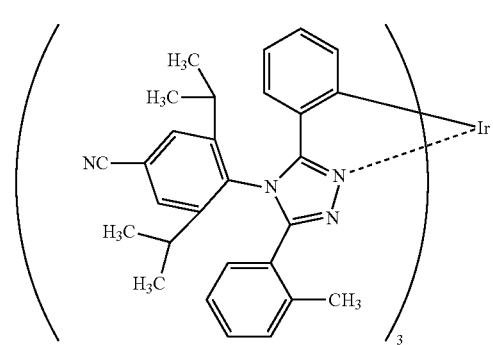 (313)
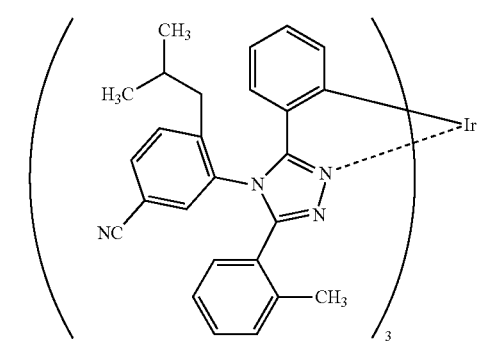 (314)
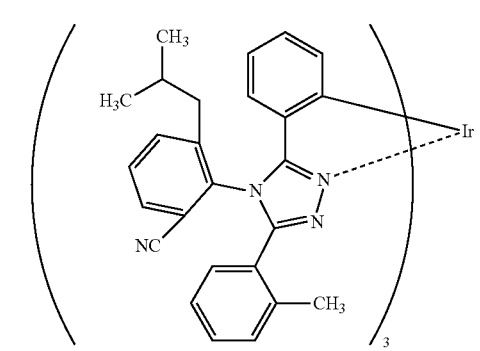 (315)
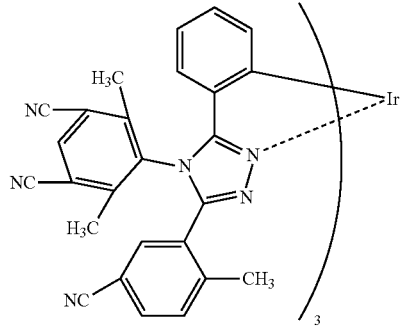 (316)
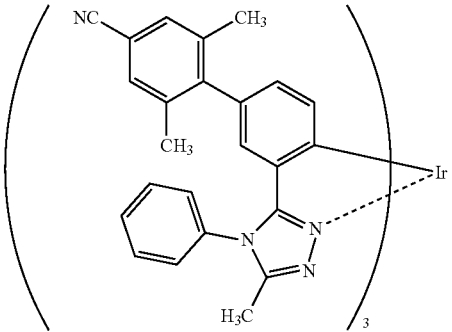 (317)
[Chemical Formula 19]
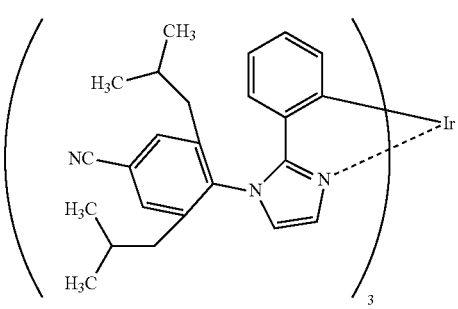 (318)
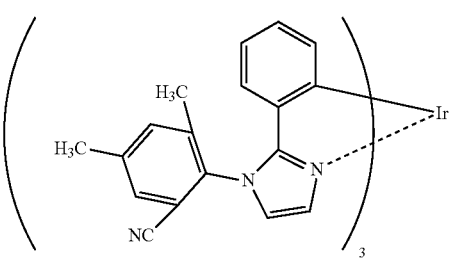 (319)
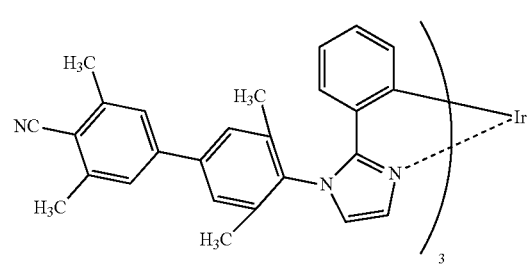 (320)

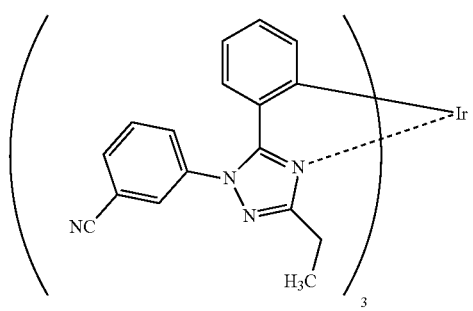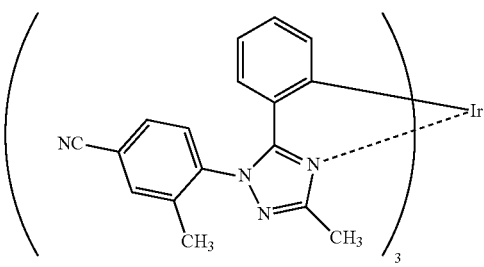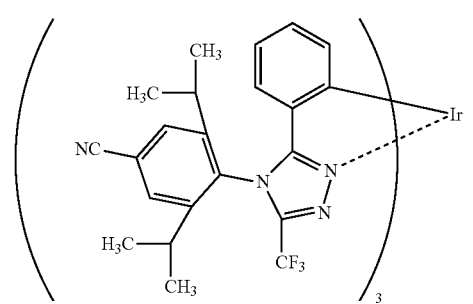
[Chemical Formula 20]
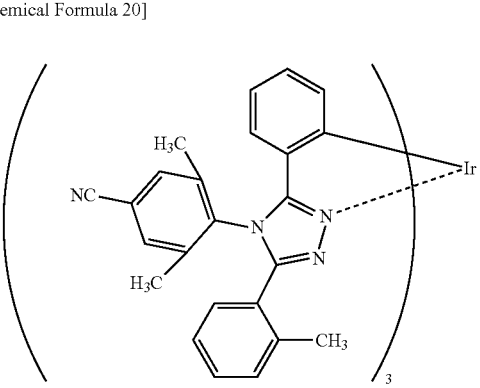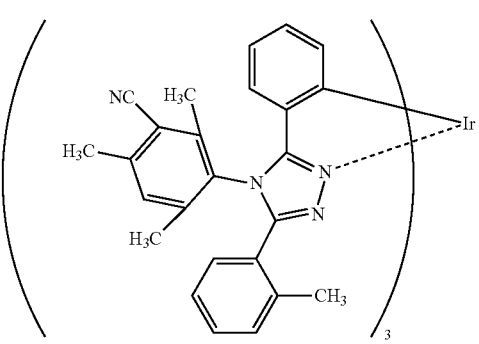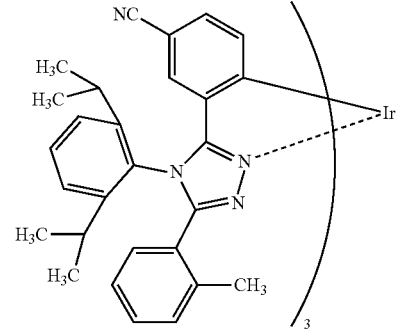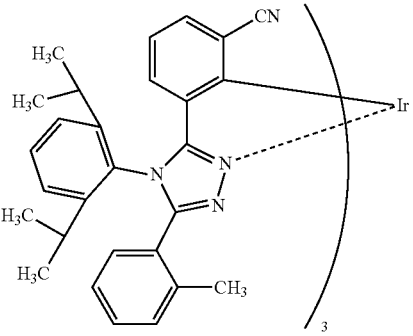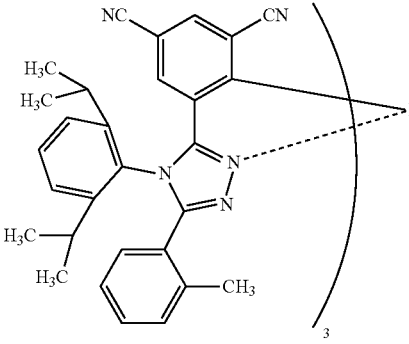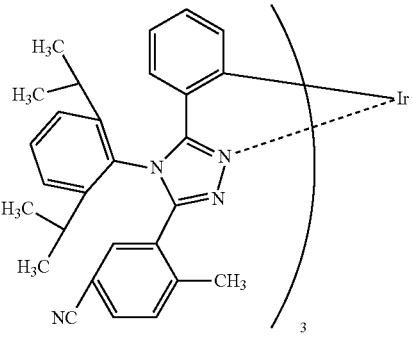

[Chemical Formula 21]

(330)
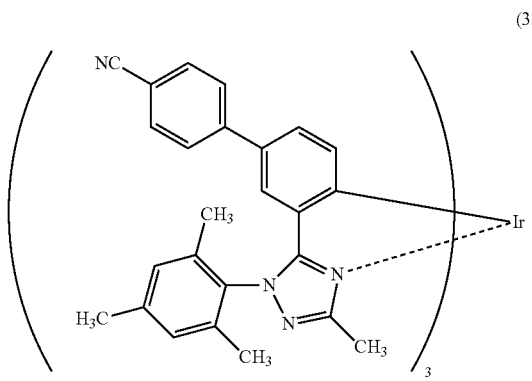

(331)
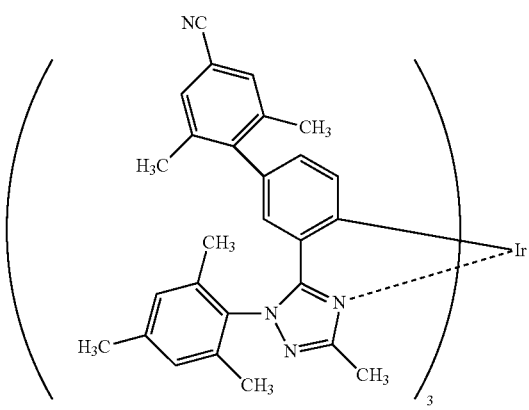

(332)
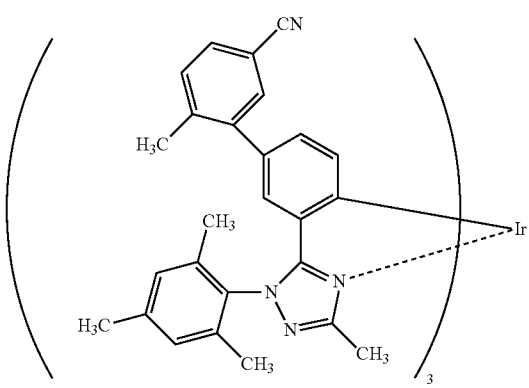

(333)
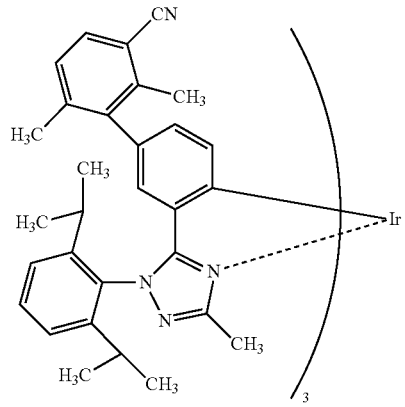

(334)
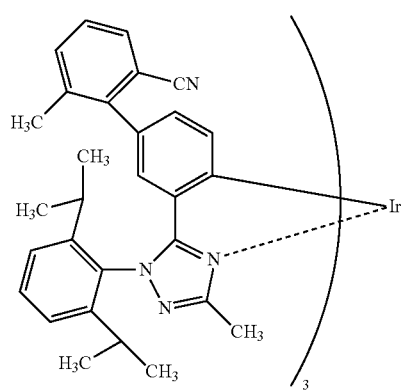

The iridium complex described above as an example has relatively low HOMO and LUMO levels as described above, and is accordingly preferred as a guest material of a light-emitting element of one embodiment of the present invention. In that case, the light-emitting element can have high emission efficiency. In addition, the iridium complex described above as an example has a high triplet excitation energy level, and is accordingly preferred particularly as a guest material of a blue light-emitting element. In that case, the blue light-emitting element can have high emission efficiency. Moreover, since the iridium complex described above as an example is highly resistant to repetition of oxidation and reduction, a light-emitting element including the iridium complex can have a long driving lifetime.

As a material that can be used as the host material 133 in the light-emitting layer 130, a material that can form an exciplex with the host material 132 is preferable. Specifically, at least one of a skeleton having a high donor property, such as a π-electron rich heteroaromatic ring skeleton or an aromatic amine skeleton, and a skeleton having a high acceptor property, such as a π-electron deficient heteroaromatic ring skeleton, is preferably included. Examples of the compound having a π-electron rich heteroaromatic ring skeleton include heteroaromatic compounds such as the above-described dibenzothiophene derivative, dibenzofuran derivative, and carbazole derivative. Examples of the compound having a π-electron deficient heteroaromatic ring skeleton include heteroaromatic compounds such as the above-described pyridine derivative, diazine derivative (pyrimidine derivative, pyrazine derivative, and pyridazine skeleton), and triazine derivative. In that case, it is preferable that the host materials 133 and 132 and the guest material 131 (phosphorescent compound) be selected such that the emission peak of the exciplex formed by the host materials 133 and 132 overlaps with an absorption band, specifically an absorption band on the longest wavelength side, of a triplet metal to ligand charge transfer (MLCT) transition of the guest material 131 (phosphorescent compound). This makes it possible to provide a light-emitting element with drastically improved emission efficiency. Note that in the case where a thermally activated delayed fluorescence material is used instead of the phosphorescent compound, it is preferable that the absorption band on the longest wavelength side be a singlet absorption band.

As a material that can be used as the host material 133, any of the above hole-transport materials and the above electron-transport materials can be used. Specifically, examples of the material include metal complexes such as tris(8-quinolinolato)aluminum(III) (abbreviation: Alq), tris (4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis (8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or ca-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino] biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'', N''',N'''-octaphenyldibenzo[g,p]chrysene-2,7,10,15-tetramine (abbreviation: DBC1), 9-[4-(10-phenyl-9-anthryl) phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl) diphenanthrene (abbreviation: DPNS2), 1,3,5-tri(1-pyrenyl) benzene (abbreviation: TPB3), and the like. One or more substances having a wider energy gap than the guest material 131 is preferably selected from these substances and known substances.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

The light-emitting layer 130 may contain a material other than the guest material 131, the host material 132, and the host material 133.

Furthermore, a fluorescent compound may be used in the light-emitting layer 130. The fluorescent compound is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N, N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-bis[4-(9-phenyl-9H-fluoren-9-yl)phenyl]-N,N'-diphenyl-3,8-dicyclohexylpyrene-1,6-diamine (abbreviation: ch-1,6FLPAPrn), N,N'-bis[4-(9H-carbazol-9-yl)phenyl]-N,N'-diphenyl stilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis [N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), N,N,N',N', N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9, 10-bis(1,1'-biphenyl-2-yl)-2-anthryl]-N,N',N'-triphenyl-1,4-phenylenediamine (abbreviation: 2DPABPhA), 9,10-bis(1, 1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11- diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H, 5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), 5,10,15,20-tetraphenylbisbenzo[5,6]indeno[1,2,3-cd: 1',2',3'-lm]perylene, and the like.

Furthermore, as the guest material 131, any material having a function of converting triplet excitation energy into singlet-excitation energy may be used. As the material having a function of converting triplet excitation energy into singlet excitation energy, a thermally activated delayed fluorescent (TADF) material can be given in addition to the phosphorescent compound. Note that the thermally activated delayed fluorescent material is a material having a small difference between the S1 level and the T1 level and a function of converting triplet excitation energy into singlet-excitation energy by reverse intersystem crossing. Thus, the TADF material can up-convert triplet excitation energy into singlet excitation energy (i.e., reverse intersystem crossing is possible) using a little thermal energy and efficiently exhibit light emission (fluorescence) from the singlet excited state. Therefore, it is acceptable that the "phosphorescent compound" in the description is replaced with the "thermally activated delayed fluorescent material". Thermally activated delayed fluorescence is efficiently obtained under the condition where the difference between the S1 level and the T1 level is larger than 0 eV and smaller than or equal to 0.2 eV, preferably larger than 0 eV and smaller than or equal to 0.1 eV.

The material that exhibits thermally activated delayed fluorescence may be a material that can form a singlet excited state by itself from a triplet excited state by reverse intersystem crossing. In the case where the thermally activated delayed fluorescent material is composed of one kind of material, any of the following materials can be used, for example.

First, a fullerene, a derivative thereof, an acridine derivative such as proflavine, eosin, and the like can be given. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2$OEP), and the like.

As the thermally activated delayed fluorescent material composed of one kind of material, a heterocyclic compound including a π-electron rich heteroaromatic skeleton and a π-electron deficient heteroaromatic skeleton can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), or the like can be used. The heterocyclic compound is preferable because of having the π-electron rich heteroaromatic skeleton and the π-electron deficient heteroaromatic skeleton, for which the electron-transport property and the hole-transport property are high. Note that a substance in which the π-electron rich heteroaromatic skeleton is directly bonded to the π-electron deficient heteroaromatic skeleton is particularly preferable because the donor property of the π-electron rich heteroaromatic skeleton and the acceptor property of the π-electron deficient heteroaromatic skeleton are both increased and the difference between the S1 level and the T1 level becomes small.

<<Pair of Electrodes>>

The electrode 101 and the electrode 102 have functions of injecting holes and electrons into the light-emitting layer 130. The electrodes 101 and 102 can be formed using a metal, an alloy, or a conductive compound, or a mixture or a stack thereof, for example. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter, referred to as ITO), indium tin oxide containing silicon or silicon oxide (ITSO), indium zinc oxide, indium oxide containing tungsten and zinc, and the like. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102. Therefore, at least one of the electrodes 101 and 102 transmits visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used. The electrode on the light extraction side may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

Note that in this specification and the like, as the electrode transmitting light, a material that transmits visible light and has conductivity is used. Examples of the material include, in addition to the above-described oxide conductor layer typified by an ITO, an oxide semiconductor layer and an organic conductive layer containing an organic substance. Examples of the organic conductive layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1\times10^5$ Ω·cm, further preferably lower than or equal to $1\times10^4$ Ω·cm.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the above aromatic amines, carbazole derivatives, aromatic hydrocarbons, stilbene derivatives, and the like can be used as the hole-transport material that can be used in the light-emitting layer 130. Furthermore, the hole-transport material may be a high molecular compound.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. As the aromatic hydrocarbon having a vinyl group, the following are given, for example: 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl) methacrylamide] (abbreviation: PTPDMA), and poly[N,N'-bis(4-butylphenyl)-N,N'-bis(phenyl)benzidine] (abbreviation: poly-TPD).

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, any of the materials given as examples of the material of the hole-injection layer 111 can be used. In addition, a substance having a hole mobility of $1\times10^{-6}$ cm$^2$/Vs or higher is preferably used. Note that other than these substances, any substance that has a property of transporting more holes than electrons may be used. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as an electron-transport material, and a material having an electron mobility of $1\times10^{-6}$ cm$^2$/Vs or higher is preferable. A metal complex containing zinc or aluminum, a π-electron deficient heteroaromatic compound such as a nitrogen-containing heteroaromatic compound, or the like can be used as a compound which easily accepts electrons (a material having an electron-transport property). Specifically, a metal complex having a quinoline ligand, a benzoquinoline ligand, an oxazole ligand, or a thiazole ligand, which is described as the electron-transport material that can be used in the light-emitting layer 130, can be given. In addition, an oxadiazole derivative, a triazole derivative, a phenanthroline derivative, a pyridine derivative, a bipyridine derivative, a pyrimidine derivative, and the like can be given. A substance having an electron mobility of $1\times10^{-6}$ cm$^2$/Vs or higher is preferable. Note that a substance other than the above substances may be used as long as it has a higher electron-transport property than a hole-transport property. The electron-transport layer 118 is not limited to a single layer, and may include stacked two or more layers containing the aforementioned substances.

Between the electron-transport layer 118 and the light-emitting layer 130, a layer that controls transfer of electron carriers may be provided. The layer that controls transfer of electron carriers is a layer formed by addition of a small amount of a substance having a high electron-trapping property to a material having a high electron-transport property as described above, and the layer is capable of adjusting the carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron donating property, a Group 1 metal, a Group 2 metal, an oxide of the metal, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. A rare earth metal compound like erbium fluoride (ErF$_3$) can also be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Furthermore, an alkali metal oxide and an alkaline earth metal oxide are preferable, and a lithium oxide, a calcium oxide, a barium oxide, and the like can be given. Alternatively, Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle-printing method, a gravure printing method, or the like. Besides the above-mentioned materials, an inorganic compound such as a quantum dot or a high molecular compound (e.g., an oligomer, a dendrimer, or a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

An example of a liquid medium used for a wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a phenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); a polyphenylene derivative; or the like. These high molecular compounds or a high molecular compound such as poly(9-vinylcarbazole) (abbreviation: PVK), poly(2-vinylnaphthalene), poly[bis(4-phenyl)(2,4,6-trimethylphenyl)amine] (abbreviation: PTAA) may be doped with a compound having a light-emitting property and used for the light-emitting layer. As the compound having a light-emitting property, any of the above-described compounds having a light-emitting property can be used.

<<Substrate>>

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic vapor deposition film, or the like can also be used. Another material may be used as long as the substrate functions as a support in a manufacturing process of the light-emitting elements or optical elements. Another material having a function of protecting the light-emitting elements or optical elements may be used.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Alternatively, polypropylene, polyester, polyvinyl fluoride, polyvinyl chloride, or the like can be used. Alternatively, polyamide, polyimide, aramid, epoxy, an inorganic vapor deposition film, paper, or the like can be used.

Alternatively, a flexible substrate may be used as the substrate, and the light-emitting element may be provided directly over the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, a light-emitting element with high durability, a light-emitting element with high heat resistance, a lightweight light-emitting element, or a thin light-emitting element can be obtained.

The light-emitting element 150 may be formed over an electrode electrically connected to a field-effect transistor (FET), for example, which is formed over any of the above-described substrates. Accordingly, an active matrix display device in which the FET controls the driving of the light-emitting element can be manufactured.

The structure described above in this embodiment can be combined with any of the other embodiments as appropriate.

Embodiment 2

Figure 5:
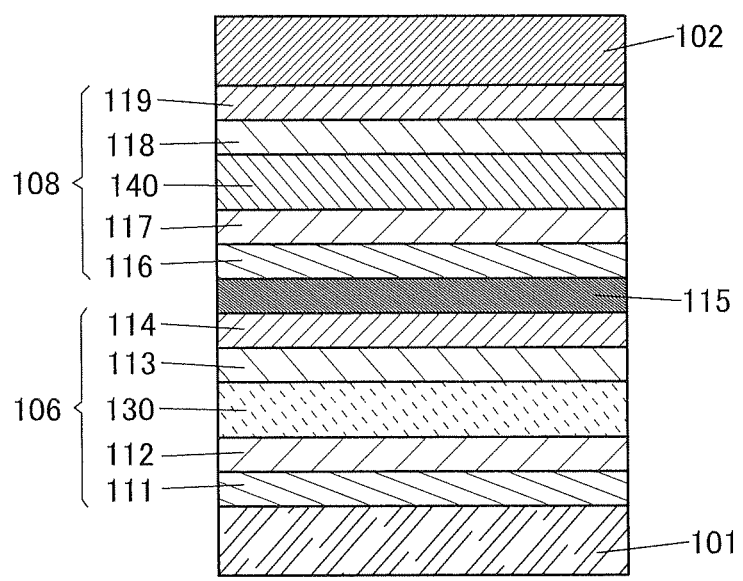
FIG. 5 is a schematic cross-sectional view of a light-emitting element of one embodiment of the present invention.

In this embodiment, a light-emitting element having a structure different from that described in Embodiment 1 and light emission mechanisms of the light-emitting element are described below with reference to FIG. 5. In FIG. 5, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

<Structure Example of Light-Emitting Element>

FIG. 5 is a schematic cross-sectional view of a light-emitting element 250.

The light-emitting element 250 illustrated in FIG. 5 includes a plurality of light-emitting units (a light-emitting unit 106 and a light-emitting unit 108 in FIG. 5) between a pair of electrodes (the electrode 101 and the electrode 102). One light-emitting unit has the same structure as the EL layer 100 illustrated in FIG. 1. That is, the light-emitting element 150 illustrated in FIG. 1 includes one light-emitting unit while the light-emitting element 250 illustrated in FIG. 5 includes a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 5, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable that the structure of the EL layer 100 illustrated in FIG. 1 be used for the light-emitting unit 106.

The light-emitting element 250 includes the light-emitting layer 130 and a light-emitting layer 140. The light-emitting unit 106 includes the hole-injection layer 111, the hole-transport layer 112, an electron-transport layer 113, and an electron-injection layer 114 in addition to the light-emitting layer 130. The light-emitting unit 108 includes a hole-injection layer 116, a hole-transport layer 117, the electron-transport layer 118, and the electron-injection layer 119 in addition to the light-emitting layer 140.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A substance having a hole mobility of $1\times10^{-6}$ cm$^2$/Vs or higher is preferably used as the organic compound. Note that any other substance may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115 like the light-emitting unit 108, the charge-generation layer 115 can also serve as a hole-injection layer or a hole-transport layer of the light-emitting unit; thus, a hole-injection layer or a hole-transport layer need not be included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having a high electron-transport property. Furthermore, the charge-generation layer 115 may be formed using a combination of a layer containing the composite material of an organic compound and an acceptor substance with a layer including a transparent conductive material.

The charge-generation layer 115 provided between the light-emitting unit 106 and the light-emitting unit 108 may have any structure as long as electrons can be injected into the light-emitting unit on one side and holes can be injected into the light-emitting unit on the other side when a voltage is applied between the electrode 101 and the electrode 102. For example, in FIG. 5, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance higher than or equal to 40%). The charge-generation layer 115 functions even if it has lower conductivity than the pair of electrodes (the electrodes 101 and 102). In the case where the conductivity of the charge-generation layer 115 is as high as those of the pair of electrodes, carriers generated in the charge-generation layer 115 flow toward the film surface direction, so that light is emitted in a region where the electrode 101 and the electrode 102 do not overlap, in some cases. To suppress such a defect, the charge-generation layer 115 is preferably formed using a material whose conductivity is lower than those of the pair of electrodes.

Forming the charge-generation layer 115 by using any of the above materials can suppress an increase in driving voltage caused by the stack of the light-emitting layers.

The light-emitting element having two light-emitting units has been described with reference to FIG. 5; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. In addition, a light-emitting element with low power consumption can be realized.

When the structure of the EL layer 100 shown in FIG. 1 is applied to at least one of the plurality of units, a light-emitting element with high emission efficiency can be provided.

It is preferable that the light-emitting layer 130 included in the light-emitting unit 106 have a structure similar to the structure described in Embodiment 1. In that case, the light-emitting element 250 has high emission efficiency.

Note that the guest materials used in the light-emitting unit 106 and the light-emitting unit 108 may be the same or different. In the case where the same guest material is used for the light-emitting unit 106 and the light-emitting unit 108, the light-emitting element 250 can exhibit high emission luminance at a small current value, which is preferable. In the case where different guest materials are used for the light-emitting unit 106 and the light-emitting unit 108, the light-emitting element 250 can exhibit multi-color light emission, which is preferable. It is particularly favorable to select the guest materials so that white light emission with high color rendering properties or light emission of at least red, green, and blue can be obtained.

Note that the light-emitting units 106 and 108 and the charge-generation layer 115 can be formed by an evaporation method (including a vacuum evaporation method), an ink-jet method, a coating method, gravure printing, or the like.

Note that the structure described in this embodiment can be used in appropriate combination with any of the structures described in the other embodiments.

Embodiment 3

In this embodiment, examples of light-emitting elements having structures different from those described in Embodiments 1 and 2 are described below with reference to FIG. 6 and FIGS. 7A and 7B.

Structure Example 1 of Light-Emitting Element

Figure 6:
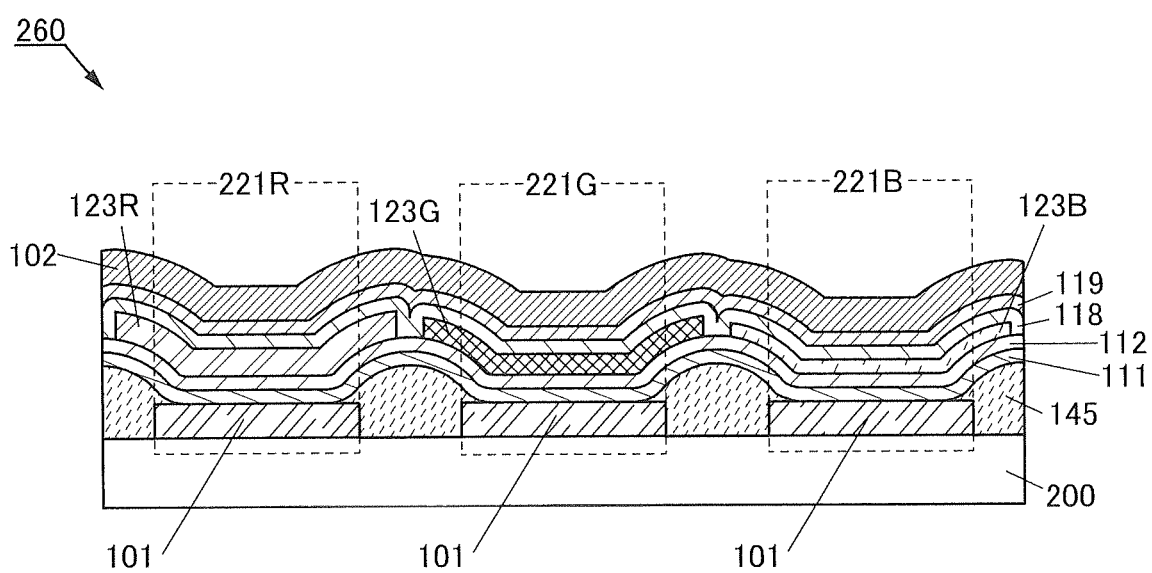
FIG. 6 is a schematic cross-sectional view of a light-emitting element of one embodiment of the present invention.

FIG. 6 is a cross-sectional view of a light-emitting element of one embodiment of the present invention. In FIG. 6, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

A light-emitting element 260 in FIG. 6 may have a bottom-emission structure in which light is extracted through a substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting element 260 has a bottom-emission structure, the electrode 101 preferably has a function of transmitting light. In addition, it is preferable that the electrode 102 have a function of reflecting light. In the case where the light-emitting element 260 has a top-emission structure, the electrode 101 preferably has a function of reflecting light. In addition, it is preferable that the electrode 102 have a function of transmitting light.

The light-emitting element 260 includes the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

Furthermore, the electrode 101 may be formed of a plurality of conductive layers. In this case, a structure in which a conductive layer having a function of reflecting light and a conductive layer having a function of transmitting light are stacked is preferable.

For the electrode 101, the structure and materials of the electrode 101 or 102 described in Embodiment 1 can be used.

In FIG. 6, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, aluminum nitride, and the like. Examples of the organic material include photosensitive resin materials such as an acrylic resin and a polyimide resin.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. By using the light-emitting element 260 having this structure in a pixel of a display device, a full-color display device can be fabricated. The thicknesses of the light-emitting layers may be the same or different.

One or more of the light-emitting layer 123B, the light-emitting layer 123G, and the light-emitting layer 123R preferably have a structure similar to the structure of the light-emitting layer 130 described in Embodiment 1. In that case, a light-emitting element with high emission efficiency can be fabricated.

One or more of the light-emitting layers 123B, 123G, and 123R may include two or more stacked layers.

When at least one light-emitting layer includes the light-emitting layer described in Embodiment 1 as described above and the light-emitting element 260 including the light-emitting layer is used in a pixel in a display device, a display device with high emission efficiency can be fabricated. Accordingly, the display device including the light-emitting element 260 can have low power consumption.

By providing a color filter over the electrode through which light is extracted, the color purity of the light-emitting element 260 can be improved. Therefore, the color purity of a display device including the light-emitting element 260 can be improved.

By providing a polarizing plate over the electrode through which light is extracted, the reflection of external light by the light-emitting element 260 can be reduced. Therefore, the contrast ratio of a display device including the light-emitting element 260 can be improved.

Note that for the other components of the light-emitting element 260, the components of the light-emitting elements in Embodiment 1 may be referred to.

Structure Example 2 of Light-Emitting Element

Next, a structure example different from the light-emitting element illustrated in FIG. 6 is described below with reference to FIGS. 7A and 7B.

Figure 7A:
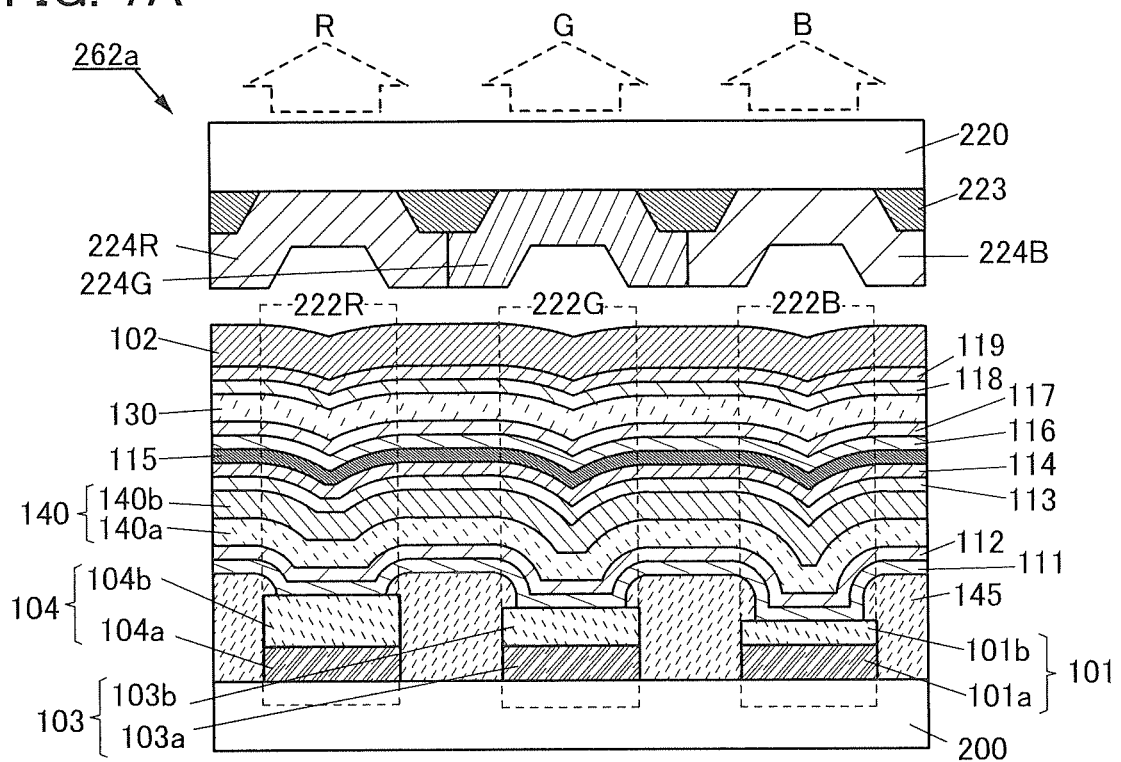
FIGS. 7A and 7B are each a schematic cross-sectional view of a light-emitting element of one embodiment of the present invention.
Figure 7B:
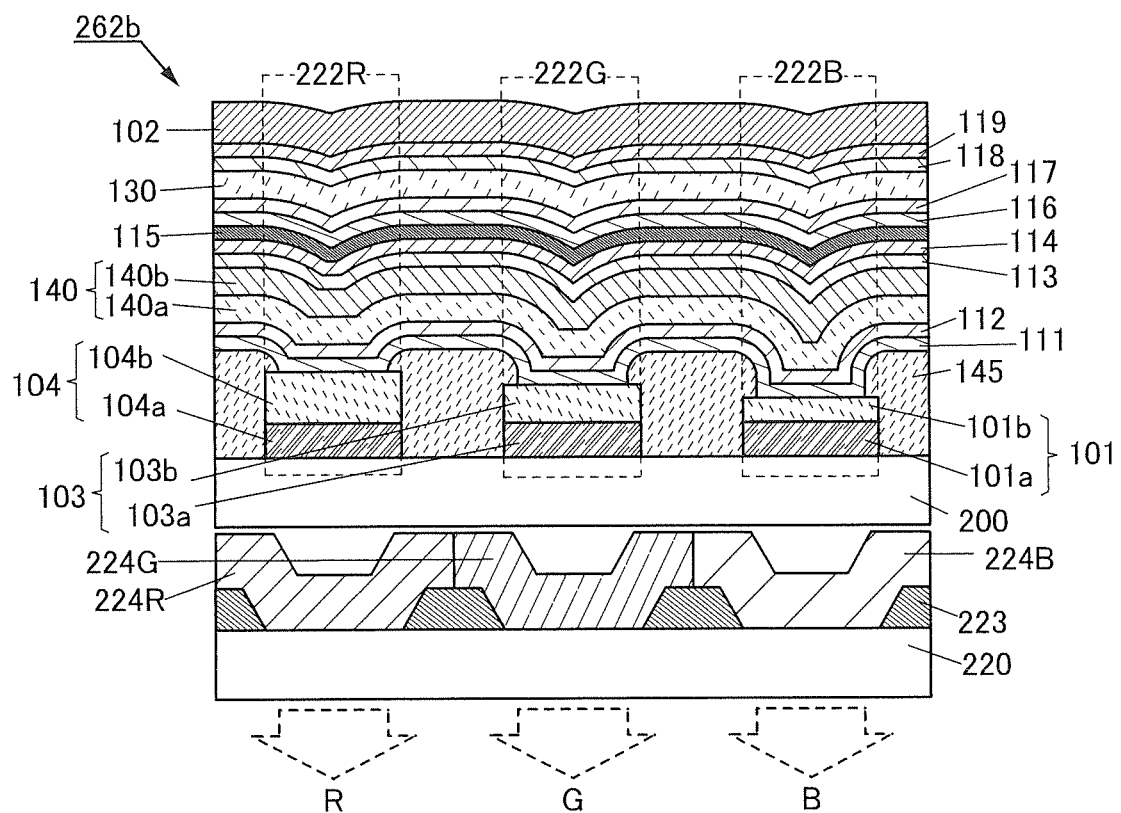

FIGS. 7A and 7B are cross-sectional views each illustrating a light-emitting element of one embodiment of the present invention. In FIGS. 7A and 7B, a portion having a function similar to that in FIG. 6 is represented by the same hatch pattern as that in FIG. 6 and not especially denoted by a reference numeral in some cases. In addition, common reference numerals are used for portions having similar functions, and a detailed description of the portions is omitted in some cases.

FIGS. 7A and 7B illustrate structure examples of a light-emitting element including the light-emitting layer between a pair of electrodes. A light-emitting element 262a illustrated in FIG. 7A has a top-emission structure in which light is extracted in a direction opposite to the substrate 200, and a light-emitting element 262b illustrated in FIG. 7B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least a light-emitting layer 130 and the charge-generation layer 115 are provided between the electrode 101 and the electrode 102, between the electrode 102 and the electrode 103, and between the electrode 102 and the electrode 104. The hole-injection layer 111, the hole-transport layer 112, a light-emitting layer 140, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 7A and the light-emitting element 262b illustrated in FIG. 7B each include the partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be divided into island shapes.

The light-emitting elements 262a and 262b each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through the corresponding optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a bandpass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum-dot can increase color reproducibility of the display device.

A plurality of optical elements may also be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 7A and 7B, blue light (B), green light (G), and red light (R) emitted from the regions through the optical elements are schematically illustrated by arrows of dashed lines.

Alight-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

For the substrate 200 and the substrate 220 provided with the optical elements, the substrate in Embodiment 1 may be referred to.

Furthermore, the light-emitting elements 262a and 262b have a microcavity structure.

<<Microcavity Structure>>

Light emitted from the light-emitting layer 130 and the light-emitting layer 140 resonates between a pair of electrodes (e.g., the electrode 101 and the electrode 102). The light-emitting layer 130 and the light-emitting layer 140 are formed at such a position as to intensify light of a desired wavelength among light to be emitted. For example, by adjusting the optical length from a reflective region of the electrode 101 to a light-emitting region of the light-emitting layer 130 and the optical length from a reflective region of the electrode 102 to the light-emitting region of the light-emitting layer 130, the light of a desired wavelength among light emitted from the light-emitting layer 130 can be intensified. Furthermore, by adjusting the optical length from a reflective region of the electrode 101 to a light-emitting region of the light-emitting layer 140 and the optical length from a reflective region of the electrode 102 to the light-emitting region of the light-emitting layer 140, the light of a desired wavelength among light emitted from the light-emitting layer 140 can be intensified. In the case of a light-emitting element in which a plurality of light-emitting layers (here, the light-emitting layers 130 and 140) are stacked, the optical lengths of the light-emitting layers 130 and 140 are preferably optimized.

In each of the light-emitting elements 262a and 262b, by adjusting the thicknesses of the conductive layers (the conductive layer 101b, the conductive layer 103b, and the conductive layer 104b) in each region, the light of a desired wavelength among light emitted from the light-emitting layers 130 and 140 can be intensified. Note that the thickness of at least one of the hole-injection layer 111 and the hole-transport layer 112 may differ between the regions to intensify the light emitted from the light-emitting layers 130 and 140.

For example, in the case where the refractive index of the conductive material having a function of reflecting light in the electrodes 101 to 104 is lower than the refractive index of the light-emitting layer 130 or the light-emitting layer 140, the thickness of the conductive layer 101b of the electrode 101 is adjusted so that the optical length between the electrode 101 and the electrode 102 is $m_B \lambda_B / 2$ ($m_B$ is a natural number and AB is the wavelength of light intensified in the region 222B). Similarly, the thickness of the conductive layer 103b of the electrode 103 is adjusted so that the optical length between the electrode 103 and the electrode 102 is $m_G \lambda_G / 2$ ($m_G$ is a natural number and $\lambda_G$ is the wavelength of light intensified in the region 222G). Furthermore, the thickness of the conductive layer 104b of the electrode 104 is adjusted so that the optical length between the electrode 104 and the electrode 102 is $m_R \lambda_R / 2$ ($m_R$ is a natural number and Ai is the wavelength of light intensified in the region 222R).

In the above manner, with the microcavity structure, in which the optical length between the pair of electrodes in the respective regions is adjusted, scattering and absorption of light in the vicinity of the electrodes can be suppressed, resulting in high light extraction efficiency. In the above structure, the conductive layers 101b, 103b, and 104b preferably have a function of transmitting light. The materials of the conductive layers 101b, 103b, and 104b may be the same or different. Each of the conductive layers 101b, 103b, and 104b may have a stacked structure of two or more layers.

Since the light-emitting element 262a illustrated in FIG. 7A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 262b illustrated in FIG. 7B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

In each of the light-emitting elements 262a and 262b, the conductive layers 101a, 103a, and 104a may be formed of different materials or the same material. When the conductive layers 101a, 103a, and 104a are formed of the same material, manufacturing cost of the light-emitting elements 262a and 262b can be reduced. Note that each of the conductive layers 101a, 103a, and 104a may have a stacked structure including two or more layers.

Furthermore, the light-emitting layer 130 in the light-emitting element 262a and the light-emitting element 262b preferably has a structure similar to the structure described in Embodiment 1. In this way, the light-emitting elements can have high emission efficiency.

Either or both of the light-emitting layers 130 and 140 may have a stacked structure of two layers like light-emitting layers 140a and 140b, for example. The two light-emitting layers including two kinds of light-emitting materials (a first light-emitting material and a second light-emitting material) for emitting different colors of light enable light emission of a plurality of colors. It is particularly preferable to select the light-emitting materials of the light-emitting layers so that white light can be obtained by combining light emission from the light-emitting layer 130 and light emission from the light-emitting layer 140.

Either or both of the light-emitting layers 130 and 140 may have a stacked structure of three or more layers, in which a layer not including a light-emitting material may be included.

In the above-described manner, by using the light-emitting element 262a or 262b including the light-emitting layer having any one of the structure described in Embodiment 1 in a pixel in a display device, a display device with high emission efficiency can be fabricated. Accordingly, the display device including the light-emitting element 262a or 262b can have low power consumption.

For the other components of the light-emitting elements 262a and 262b, the components of the light-emitting element 260 or the light-emitting elements described in Embodiments 1 and 2 may be referred to.

Note that a structure described in this embodiment can be used in appropriate combination with any of the structures described in the other embodiments.

Embodiment 4

In this embodiment, a display device including a light-emitting element of one embodiment of the present invention is described with reference to FIGS. 8A and 8B, FIGS. 9A and 9B, and FIGS. 10A and 10B.

Structure Example 1 of Display Device

Figure 8A:
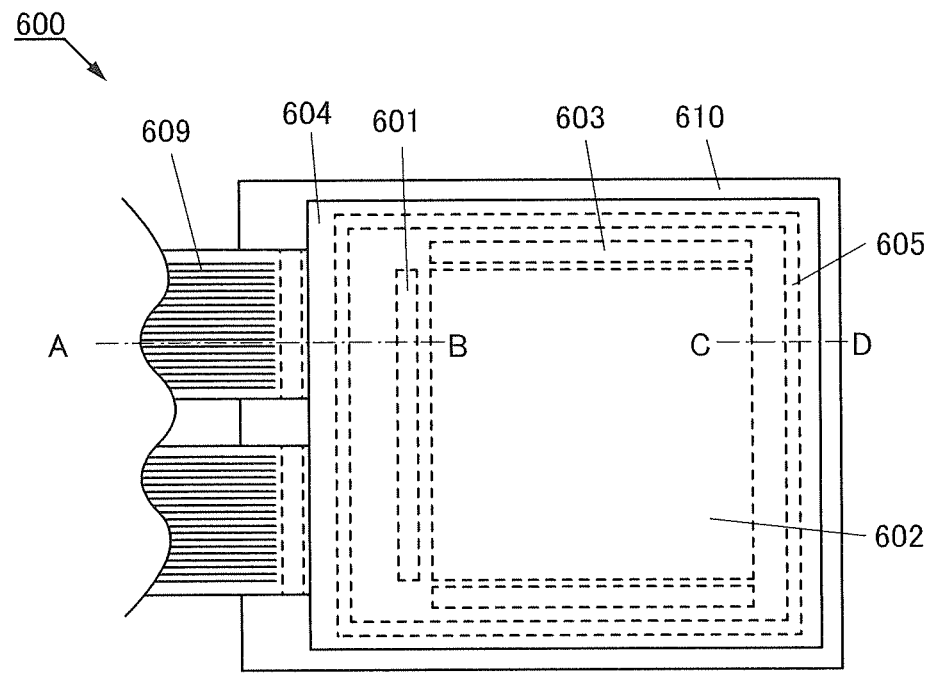
FIGS. 8A and 8B are a top view and a schematic cross-sectional view illustrating a display device of one embodiment of the present invention.
Figure 8B:
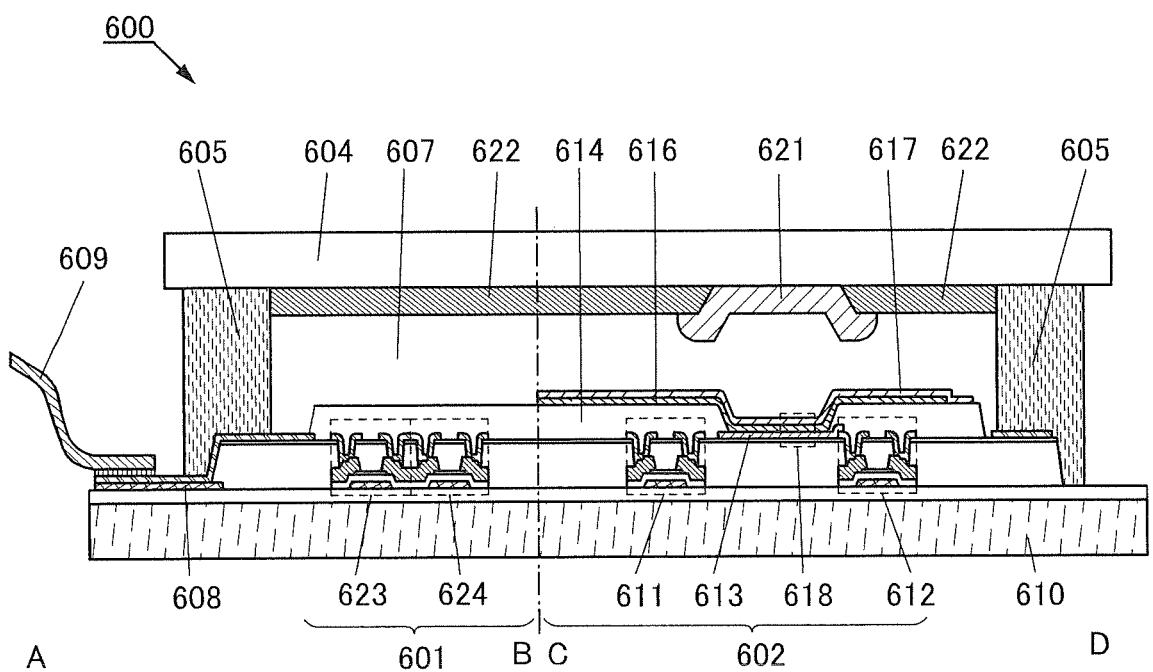

FIG. 8A is a top view illustrating a display device 600 and FIG. 8B is a cross-sectional view taken along the dashed-dotted line A-B and the dashed-dotted line C-D in FIG. 8A.

The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 m to 3 µm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for the transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more, and further preferably 3 eV or more, for the transistors, so that the off-state current of the transistors can be reduced. Examples of the oxide semiconductor include an In—Ga oxide, an In-M-Zn oxide (M is aluminum (Al), gallium (Ga), yttrium (Y), zirconium (Zr), lanthanum (La), cerium (Ce), tin (Sn), hafnium (Hf), or neodymium (Nd)), and the like.

An EL layer 616 and an upper electrode 617 are formed over the lower electrode 613. Here, the lower electrode 613 functions as an anode and the upper electrode 617 functions as a cathode.

In addition, the EL layer 616 is formed by any of various methods including an evaporation method (including a vacuum evaporation method) with an evaporation mask, a droplet discharge method (also referred to as an ink-jet method), a coating method such as a spin coating method, and a gravure printing method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. It is preferable that the sealing substrate be provided with a recessed portion and a desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

Note that an epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In the above-described manner, a display device including any of the light-emitting elements and the optical elements which are described in Embodiments 1 to 3 can be obtained.

Structure Example 2 of Display Device

Next, another example of the display device is described with reference to FIGS. 9A and 9B. Note that FIGS. 9A and 9B are each a cross-sectional view of a display device of one embodiment of the present invention.

In FIG. 9A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 9A, examples of the optical elements, coloring layers (a red coloring layer 1034R, a green coloring layer 1034G, and a blue coloring layer 1034B) are provided on a transparent base material 1033. Furthermore, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In FIG. 9A, red light, green light, and blue light pass through the coloring layers, and thus an image can be displayed with the use of pixels of three colors.

FIG. 9B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

As examples of the optical elements, the coloring layers (the red coloring layer 1034R, the green coloring layer 1034G, and the blue coloring layer 1034B) are provided between the first interlayer insulating film 1020 and the second interlayer insulating film 1021.

The above-described display device has a structure in which light is extracted from the substrate 1001 side where the transistors are formed (a bottom-emission structure), but may have a structure in which light is extracted from the sealing substrate 1031 side (a top-emission structure).

Structure Example 3 of Display Device

Figure 10A:
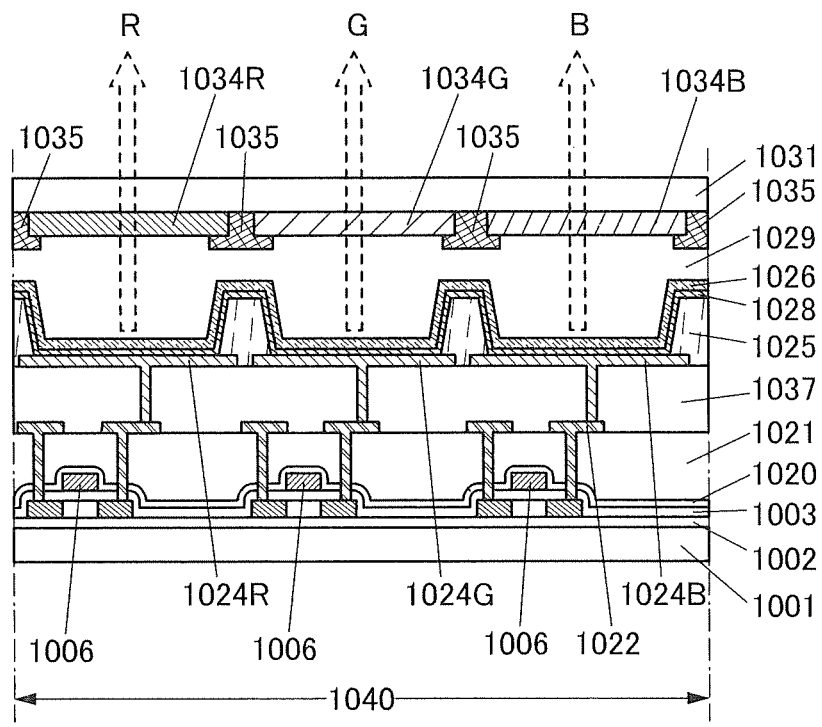
FIGS. 10A and 10B are schematic cross-sectional views each illustrating a display device of one embodiment of the present invention.
Figure 10B:
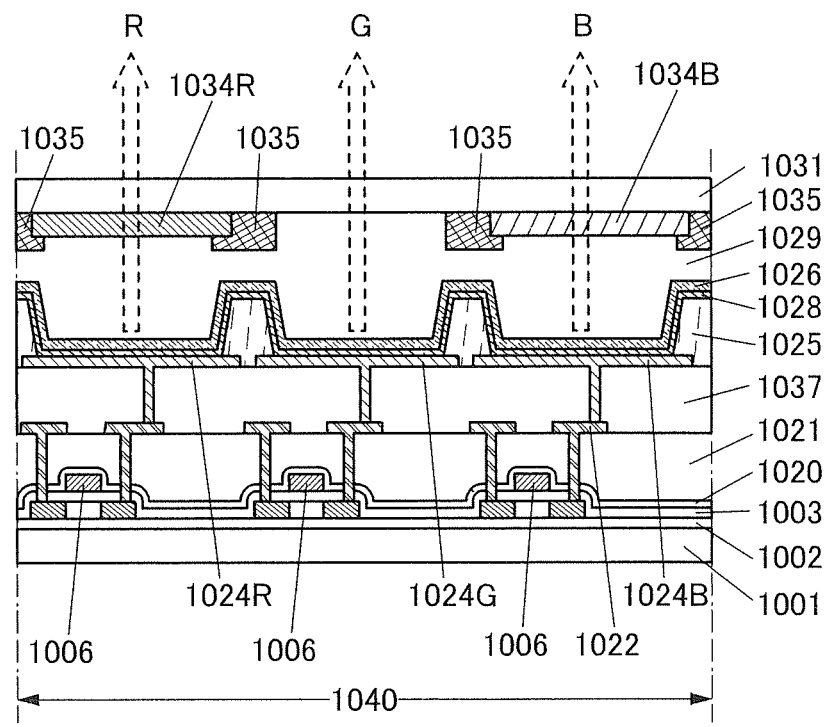

FIGS. 10A and 10B are each an example of a cross-sectional view of a display device having a top-emission structure. Note that FIGS. 10A and 10B are each a cross-sectional view illustrating the display device of one embodiment of the present invention, and the driver circuit portion 1041, the peripheral portion 1042, and the like, which are illustrated in FIGS. 9A and 9B, are not illustrated therein.

In that case, a substrate which does not transmit light can be used as the substrate 1001. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using various other materials.

The lower electrodes 1024R, 1024G, and 1024B of the light-emitting elements each function as an anode here, but may function as a cathode. Furthermore, in the case of a display device having a top-emission structure as illustrated in FIGS. 10A and 10B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 10A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 10A illustrates the structure provided with the light-emitting elements and the coloring layers for the light-emitting elements as an example; however, the structure is not limited thereto. For example, as shown in FIG. 10B, a structure including the red coloring layer 1034R and the blue coloring layer 1034B but not including a green coloring layer may be employed to achieve full color display with the three colors of red, green, and blue. The structure as illustrated in FIG. 10A where the light-emitting elements are provided with the coloring layers is effective to suppress reflection of external light. In contrast, the structure as illustrated in FIG. 10B where the light-emitting elements are provided with the red coloring layer and the blue coloring layer but not with the green coloring layer is effective in reducing power consumption because of small energy loss of light emitted from the green-light-emitting element.

Although a display device including sub-pixels of three colors (red, green, and blue) is described above, the number of colors of sub-pixels may be four (red, green, blue, and yellow, or red, green, blue, and white). In this case, a coloring layer can be used which has a function of transmitting yellow light or a function of transmitting light of a plurality of colors selected from blue, green, yellow, and red. When the coloring layer can transmit light of a plurality of colors selected from blue, green, yellow, and red, light passing through the coloring layer may be white light. Since the light-emitting element which exhibits yellow or white light has high emission efficiency, the display device having such a structure can have lower power consumption.

Furthermore, in the display device 600 shown in FIGS. 8A and 8B, a sealing layer may be formed in the region 607 which is surrounded by the element substrate 610, the sealing substrate 604, and the sealant 605. For the sealing layer, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer in the region 607 can prevent deterioration of the light-emitting element 618 due to impurities such as water, which is preferable. Note that in the case where the sealing layer is formed, the sealant 605 is not necessarily provided.

When the sealing layer has a multilayer structure, the impurities such as water can be effectively prevented from entering the light-emitting element 618 which is inside the display device from the outside of the display device 600. In the case where the sealing layer has a multilayer structure, a resin and an inorganic material are preferably stacked.

The structures described in this embodiment can be combined as appropriate with any of the other structures in this embodiment and the other embodiments.

Embodiment 5

In this embodiment, a display module, electronic devices, a light-emitting device, and lighting devices each including the light-emitting element of one embodiment of the present invention are described with reference to FIG. 11, FIGS. 12A to 12G, FIGS. 13A to 13C, and FIG. 14.

<Display Module>

Figure 11:
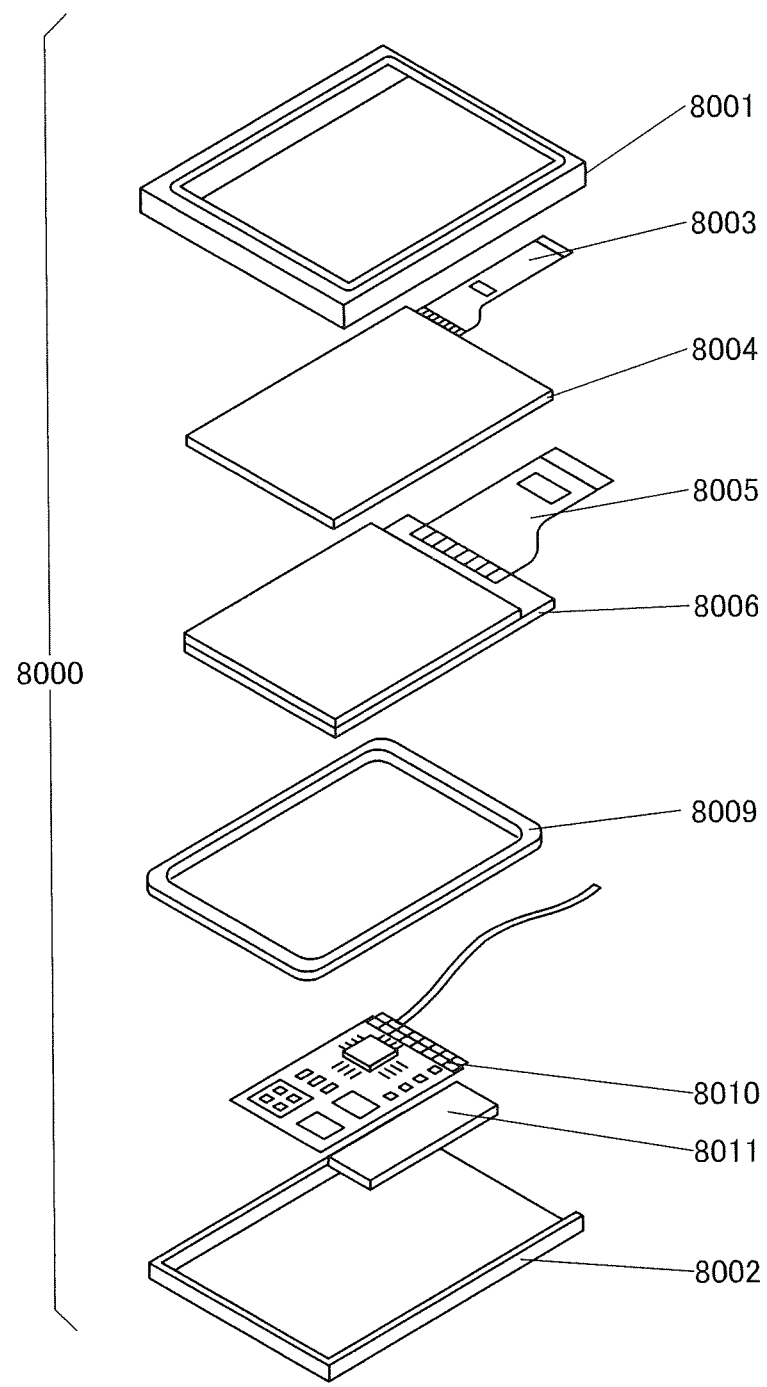
FIG. 11 is a perspective view illustrating a display module of one embodiment of the present invention.

In a display module 8000 in FIG. 11, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 can also function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 12A to 12G show electronic devices. These electronic devices can each include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 12A to 12G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the electronic devices illustrated in FIGS. 12A to 12G can have a variety of functions without limitation to the above functions. Although not illustrated in FIGS. 12A to 12G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 12A to 12G are described in detail below.

Figure 12A:
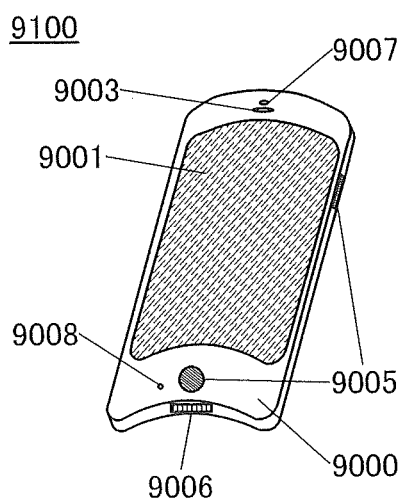
FIGS. 12A to 12G illustrate electronic devices of embodiments of the present invention.

FIG. 12A is a perspective view of a portable information terminal 9100. The display portion 9001 of the portable information terminal 9100 is flexible. Therefore, the display portion 9001 can be incorporated along a curved surface of a curved housing 9000. In addition, the display portion 9001 includes a touch sensor, and operation can be performed by touching the screen with a finger, a stylus, or the like. For example, when an icon displayed on the display portion 9001 is touched, an application can be started.

Figure 12B:
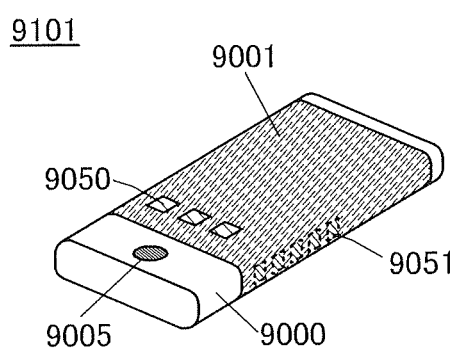

FIG. 12B is a perspective view illustrating a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in the drawing in FIG. 12A, can be positioned in the portable information terminal 9101 as in the portable information terminal 9100 illustrated in FIG. 12A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, for example, an alloy, plastic, or ceramic can be used. As a plastic, a reinforced plastic can also be used. A carbon fiber reinforced plastic (CFRP), which is a kind of reinforced plastic, has advantages of being lightweight and corrosion-free. Other examples of the reinforced plastic include one including glass fiber and one including aramid fiber. As the alloy, an aluminum alloy and a magnesium alloy can be given. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is put in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 12C:
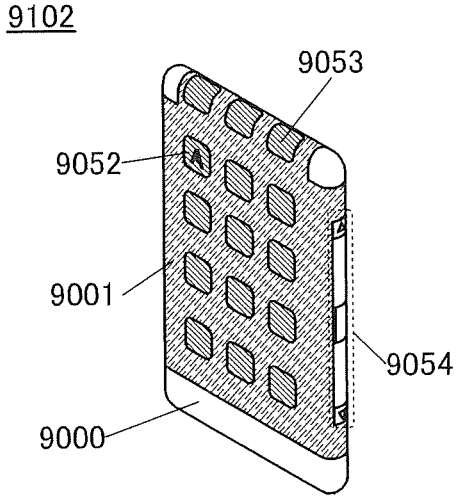

FIG. 12C is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 12D:
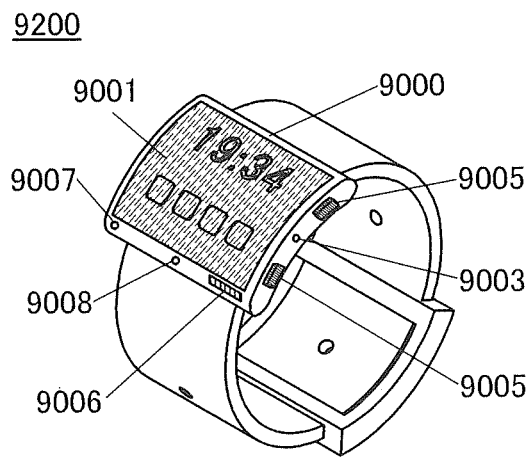

FIG. 12D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 12E:
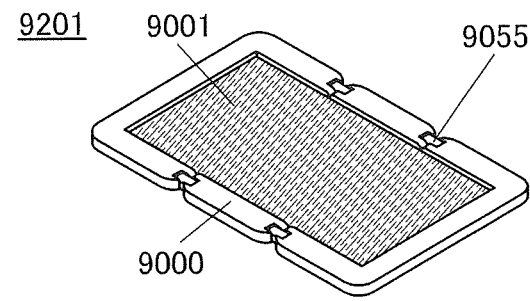
Figure 12F:
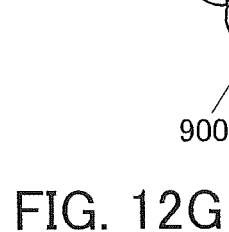
Figure 12G:
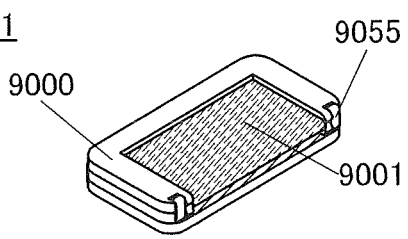

FIGS. 12E, 12F, and 12G are perspective views of a foldable portable information terminal 9201. FIG. 12E is a perspective view illustrating the portable information terminal 9201 that is opened. FIG. 12F is a perspective view illustrating the portable information terminal 9201 that is shifted from the opened state to the folded state or from the folded state to the opened state. FIG. 12G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

The electronic device or the lighting device of one embodiment of the present invention has flexibility and therefore can be incorporated along a curved inside/outside wall surface of a house or a building or a curved interior/exterior surface of a car. For example, the electronic device or the lighting device can be used for lighting for a dashboard, a windshield, a ceiling, and the like of a car.

<Light-Emitting Device>

Figure 13A:
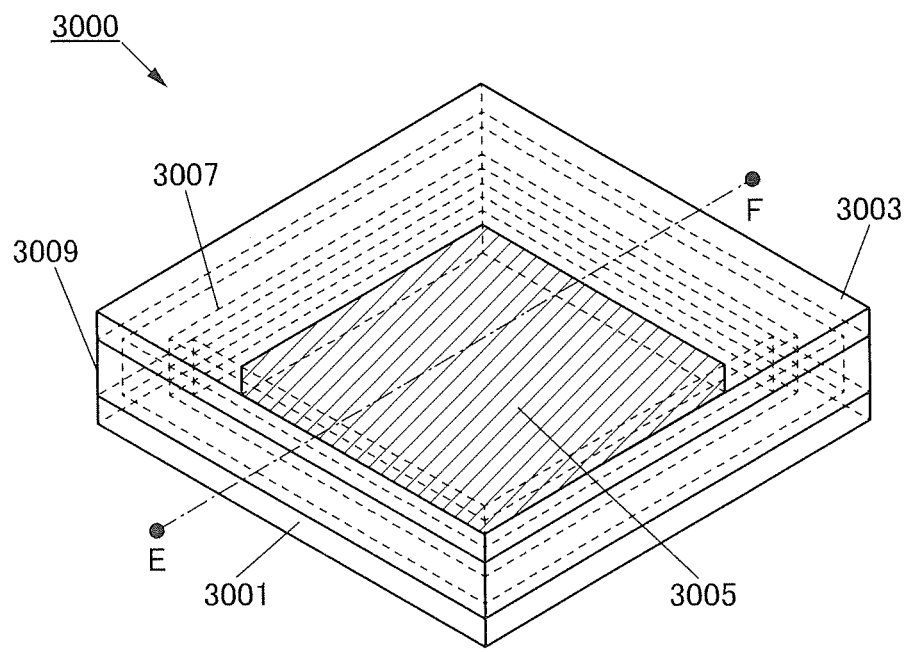
FIGS. 13A to 13C are perspective views illustrating a display device of one embodiment of the present invention.
Figure 13B:
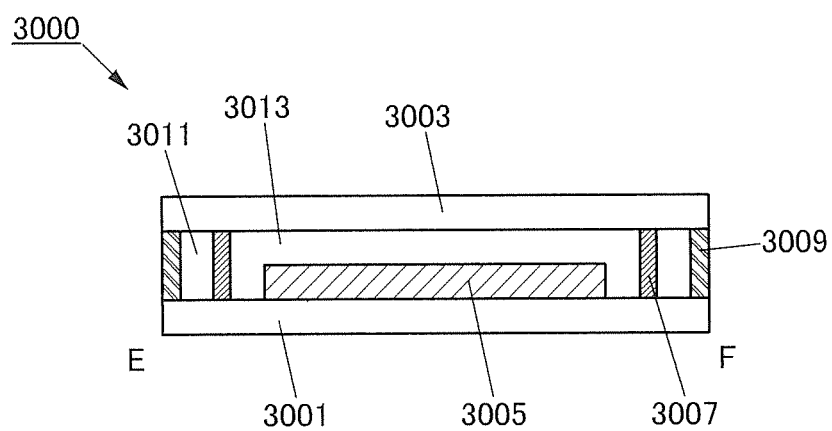

FIG. 13A is a perspective view of a light-emitting device 3000 shown in this embodiment, and FIG. 13B is a cross-sectional view along dashed-dotted line E-F in FIG. 13A. Note that in FIG. 13A, some components are illustrated by broken lines in order to avoid complexity of the drawing.

The light-emitting device 3000 illustrated in FIGS. 13A and 13B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 13A and 13B, a structure in which light is emitted from the light-emitting element 3005 to the lower side (the substrate 3001 side) is illustrated.

As illustrated in FIGS. 13A and 13B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 13B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited thereto, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon or aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 13B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 13C:
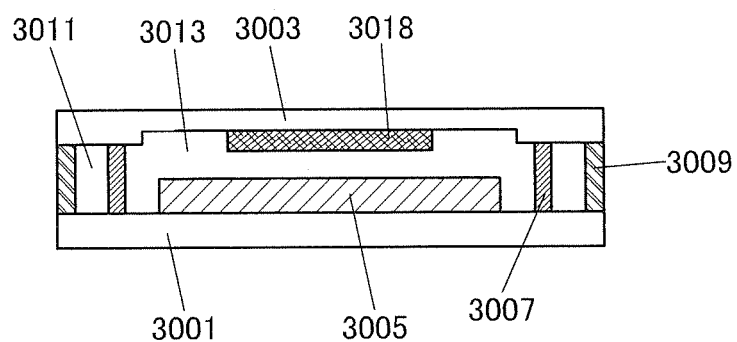

FIG. 13C illustrates a modification example of the structure in FIG. 13B. FIG. 13C is a cross-sectional view illustrating the modification example of the light-emitting device 3000.

FIG. 13C illustrates a structure in which a desiccant 3018 is provided in a recessed portion provided in part of the substrate 3003. The other components are the same as those of the structure illustrated in FIG. 13B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxides (e.g., calcium oxide, barium oxide, and the like), sulfate, metal halides, perchlorate, zeolite, silica gel, and the like.

<Description of Lighting Device>

Figure 14:
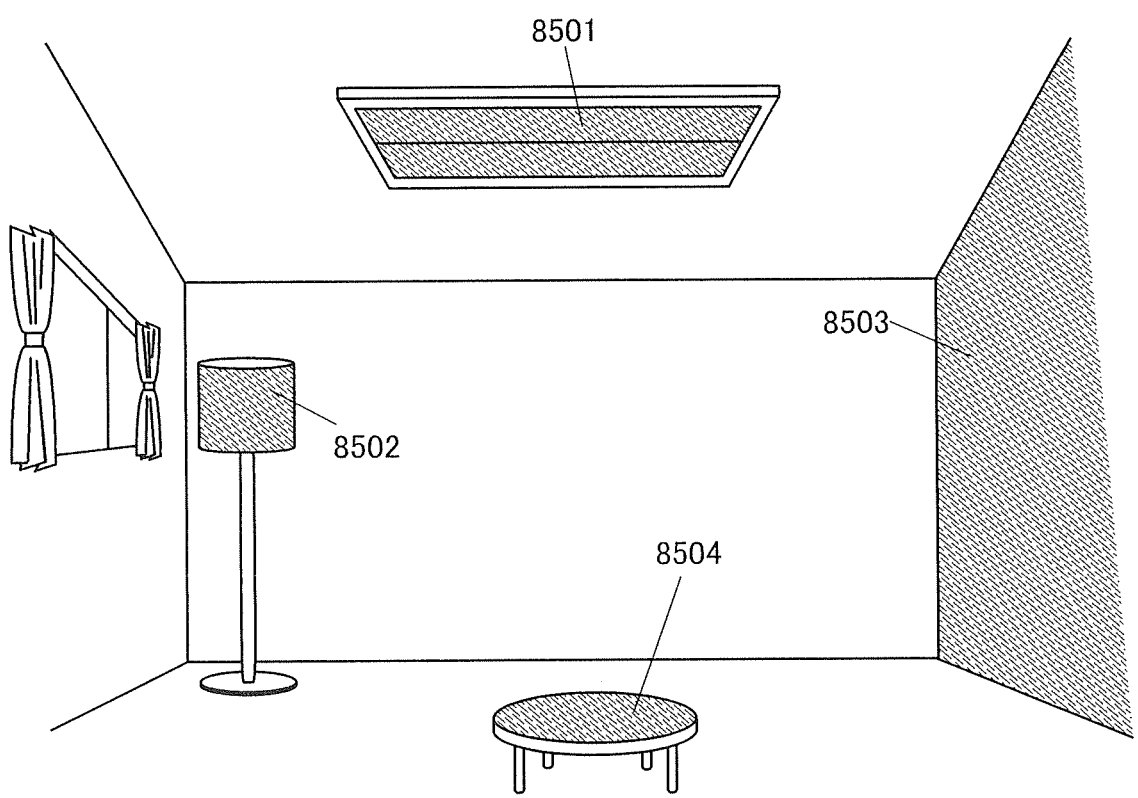
FIG. 14 illustrates lighting devices of one embodiment of the present invention.

FIG. 14 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. The light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, display modules, light-emitting devices, electronic devices, and lighting devices can be obtained by application of the light-emitting element of one embodiment of the present invention. Note that the light-emitting element can be used for electronic devices in a variety of fields without being limited to the lighting devices and the electronic devices described in this embodiment.

The structure described in this embodiment can be combined with any of the structures described in the other embodiments as appropriate.

Example 1

In this example, examples of fabricating light-emitting elements of embodiments of the present invention and characteristics of the light-emitting elements are described. The structure of each of the light-emitting elements fabricated in this example is the same as that illustrated in FIG. 1. Table 1 and Table 2 show the detailed structures of the elements. In addition, structures and abbreviations of compounds used here are given below.

[Chemical Formula 22]

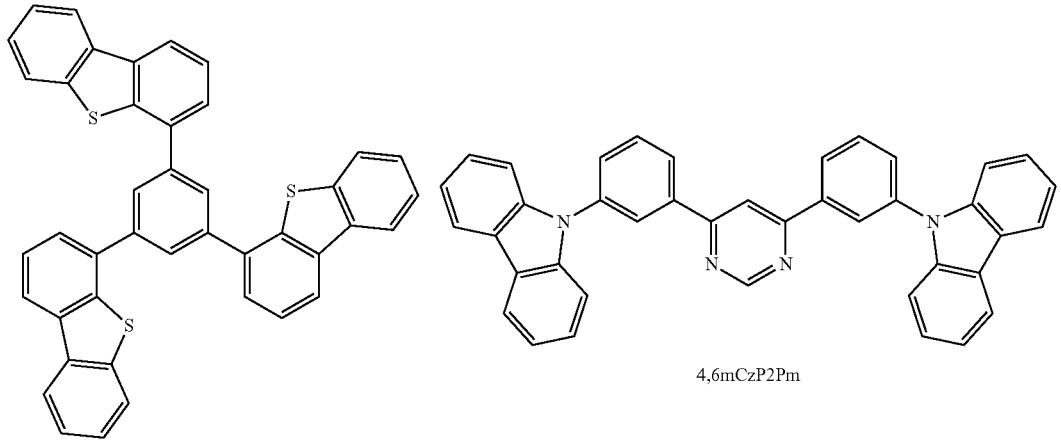

DBT3P-II 4,6mCzP2Pm

-continued
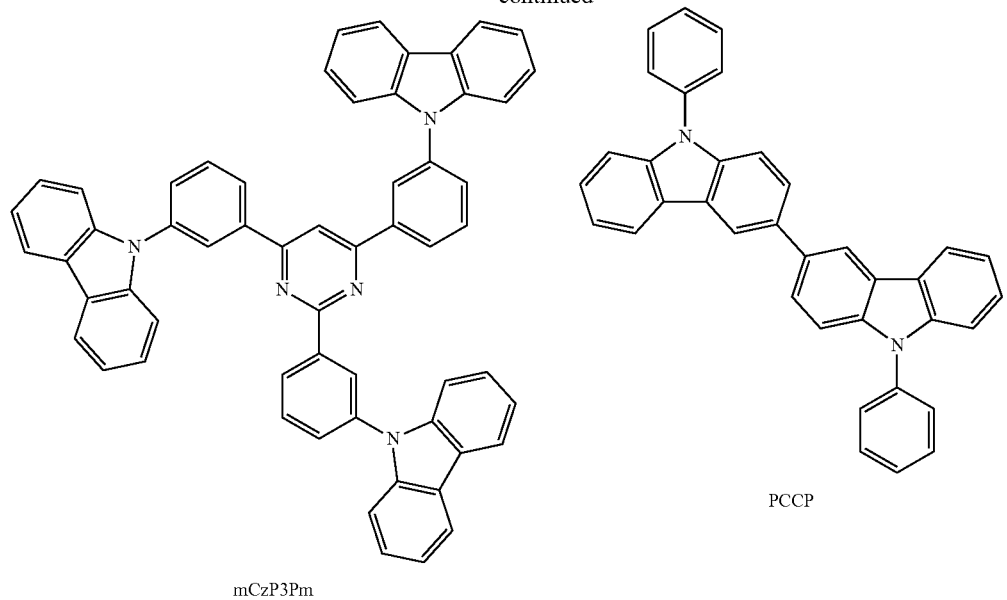
mCzP3Pm
PCCP
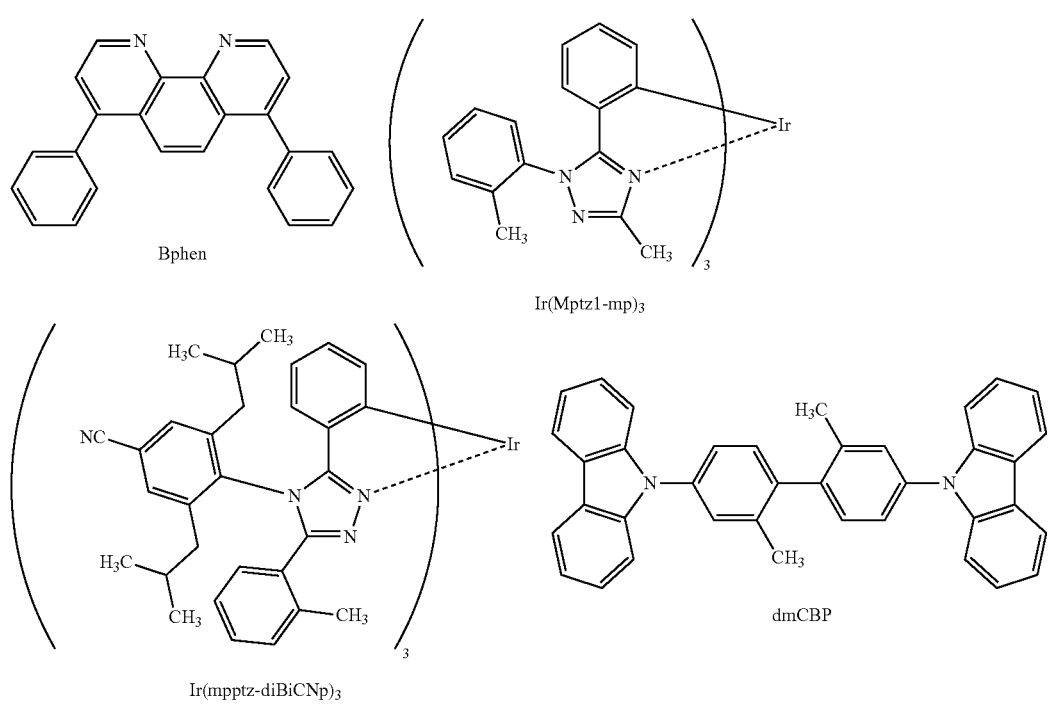
Bphen
Ir(Mptz1-mp)₃
Ir(mpptz-diBiCNp)₃
dmCBP
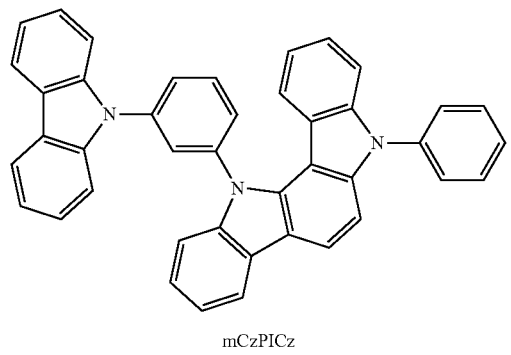
mCzPICz

[Chemical Formula 23]

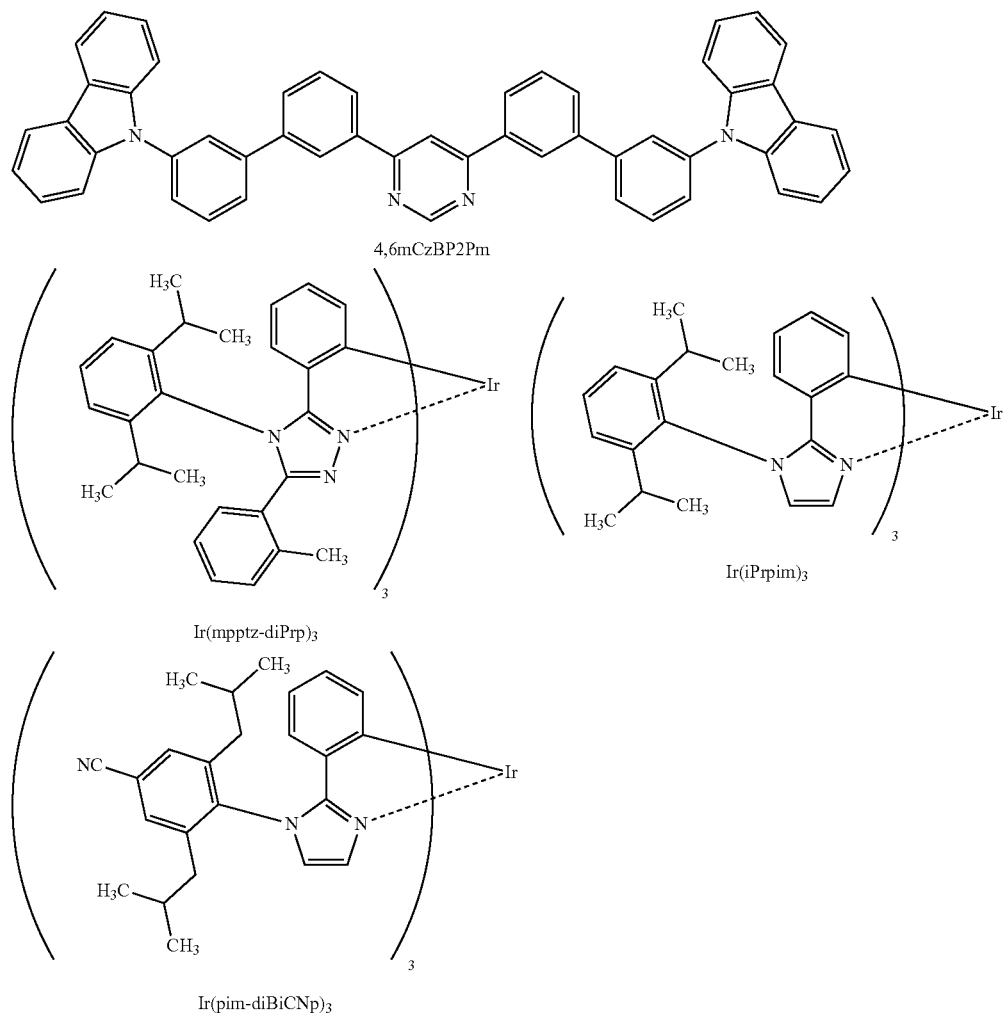

4,6mCzBP2Pm

Ir(mpptz-diPrp)₃

Ir(iPrpim)₃

Ir(pim-diBiCNp)₃

TABLE 1

| | Layer | Reference numeral | Thickness (nm) | Material(s) | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 130(2) | 10 | 4,6mCzP2Pm:PCCP:Ir(mpptz-diBuCNp)₃ | 0.8:0.2:0.125 |
| | Light-emitting layer | 130(1) | 30 | 4,6mCzP2Pm:PCCP:Ir(mpptz-diBuCNp)₃ | 0.4:0.6:0.125 |
| | Hole-transport layer | 112 | 20 | PCCP | — |
| | Hole-injection layer | 111 | 20 | DBT3P-II:MoO₃ | 1:0.5 |
| | Electrode | 101 | 70 | ITSO | — |
| Light-emitting element 2 | Electrode | 102 | 200 | Al | — |
| | Electron-injection layer | 119 | 1 | LiF | — |
| | Electron-transport layer | 118(2) | 15 | BPhen | — |
| | | 118(1) | 10 | mCzP3Pm | — |
| | Light-emitting layer | 130(2) | 20 | mCzP3Pm:PCCP:Ir(mpptz-diBuCNp)₃ | 0.6:0.4:0.06 |

TABLE 1-continued

|  | Layer | Reference numeral | Thickness (nm) | Material(s) | Weight ratio |
|---|---|---|---|---|---|
|  | Light-emitting layer | 130(1) | 20 | mCzP3Pm:PCCP:Ir(mpptz-diBuCNp)₃ | 0.2:0.8:0.06 |
|  | Hole-transport layer | 112 | 20 | PCCP | — |
|  | Hole-injection layer | 111 | 20 | DBT3P-II:MoO₃ | 1:0.5 |
|  | Electrode | 101 | 70 | ITSO | — |
| Light-emitting element 3 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | 4,6mCzP2Pm | — |
|  | Light-emitting layer | 130(2) | 10 | 4,6mCzP2Pm:mCzPICz:Ir(Mptz1-mp)₃ | 0.8:0.2:0.125 |
|  | Light-emitting layer | 130(1) | 30 | 4,6mCzP2Pm:mCzPICz:Ir(Mptz1-mp)₃ | 0.6:0.4:0.125 |
|  | Hole-transport layer | 112 | 20 | dmCBP | — |
|  | Hole-injection layer | 111 | 20 | DBT3P-II:MoO₃ | 1:0.5 |
|  | Electrode | 101 | 70 | ITSO | — |

TABLE 2

|  | Layer | Reference numeral | Thickness (nm) | Material(s) | Weight ratio |
|---|---|---|---|---|---|
| Light-emitting element 4 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | 4,6mCzBP2Pm | — |
|  | Light-emitting layer | 130(2) | 10 | 4,6mCzBP2Pm:PCCP:Ir(mpptz-diPrp)₃ | 0.8:0.2:0.125 |
|  | Light-emitting layer | 130(1) | 30 | 4,6mCzBP2Pm:PCCP:Ir(mpptz-diPrp)₃ | 0.4:0.6:0.125 |
|  | Hole-transport layer | 112 | 20 | PCCP | — |
|  | Hole-injection layer | 111 | 25 | DBT3P-II:MoO₃ | 1:0.5 |
|  | Electrode | 101 | 70 | ITSO | — |
| Light-emitting element 5 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | 4,6mCzP2Pm | — |
|  | Light-emitting layer | 130(2) | 10 | 4,6mCzP2Pm:PCCP:Ir(mpptz-diPrp)₃ | 0.8:0.2:0.125 |
|  | Light-emitting layer | 130(1) | 30 | 4,6mCzP2Pm:PCCP:Ir(mpptz-diPrp)₃ | 0.2:0.8:0.125 |
|  | Hole-transport layer | 112 | 20 | PCCP | — |
|  | Hole-injection layer | 111 | 20 | DBT3P-II:MoO₃ | 1:0.5 |
|  | Electrode | 101 | 70 | ITSO | — |
| Light-emitting element 6 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | 4,6mCzP2Pm | — |
|  | Light-emitting layer | 130(2) | 10 | 4,6mCzP2Pm:PCCP:Ir(pim-diBuCNp)₃ | 0.6:0.4:0.125 |
|  | Light-emitting layer | 130(1) | 30 | 4,6mCzP2Pm:PCCP:Ir(pim-diBuCNp)₃ | 0.2:0.8:0.125 |
|  | Hole-transport layer | 112 | 20 | PCCP | — |
|  | Hole-injection layer | 111 | 20 | DBT3P-II:MoO₃ | 1:0.5 |
|  | Electrode | 101 | 70 | ITSO | — |
| Light-emitting element 7 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | 4,6mCzP2Pm | — |

TABLE 2-continued

| Layer | Reference numeral | Thickness (nm) | Material(s) | Weight ratio |
|---|---|---|---|---|
| Light-emitting layer | 130(2) | 10 | 4,6mCzP2Pm:PCCP:Ir(iPrpim)$_3$ | 0.8:0.2:0.125 |
| Light-emitting layer | 130(1) | 30 | 4,6mCzP2Pm:PCCP:Ir(iPrpim)$_3$ | 0.2:0.8:0.125 |
| Hole-transport layer | 112 | 20 | PCCP | — |
| Hole-injection layer | 111 | 20 | DBT3P-II:MoO$_3$ | 1:0.5 |
| Electrode | 101 | 70 | ITSO | — |

<Fabrication of Light-Emitting Elements>

Methods for fabricating light-emitting elements of this example are described below.

<<Fabrication of Light-Emitting Element 1>>

As the electrode 101, an ITSO film was formed to a thickness of 70 nm over a glass substrate. The electrode area of the electrode 101 was set to 4 mm$^2$ (2 mm×2 mm).

Then, as the hole-injection layer 111, DBT3P-II and molybdenum oxide (MoO$_3$) were deposited over the electrode 101 by co-evaporation in a weight ratio of DBT3P-II:MoO$_3$=1:0.5 to a thickness of 20 nm.

Next, as the hole-transport layer 112, PCCP was deposited over the hole-injection layer 111 by evaporation to a thickness of 20 nm.

Then, as the light-emitting layer 130 over the hole-transport layer 112, 4,6mCzP2Pm, PCCP, and tris{2-[4-(4-cyano-2,6-diisobutylphenyl)-5-(2-methylphenyl)-4H-1,2,4-triazol-3-yl-κN$^2$]phenyl-κC}iridium(III) (abbreviation: Ir(mpptz-diBuCNp)$_3$) were deposited by co-evaporation in a weight ratio of 4,6mCzP2Pm: PCCP: Ir(mpptz-diBuCNp)$_3$=0.4:0.6:0.125 to a thickness of 30 nm, and successively, 4,6mCzP2Pm, PCCP, and Ir(mpptz-diBuCNp)$_3$ were deposited by co-evaporation in a weight ratio of 4,6mCzP2Pm: PCCP: Ir(mpptz-diBuCNp)$_3$=0.8:0.2:0.125 to a thickness of 10 nm. In the light-emitting layer 130, Ir(mpptz-diBuCNp)$_3$ is the guest material (first organic compound), 4,6mCzP2Pm is the host material (second organic compound), and PCCP is the host material (third organic compound).

Next, as the electron-transport layer 118, 4,6mCzP2Pm and BPhen were sequentially deposited over the light-emitting layer 130 by evaporation to thicknesses of 10 nm and 15 nm, respectively. Then, as the electron-injection layer 119, LiF was deposited over the electron-transport layer 118 by evaporation to a thickness of 1 nm.

Then, as the electrode 102, aluminum (Al) was deposited over the electron-injection layer 119 to a thickness of 200 nm.

Next, in a glove box containing a nitrogen atmosphere, the light-emitting element 1 was sealed by fixing a glass substrate for sealing to a glass substrate on which the organic materials were deposited using a sealant for an organic EL device. Specifically, after the sealant was applied to surround the organic materials deposited on the glass substrate and these glass substrates were bonded to each other, irradiation with ultraviolet light having a wavelength of 365 nm at 6 J/cm$^2$ and heat treatment at 80° C. for one hour were performed. Through the process, the light-emitting element 1 was obtained.

<<Fabrication of Light-Emitting Element 2>>

The light-emitting element 2 was fabricated through the same steps as those for the light-emitting element 1 except for the steps of forming the light-emitting layer 130 and the electron-transport layer 118.

As the light-emitting layer 130 of the light-emitting element 2, 2,4,6-tris[3-(9H-carbazol-9-yl)phenyl]pyrimidine (abbreviation: mCzP3Pm), PCCP, and Ir(mpptz-diBuCNp)$_3$ were deposited by co-evaporation such that the deposited layer had a weight ratio of mCzP3Pm: PCCP: Ir(mpptz-diBuCNp)$_3$=0.2:0.8:0.06 and a thickness of 20 nm, and then, mCzP3Pm, PCCP, and Ir(mpptz-diBuCNp)$_3$ were deposited by co-evaporation such that the deposited layer had a weight ratio of mCzP3Pm: PCCP: Ir(mpptz-diBuCNp)$_3$=0.6:0.4:0.06 and a thickness of 20 nm. In the light-emitting layer 130, Ir(mpptz-diBuCNp)$_3$ is the guest material (first organic compound), mCzP3Pm is the host material (second organic compound), and PCCP is the host material (third organic compound).

Next, as the electron-transport layer 118, mCzP3Pm and BPhen were sequentially deposited over the light-emitting layer 130 by evaporation to thicknesses of 10 nm and 15 nm, respectively.

<<Fabrication of Light-Emitting Element 3>>

The light-emitting element 3 was fabricated through the same steps as those for the light-emitting element 1 except for the steps of forming the hole-transport layer 112 and the light-emitting layer 130.

As the hole-transport layer 112 of the light-emitting element 3, 4,4'-bis(9-carbazole)-2,2'-dimethylbiphenyl (abbreviation: dmCBP) was deposited by evaporation to a thickness of 20 nm.

Next, as the light-emitting layer 130 over the hole-transport layer 112, 4,6mCzP2Pm, 12-[3-(9H-carbazol-9-yl)phenyl]-5,12-dihydro-5-phenyl-indolo[3,2-a]carbazole (abbreviation: mCzPICz), and tris[3-methyl-1-(2-methylphenyl)-5-phenyl-1H-1,2,4-triazolato]iridium(III) (abbreviation: Ir(Mptz1-mp)$_3$) were deposited by co-evaporation in a weight ratio of 4,6mCzP2Pm: mCzPICz: Ir(Mptz1-mp)$_3$=0.6:0.4:0.125 to a thickness of 30 nm, and successively, 4,6mCzP2Pm, mCzPICz, and Ir(Mptz1-mp)$_3$ were deposited by co-evaporation in a weight ratio of 4,6mCzP2Pm: mCzPICz: Ir(Mptz1-mp)$_3$=0.8:0.2:0.125 to a thickness of 10 nm. In the light-emitting layer 130, Ir(Mptz1-mp)$_3$ is the guest material (first organic compound), 4,6mCzP2Pm is the host material (second organic compound), and mCzPICz is the host material (third organic compound).

<<Fabrication of Light-Emitting Element 4>>

The light-emitting element 4 was fabricated through the same steps as those for the light-emitting element 1 except for the steps of forming the hole-injection layer 111, the light-emitting layer 130, and the electron-transport layer 118.

As the hole-injection layer 11 of the light-emitting element 4, DBT3P-II and MoO$_3$ were deposited by co-evaporation such that the deposited layer had a weight ratio of DBT3P-II: MoO$_3$=1:0.5 to a thickness of 25 nm.

As the light-emitting layer 130, 9,9'-[pyrimidine-4,6-diyl-bis(biphenyl-3,3'-diyl)]bis(9H-carbazole) (abbreviation: 4,6mCzBP2Pm), PCCP, and tris{2-[5-(2-methylphenyl)-4-(2,6-diisopropylphenyl)-4H-1,2,4-triazol-3-yl-κN²]phenyl-κC}iridium(III) (abbreviation: Ir(mpptz-diPrp)₃) were deposited over the hole-transport layer 112 by co-evaporation in a weight ratio of 4,6mCzBP2Pm: PCCP: Ir(mpptz-diPrp)₃=0.4:0.6:0.125 to a thickness of 30 nm, and successively, 4,6mCzBP2Pm, PCCP, and Ir(mpptz-diPrp)₃ were deposited by co-evaporation in a weight ratio of 4,6mCzBP2Pm: PCCP: Ir(mpptz-diPrp)₃=0.8:0.2:0.125 to a thickness of 10 nm. In the light-emitting layer 130, Ir(mpptz-diPrp)₃ is the guest material (first organic compound), 4,6mCzBP2Pm is the host material (second organic compound), and PCCP is the host material (third organic compound).

Then, as the electron-transport layer 118, 4,6mCzBP2Pm and Bphen were sequentially deposited over the light-emitting layer 130 by evaporation to thicknesses of 10 nm and 15 nm, respectively.

<<Fabrication of Light-Emitting Elements 5 to 7>>

The light-emitting elements 5 to 7 were fabricated through the same steps as those for the light-emitting element 1 except for the step of forming the light-emitting layer 130.

As the light-emitting layer 130 in the light-emitting element 5, 4,6mCzP2Pm, PCCP, and Ir(mpptz-diPrp)₃ were deposited by co-evaporation in a weight ratio of 4,6mCzP2Pm: PCCP: Ir(mpptz-diPrp)₃=0.2:0.8:0.125 to a thickness of 30 nm, and successively, 4,6mCzP2Pm, PCCP, and Ir(mpptz-diPrp)₃ were deposited by co-evaporation in a weight ratio of 4,6mCzP2Pm: PCCP: Ir(mpptz-diPrp)₃=0.8:0.2:0.125 to a thickness of 10 nm. In the light-emitting layer 130, Ir(mpptz-diPrp)₃ is the guest material (first organic compound), 4,6mCzP2Pm is the host material (second organic compound), and PCCP is the host material (third organic compound).

As the light-emitting layer 130 of the light-emitting element 6, 4,6mCzP2Pm, PCCP, and tris {2-[1-(4-cyano-2,6-diisobutylphenyl)-1H-imidazol-2-yl-κN³]phenyl-κC}iridium(III) (abbreviation: Ir(pim-diBuCNp)₃) were deposited by co-evaporation in a weight ratio of 4,6mCzP2Pm: PCCP: Ir(pim-diBuCNp)₃=0.2:0.8:0.125 to a thickness of 30 nm, and successively, 4,6mCzP2Pm, PCCP, and Ir(pim-diBuCNp)₃ were deposited by co-evaporation in a weight ratio of 4,6mCzP2Pm: PCCP: Ir(pim-diBuCNp)₃=0.6:0.4:0.06 to a thickness of 10 nm. In the light-emitting layer 130, Ir(pim-diBuCNp)₃ is the guest material (first organic compound), 4,6mCzP2Pm is the host material (second organic compound), and PCCP is the host material (third organic compound).

As the light-emitting layer 130 of the light-emitting element 7, 4,6mCzP2Pm, PCCP, and tris {2-[1-(2,6-diisopropylphenyl)-1H-imidazol-2-yl-κN³]phenyl-κC}iridium (III) (abbreviation: Ir(iPrpim)₃) were deposited by co-evaporation in a weight ratio of 4,6mCzP2Pm: PCCP: Ir(iPrpim)₃=0.2:0.8:0.125 to a thickness of 30 nm, and successively, 4,6mCzP2Pm, PCCP, and Ir(mpptz-diBuCNp)₃ were deposited by co-evaporation in a weight ratio of 4,6mCzP2Pm: PCCP: Ir(iPrpim)₃=0.8:0.2:0.125 to a thickness of 10 nm. In the light-emitting layer 130, Ir(iPrpim)₃ is the guest material (first organic compound), 4,6mCzP2Pm is the host material (second organic compound), and PCCP is the host material (third organic compound).

<Characteristics of Light-Emitting Elements>

Next, the characteristics of the fabricated light-emitting elements 1 to 7 were measured. For measuring the luminance and the CIE chromaticity, a luminance colorimeter (BM-5A produced by TOPCON TECHNOHOUSE CORPORATION) was used. For measuring the electroluminescence spectrum, a multi-channel spectrometer (PMA-11 produced by Hamamatsu Photonics K.K.) was used.

Figure 15A:
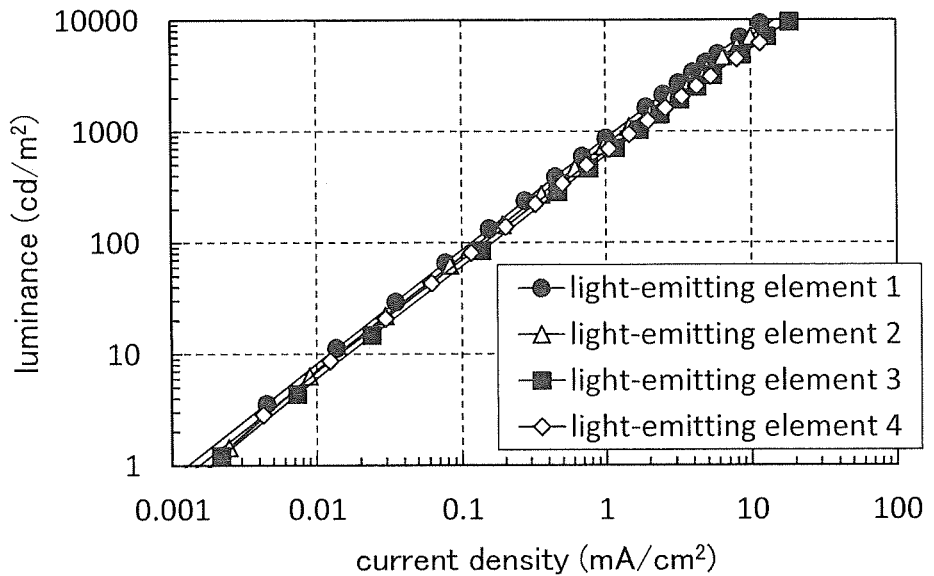
FIGS. 15A and 15B show the luminance-current density characteristics of light-emitting elements in Example.
Figure 15B:
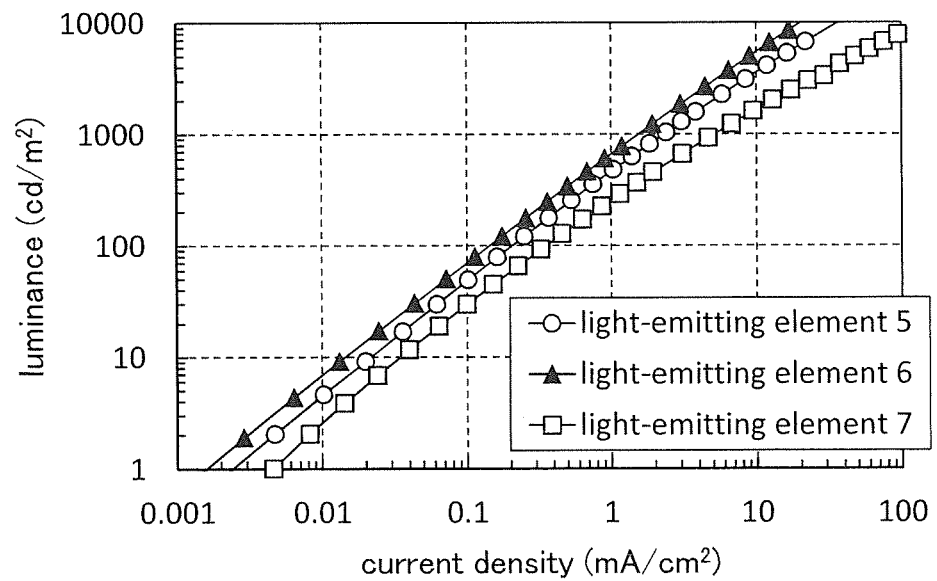
Figure 16A:
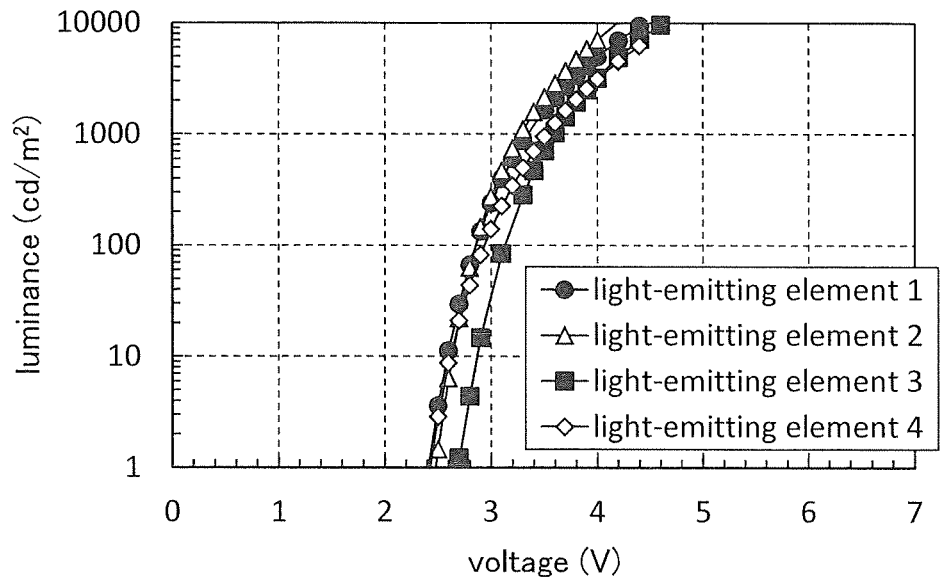
FIGS. 16A and 16B show the luminance-voltage characteristics of light-emitting elements in Example.
Figure 16B:
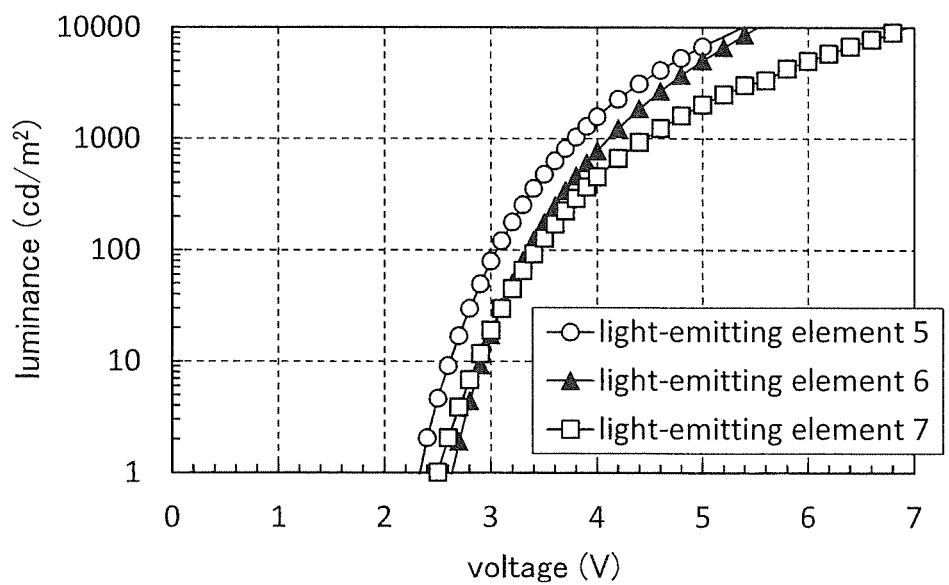
Figure 17A:
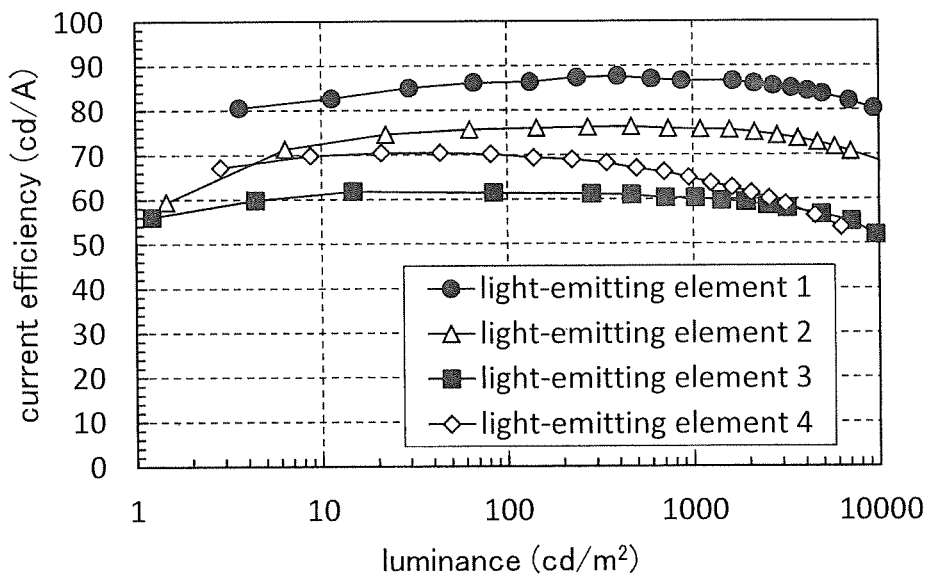
FIGS. 17A and 17B show the current efficiency-luminance characteristics of light-emitting elements in Example.
Figure 17B:
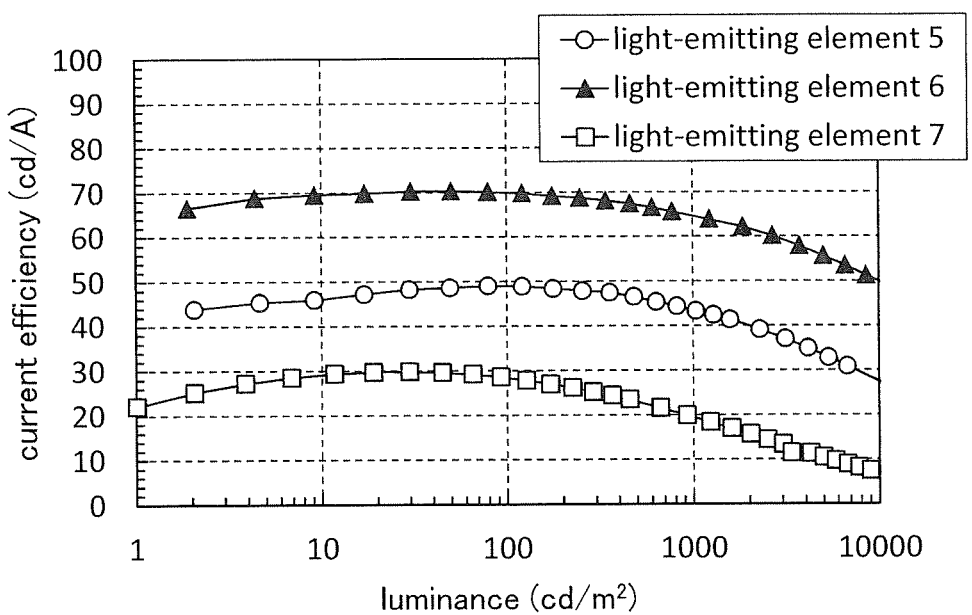
Figure 18A:
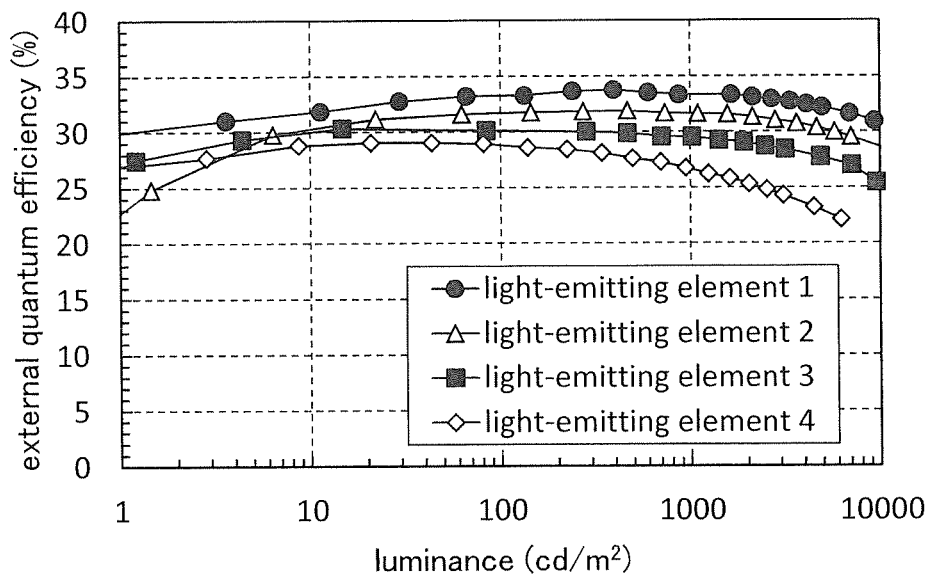
FIGS. 18A and 18B show the external quantum efficiency-luminance characteristics of light-emitting elements in Example.
Figure 18B:
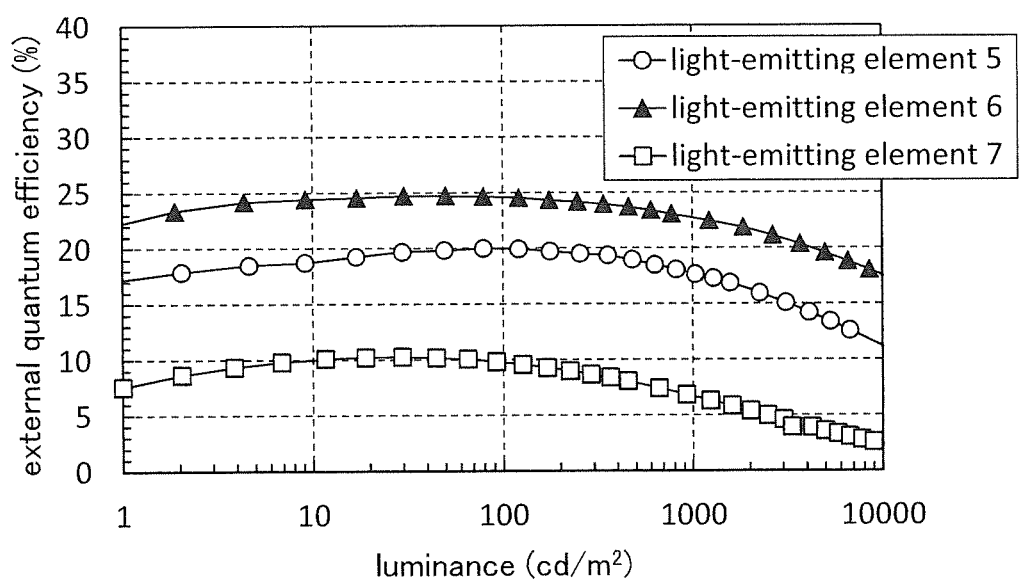
Figure 19A:
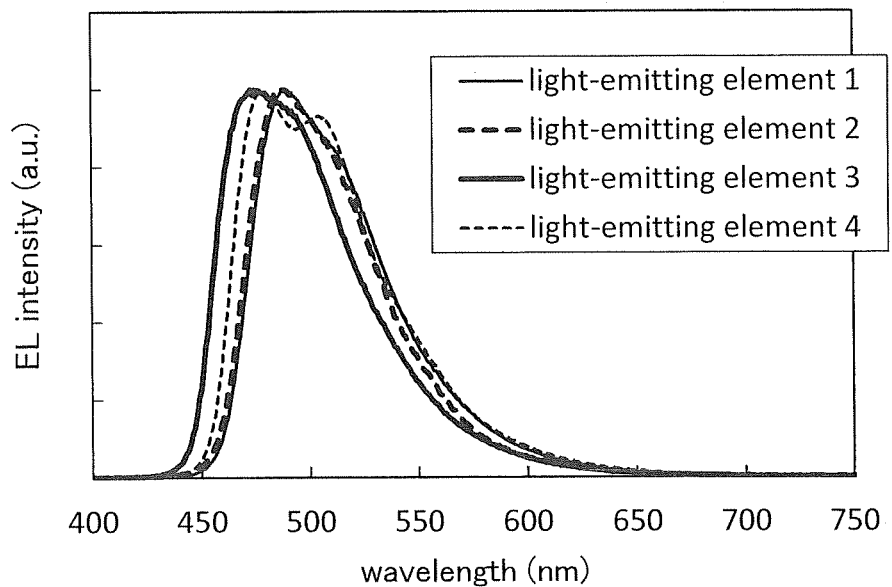
FIGS. 19A and 19B show the electroluminescence spectra of light-emitting elements in Example.
Figure 19B:
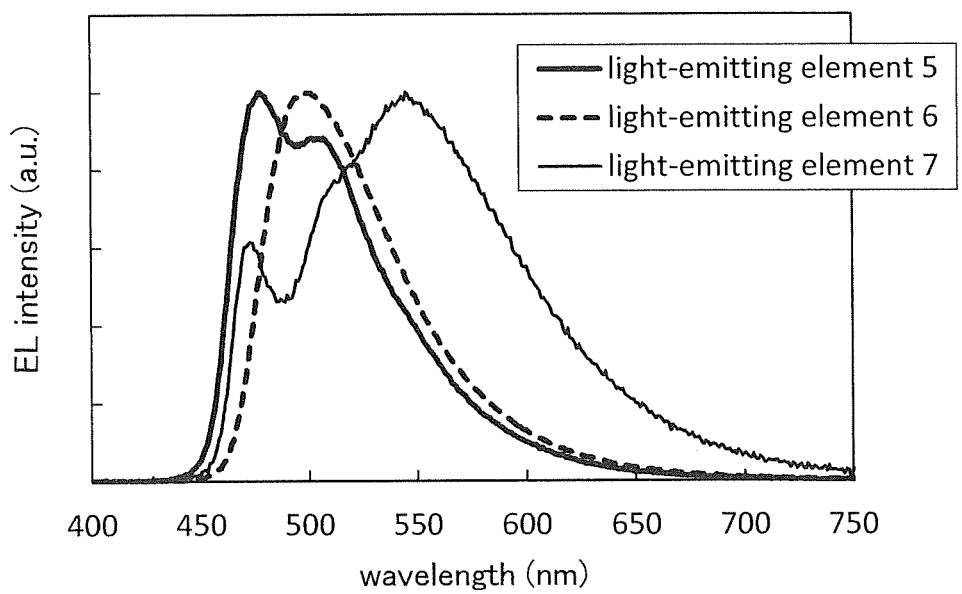

FIGS. 15A and 15B show luminance-current density characteristics of the light-emitting elements 1 to 7. FIGS. 16A and 16B show luminance-voltage characteristics thereof. FIGS. 17A and 17B show current efficiency-luminance characteristics thereof. FIGS. 18A and 18B show external quantum efficiency-luminance characteristics thereof. FIGS. 19A and 19B show electroluminescence spectra of the light-emitting elements 1 to 7 to which a current at a current density of 2.5 mA/cm² was supplied. The measurements of the light-emitting elements were performed at room temperature (in an atmosphere kept at 23° C.).

Table 3 shows element characteristics of the light-emitting elements 1 to 7 at around 1000 cd/m².

TABLE 3

|  | Voltage (V) | Current density (mA/cm²) | CIE chromaticity (x, y) | Luminance (cd/m²) | Current efficiency (cd/A) | Power efficiency (lm/W) | External quantum efficiency (%) |
| --- | --- | --- | --- | --- | --- | --- | --- |
| Light-emitting element 1 | 3.30 | 1.01 | (0.197, 0.496) | 870 | 86.6 | 82.4 | 33.4 |
| Light-emitting element 2 | 3.30 | 1.45 | (0.179, 0.475) | 1100 | 75.7 | 72.1 | 31.6 |
| Light-emitting element 3 | 3.60 | 1.71 | (0.168, 0.340) | 1030 | 60.3 | 52.6 | 29.5 |
| Light-emitting element 4 | 3.50 | 1.46 | (0.193, 0.438) | 950 | 64.9 | 58.3 | 26.8 |
| Light-emitting element 5 | 3.80 | 2.39 | (0.203, 0.434) | 1040 | 43.3 | 35.8 | 17.7 |
| Light-emitting element 6 | 4.00 | 1.18 | (0.234, 0.554) | 780 | 65.6 | 51.6 | 23.1 |
| Light-emitting element 7 | 4.40 | 4.66 | (0.341, 0.511) | 930 | 19.9 | 14.2 | 6.8 |

The peak wavelengths on the shortest wavelength side of the electroluminescence spectra of the light-emitting elements 1 to 7 are 489 nm, 485 nm, 473 nm, 478 nm, 477 nm, 498 nm, and 472 nm, respectively, which are in the blue wavelength range. The light emission originates from the guest material. The full widths at half maximum of the electroluminescence spectra of the light-emitting elements 1 to 7 are 66 nm, 64 nm, 70 nm, 71 nm, 75 nm, 70 nm, and 137 nm, respectively, and the electroluminescence spectra of the light-emitting elements 3 to 7 have spectrum shapes broader than those of the light-emitting elements 1 and 2. In particular, the electroluminescence spectrum of the light-emitting element 7 has a broad spectrum shape, and indicates light emission attributed to Ir(iPrpim)$_3$, which is the guest material, and broad light emission in a wavelength range of green to yellow.

Furthermore, the light emission start voltages (voltages at a luminance higher than 1 cd/m$^2$) of the light-emitting elements 1 to 7 are 2.5 V, 2.5 V, 2.7 V, 2.5 V, 2.4 V, 2.7 V, and 2.5 V, respectively. This voltage is smaller than a voltage corresponding to an energy difference between the LUMO level and the HOMO level of the guest material of each of the light-emitting elements, which is described later. The results suggest that in the light-emitting elements 1 to 7, carriers are not directly recombined in the guest material but are recombined in the material having a smaller energy gap.

The driving voltages in a high luminance region of the light-emitting elements 1 to 4 are lower than those of the light-emitting elements 5 and 6. The light-emitting elements 1 and 2 have low driving voltage and high current efficiency, and thus have high power efficiency.

The maximum external quantum efficiencies of the light-emitting elements 1 to 7 are 33.8%, 31.9%, 30.3%, 29.1%, 20.0%, 24.7%, and 10.3%, respectively, and the light-emitting elements 1 to 4 have high external quantum efficiency exceeding 25%.

<Results of CV Measurement>

The electrochemical characteristics (oxidation reaction characteristics and reduction reaction characteristics) of the compounds used in the fabricated light-emitting elements were measured by cyclic voltammetry (CV) measurement. Note that an electrochemical analyzer (ALS model 600A or 600C, product of BAS Inc.) was used for the measurement. In the measurements, the potential of a working electrode with respect to the reference electrode was changed within an appropriate range, so that the oxidation peak potential and the reduction peak potential were each obtained. In addition, the HOMO and LUMO levels of each compound were calculated from the estimated redox potential of the reference electrode of −4.94 eV and the obtained peak potentials.

For the measurement of oxidation reaction characteristics and reduction reaction characteristics of 4,6mCzP2Pm, mCzP3Pm, 4,6mCzBP2Pm, PCCP, and mCzPICz, which are the host materials (the second organic compound and the third organic compound), a solution obtained by dissolving each compound in N,N-dimethylformamide (abbreviation: DMF) was used. In general, the relative dielectric constant of an organic compound used in an organic EL element is approximately 3. Thus, when DMF, which is a high polarity solvent (relative dielectric constant: 38), is used for measurement of oxidation reaction characteristics of a compound with a relatively high polarity (in particular, a compound including a substituent with a high electron-withdrawing property) such as afac-type iridium complex, the accuracy might be decreased. For this reason, in this example, for Ir(mpptz-diBuCNp)$_3$, Ir(Mptz1-mp)$_3$, Ir(mpptz-diPrp)$_3$, Ir(pim-diBuCNp)$_3$, and Ir(iPrpim)$_3$, which are the guest materials (the first organic compound), a solution obtained by dissolving each compound in chloroform with a low polarity (relative dielectric constant: 4.8) was used for the measurement of oxidation reaction characteristics. For the measurement of reduction reaction characteristics of the guest materials, a solution obtained by dissolving each compound in DMF was used.

Table 4 shows oxidation potentials and reduction potentials of the compounds obtained from the results of the CV measurement and HOMO levels and LUMO levels of the compounds calculated from the results of the CV measurement. Note that the LUMO level of Ir(iPrpim)$_3$ was probably high because the reduction potential of Ir(iPrpim)$_3$ was low and a clear reduction peak potential was not observed.

TABLE 4

| Abbreviation | Oxidation potential (V) | Reduction potential (V) | HOMO level calculated from oxidation potential (eV) | LUMO level calculated from reduction potential (eV) |
|---|---|---|---|---|
| Ir(mpptz-diBuCNp)$_3$ | 0.46 | −2.46 | −5.40 | −2.49 |
| Ir(Mptz1-mp)$_3$ | 0.60 | −2.76 | −5.54 | −2.19 |
| Ir(mpptz-diPrp)$_3$ | 0.30 | −2.98 | −5.24 | −1.96 |
| Ir(pim-diBuCNp)$_3$ | 0.28 | −2.54 | −5.22 | −2.41 |
| Ir(iPrpim)$_3$ | 0.15 | — | −5.09 | — |
| 4,6mCzP2Pm | 0.95 | −2.06 | −5.89 | −2.88 |
| mCzP3Pm | 0.95 | −2.03 | −5.89 | −2.91 |
| 4,6mCzBP2Pm | 0.95 | −2.14 | −5.89 | −2.80 |
| PCCP | 0.69 | −2.98 | −5.63 | −1.96 |
| mCzPICz | 0.68 | −3.00 | −5.62 | −1.95 |

As shown in Table 4, the HOMO levels of the first organic compounds (Ir(mpptz-diBuCNp)$_3$, Ir(Mptz1-mp)$_3$, Ir(mpptz-diPrp)$_3$, Ir(pim-diBuCNp)$_3$, and Ir(iPrpim)$_3$), which are the guest materials, are higher than or equal to those of the second organic compounds (4,6mCzP2Pm, mCzP3Pm, and 4,6mCzBP2Pm), which are the host materials. The LUMO levels of the first organic compounds (Ir(mpptz-diBuCNp)$_3$, Ir(Mptz1-mp)$_3$, Ir(mpptz-diPrp)$_3$, Ir(pim-diBuCNp)$_3$, and Ir(iPrpim)$_3$) are higher than or equal to those of the second organic compounds (4,6mCzP2Pm, mCzP3Pm, and 4,6mCzBP2Pm). Thus, in the case where the compounds are used for a light-emitting layer as in the light-emitting elements 1 to 7, electrons and holes that are carriers injected from a pair of electrodes are efficiently injected to the second organic compound (host material) and the first organic compound (guest material); thus, the combination of the second organic compound (host material) and the first organic compound (guest material) can form an exciplex.

In this case, in an exciplex formed by the first organic compound (Ir(mpptz-diBuCNp)$_3$, Ir(Mptz1-mp)$_3$, Ir(mpptz-diPrp)$_3$, Ir(pim-diBuCNp)$_3$, or Ir(iPrpim)$_3$) and the second organic compound (4,6mCzP2Pm, mCzP3Pm, or 4,6mCzBP2Pm) has the LUMO level in the second organic compound and the HOMO level in the first organic compound.

<Emission Spectra 1 of Thin Films>

Here, thin film samples including the first organic compounds (guest materials) and the second organic compounds (host materials) used for the light-emitting elements 1 to 7 were fabricated, and the emission spectra of the thin films were measured. Furthermore, for comparison, comparative thin film samples including 35DCzPPy, which is an organic compound having a high LUMO level, and the first organic compounds (guest materials) were fabricated.

As a thin film 1, 4,6mCzP2Pm and Ir(mpptz-diBuCNp)$_3$ were deposited over a quartz substrate by co-evaporation in a weight ratio of 4,6mCzP2Pm: Ir(mpptz-diBuCNp)$_3$=1: 0.125 to a thickness of 50 nm. That is, the thin film 1 includes the compound used for the light-emitting layer 130 of the light-emitting element 1.

As a thin film 2, mCzP3Pm and Ir(mpptz-diBuCNp)$_3$ were deposited over a quartz substrate by co-evaporation in a weight ratio of mCzP3Pm: Ir(mpptz-diBuCNp)$_3$=1:0.125 to a thickness of 50 nm. That is, the thin film 2 includes the compound used for the light-emitting layer 130 of the light-emitting element 2.

As a comparative thin film 1, 35DCzPPy and Ir(mpptz-diBuCNp)$_3$ were deposited over a quartz substrate by co-evaporation in a weight ratio of 35DCzPPy: Ir(mpptz-diBuCNp)$_3$=1:0.125 to a thickness of 50 nm.

As a thin film 3, 4,6mCzP2Pm and Ir(Mptz1-mp)$_3$ were deposited over a quartz substrate by co-evaporation in a weight ratio of 4,6mCzP2Pm: Ir(Mptz1-mp)$_3$=1:0.125 to a thickness of 50 nm. That is, the thin film 3 includes the compound used for the light-emitting layer 130 of the light-emitting element 3.

As a comparative thin film 2, 35DCzPPy and Ir(Mptz1-mp)$_3$ were deposited over a quartz substrate by co-evaporation in a weight ratio of 35DCzPPy: Ir(Mptz1-mp)$_3$=1: 0.125 to a thickness of 50 nm.

As a thin film 4, 4,6mCzBP2Pm and Ir(mpptz-diPrp)$_3$ were deposited over a quartz substrate by co-evaporation in a weight ratio of 4,6mCzBP2Pm: Ir(mpptz-diPrp)$_3$=1:0.125 to a thickness of 50 nm. That is, the thin film 4 includes the compound used for the light-emitting layer 130 of the light-emitting element 4.

As a thin film 5, 4,6mCzP2Pm and Ir(mpptz-diPrp)$_3$ were deposited over a quartz substrate by co-evaporation in a weight ratio of 4,6mCzP2Pm: Ir(mpptz-diPrp)$_3$=1:0.125 to a thickness of 50 nm. That is, the thin film 5 includes the compound used for the light-emitting layer 130 of the light-emitting element 5.

As a comparative thin film 3, 35DCzPPy and Ir(mpptz-diPrp)$_3$ were deposited over a quartz substrate by co-evaporation in a weight ratio of 35DCzPPy: Ir(mpptz-diPrp)$_3$=1: 0.125 to a thickness of 50 nm.

As a thin film 6, 4,6mCzBP2Pm and Ir(pim-diBuCNp)$_3$ were deposited over a quartz substrate by co-evaporation in a weight ratio of 4,6mCzBP2Pm: Ir(pim-diBuCNp)$_3$=1: 0.125 to a thickness of 50 nm. That is, the thin film 6 includes the compound used for the light-emitting layer 130 of the light-emitting element 6.

As a comparative thin film 4, 35DCzPPy and Ir(pim-diBuCNp)$_3$ were deposited over a quartz substrate by co-evaporation in a weight ratio of 35DCzPPy: Ir(pim-diBuCNp)$_3$=1:0.125 to a thickness of 50 nm.

As a thin film 7, 4,6mCzP2Pm and Ir(iPrpim)$_3$ were deposited over a quartz substrate by co-evaporation in a weight ratio of 4,6mCzP2Pm: Ir(iPrpim)$_3$=1:0.125 to a thickness of 50 nm. That is, the thin film 7 includes the compound used for the light-emitting layer 130 of the light-emitting element 7.

As a comparative thin film 5, 35DCzPPy and Ir(iPrpim)$_3$ were deposited over a quartz substrate by co-evaporation in a weight ratio of 35DCzPPy: Ir(iPrpim)$_3$=1:0.125 to a thickness of 50 nm.

The emission spectra of the fabricated thin films 1 to 7 and the fabricated comparative thin films 1 to 5 were measured. The emission spectra were measured with an absolute quantum yield measurement system C9920-02 produced by Hamamatsu Photonics K.K, and the wavelength of the irradiated excitation light was 250 nm. The measurement was performed at room temperature (in an atmosphere kept at 23° C.). Measurement results are shown in FIGS. 20A and 20B, FIGS. 21A and 21B, FIGS. 22A and 22B, FIGS. 23A and 23B, FIGS. 24A and 24B, FIGS. 25A and 25B, and FIGS. 26A and 26B.

Note that the LUMO level and the HOMO level of 35DCzPPy were measured by a method similar to the above-described method. The LUMO level was −2.39 eV and the HOMO level was −5.90 eV Accordingly, the LUMO level of 35DCzPPy is substantially the same as that of any of the first organic compounds (Ir(mpptz-diBuCNp)$_3$, Ir(Mptz1-mp)$_3$, Ir(mpptz-diPrp)$_3$, Ir(pim-diBuCNp)$_3$, and Ir(iPrpim)$_3$); therefore, it can be said that a combination of 35DCzPPy and any of the first organic compounds (Ir (mpptz-diBuCNp)$_3$, Ir(Mptz1-mp)$_3$, Ir(mpptz-diPrp)$_3$, Ir(pim-diBuCNp)$_3$, and Ir(iPrpim)$_3$) does not easily form an exciplex. Thus, it can be said that light emission from the fabricated comparative thin films 1 to 5 does not include light emission from the exciplex formed by 35DCzPPy and the first organic compound, and includes light emission from the first organic compound.

Figure 20A:
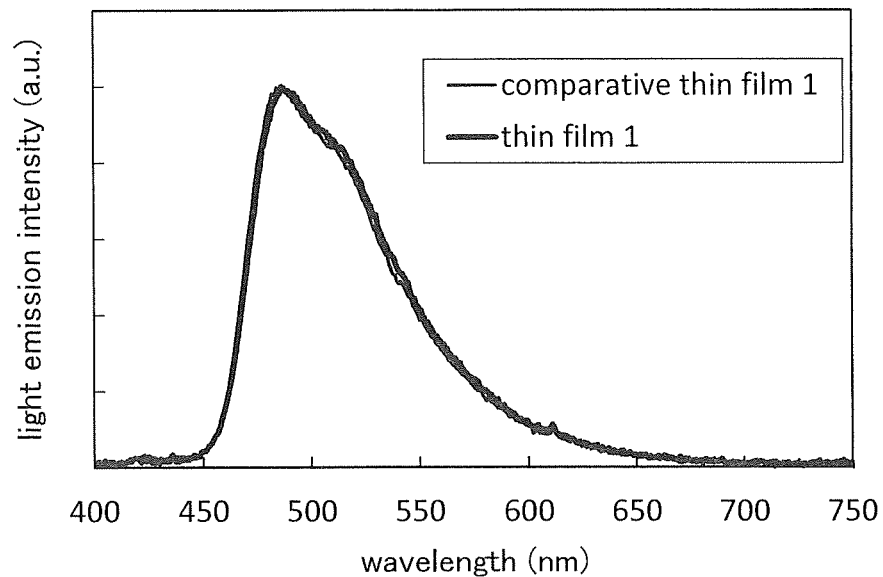
FIGS. 20A and 20B show emission spectra of a thin film in Example.
Figure 21A:
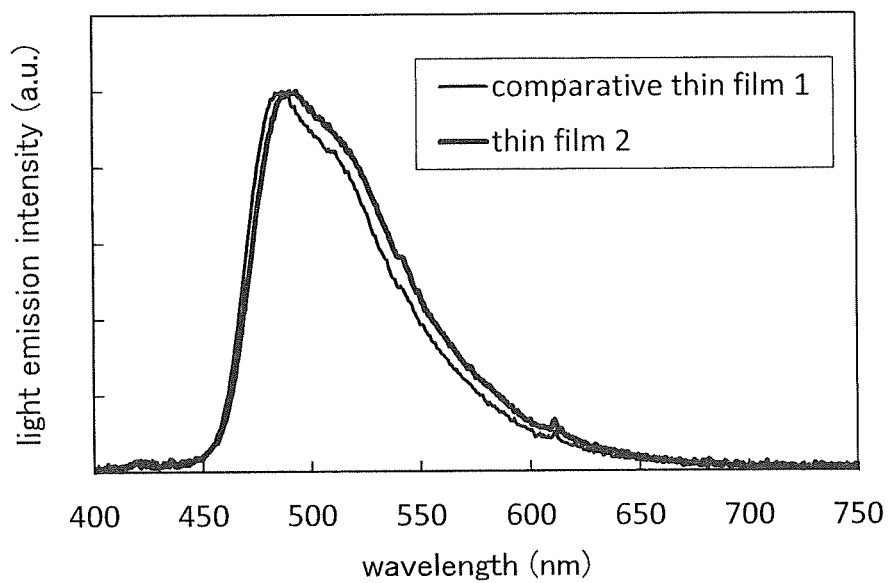
FIGS. 21A and 21B show emission spectra of a thin film in Example.

Emission spectra were measured, and as shown in FIG. 20A and FIG. 21A, in the comparative thin film 1, the emission spectrum of blue light from Ir(mpptz-diBuCNp)$_3$, which is a phosphorescent compound, was observed. In the emission spectra of the thin film 1 and the thin film 2, emission spectra slightly shifted to a longer wavelength side than the emission spectrum of the comparative thin film 1 were observed.

Figure 20B:
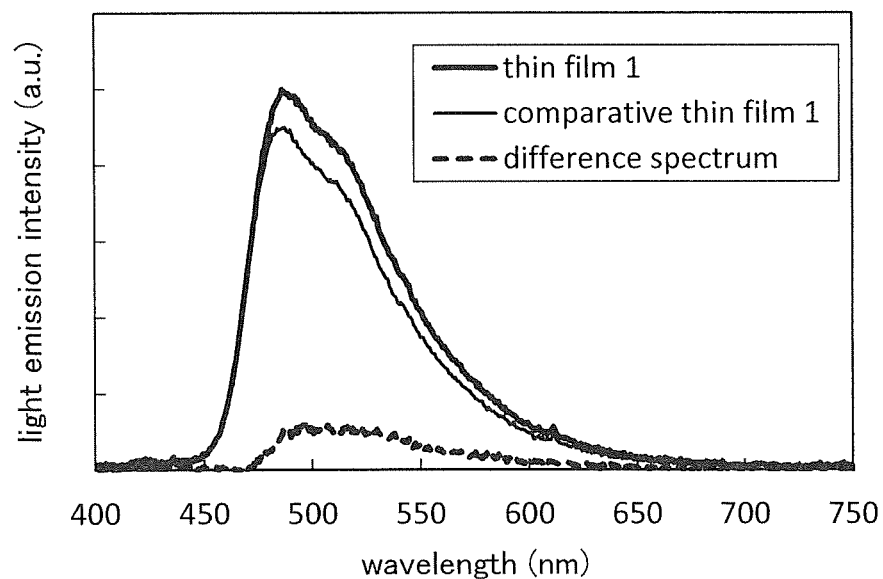
Figure 21B:
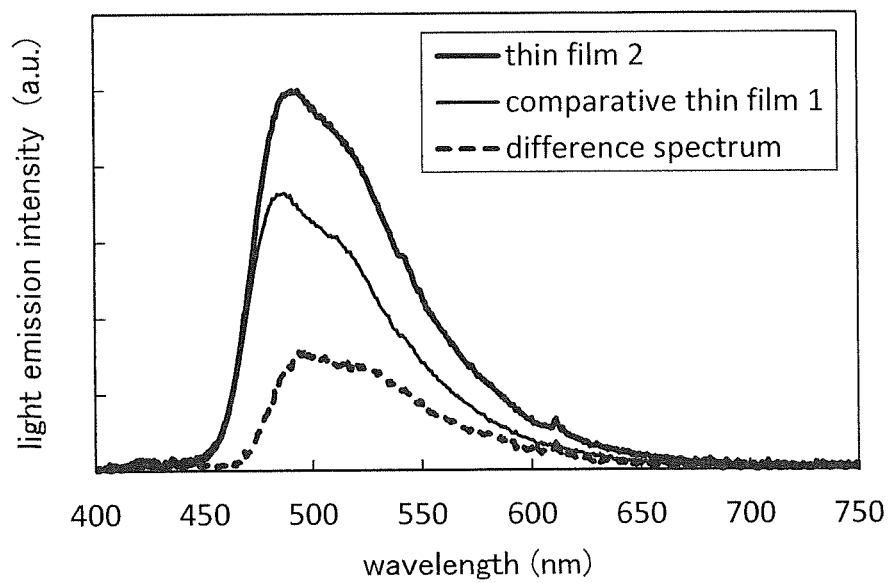

Next, difference spectra obtained by subtracting the emission spectrum of the comparative thin film 1 from the emission spectrum of each of the thin film 1 and the thin film 2 are shown in FIG. 20B and FIG. 21B. As a result, it was found that light emission from the thin film 1 and light emission from the thin film 2 have peak wavelengths of 486 nm and 494 nm, respectively, in addition to a peak wavelength of 487 nm attributed to Ir(mpptz-diBuCNp)$_3$. The percentages (area ratios) of the difference spectra with respect to the emission spectra of the thin film 1 and the thin film 2 (the spectrum of the thin film 1–the spectrum of the comparative thin film 1 and the spectrum of the thin film 2–the spectrum of the comparative thin film 1) are 10.1% and 34.0%, respectively.

The CV measurement results show that the combination of Ir(mpptz-diBuCNp)$_3$ (first organic compound) and 4,6mCzP2Pm (second organic compound) forms an exciplex. The energy difference between the LUMO level of 4,6mCzP2Pm and the HOMO level of Ir(mpptz-diBuCNp)$_3$ is 2.52 eV. This energy difference substantially corresponds to light emission energy (2.55 eV) calculated from the peak wavelength of the difference spectrum with respect to the thin film 1, which is shown in FIG. 20B. Thus, it can be said that the emission spectrum observed in the thin film 1 includes light emission attributed to the first organic compound and in addition, light emission attributed to the exciplex formed by the first organic compound and the second organic compound.

The electroluminescence spectrum of the light-emitting element 1 in FIG. 19A substantially corresponds to that of the thin film 1 in FIG. 20A. Accordingly, it can be said that the electroluminescence spectrum of the light-emitting element 1 includes light emission attributed to the exciplex formed by the first organic compound (Ir(mpptz-diBuCNp)$_3$) and the second organic compound (4,6mCzP2Pm) and light emission attributed to Ir(mpptz-diBuCNp)$_3$. In the exciplex, the difference between the S1 level and the T1 level is small; thus, the emission energy of the exciplex can be regarded as energy of each of the S1 level and the T1 level of the exciplex (2.55 eV).

The energy difference (2.52 eV) between the LUMO level of 4,6mCzP2Pm and the HOMO level of Ir(mpptz-diBuCNp)$_3$ is smaller than the energy difference (2.92 eV) between the LUMO level and the HOMO level of Ir(mpptz-diBuCNp)$_3$. Therefore, carriers can be recombined by the exciplex formed by the first organic compound (Ir(mpptz-diBuCNp)$_3$) and the second organic compound (4,6mCzP2Pm) without the direct carrier recombination in the first organic compound (Ir(mpptz-diBuCNp)$_3$), whereby the driving voltage of the light-emitting element can be lowered.

The CV measurement results show that the combination of Ir(mpptz-diBuCNp)$_3$ (first organic compound) and mCzP3Pm (second organic compound) forms an exciplex. The energy difference between the LUMO level of mCzP3Pm and the HOMO level of Ir(mpptz-diBuCNp)$_3$ is 2.49 eV This energy difference substantially corresponds to light emission energy (2.51 eV) calculated from the peak wavelength of the difference spectrum of the thin film 2, which is shown in FIG. 21B. Thus, it can be said that the emission spectrum observed in the thin film 2 includes light emission attributed to the first organic compound and in addition, light emission attributed to the exciplex formed by the first organic compound and the second organic compound.

The electroluminescence spectrum of the light-emitting element 2 in FIG. 19A substantially corresponds to that of the thin film 2 in FIG. 21A. Accordingly, it can be said that the electroluminescence spectrum of the light-emitting element 2 includes light emission attributed to the exciplex formed by the first organic compound (Ir(mpptz-diBuCNp)$_3$) and the second organic compound (mCzP3Pm) and light emission attributed to Ir(mpptz-diBuCNp)$_3$. In the exciplex, the difference between the S1 level and the T1 level is small; thus, the emission energy of the exciplex can be regarded as energy of each of the S1 level and the T1 level of the exciplex (2.51 eV).

The energy difference (2.49 eV) between the LUMO level of mCzP3Pm and the HOMO level of Ir(mpptz-diBuCNp)$_3$ is smaller than the energy difference (2.92 eV) between the LUMO level and the HOMO level of Ir(mpptz-diBuCNp)$_3$. Therefore, carriers can be recombined by the exciplex formed by the first organic compound (Ir(mpptz-diBuCNp)$_3$) and the second organic compound (mCzP3Pm) without the direct carrier recombination in the first organic compound (Ir(mpptz-diBuCNp)$_3$), whereby the driving voltage of the light-emitting element can be lowered.

Figure 22A:
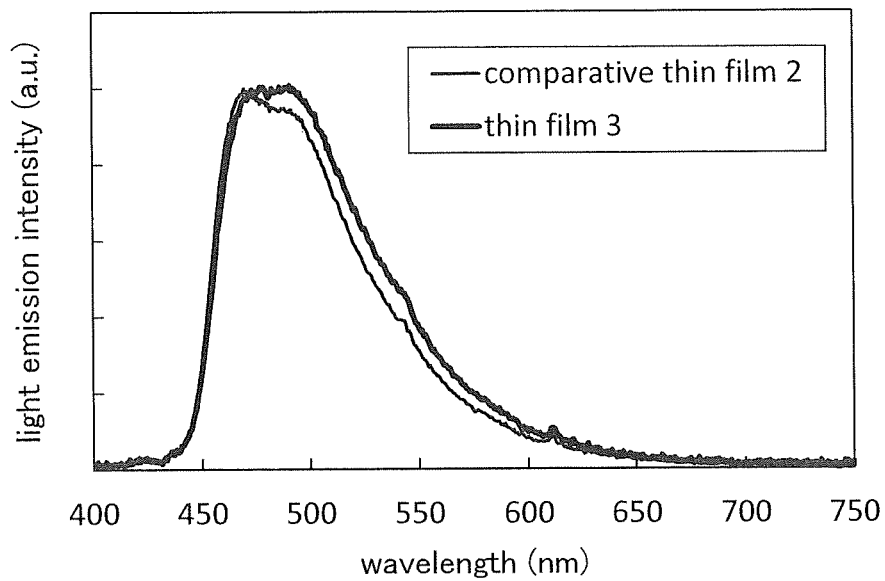
FIGS. 22A and 22B show emission spectra of a thin film in Example.

As shown in FIG. 22A, in the comparative thin film 2, the emission spectrum of blue from Ir(Mptz1-mp)$_3$, which is a phosphorescent compound, was observed. In the emission spectra of the thin film 3, emission spectra shifted to a longer wavelength side than the emission spectrum of the comparative thin film 2 were observed.

Figure 22B:
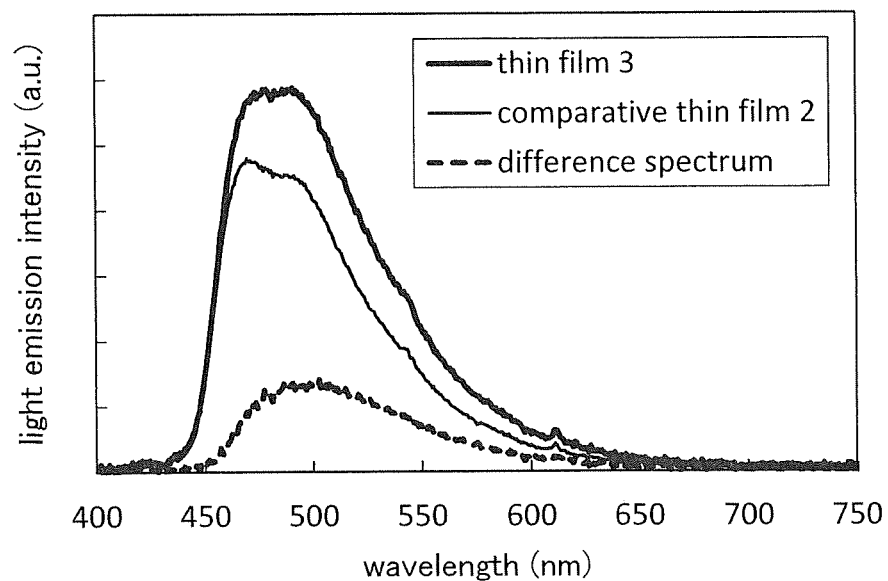

Next, a difference spectrum obtained by subtracting the emission spectrum of the comparative thin film 2 from the emission spectrum of the thin film 3 is shown in FIG. 22B. As a result, it was found that light emission from the thin film 3 has a peak wavelength of 497 nm in addition to a peak wavelength of 470 nm attributed to Ir(Mptz1-mp)$_3$. The percentage (area ratio) of the difference spectrum with respect to the emission spectrum of the thin film 3 (the spectrum of the thin film 3–the spectrum of the comparative thin film 2) is 22.9%.

The CV measurement results show that the combination of Ir(Mptz1-mp)$_3$ (first organic compound) and 4,6mCzP2Pm (second organic compound) forms an exciplex. The energy difference between the LUMO level of 4,6mCzP2Pm and the HOMO level of Ir(Mptz1-mp)$_3$ is 2.66 eV This energy difference substantially corresponds to light emission energy (2.49 eV) calculated from the peak wavelength of the difference spectrum of the thin film 3, which is shown in FIG. 22B. Thus, it can be said that the emission spectrum observed in the thin film 3 includes light emission attributed to the first organic compound and in addition, light emission attributed to the exciplex formed by the first organic compound and the second organic compound.

The electroluminescence spectrum of the light-emitting element 3 in FIG. 19A substantially corresponds to that of the thin film 3 in FIG. 22A. Accordingly, it can be said that the electroluminescence spectrum of the light-emitting element 3 includes light emission attributed to the exciplex formed by the first organic compound (Ir(Mptz1-mp)$_3$) and the second organic compound (4,6mCzP2Pm) and light emission attributed to Ir(Mptz1-mp)$_3$. In the exciplex, the difference between the S1 level and the T1 level is small; thus, the emission energy of the exciplex can be regarded as energy of each of the S1 level and the T1 level of the exciplex (2.49 eV).

The energy difference (2.66 eV) between the LUMO level of 4,6mCzP2Pm and the HOMO level of Ir(Mptz1-mp)$_3$ is smaller than the energy difference (3.36 eV) between the LUMO level and the HOMO level of Ir(Mptz1-mp)$_3$. Therefore, carriers can be recombined by the exciplex formed by the first organic compound (Ir(Mptz1-mp)$_3$) and the second organic compound (4,6mCzP2Pm) without the direct carrier recombination in the first organic compound (Ir(Mptz1-mp)$_3$), whereby the driving voltage of the light-emitting element can be lowered.

Figure 23A:
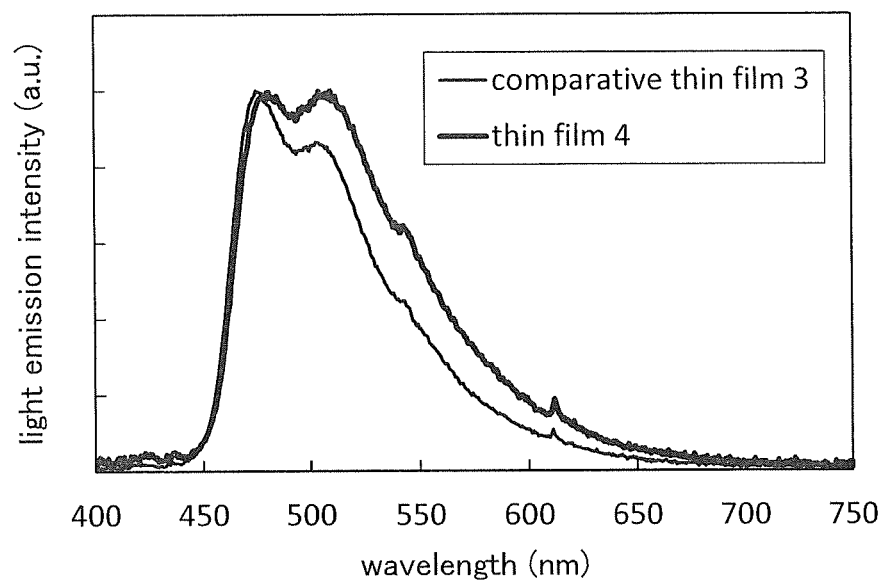
FIGS. 23A and 23B show emission spectra of a thin film in Example.
Figure 24A:
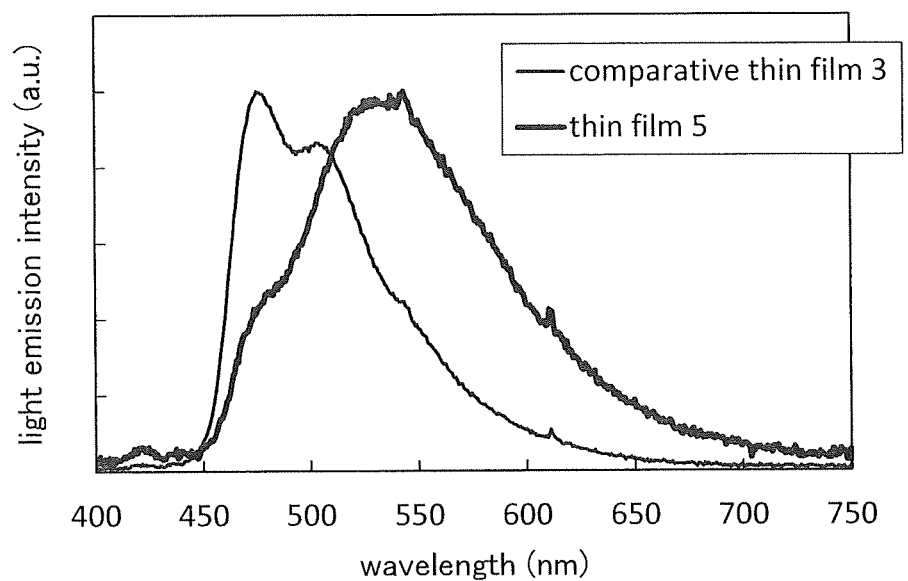
FIGS. 24A and 24B show emission spectra of a thin film in Example.

Emission spectra were measured, and as shown in FIG. 23A and FIG. 24A, in the comparative thin film 3, the emission spectrum of blue from Ir(mpptz-diPrp)$_3$, which is a phosphorescent compound, was observed. In the emission spectra of the thin film 4 and the thin film 5, emission spectra peaking at a longer wavelength were observed.

Figure 23B:
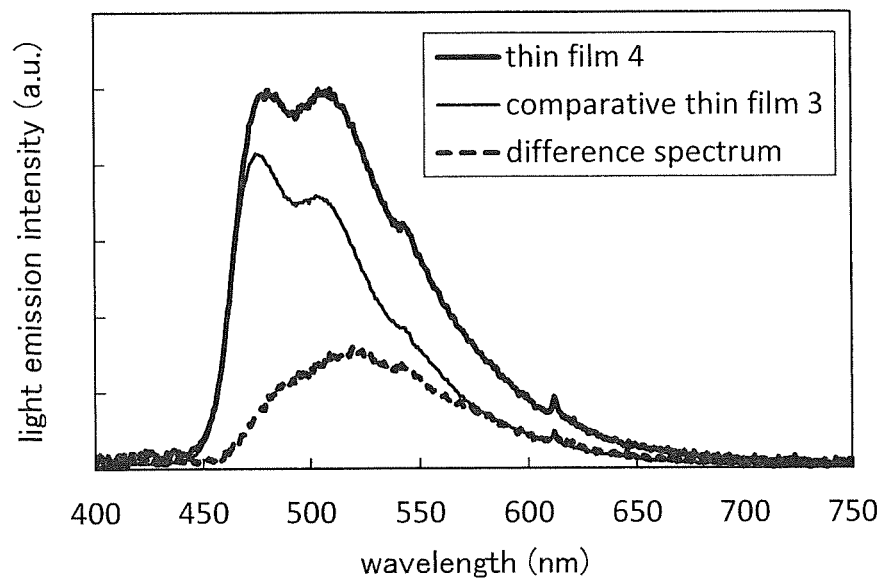
Figure 24B:
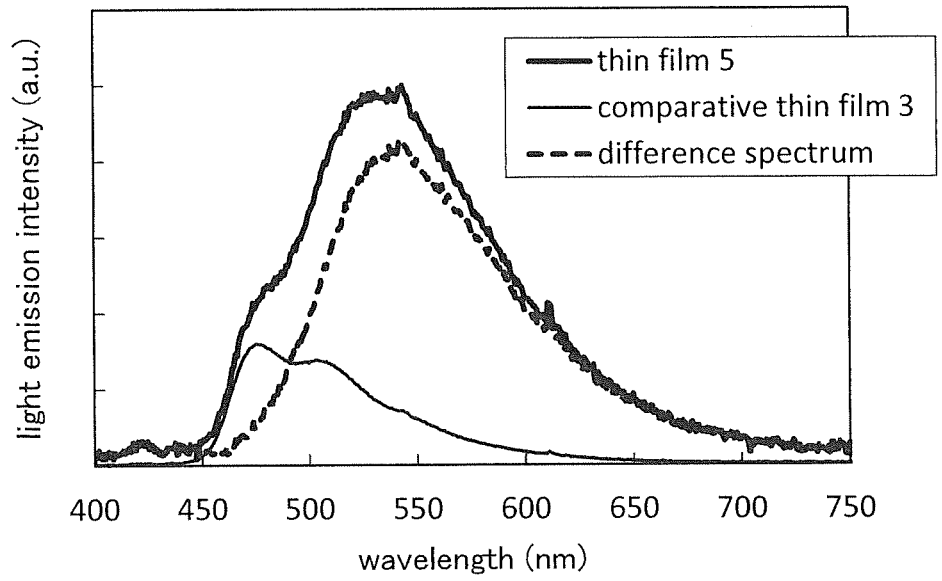

Next, difference spectra obtained by subtracting the emission spectrum of the comparative thin film 3 from the emission spectrum of each of the thin film 4 and the thin film 5 are shown in FIG. 23B and FIG. 24B. As a result, it was found that light emission from the thin film 4 and light emission from the thin film 5 have peak wavelengths of 519 nm and 539 nm, respectively in addition to a peak wavelength of 475 nm attributed to Ir(mpptz-diPrp)$_3$. The percentages (area ratios) of the difference spectra with respect to the emission spectra of the thin film 4 and the thin film 5 (the spectrum of the thin film 4–the spectrum of the comparative thin film 3 and the spectrum of thin film 5–the spectrum of the comparative thin film 3) are 38.1% and 81.5%, respectively.

The CV measurement results show that the combination of Ir(mpptz-diPrp)$_3$ (first organic compound) and 4,6mCzBP2Pm (second organic compound) forms an exciplex. The energy difference between the LUMO level of 4,6mCzBP2Pm and the HOMO level of Ir(mpptz-diPrp)$_3$ is 2.44 eV. This energy difference substantially corresponds to light emission energy (2.39 eV) calculated from the peak wavelength of the difference spectrum of the thin film 4, which is shown in FIG. 23B. Thus, it can be said that the emission spectrum observed in the thin film 4 includes light emission attributed to the first organic compound and in addition, light emission attributed to the exciplex formed by the first organic compound and the second organic compound.

The electroluminescence spectrum of the light-emitting element 4 in FIG. 19A substantially corresponds to that of the thin film 4 in FIG. 23A. Accordingly, it can be said that the electroluminescence spectrum of the light-emitting element 4 includes light emission attributed to the exciplex formed by the first organic compound (Ir(mpptz-diPrp)$_3$) and the second organic compound (4,6mCzBP2Pm) and light emission attributed to Ir(mpptz-diPrp)$_3$. In the exciplex, the difference between the S1 level and the T1 level is small; thus, the emission energy of the exciplex can be regarded as energy of each of the S1 level and the T1 level of the exciplex (2.39 eV).

The energy difference (2.44 eV) between the LUMO level of 4,6mCzBP2Pm and the HOMO level of Ir(mpptz-diPrp)$_3$ is smaller than the energy difference (3.28 eV) between the LUMO level and the HOMO level of Ir(mpptz-diPrp)$_3$. Therefore, carriers can be recombined by the exciplex formed by the first organic compound (Ir(mpptz-diPrp)$_3$) and the second organic compound (4,6mCzBP2Pm) without the direct carrier recombination in the first organic compound (Ir(mpptz-diPrp)$_3$), whereby the driving voltage of the light-emitting element can be lowered.

The CV measurement results show that the combination of Ir(mpptz-diPrp)$_3$ (first organic compound) and 4,6mCzP2Pm (second organic compound) forms an exciplex. The energy difference between the LUMO level of 4,6mCzP2Pm and the HOMO level of Ir(mpptz-diPrp)$_3$ is 2.36 eV This energy difference substantially corresponds to light emission energy (2.30 eV) calculated from the peak wavelength of the difference spectrum of the thin film 5, which is shown in FIG. 24B. Thus, it can be said that the emission spectrum observed in the thin film 5 includes light emission attributed to the first organic compound and in addition, light emission attributed to the exciplex formed by the first organic compound and the second organic compound.

The electroluminescence spectrum of the light-emitting element 5 in FIG. 19B, substantially corresponds to that of the thin film 5 in FIG. 24A. Accordingly, it can be said that the electroluminescence spectrum of the light-emitting element 5 includes light emission attributed to the exciplex formed by the first organic compound (Ir(mpptz-diPrp)$_3$) and the second organic compound (4,6mCzP2Pm) and light emission attributed to Ir(mpptz-diPrp)$_3$. In the exciplex, the difference between the S1 level and the T1 level is small; thus, the emission energy of the exciplex can be regarded as energy of each of the S1 level and the T1 level of the exciplex (2.30 eV).

The energy difference (2.36 eV) between the LUMO level of 4,6mCzP2Pm and the HOMO level of Ir(mpptz-diPrp)$_3$ is smaller than the energy difference (3.28 eV) between the LUMO level and the HOMO level of Ir(mpptz-diPrp)$_3$. Therefore, carriers can be recombined by the exciplex formed by the first organic compound (Ir(mpptz-diPrp)$_3$) and the second organic compound (4,6mCzP2Pm) without the direct carrier recombination in the first organic compound (Ir(mpptz-diPrp)$_3$), whereby the driving voltage of the light-emitting element can be lowered.

Figure 25A:
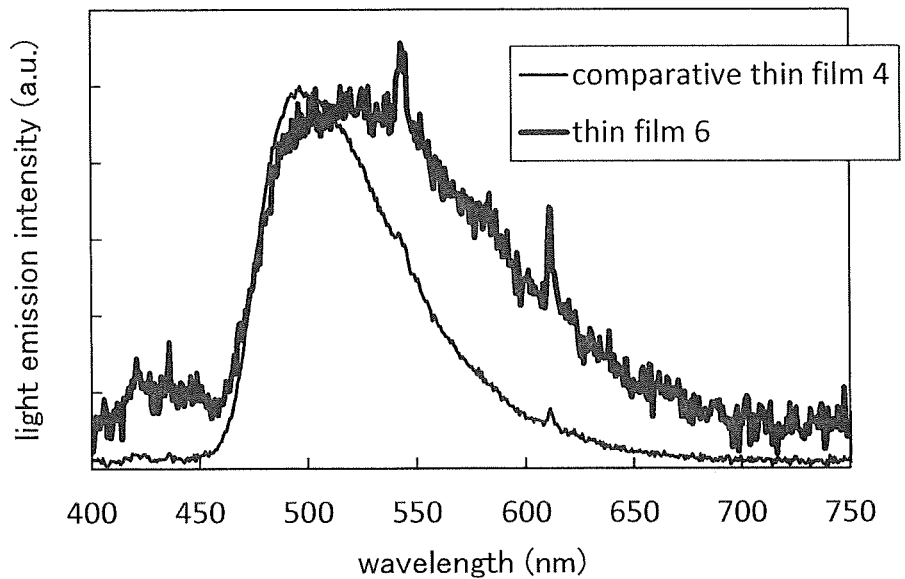
FIGS. 25A and 25B show emission spectra of a thin film in Example.

As shown in FIG. 25A, in the comparative thin film 4, the emission spectrum of blue from Ir(pim-diBuCNp)$_3$, which is a phosphorescent compound, was observed. In the emission spectra of the thin film 6, emission spectra shifted to a longer wavelength side than the emission spectrum of the comparative thin film 4 were observed.

Figure 25B:
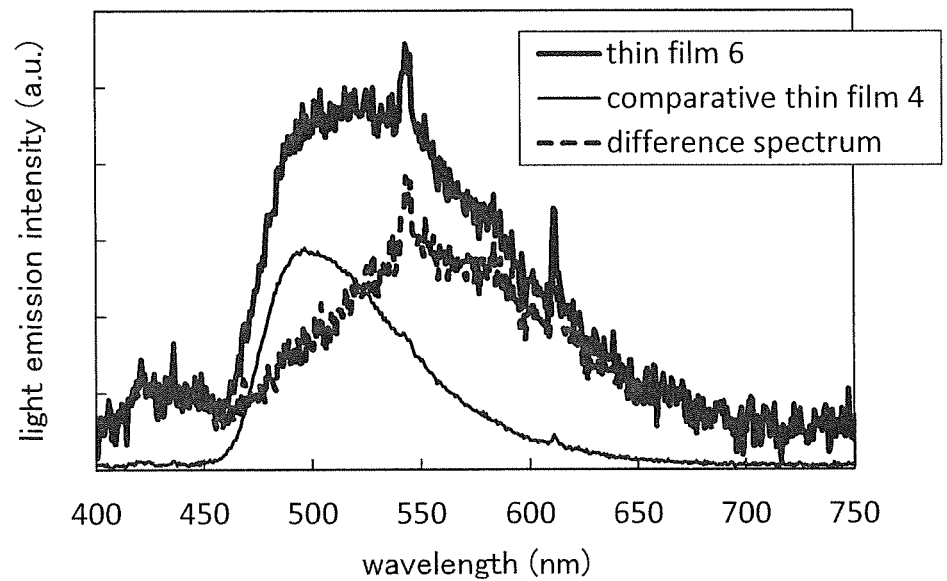

Next, a difference spectrum obtained by subtracting the emission spectrum of the comparative thin film 4 from the emission spectrum of each of the thin film 6 is shown in FIG. 25B. As a result, it was found that light emission from the thin film 6 has a peak wavelength of 546 nm in addition to a peak wavelength of 497 nm attributed to Ir(pim-diBuCNp)$_3$. The percentage (area ratio) of the difference spectrum with respect to the emission spectrum of the thin film 6 (the spectrum of the thin film 6–the spectrum of the comparative thin film 4) is 72.1%.

The CV measurement results show that the combination of Ir(pim-diBuCNp)$_3$ (first organic compound) and 4,6mCzP2Pm (second organic compound) forms an exciplex. The energy difference between the LUMO level of 4,6mCzP2Pm and the HOMO level of Ir(pim-diBuCNp)$_3$ is 2.34 eV. This energy difference substantially corresponds to light emission energy (2.27 eV) calculated from the peak wavelength of the difference spectrum of the thin film 6, which is shown in FIG. 25B. Thus, it can be said that the emission spectrum observed in the thin film 6 includes light emission attributed to the first organic compound and in addition, light emission attributed to the exciplex formed by the first organic compound and the second organic compound.

The electroluminescence spectrum of the light-emitting element 6 in FIG. 19B, substantially corresponds to that of the thin film 6 in FIG. 25A. Accordingly, it can be said that the electroluminescence spectrum of the light-emitting element 6 includes light emission attributed to the exciplex formed by the first organic compound (Ir(pim-diBuCNp)$_3$) and the second organic compound (4,6mCzP2Pm) and light emission attributed to Ir(pim-diBuCNp)$_3$. In the exciplex, the difference between the S1 level and the T1 level is small; thus, the emission energy of the exciplex can be regarded as energy of each of the S1 level and the T1 level of the exciplex (2.27 eV).

The energy difference (2.34 eV) between the LUMO level of 4,6mCzP2Pm and the HOMO level of Ir(pim-diBuCNp)$_3$ is smaller than the energy difference (2.81 eV) between the LUMO level and the HOMO level of Ir(pim-diBuCNp)$_3$. Therefore, carriers can be recombined by the exciplex formed by the first organic compound (Ir(pim-diBuCNp)$_3$) and the second organic compound (4,6mCzP2Pm) without the direct carrier recombination in the first organic compound (Ir(pim-diBuCNp)$_3$), whereby the driving voltage of the light-emitting element can be lowered.

Figure 26A:
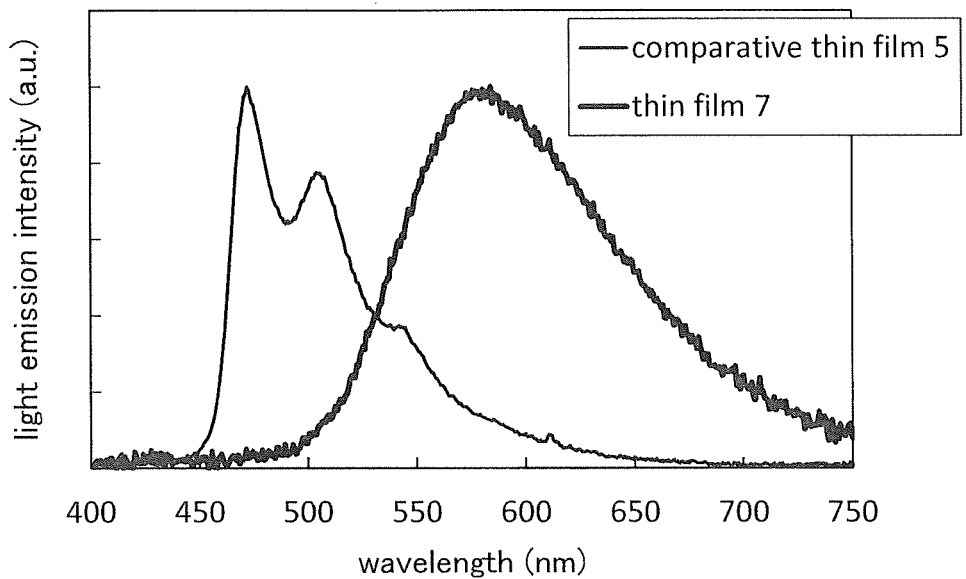
FIGS. 26A and 26B show emission spectra of a thin film in Example.

As shown in FIG. 26A, in the comparative thin film 5, the emission spectrum of blue from Ir(iPrpim)$_3$, which is a phosphorescent compound, was observed. In the thin film 7, an emission spectrum of yellow light, which is different from the emission spectrum of the comparative thin film 5, was observed.

Figure 26B:
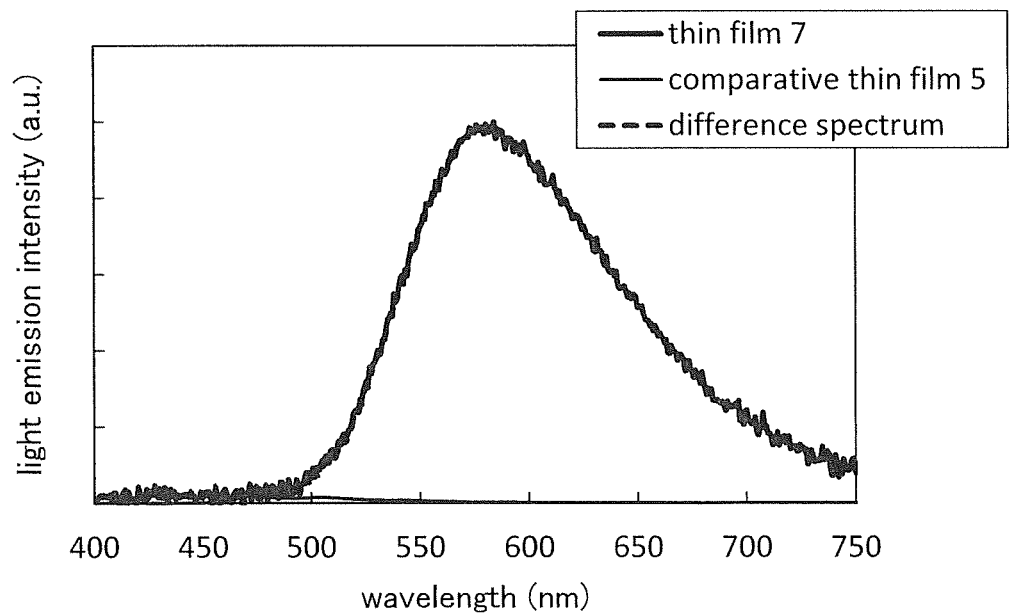

Next, a difference spectrum obtained by subtracting the emission spectrum of the comparative thin film 5 from the emission spectrum of the thin film 7 is shown in FIG. 26B. As a result, it was found that light emission from the thin film 7 includes yellow light emission with a peak wavelength of 580 nm and in addition, slightly includes light emission with a peak wavelength of 472 nm attributed to Ir(iPrpim)$_3$. The percentage (area ratio) of the difference spectrum with respect to the emission spectrum of the thin film 7 (the spectrum of the thin film 7–the spectrum of the comparative thin film 5) is 98.7%.

The CV measurement results show that the combination of Ir(iPrpim)$_3$ (first organic compound) and 4,6mCzP2Pm (second organic compound) forms an exciplex. The energy difference between the LUMO level of 4,6mCzP2Pm and the HOMO level of Ir(iPrpim)$_3$ is 2.21 eV This energy difference substantially corresponds to light emission energy (2.14 eV) calculated from the peak wavelength of the difference spectrum of the thin film 7, which is shown in FIG. 26B. Thus, it can be said that the emission observed in the thin film 7 includes light emission attributed to the exciplex formed by the first organic compound and the second organic compound and slightly includes light emission attributed to the first organic compound.

The electroluminescence spectrum of the light-emitting element 7 in FIG. 19B, substantially corresponds to that of the thin film 7 in FIG. 26A. Accordingly, it can be said that the electroluminescence spectrum of the light-emitting element 7 includes light emission attributed to the exciplex formed by the first organic compound (Ir(iPrpim)$_3$) and the second organic compound (4,6mCzP2Pm) and light emission attributed to Ir(iPrpim)$_3$. In the exciplex, the difference between the S1 level and the T1 level is small; thus, the emission energy of the exciplex can be regarded as energy of each of the S1 level and the T1 level of the exciplex (2.14 eV).

The energy difference (2.21 eV) between the LUMO level of 4,6mCzP2Pm and the HOMO level of Ir(iPrpim)$_3$ is assumed to be smaller than the energy difference between the LUMO level and the HOMO level of Ir(iPrpim)$_3$. Therefore, carriers can be recombined by the exciplex formed by the first organic compound (Ir(iPrpim)$_3$) and the second organic compound (4,6mCzP2Pm) without the direct carrier recombination in the first organic compound (Ir(iPrpim)$_3$), whereby the driving voltage of the light-emitting element can be lowered.

As described above, it was found that light emission from each of the thin films 1 to 7 includes light emission attributed to the first organic compound (phosphorescent compound) in addition to light emission attributed to the exciplex formed by the first organic compound and the second organic compound. Thus, it can be said that light emission from the light-emitting elements 1 to 7 including, in the light-emitting layer 130, compounds that are the same as those in the thin films 1 to 7, respectively, includes light emission attributed to the first organic compounds (phosphorescent compounds) and in addition, light emission attributed to the exciplex formed by the first organic compound and the second organic compound.

<Relation 1 Between Percentage of Light Emission of Exciplexes and Characteristics of Light-Emitting Elements>

Accordingly, the percentages of light emission of the exciplexes in the thin films 1 to 7 were calculated to be 10.1%, 34.0%, 22.9%, 38.1%, 81.5%, 72.1%, and 98.7%, respectively. Next, FIG. 27 shows the relation between the maximum external quantum efficiencies of the light-emitting elements 1 to 7 and the percentages of light emission of the exciplexes to light emission from the thin films 1 to 7.

Figure 27:
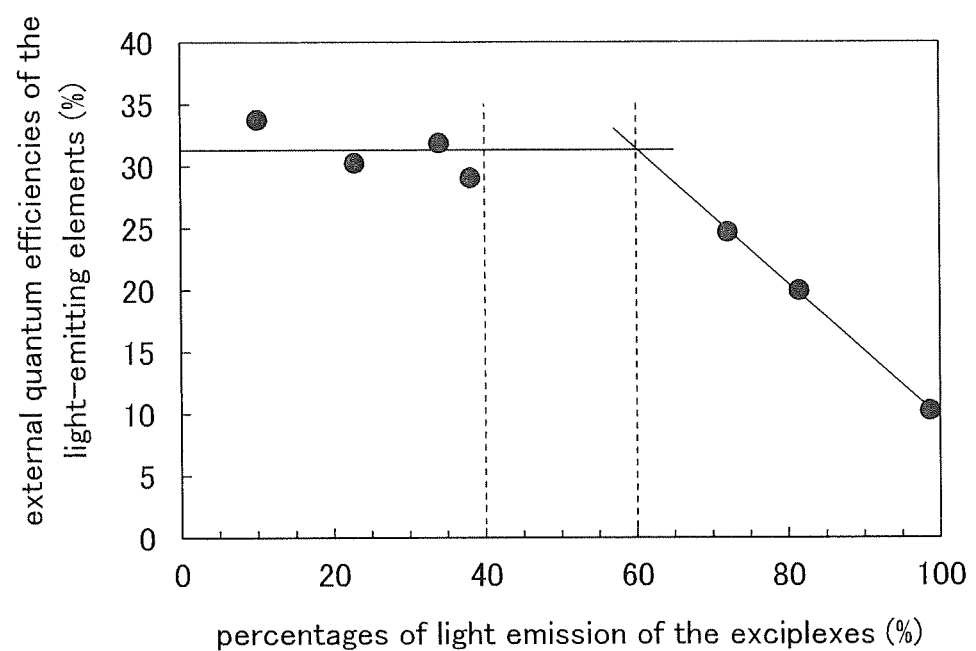
FIG. 27 shows the relation between the external quantum efficiency and the percentage of light emission of an exciplex in Example.

As shown in FIG. 27, the external quantum efficiencies of the light-emitting elements 1 to 4 including compounds included in the thin films 1 to 4 that have small percentages of light emission of the exciplexes are high, and the external quantum efficiencies of the light-emitting elements 5 to 7 including compounds included in the thin films 5 to 7 that have large percentages of light emission of the exciplexes are low. When a straight line obtained by linear approximation of the relation between the percentages of light emission of the exciplexes of the thin films 5 to 7 and the external quantum efficiencies of the light-emitting elements 5 to 7 reaches to an average value (31.3%) of external quantum efficiencies of the light-emitting elements 1 to 4, the percentage of light emission of the exciplex was calculated to be 60%. That is, a light-emitting element having a high external quantum efficiency can be provided in the case where the percentage of light emission of an exciplex to light emission from the light-emitting element is lower than or equal to 60%. Furthermore, since the external quantum efficiencies of the light-emitting elements 1 to 4 are high, the percentage of light emission of the exciplex to light emission from the light-emitting element is preferably lower than or equal to 40%. By forming the exciplex by the first organic compound and the second organic compound as in the light-emitting elements 1 to 7, the driving voltage of the light-emitting element can be lowered. Accordingly, the percentage of light emission of the exciplex to light emission from the light-emitting element is preferably higher than 0% and lower than or equal to 60%, further preferably higher than 0% and lower than or equal to 40%.

From FIGS. 20A and 20B to FIGS. 26A and 26B, the peak wavelengths of light emission attributed to the first organic compounds (guest materials) in the thin films 2 to 7 are 487 nm, 470 nm, 475 nm, 475 nm, 497 nm, and 472 nm, respectively; thus, the light emission energies ($E_{G\_em}$) of the first organic compounds (guest materials) are 2.55 eV, 2.64 eV, 2.61 eV, 2.61 eV, 2.49 eV, and 2.63 eV, respectively. Furthermore, the peak wavelengths of light emission attributed to the exciplexes formed by the first organic compounds and the second organic compounds are 494 nm, 497 nm, 519 nm, 539 nm, 546 nm, and 580 nm, respectively; thus, the light emission energies ($E_{Ex\_em}$) of the exciplexes formed by the first organic compounds and the second organic compounds were calculated to be 2.51 eV, 2.49 eV, 2.39 eV, 2.30 eV, 2.27 eV, and 2.14 eV, respectively. Thus, in the thin films 2 to 7, $E_{G\_em}$ is greater than $E_{Ex\_em}$.

Figure 28A:
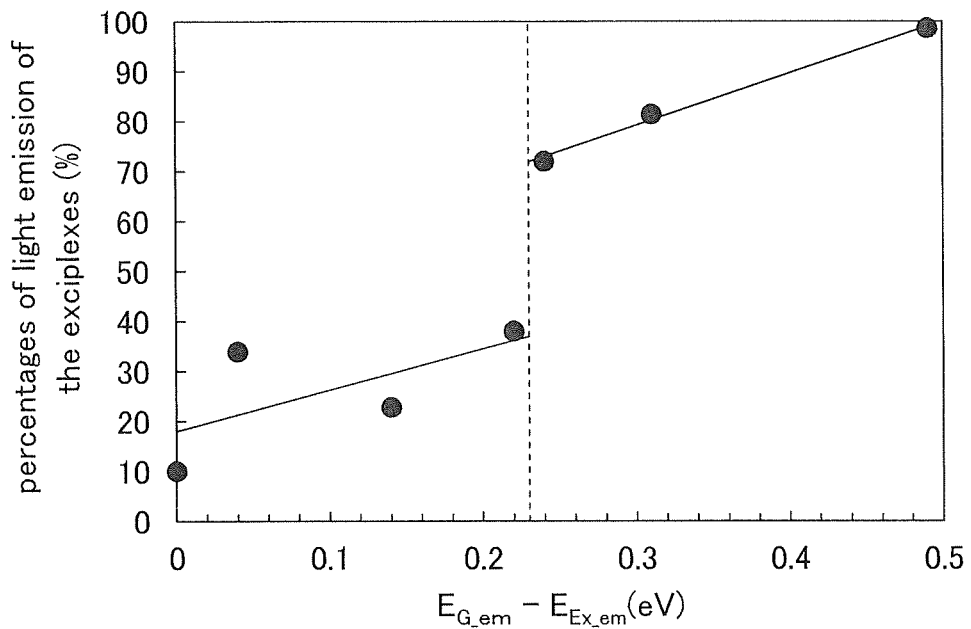
FIG. 28A shows the relation between the percentage of light emission of an exciplex- and the energy difference between a guest material and the exciplex in Example.

The relation between the percentages of light emission of the exciplexes to light emission from the thin films 1 to 7 and $E_{G\_em}-E_{Ex\_em}$ is shown in FIG. 28A. FIG. 28A shows that the tendency of the thin films 1 to 4 having small percentages of light emission of the exciplexes is different from that of the thin films 5 to 7 having large percentages of light emission of the exciplexes. This shows that the percentage of light emission of the exciplex is changed at a boundary where $E_{G\_em}-E_{Ex\_em}$ is 0.23 eV.

Figure 28B:
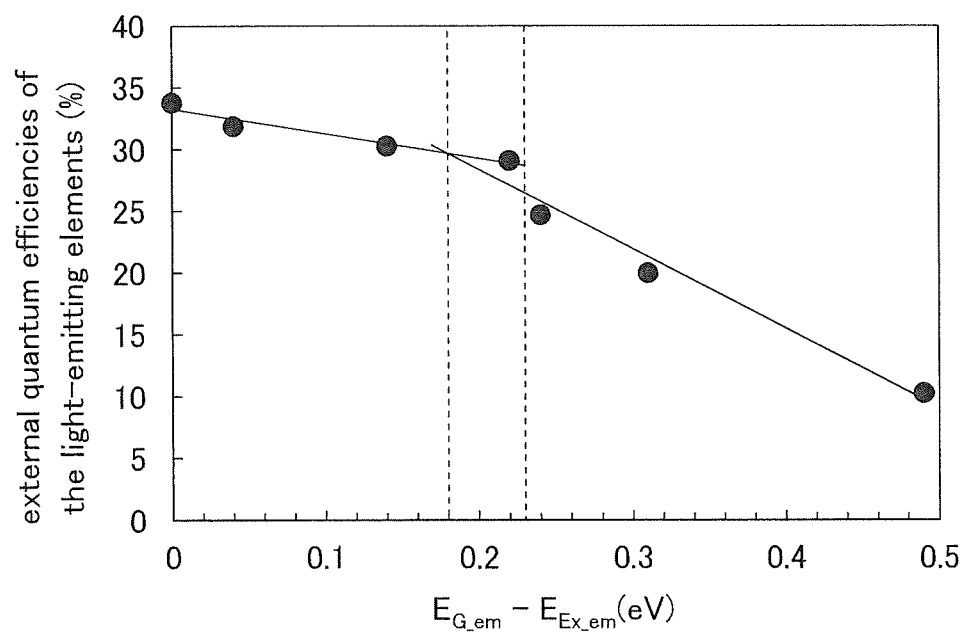
FIG. 28B shows the relation between the external quantum efficiency and the energy difference between the guest material- and the exciplex in Example.

The relation between the maximum external quantum efficiencies of the light-emitting elements 1 to 7 and $E_{G\_em}-E_{Ex\_em}$ is shown in FIG. 28B. FIG. 28B also shows that the tendency of the thin films 1 to 4 having small percentages of light emission of the exciplexes is different from that of the thin films 5 to 7 having large percentages of light emission of the exciplexes, and the percentage of light emission of the exciplex is markedly changed at a boundary where $E_{G\_em}-E_{Ex\_em}$ is 0.23 eV. That is, when $E_{G\_em}-E_{Ex\_em}$ is smaller than or equal to 0.23 eV, the percentage of light emission of the exciplex is decreased, and high emission efficiency can be obtained. Furthermore, the point of intersection of a straight line obtained by linear approximation of the relation between $E_{G\_em}-E_{Ex\_em}$ of the thin films 1 to 4 and the external quantum efficiencies of the light-emitting elements 1 to 4 with a straight line obtained by linear approximation of the relation between $E_{G\_em}-E_{Ex\_em}$ of the thin films 4 to 7 and the external quantum efficiencies of the light-emitting elements 4 to 7 was calculated to be 0.18 eV That is, it is preferable that $E_{G\_em}-E_{Ex\_em}$ be smaller than or equal to 0.18 eV because the light-emitting element can have high external quantum efficiency. Accordingly, $E_{G\_em}-E_{Ex\_em}$ is preferably larger than 0 eV and smaller than or equal to 0.23 eV (0 eV<$E_{G\_em}-E_{Ex\_em}$≤0.23 eV), further preferably larger than 0 eV and smaller than or equal to 0.18 eV (0 eV<$E_{G\_em}-E_{Ex\_em}$≤0.18 eV).

<Absorption Spectra of Guest Materials>

Next, FIG. 31 to FIG. 35 show the measurement results of the absorption spectra of Ir(mpptz-diBuCNp)$_3$, Ir(Mptz1-mp)$_3$, Ir(mpptz-diPrp)$_3$, Ir(pim-diBuCNp)$_3$, and Ir(iPrpim)$_3$, which are the guest materials used for the light-emitting elements.

For the absorption spectrum measurement, a dichloromethane solution in which the corresponding guest material was dissolved was prepared, and a quartz cell was used. The absorption spectrum was measured using an ultraviolet-visible spectrophotometer (V-550, produced by JASCO Corporation). The absorption spectra of a quartz cell and a solvent were subtracted from the measured spectrum of the sample. The measurements were performed at room temperature (in an atmosphere kept at 23° C.).

Figure 31:
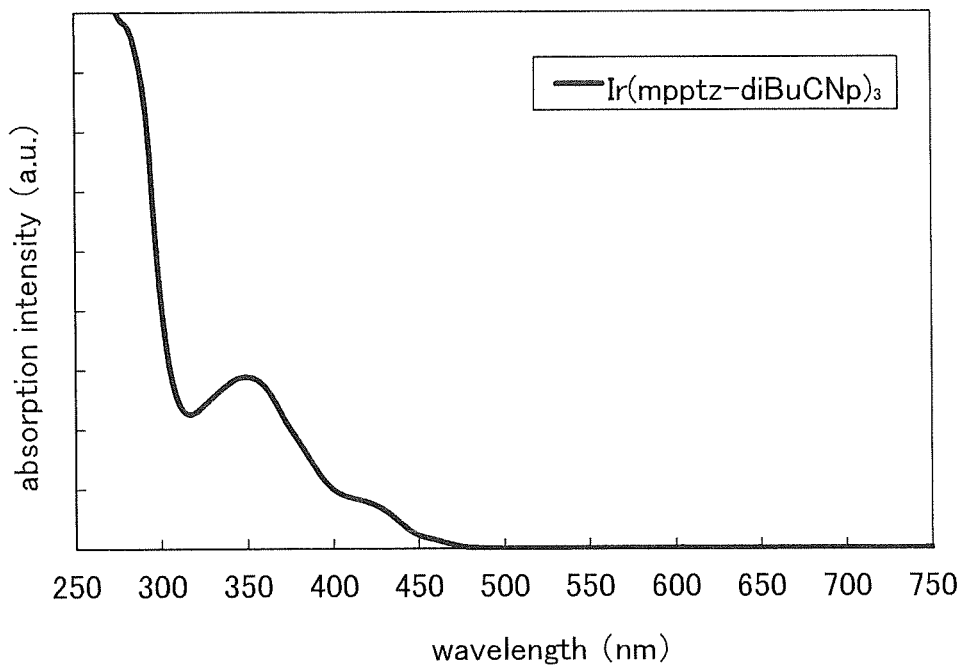
FIG. 31 shows an absorption spectrum of a guest material in Example.

As shown in FIG. 31, the absorption edge on the lowest energy side (the longest wavelength side) of the absorption spectrum of Ir(mpptz-diBuCNp)$_3$ is at around 470 nm. The absorption edge was obtained from data of the absorption spectrum, and the transition energy was estimated on the assumption of direct transition. As a result, the absorption edge of Ir(mpptz-diBuCNp)$_3$ was 479 nm and the transition energy was calculated to be 2.59 eV. Since Ir(mpptz-diBuCNp)$_3$ is a phosphorescent compound, the absorption edge on the lowest energy side is an absorption edge based on the transition to the triplet excited state. Accordingly, the T1 level of Ir(mpptz-diBuCNp)$_3$ was calculated to be 2.59 eV from the absorption edge.

The T1 level (2.59 eV) of Ir(mpptz-diBuCNp)$_3$ is higher than or equal to the T1 level (2.55 eV) of the exciplex formed by 4,6mCzP2Pm and Ir(mpptz-diBuCNp)$_3$ and higher than or equal to the T1 level (2.51 eV) of the exciplex formed by mCzP3Pm and Ir(mpptz-diBuCNp)$_3$, and these energy levels are close to each other.

Thus, the absorption band on the lowest energy side (the longest wavelength side) of the absorption spectrum of Ir(mpptz-diBuCNp)$_3$ includes a region that overlaps with the emission spectrum of the exciplex formed by 4,6mCzP2Pm and Ir(mpptz-diBuCNp)$_3$ and light emission from the exciplex formed by mCzP3Pm and Ir(mpptz-diBuCNp)$_3$, which means that in the light-emitting elements 1 and 2 including these exciplexes as host materials, excitation energy can be transferred effectively to the guest material.

Figure 32:
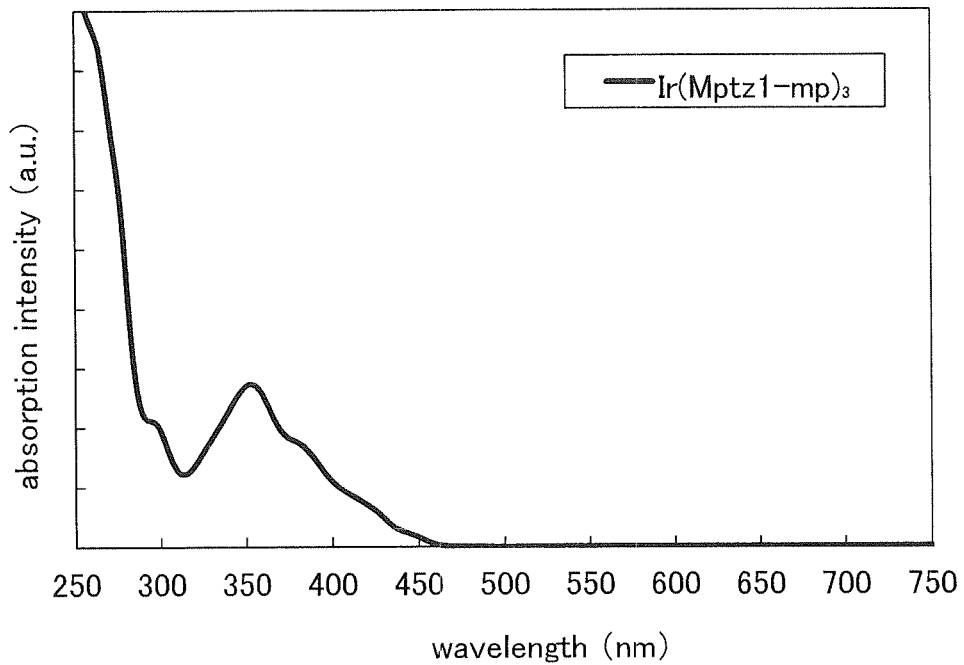
FIG. 32 shows an absorption spectrum of a guest material in Example.

As shown in FIG. 32, the absorption edge on the lowest energy side (the longest wavelength side) of the absorption spectrum of Ir(Mptz1-mp)$_3$ is at around 460 nm. The absorption edge was obtained from data of the absorption spectrum, and the transition energy was estimated on the assumption of direct transition. As a result, the absorption edge of Ir(Mptz1-mp)$_3$ was 463 nm and the transition energy was calculated to be 2.68 eV. Since Ir(Mptz1-mp)$_3$ is a phosphorescent compound, the absorption edge on the lowest energy side is an absorption edge based on the transition to the triplet excited state. Accordingly, the T1 level of Ir(Mptz1-mp)$_3$ was calculated to be 2.68 eV from the absorption edge.

The T1 level (2.68 eV) of Ir(Mptz1-mp)$_3$ is higher than or equal to the T1 level (2.49 eV) of the exciplex formed by 4,6mCzP2Pm and Ir(Mptz1-mp)$_3$, and these energy levels are close to each other.

Therefore, the absorption band of the absorption spectrum of Ir(Mptz1-mp)$_3$ on the lowest energy side (the longest wavelength side) has a region that overlaps with the emission spectrum of the exciplex formed by 4,6mCzP2Pm and Ir(Mptz1-mp)$_3$, which means that in the light-emitting element 3 including the exciplex as the host material, excitation energy can be transferred effectively to the guest material.

Figure 33:
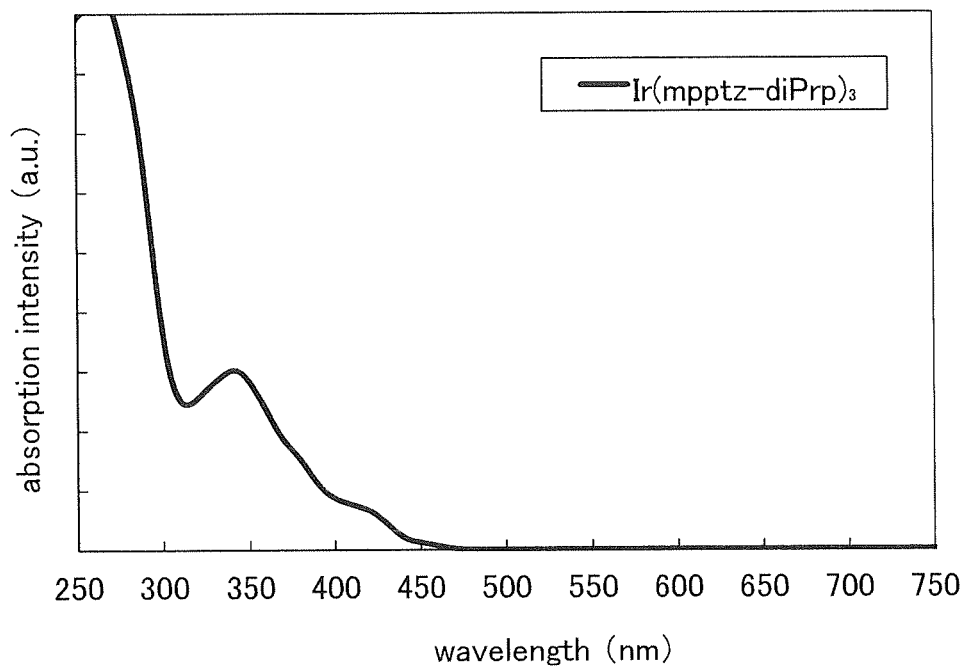
FIG. 33 shows an absorption spectrum of a guest material in Example.

As shown in FIG. 33, the absorption edge on the lowest energy side (the longest wavelength side) of the absorption spectrum of Ir(mpptz-diPrp)$_3$ is at around 470 nm. The absorption edge was obtained from data of the absorption spectrum, and the transition energy was estimated on the assumption of direct transition. As a result, the absorption edge of Ir(mpptz-diPrp)$_3$ was 472 nm and the transition energy was calculated to be 2.63 eV. Since Ir(mpptz-diPrp)$_3$ is a phosphorescent compound, the absorption edge on the lowest energy side is an absorption edge based on the transition to the triplet excited state. Accordingly, the T1 level of Ir(mpptz-diPrp)$_3$ was calculated to be 2.63 eV from the absorption edge.

The T1 level (2.63 eV) of Ir(mpptz-diPrp)$_3$ is higher than or equal to the T1 level (2.39 eV) of the exciplex formed by 4,6mCzBP2Pm and Ir(mpptz-diPrp)$_3$ and the T1 level (2.30 eV) of the exciplex formed by 4,6mCzP2Pm and Ir(mpptz-diPrp)$_3$, and these energy levels are close to each other.

Thus, the absorption band on the lowest energy side (the longest wavelength side) of the absorption spectrum of Ir(mpptz-diPrp)$_3$ includes a region that overlaps with the emission spectrum of the exciplex formed by 4,6mCzBP2Pm and Ir(mpptz-diPrp)$_3$ and light emission from the exciplex formed by 4,6mCzP2Pm and Ir(mpptz-diPrp)$_3$, which means that in the light-emitting element 4 and 5 including these exciplexes as host materials, excitation energy can be transferred effectively to the guest material.

Figure 34:
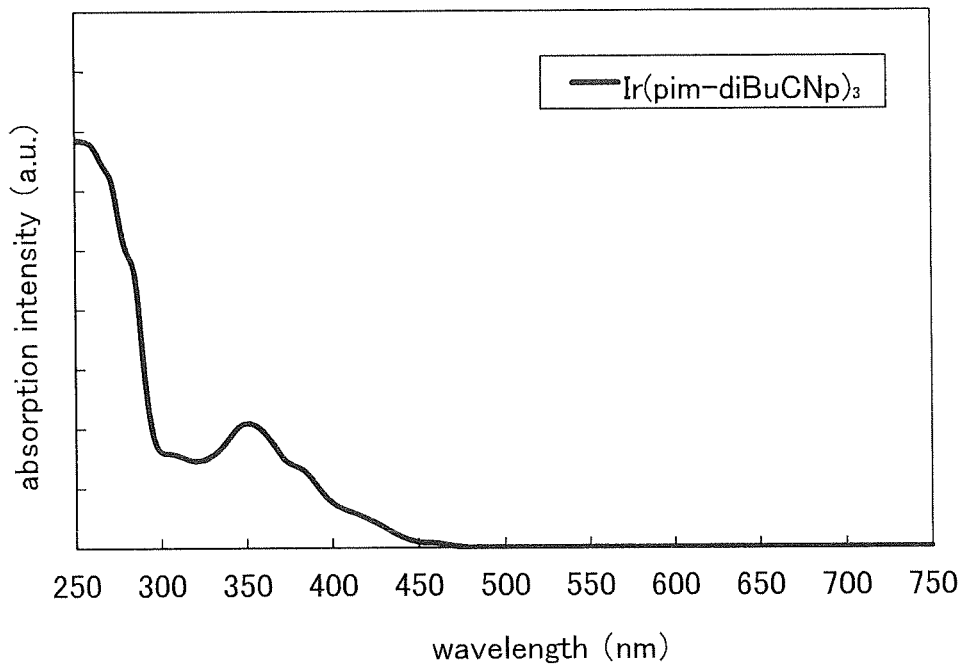
FIG. 34 shows an absorption spectrum of a guest material in Example.

As shown in FIG. 34, the absorption edge on the lowest energy side (the longest wavelength side) of the absorption spectrum of Ir(pim-diBuCNp)$_3$ is at around 470 nm. The absorption edge was obtained from data of the absorption spectrum, and the transition energy was estimated on the assumption of direct transition. As a result, the absorption edge of Ir(pim-diBuCNp)$_3$ was 476 nm and the transition energy was calculated to be 2.61 eV Since Ir(pim-diBuCNp)$_3$ is a phosphorescent compound, the absorption edge on the lowest energy side is an absorption edge based on the transition to the triplet excited state. Accordingly, the T1 level of Ir(pim-diBuCNp)$_3$ was calculated to be 2.61 eV from the absorption edge.

The T1 level (2.61 eV) of Ir(pim-diBuCNp)$_3$ is higher than or equal to the T1 level (2.27 eV) of the exciplex formed by 4,6mCzP2Pm and Ir(pim-diBuCNp)$_3$, and the difference between these energy levels is large.

However, the absorption band on the lowest energy side (the longest wavelength side) of the absorption spectrum of Ir(pim-diBuCNp)$_3$ includes a region that overlaps with the emission spectrum of the exciplex formed by 4,6mCzP2Pm and Ir(pim-diBuCNp)$_3$, which means that in the light-emitting element 6 including the exciplex as a host material, excitation energy can be transferred effectively to the guest material.

Figure 35:
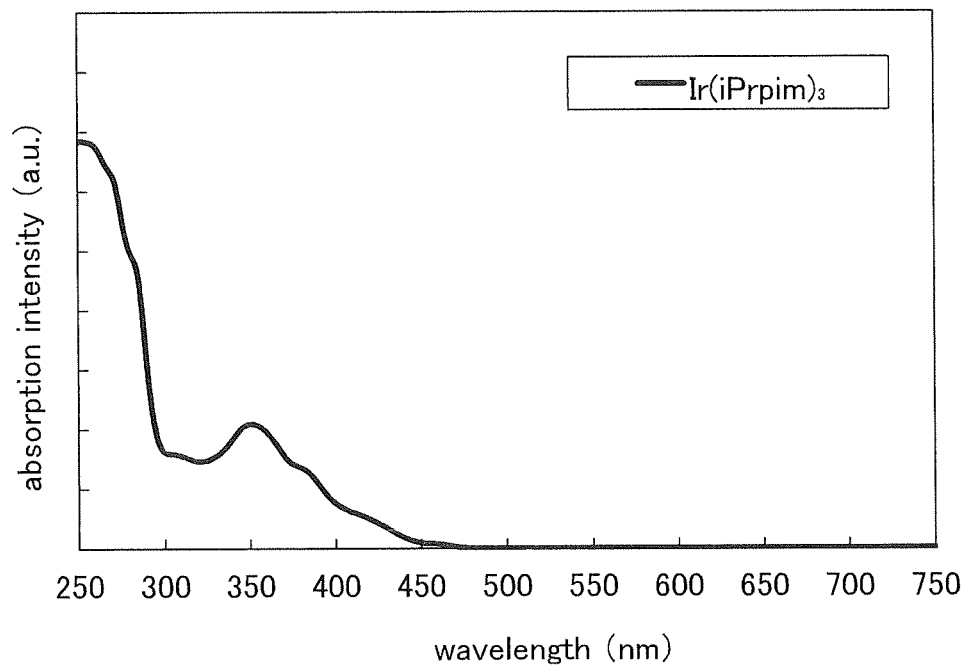
FIG. 35 shows an absorption spectrum of a guest material in Example.

As shown in FIG. 35, the absorption edge on the lowest energy side (the longest wavelength side) of the absorption spectrum of Ir(iPrpim)$_3$ is at around 470 nm. The absorption edge was obtained from data of the absorption spectrum, and the transition energy was estimated on the assumption of direct transition. As a result, the absorption edge of Ir(iPrpim)$_3$ was 476 nm and the transition energy was calculated to be 2.61 eV Since Ir(iPrpim)$_3$ is a phosphorescent compound, the absorption edge on the lowest energy side is an absorption edge based on the transition to the triplet excited state. Accordingly, the T1 level of Ir(iPrpim)$_3$ was calculated to be 2.61 eV from the absorption edge.

The T1 level (2.61 eV) of Ir(iPrpim)$_3$ is higher than or equal to the T1 level (2.27 eV) of the exciplex formed by 4,6mCzP2Pm and Ir(iPrpim)$_3$, and the difference between these energy levels is large.

Therefore, the region where the absorption band of the absorption spectrum of Ir(iPrpim)$_3$ on the lowest energy side (the longest wavelength side) overlaps with the emission spectrum of the exciplex formed by 4,6mCzP2Pm and Ir(iPrpim)$_3$ is small, which means that in the light-emitting element 7 including the exciplex as the host materials, it is difficult to transfer excitation energy to the guest material.

According to the above results, in the above guest materials, the energy difference between the LUMO level and the HOMO level is larger than the energy calculated from the absorption edge. In Ir(mpptz-diBuCNp)$_3$, Ir(Mptz1-mp)$_3$, Ir(mpptz-diPrp)$_3$, and Ir(pim-diBuCNp)$_3$, the energy difference between the LUMO level and the HOMO level is larger than the energy calculated from the absorption edge by 0.33 eV, 0.68 eV, 0.65 eV, and 0.20 eV, respectively. In addition, the energy difference between the LUMO level and the HOMO level is larger than the light emission energy. In Ir(mpptz-diBuCNp)$_3$, Ir(Mptz1-mp)$_3$, Ir(mpptz-diPrp)$_3$, and Ir(pim-diBuCNp)$_3$, the energy difference between the LUMO level and the HOMO level is larger than the light emission energy by 0.37 eV, 0.72 eV, 0.67 eV, and 0.32 eV, respectively. Therefore, high energy corresponding to the energy difference between the LUMO level and the HOMO level is needed, that is, high voltage is needed when carriers injected from a pair of electrodes in the light-emitting element are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

<Relation 2 Between Percentage of Light Emission of Exciplexes and Characteristics of Light-Emitting Elements>

Accordingly, the transition energies ($E_{G\_abs}$) calculated from the absorption edges of the absorption spectra of the guest materials included in the thin films 1 to 7 were calculated to be 2.59 eV, 2.59 eV, 2.68 eV, 2.63 eV, 2.63 eV, 2.61 eV, and 2.61 eV, respectively. Thus, in the thin films 1 to 7, $E_{G\_abs}$ is greater than $E_{Ex\_em}$.

Figure 29A:
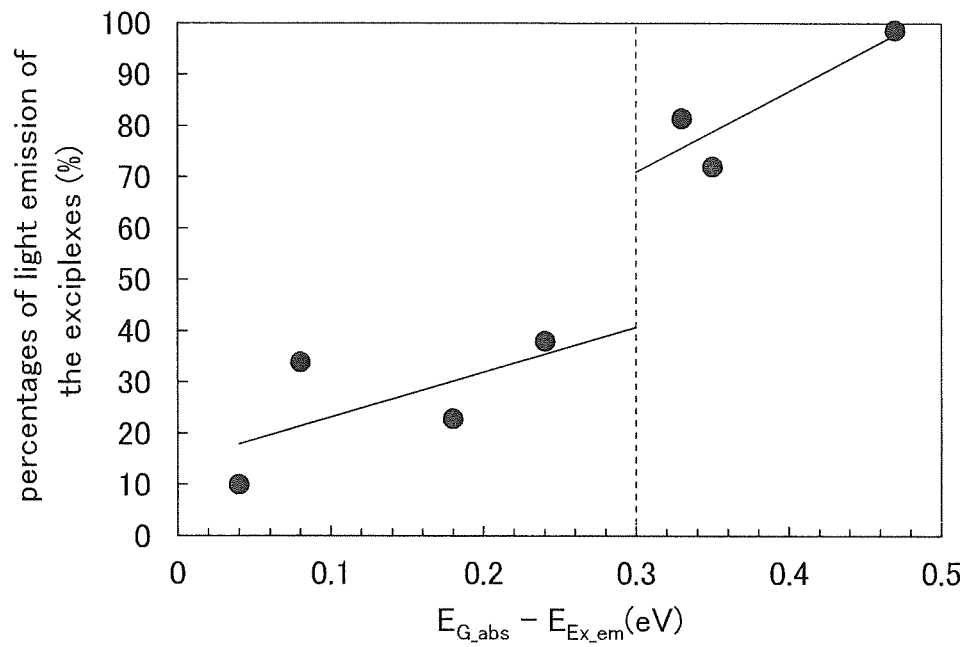
FIG. 29A shows the relation between the percentage of light emission of an exciplex- and the energy difference between a guest material and the exciplex in Example.

The relation between the percentages of light emission of the exciplexes to light emission from the thin films 1 to 7 and $E_{G\_abs}-E_{Ex\_em}$ is shown in FIG. 29A. FIG. 29A shows that the tendency of the thin films 1 to 4 having small percentages of light emission of the exciplexes is different from that of the thin films 5 to 7 having large percentages of light emission of the exciplexes. This shows that the percentage of light emission of the exciplex is markedly changed at a boundary where $E_{G\_abs}-E_{Ex\_em}$ is 0.30 eV That is, when $E_{G\_abs}-E_{Ex\_em}$ is smaller than or equal to 0.30 eV, the percentage of light emission of the exciplex is decreased, and high emission efficiency can be obtained.

Figure 29B:
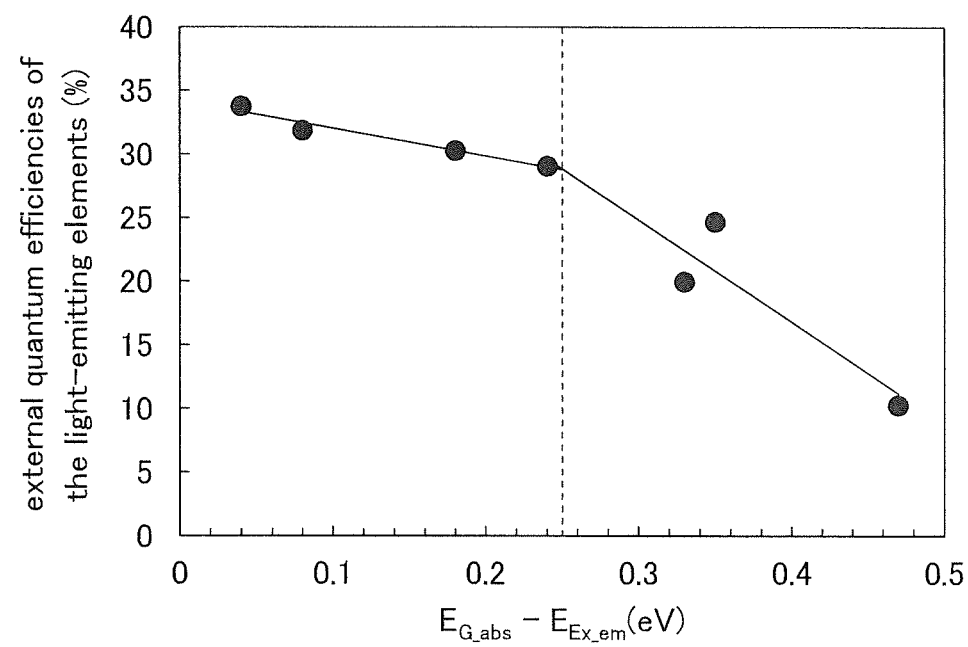
FIG. 29B shows the relation between the external quantum efficiency and the energy difference between the guest material- and the exciplex in Example.

The relation between the maximum external quantum efficiencies of the light-emitting elements 1 to 7 and $E_{G\_abs}-E_{Ex\_em}$ is shown in FIG. 29B. As shown in FIG. 29B, the point of intersection of a straight line obtained by linear approximation of the relation between $E_{G\_abs}-E_{Ex\_em}$ of the thin films 1 to 4 and the external quantum efficiencies of the light-emitting elements 1 to 4 with a straight line obtained by linear approximation of the relation between $E_{G\_abs}-E_{Ex\_em}$ of the thin films 5 to 7 and the external quantum efficiencies of the light-emitting elements 5 to 7 was calculated to be 0.23 eV. That is, it is preferable that $E_{G\_abs}-E_{Ex\_em}$ be smaller than or equal to 0.23 eV because the light-emitting element can have high external quantum efficiency. Accordingly, $E_{G\_abs}-E_{Ex\_em}$ is preferably larger than 0 eV and smaller than or equal to 0.30 eV (0 eV<$E_{G\_abs}-E_{Ex\_em}$≤0.30 eV), further preferably larger than 0 eV and smaller than or equal to 0.23 eV (0 eV<$E_{G\_abs}-E_{Ex\_em}$≤0.23 eV).

As has been described above, the excitation energy of each of the exciplexes formed in the thin films 1 to 7 substantially corresponds to the energy difference between the LUMO level of the second organic compound and the HOMO level of the first organic compound. The energy differences between the LUMO levels of the second organic compounds (host materials) and the HOMO levels of the first organic compounds (guest materials) in the thin films 1 to 7 are 2.52 eV, 2.49 eV, 2.66 eV, 2.44 eV, 2.36 eV, 2.34 eV, and 2.21 eV, respectively. Thus, in the thin films 1 to 7, $E_{G\_abs}$ is greater than $\Delta E_{Ex}$.

Figure 30A:
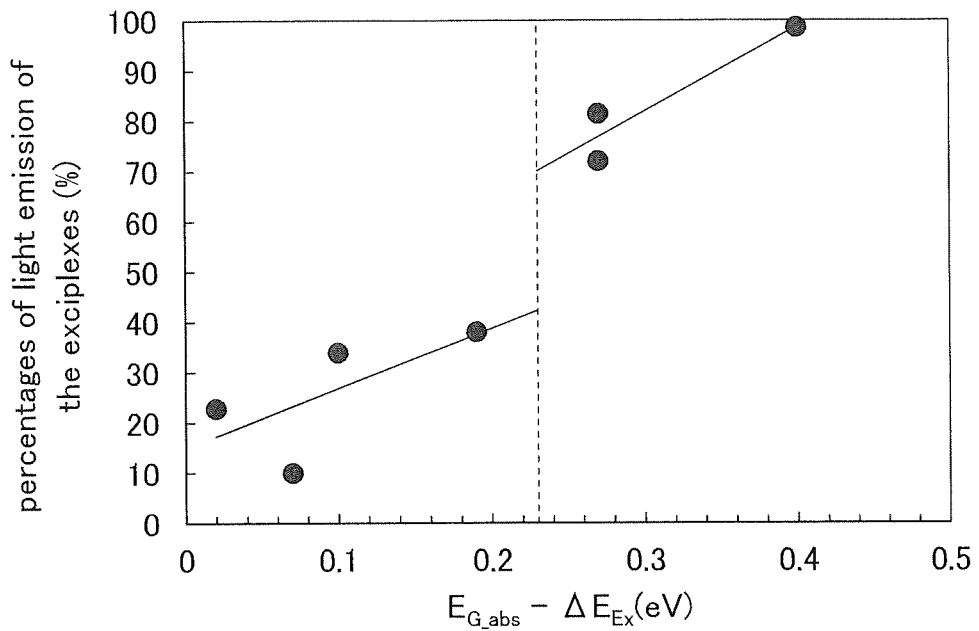
FIG. 30A shows the relation between the percentage of light emission of an exciplex- and the energy difference between a guest material and the exciplex in Example.

The relation between the percentages of light emission of the exciplexes to light emission from the thin films 1 to 7 and $E_{G\_abs}-\Delta E_{Ex}$ is shown in FIG. 30A. FIG. 30A shows that the tendency of the thin films 1 to 4 having small percentages of light emission of the exciplexes is different from that of the thin films 5 to 7 having large percentages of light emission of the exciplexes. This shows that the percentage of light emission of the exciplex is markedly changed at a boundary where $E_{G\_abs}-\Delta E_{Ex}$ is 0.23 eV. That is, when $E_{G\_abs}-\Delta E_{Ex}$ is smaller than or equal to 0.23 eV, the percentage of light emission of the exciplex is decreased, and high emission efficiency can be obtained.

Figure 30B:
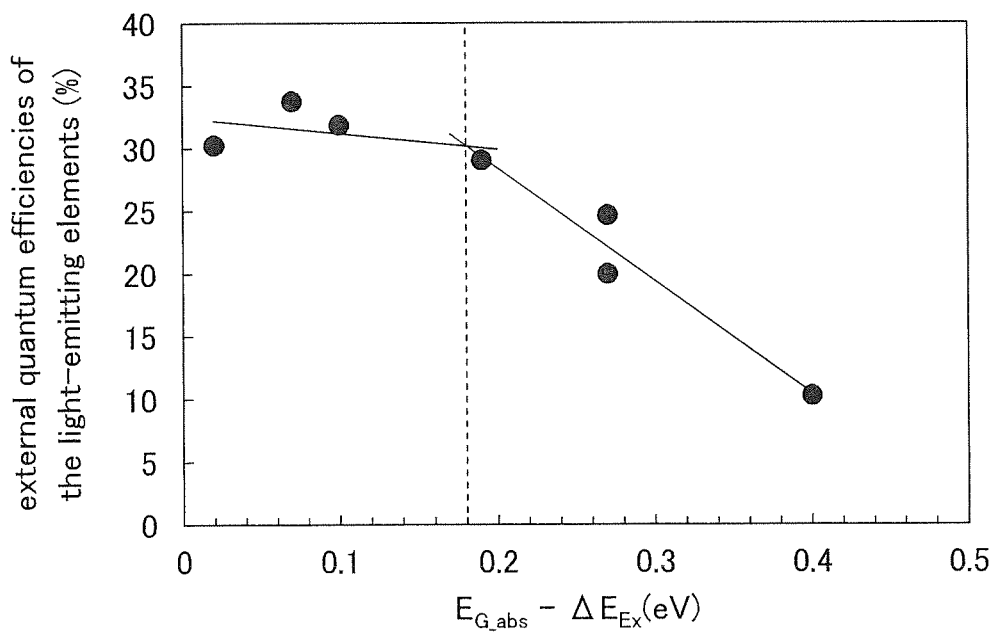
FIG. 30B shows the relation between the external quantum efficiency and the energy difference between the guest material- and the exciplex in Example.

The relation between the maximum external quantum efficiencies of the light-emitting elements 1 to 7 and $E_{G\_abs}-\Delta E_{Ex}$ is shown in FIG. 30B. As shown in FIG. 30B, the point of intersection of a straight line obtained by linear approximation of the relation between $E_{G\_abs}-\Delta E_{Ex}$ of the thin films 1 to 4 and the external quantum efficiencies of the light-emitting elements 1 to 4 with a straight line obtained by linear approximation of the relation between $E_{G\_abs}-\Delta E_{Ex}$ of the thin films 5 to 7 and the external quantum efficiencies of the light-emitting elements 5 to 7 was calculated to be 0.18 eV. That is, it is preferable that $E_{G\_abs}-\Delta E_{Ex}$ be smaller than or equal to 0.18 eV because the light-emitting element can have high external quantum efficiency. Accordingly, $E_{G\_abs}-\Delta E_{Ex}$ is preferably larger than 0 eV and smaller than or equal to 0.23 eV (0 eV<$E_{G\_abs}-\Delta E_{Ex}$≤0.23 eV), further preferably larger than 0 eV and smaller than or equal to 0.18 eV (0 eV<$E_{G\_abs}-\Delta E_{Ex}$≤0.18 eV).

<Phosphorescence Spectra of Host Materials>

Next, to obtain the T1 levels of the host materials (the second and third organic compounds) included in the light-emitting elements 1 to 7, the thin film of each compound was formed over a quartz substrate by a vacuum evaporation method, and the emission spectra of the thin films were measured at a low temperature (10 K).

The measurement was performed at a measurement temperature of 10 K with a PL microscope, LabRAM HR-PL, produced by HORIBA, Ltd., a He—Cd laser having a wavelength of 325 nm as excitation light, and a CCD detector.

Note that in the measurement of the emission spectra, in addition to the normal measurement of emission spectra, the measurement of time-resolved emission spectra in which light emission with a long lifetime is focused on was also performed. Since in this measurement method of emission spectra, the measurement temperature was set at a low temperature (10K), in the normal measurement of emission spectra, in addition to fluorescence, which is the main emission component, phosphorescence was observed. Furthermore, in the measurement of time-resolved emission spectra in which light emission with a long lifetime is focused on, phosphorescence was mainly observed. FIG. 36 to FIG. 40 show the phosphorescent components of the time-resolved emission spectra of 4,6mCzP2Pm, mCzP3Pm, 4,6mCzBP2Pm, PCCP, and mCzPICz, respectively, measured at low temperature.

Figure 36:
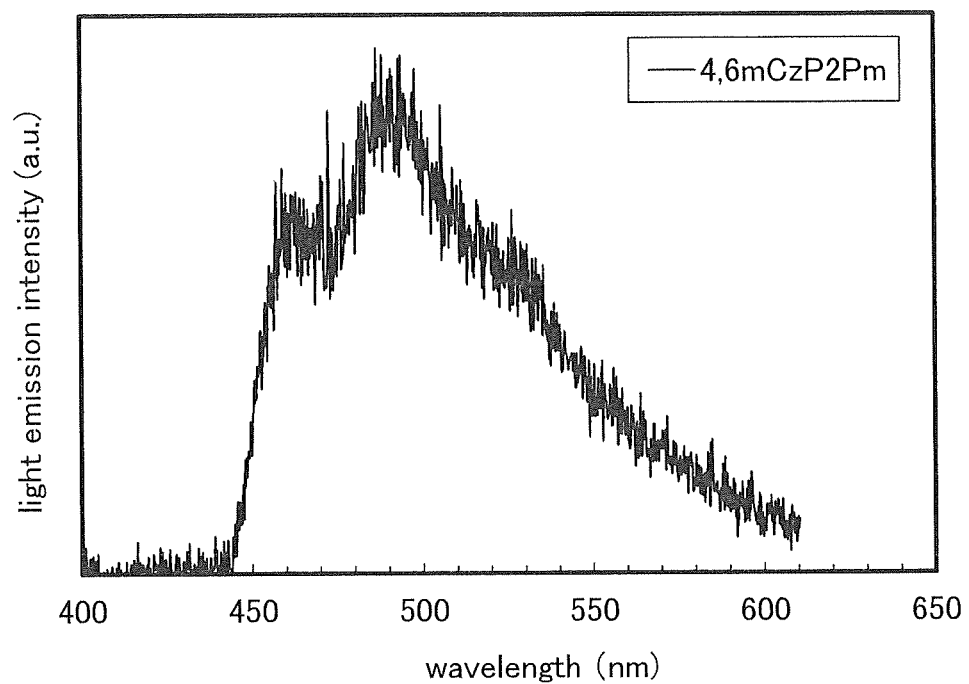
FIG. 36 shows an emission spectrum of a thin film in Example.

As shown in FIG. 36, the phosphorescent component of the emission spectrum of 4,6mCzP2Pm has a peak (including a shoulder) on the shortest wavelength side at 459 nm. Accordingly, the T1 level of 4,6mCzP2Pm was calculated to be 2.70 eV.

Figure 37:
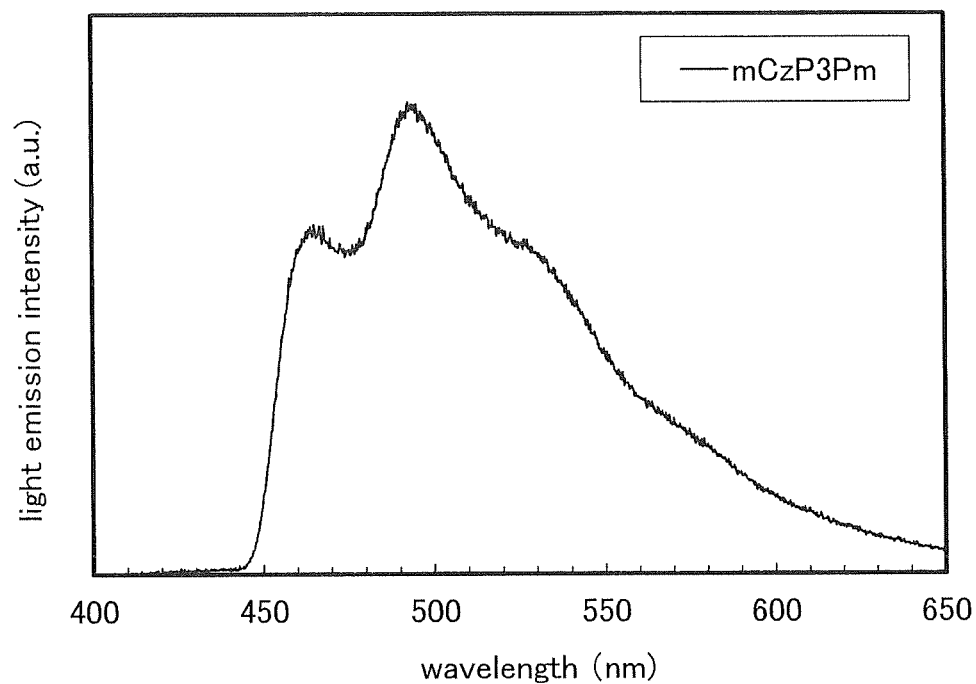
FIG. 37 shows an emission spectrum of a thin film in Example.

As shown in FIG. 37, the phosphorescent component of the emission spectrum of mCzP3Pm has a peak (including a shoulder) on the shortest wavelength side at 464 nm. Accordingly, the T1 level of mCzP3Pm was calculated to be 2.67 eV.

Figure 38:
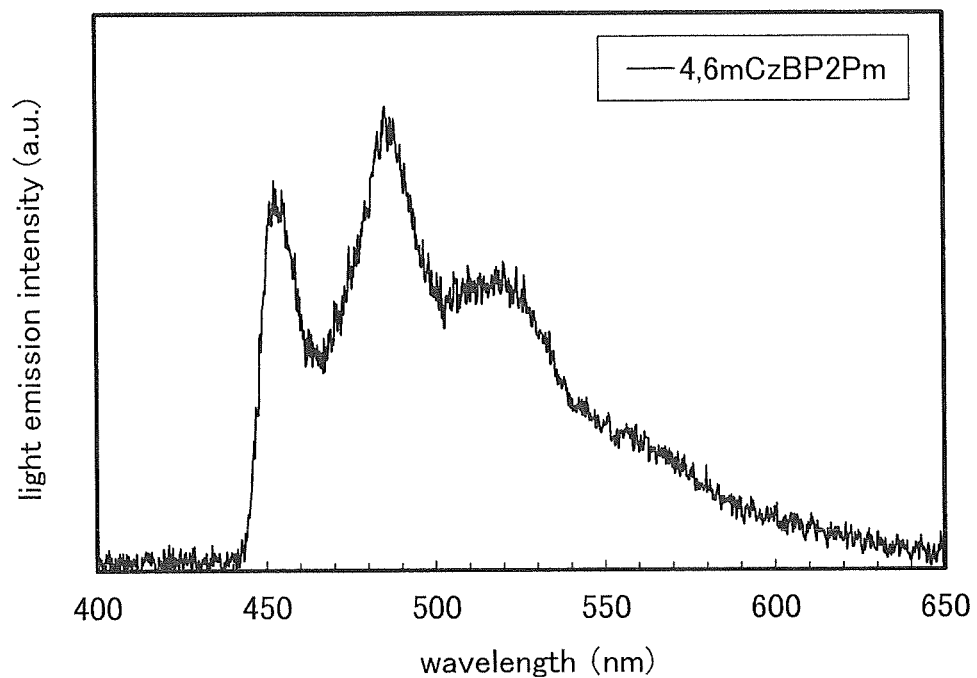
FIG. 38 shows an emission spectrum of a thin film in Example.

As shown in FIG. 38, the phosphorescent component of the emission spectrum of 4,6mCzBP2Pm has a peak (including a shoulder) on the shortest wavelength side at 452 nm. Accordingly, the T1 level of 4,6mCzBP2Pm was calculated to be 2.74 eV.

Figure 39:
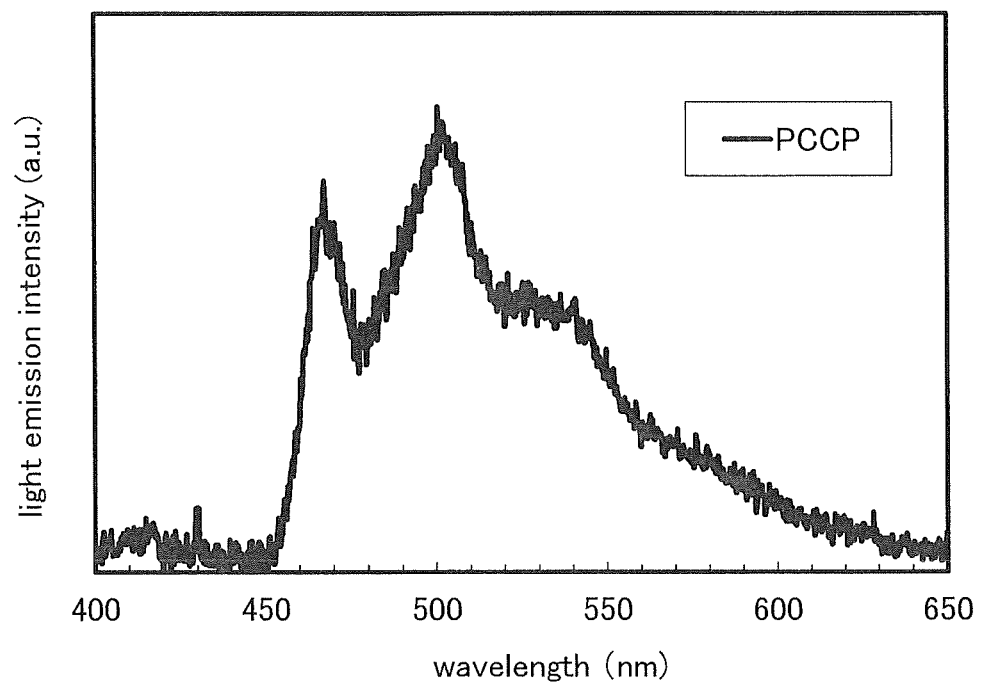
FIG. 39 shows an emission spectrum of a thin film in Example.

As shown in FIG. 39, the phosphorescent component of the emission spectrum of PCCP has a peak (including a shoulder) on the shortest wavelength side at 467 nm. Accordingly, the T1 level of PCCP was calculated to be 2.66 eV.

Figure 40:
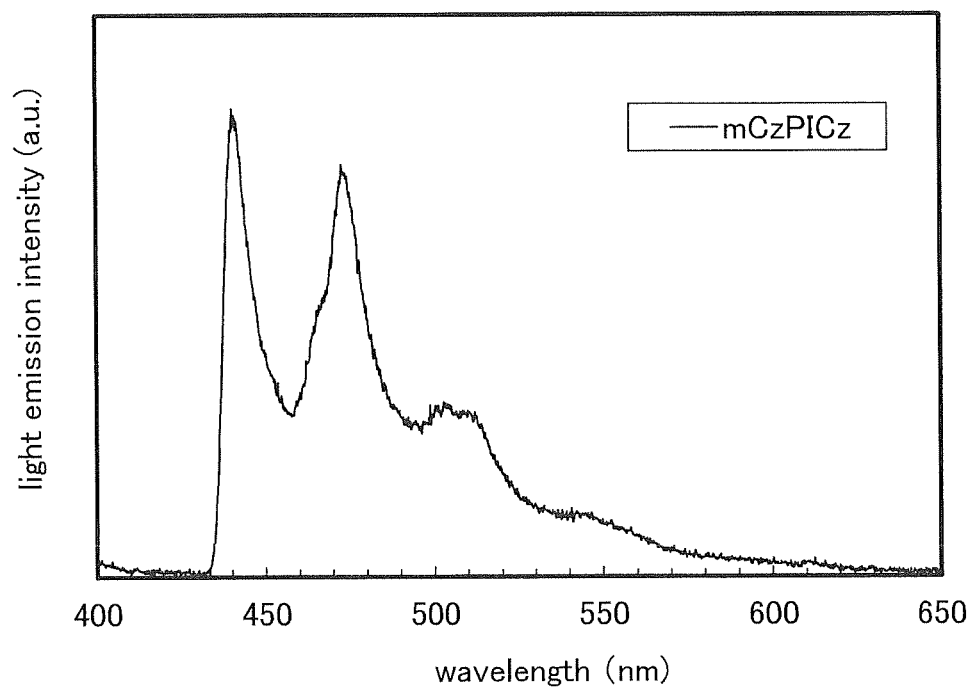
FIG. 40 shows an emission spectrum of a thin film in Example.
Figure 41:
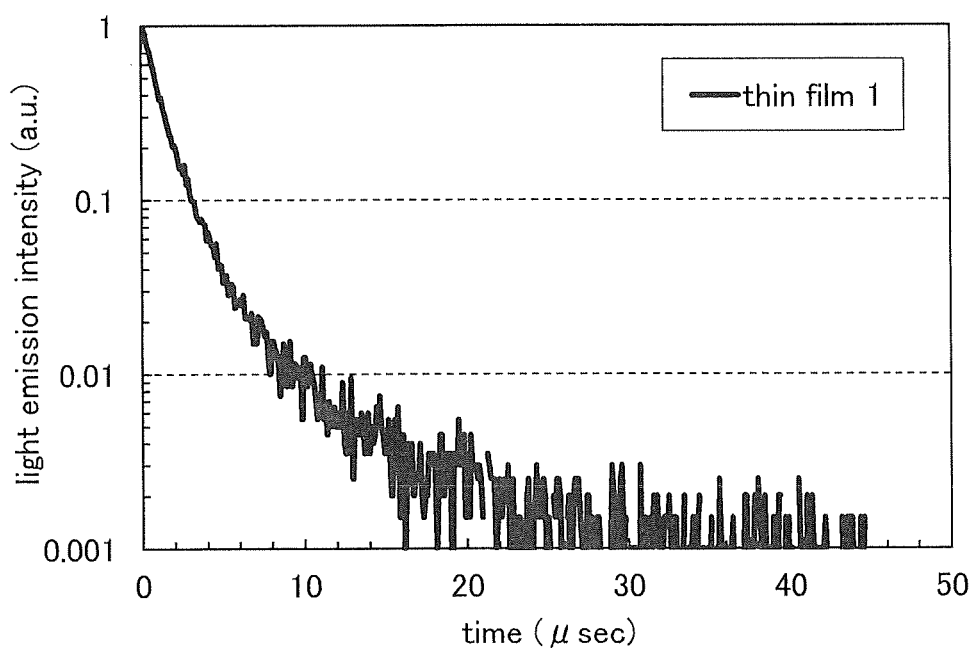
FIG. 41 shows transient emission characteristics of thin films in Example.
Figure 42:
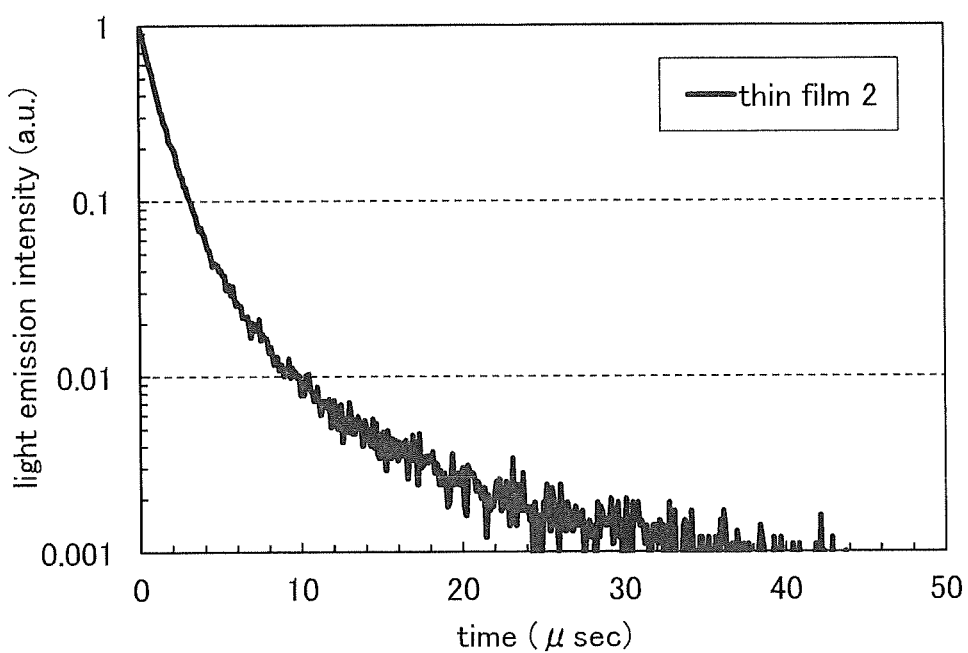
FIG. 42 shows transient emission characteristics of thin films in Example.
Figure 43:
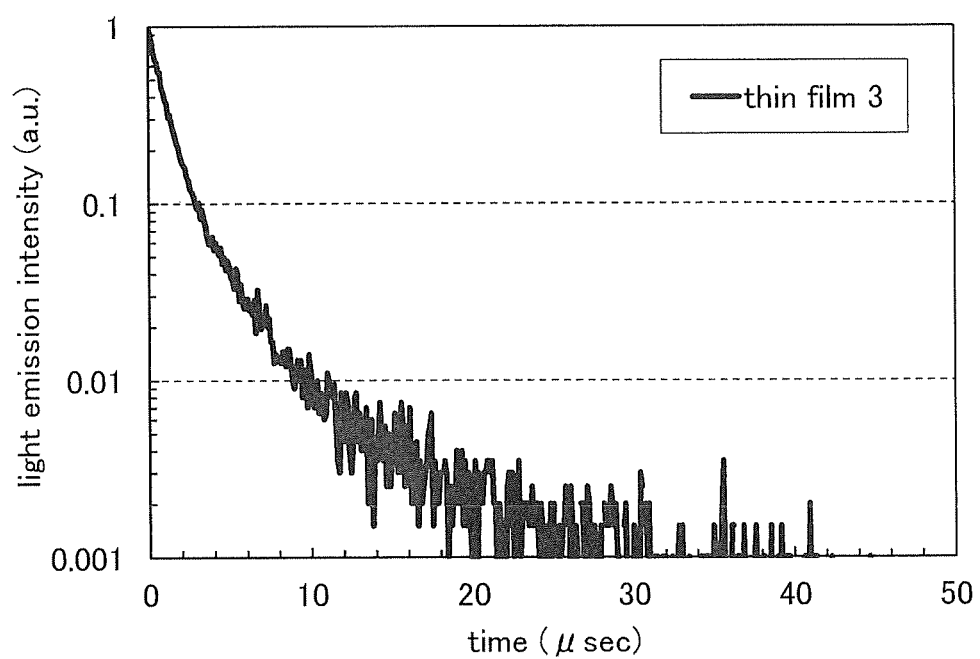
FIG. 43 shows transient emission characteristics of thin films in Example.
Figure 44:
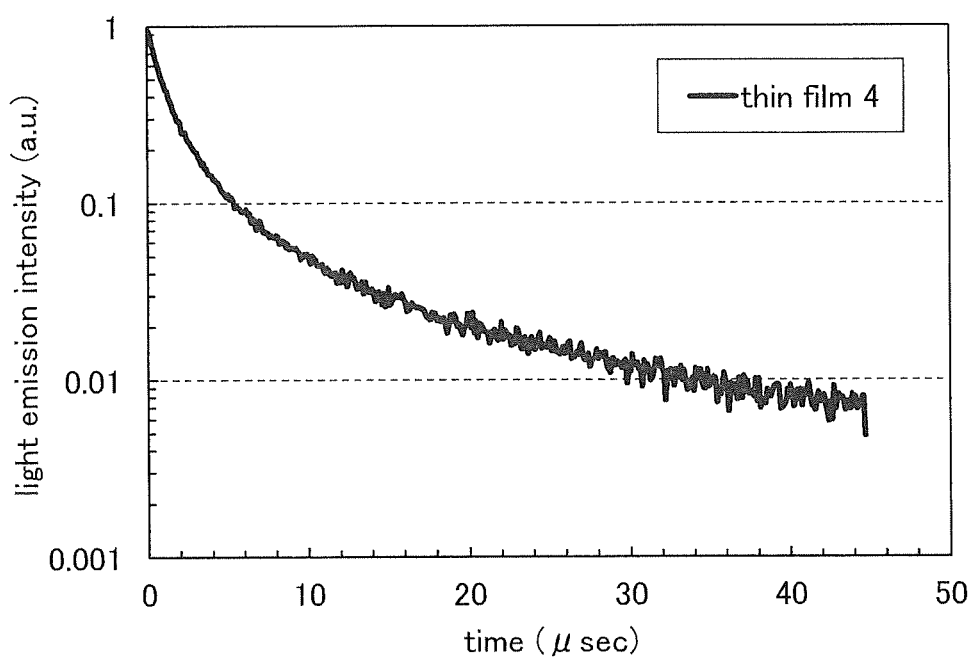
FIG. 44 shows transient emission characteristics of thin films in Example.
Figure 45:
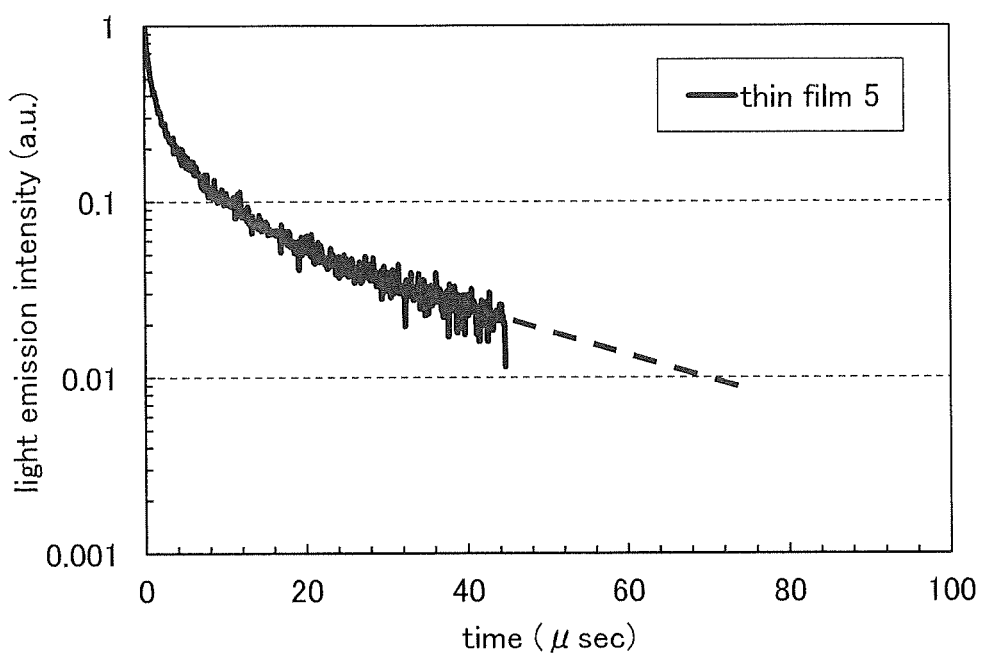
FIG. 45 shows transient emission characteristics of thin films in Example.
Figure 46:
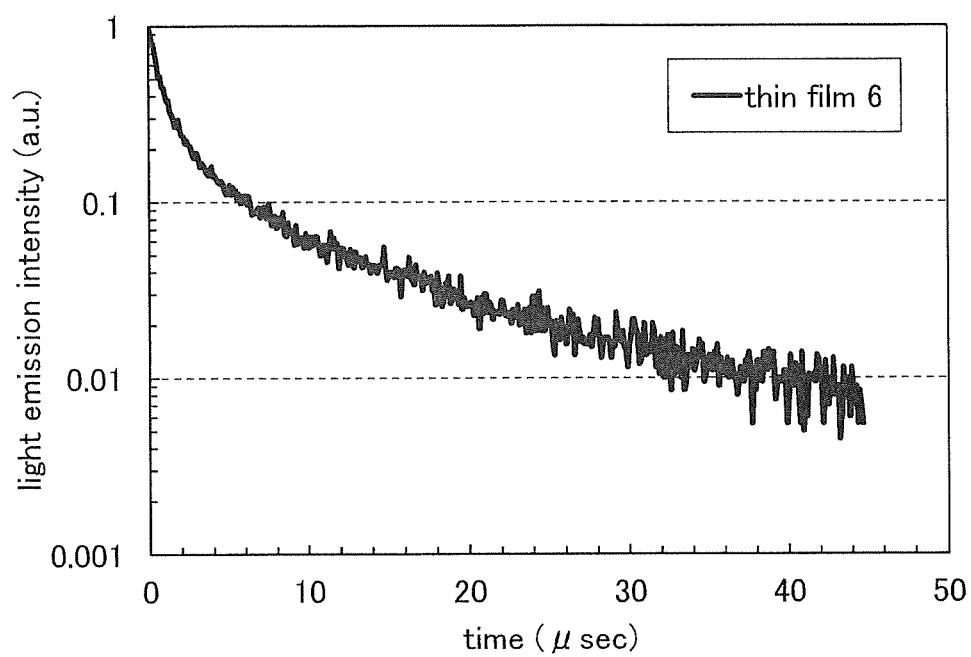
FIG. 46 shows transient emission characteristics of thin films in Example.
Figure 47:
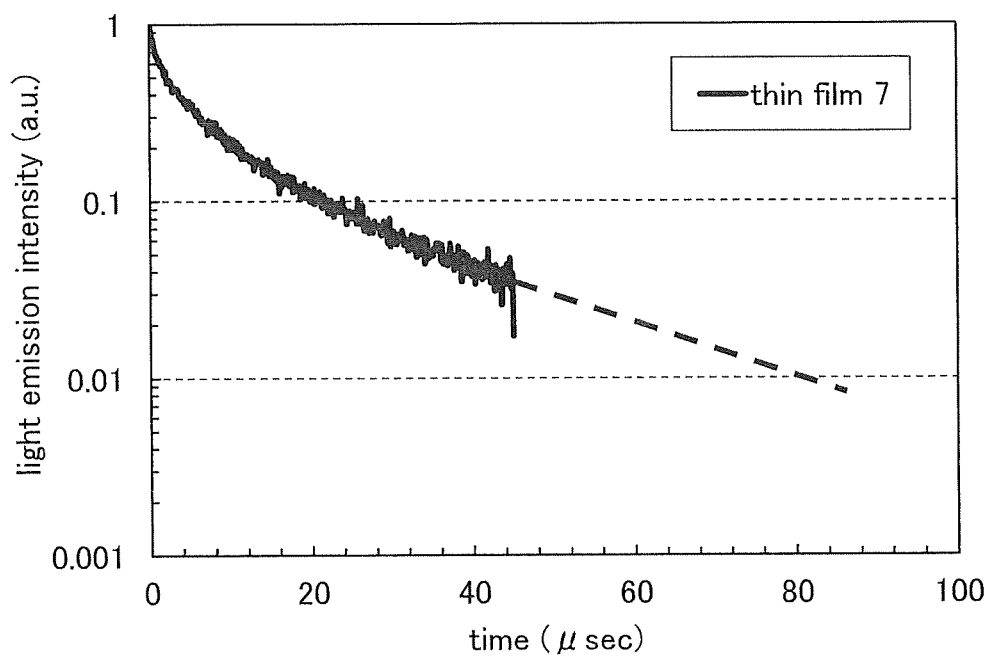
FIG. 47 shows transient emission characteristics of thin films in Example.

As shown in FIG. 40, the phosphorescent component of the emission spectrum of mCzPICz has a peak (including a shoulder) on the shortest wavelength side at 441 nm. Accordingly, the T1 level of mCzPICz was calculated to be 2.81 eV.

Accordingly, in the light-emitting elements 1 to 7, the T1 levels of the host materials (the second and third organic compounds) are higher than or equal to the T1 levels of the guest materials (the first organic compounds) and higher than or equal to the T1 levels of the exciplex formed by the first organic compound and the second organic compound. Therefore, the second and third organic compounds in the light-emitting elements 1 to 7 have the T1 levels high enough for host materials.

<Time-Resolved Emission Measurement>

Next, transient emission characteristics of the fabricated thin films 1 to 7 were measured using time-resolved emission measurement.

A picosecond fluorescence lifetime measurement system (produced by Hamamatsu Photonics K.K.) was used for the measurement. In this measurement, the thin film was irradiated with pulsed laser, and light emission from the thin film which was attenuated from the laser irradiation underwent time-resolved measurement using a streak camera to measure the lifetime of light emission from the thin film. A nitrogen gas laser with a wavelength of 337 nm was used as the pulsed laser. The thin film was irradiated with pulsed laser with a pulse width of 500 ps at a repetition rate of 10 Hz. By integrating data obtained by the repeated measurement, data with a high S/N ratio was obtained. The measurement wavelength range of light emission was greater than or equal to 435 nm and less than or equal to 570 nm, and the measurement time range was shorter than or equal to 50 µs. Note that the measurement was performed at room temperature (in an atmosphere kept at 23° C.).

The measured transient emission characteristics of the thin films 1 to 7 are shown in FIG. 41 to FIG. 47, respectively.

It was found that the transient emission characteristics of each of the thin films 1 to 7 include a delayed emission component in addition to a prompt emission component. In other words, it was suggested that light emission each of the thin films 1 to 7 includes light emission from at least two components.

Times in which the emission intensity is reduced to 1% (hereinafter also referred to as 1% emission lifetime) in the transient emission characteristics of the thin films 1 to 7 are 9.5 µs, 8.8 µs, 9.6 µs, 35 µs, 70 µs, 38 µs, and 80 µs, respectively.

Figure 48A:
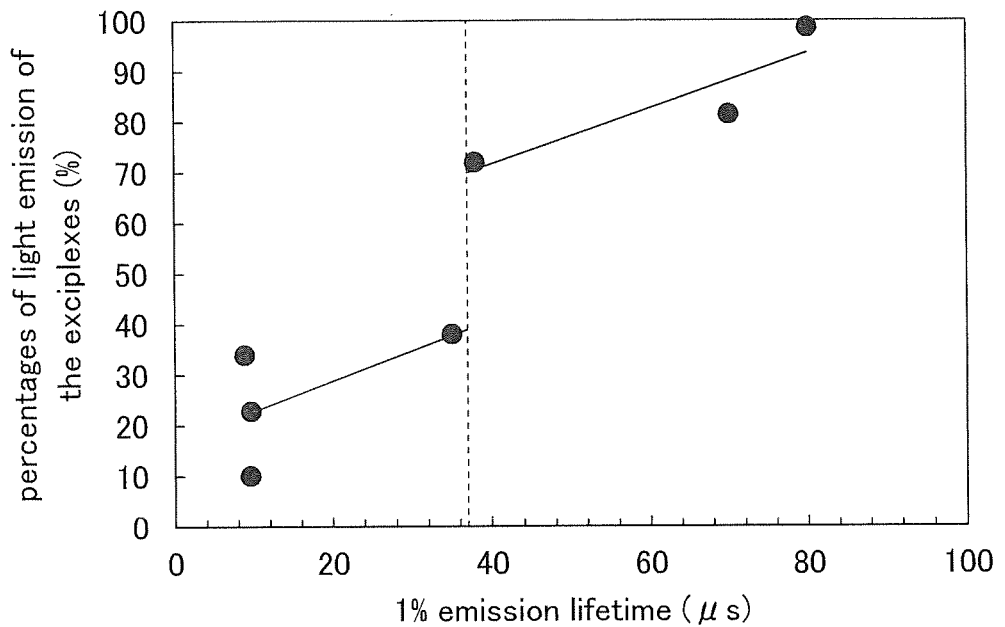
FIG. 48A shows the relation between the percentage of light emission of an exciplex and an emission lifetime in Example.

Next, the relation between the percentages of light emission of the exciplexes to light emission from the thin films 1 to 7 and the 1% emission lifetime in the transient emission characteristics is shown in FIG. 48A. FIG. 48A shows that the tendency of the thin films 1 to 4 having small percentages of light emission of the exciplexes is different from that of the thin films 5 to 7 having large percentages of light emission of the exciplexes. This shows that the percentage of light emission of the exciplex is markedly changed at a boundary where the 1% emission lifetime is 37 µs. That is, when the 1% emission lifetime is shorter than or equal to 37 hts, the percentage of light emission of the exciplex is decreased, and high emission efficiency can be obtained.

Figure 48B:
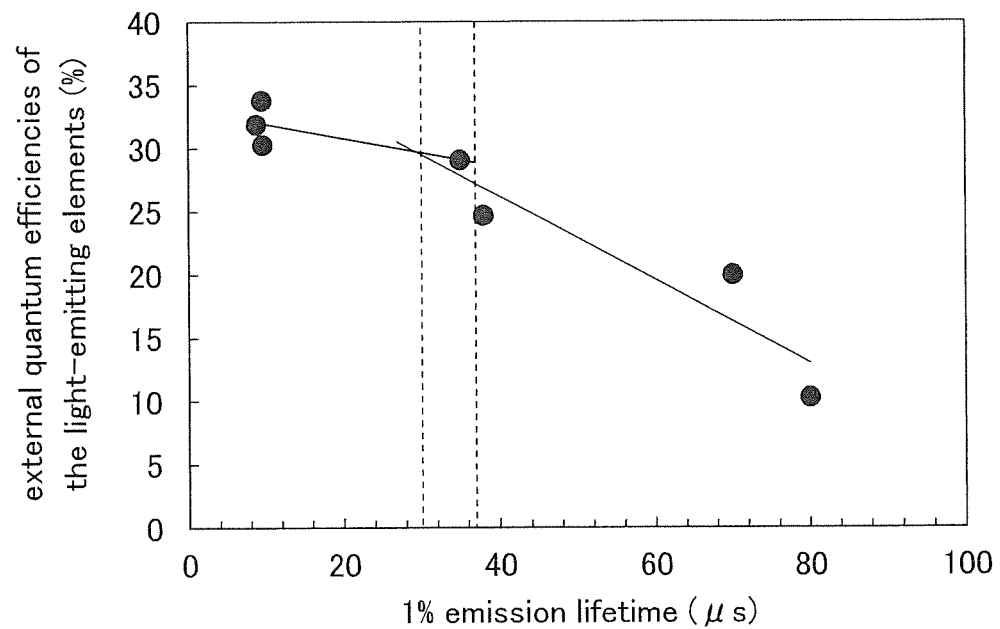
FIG. 48B shows the relation between the external quantum efficiency and an emission lifetime in Example.

The relation between the maximum external quantum efficiencies of the light-emitting elements 1 to 7 and the 1% emission lifetime in the transient emission characteristics of the thin films 1 to 7 is shown in FIG. 48B. As shown in FIG. 48B, the point of intersection of a straight line obtained by linear approximation of the relation between the 1% emission lifetime of the thin films 1 to 4 and the external quantum efficiencies of the light-emitting elements 1 to 4 with a straight line obtained by linear approximation of the relation between the 1% emission lifetime of the thin films 4 to 7 and the external quantum efficiencies of the light-emitting elements 4 to 7 was calculated to be 30 µs. That is, it is preferable that the 1% emission lifetime be shorter than or equal to 30 µs because the light-emitting element can have high external quantum efficiency. Accordingly, the 1% emission lifetime is preferably shorter than or equal to 37 µs, further preferably shorter than or equal to 30 µs.

<Emission Spectra 2 of Thin Films>

Note that as shown in Table 4, the HOMO level of each of the second organic compounds (4,6mCzP2Pm, mCzP3Pm, and 4,6mCzBP2Pm), which are the host materials, is lower than or equal to the HOMO level of each of the third organic compounds (PCCP and mCzPICz), which are the host materials. The LUMO level of each of the second organic compounds (4,6mCzP2Pm, mCzP3Pm, and 4,6mCzBP2Pm) is lower than or equal to the LUMO level of each of the third organic compounds (PCCP and mCzPICz). Thus, in the case where the compounds are used for a light-emitting layer as in the light-emitting elements 1 to 7, electrons and holes that are carriers injected from a pair of electrodes are efficiently injected to the second organic compound (host material) and the third organic compound (host material); thus, the combination of the second organic compound (host material) and the third organic compound (host material) can form an exciplex.

Figure 49:
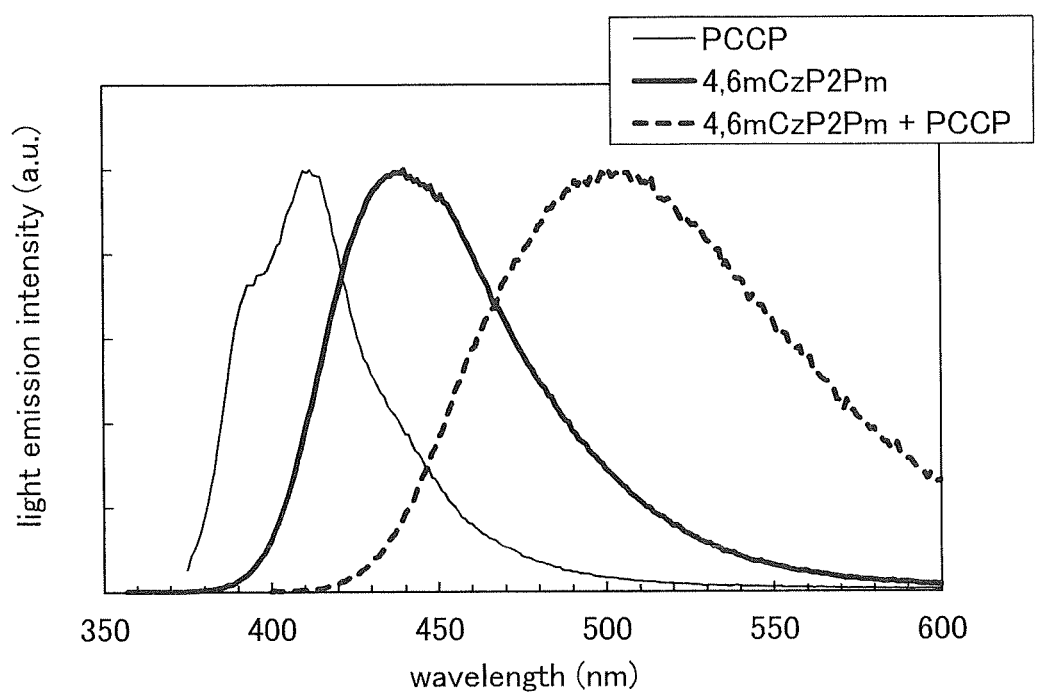
FIG. 49 shows the emission spectra of thin films in Example.
Figure 50:
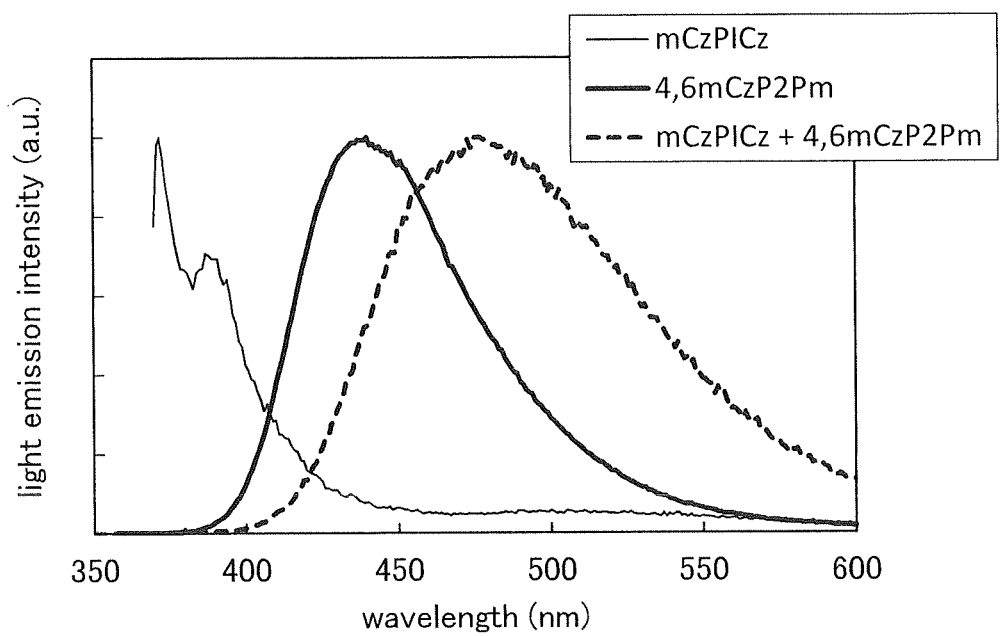
FIG. 50 shows the emission spectra of thin films in Example.

Thus, next, FIG. 49 and FIG. 50 show the measurement results of the emission spectrum of each of the thin films of 4,6mCzP2Pm, PCCP, and mCzPICz, which are used as the host materials (the second and third organic compounds) of the above light-emitting elements, the emission spectrum of a mixed thin film of 4,6mCzP2Pm and PCCP, and the emission spectrum of a mixed thin film of 4,6mCzP2Pm and mCzPICz.

For the emission spectrum measurement, the thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each the thin film was 50 nm. The mixing ratio of the two kinds of compounds in each of the mixed thin films was 1:1.

As shown in FIG. 49, a peak wavelength of the emission spectrum of the mixed thin film of 4,6mCzP2Pm and PCCP is 501 nm. The emission spectrum of the mixed thin film of 4,6mCzP2Pm and PCCP differs from the emission spectrum of the thin film of 4,6mCzP2Pm (peak wavelength: 440 nm) and the emission spectrum of the thin film of PCCP (peak wavelength: 412 nm). As shown in Table 4, the LUMO level of 4,6mCzP2Pm is lower than that of PCCP, and the HOMO level of 4,6mCzP2Pm is lower than that of PCCP. The energy of light emission from the mixed thin film of 4,6mCzP2Pm and PCCP approximately corresponds to an energy difference between the LUMO level of 4,6mCzP2Pm and the HOMO level of PCCP. The light emission from the mixed thin film of 4,6mCzP2Pm and PCCP has a longer wavelength (lower energy) than light emission from the thin film of 4,6mCzP2Pm and light emission from the thin film of PCCP. Therefore, it can be said that the light emission from the mixed thin film of 4,6mCzP2Pm and PCCP is light emission from an exciplex formed by 4,6mCzP2Pm and PCCP. That is, 4,6mCzP2Pm and PCCP are organic compounds which form an exciplex in combination with each other.

The absorption band on the lowest energy side (the longest wavelength side) of each of the absorption spectra of Ir(mpptz-diBuCNp)$_3$, Ir(mpptz-diPrp)$_3$, Ir(pim-diBuCNp)$_3$, and Ir(iPrpim)$_3$, which are the guest materials of the light-emitting elements 1, 5, 6, and 7 including 4,6mCzP2Pm and PCCP as the host materials includes a region that overlaps with light emission from the mixed thin film of 4,6mCzP2Pm and PCCP (that is, light emission of the exciplex formed by 4,6mCzP2Pm and PCCP). Thus, excitation energy can be transferred effectively from the exciplex formed by 4,6mCzP2Pm and PCCP to the guest materials. Therefore, by including 4,6mCzP2Pm and PCCP as host materials, a light-emitting element that is driven at low voltage can be provided.

Note that the energy difference between the S1 level and the T1 level of an exciplex is small; thus, the S1 level and the T1 level of an exciplex can be obtained by a peak wavelength on the shortest wavelength side of the emission spectrum. That is, the S1 level and the T1 level of the exciplex formed by 4,6mCzP2Pm and PCCP can be regarded as 2.47 eV. The energy of the T1 level is lower than the T1 level of 4,6mCzP2Pm (2.70 eV) and lower than the T1 level of PCCP (2.66 eV). Thus, 4,6mCzP2Pm and PCCP have the T1 levels high enough for suppressing deactivation of triplet excitation energy of the exciplex formed by 4,6mCzP2Pm and PCCP, and with these compounds, a light-emitting element that has high emission efficiency and is driven at low voltage can be provided.

As shown in FIG. 50, a peak wavelength of the emission spectrum of the mixed thin film of 4,6mCzP2Pm and mCzPICz is 477 nm. The emission spectrum differs from the emission spectrum of the thin film of 4,6mCzP2Pm (peak wavelength: 440 nm) and the emission spectrum of the thin film of mCzPICz (peak wavelength: 372 nm). As shown in Table 4, the LUMO level of 4,6mCzP2Pm is lower than that of mCzPICz, and the HOMO level of 4,6mCzP2Pm is lower than that of mCzPICz. The energy of light emission from the mixed thin film of 4,6mCzP2Pm and mCzPICz approximately corresponds to an energy difference between the LUMO level of 4,6mCzP2Pm and the HOMO level of mCzPICz. The light emission from the mixed thin film of 4,6mCzP2Pm and mCzPICz has a longer wavelength (lower energy) than light emission from the thin film of 4,6mCzP2Pm and light emission from the thin film of mCzPICz. Therefore, it can be said that the light emission from the mixed thin film of 4,6mCzP2Pm and mCzPICz is light emission from an exciplex formed by 4,6mCzP2Pm and mCzPICz. That is, 4,6mCzP2Pm and mCzPICz are organic compounds which form an exciplex in combination with each other.

The absorption band on the lowest energy side (the longest wavelength side) of the absorption spectrum of Ir(Mptz1-mp)$_3$, which is the guest material of the light-emitting element 3 including 4,6mCzP2Pm and mCzPICz as the host materials includes a region that overlaps with light emission from the mixed thin film of 4,6mCzP2Pm and mCzPICz (that is, light emission of the exciplex formed by 4,6mCzP2Pm and mCzPICz). Thus, excitation energy can be transferred effectively from the exciplex formed by 4,6mCzP2Pm and mCzPICz to the guest materials. Therefore, by including 4,6mCzP2Pm and mCzPICz as host materials, a light-emitting element that is driven at low voltage can be provided.

Note that the energy difference between the S1 level and the T1 level of an exciplex is small; thus, the S1 level and the T1 level of an exciplex can be obtained by a peak wavelength on the shortest wavelength side of the emission spectrum. That is, the S1 level and the T1 level of the exciplex formed by 4,6mCzP2Pm and mCzPICz can be regarded as 2.60 eV. The energy of the T1 level is lower than the T1 level of 4,6mCzP2Pm (2.70 eV) and the T1 level of mCzPICz (2.81 eV). Thus, 4,6mCzP2Pm and mCzPICz have the T1 levels high enough for suppressing deactivation of triplet excitation energy of the exciplex formed by 4,6mCzP2Pm and mCzPICz, and with these compounds, a light-emitting element that has high emission efficiency and is driven at low voltage can be provided.

With one embodiment of the present invention, a light-emitting element with high emission efficiency can be provided. In addition, with one embodiment of the present invention, a light-emitting element with low driving voltage and reduced power consumption can be provided.

Example 2

In this example, examples of fabricating light-emitting elements of embodiments of the present invention and characteristics of the light-emitting elements are described. The structure of each of the light-emitting elements fabricated in this example is the same as that illustrated in FIG. 1. Table 5 and Table 6 show the detailed structures of the elements. In addition, structures and abbreviations of compounds used here are given below.

[Chemical Formula 24]

4,8mCzP2Bfpm
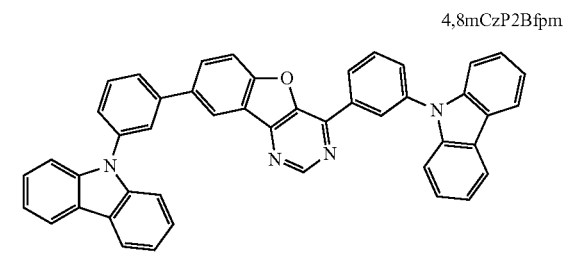

4,8mDBtP2Bfpm
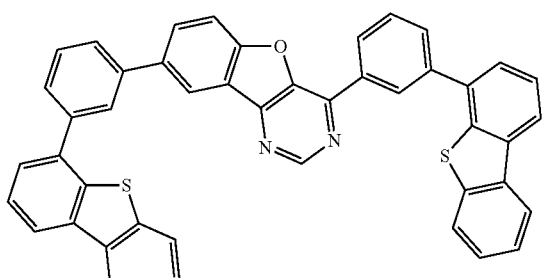

4mDBTBPBfpm-II
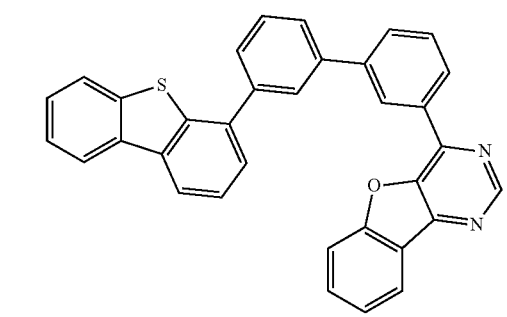

4,6mDBTP2Pm-II
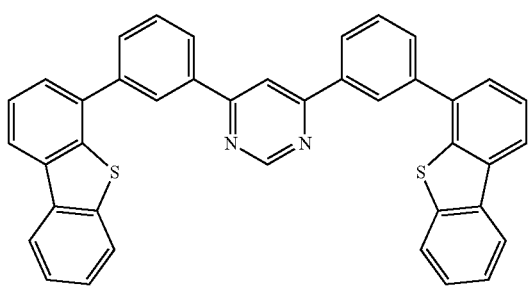

5Me-4,6mCzP2Pm
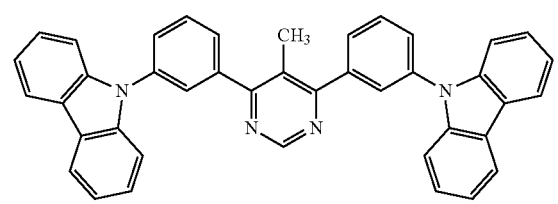

4,4'mCzP2BPy
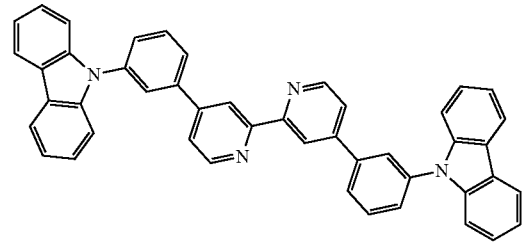

TABLE 5

| | Layer | Reference numeral | Thickness (nm) | Material(s) | Weight ratio |
|---|---|---|---|---|---|
| Light-emitting element 8 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,8mCzP2Bfpm | — |
| | Light-emitting layer | 130(2) | 20 | 4,8mCzP2Bfpm:PCCP:GD270 | 0.8:0.2:0.05 |
| | Light-emitting layer | 130(1) | 20 | 4,8mCzP2Bfpm:PCCP:GD270 | 0.5:0.5:0.05 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 9 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,8mDBtP2Bfpm | — |
| | Light-emitting layer | 130(2) | 20 | 4,8mDBtP2Bfpm:PCCP:GD270 | 0.8:0.2:0.05 |
| | Light-emitting layer | 130(1) | 20 | 4,8mDBtP2Bfpm:PCCP:GD270 | 0.5:0.5:0.05 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |

TABLE 5-continued

| | Layer | Reference numeral | Thickness (nm) | Material(s) | Weight ratio |
|---|---|---|---|---|---|
| Light-emitting element 10 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4mDBTBPBfpm-II | — |
| | Light-emitting layer | 130(2) | 20 | 4mDBTBPBfpm-II:PCCP:GD270 | 0.8:0.2:0.05 |
| | Light-emitting layer | 130(1) | 20 | 4mDBTBPBfpm-II:PCCP:GD270 | 0.5:0.5:0.05 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 11 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 130(2) | 20 | 4,6mCzP2Pm:PCCP:GD270 | 0.8:0.2:0.05 |
| | Light-emitting layer | 130(1) | 20 | 4,6mCzP2Pm:PCCP:GD270 | 0.5:0.5:0.05 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |

TABLE 6

| | Layer | Reference numeral | Thickness (nm) | Material(s) | Weight ratio |
|---|---|---|---|---|---|
| Light-emitting element 12 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mDBTP2Pm-II | — |
| | Light-emitting layer | 130(2) | 20 | 4,6mDBTP2Pm-II:PCCP:GD270 | 0.8:0.2:0.05 |
| | Light-emitting layer | 130(1) | 20 | 4,6mDBTP2Pm-II; :PCCP:GD270 | 0.5:0.5:0.05 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 13 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzBP2Pm | — |
| | Light-emitting layer | 130(2) | 20 | 4,6mCzBP2Pm:PCCP:GD270 | 0.8:0.2:0.05 |
| | Light-emitting layer | 130(1) | 20 | 4,6mCzBP2Pm:PCCP:GD270 | 0.5:0.5:0.05 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 14 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 5Me-4,6mCzP2Pm | — |
| | Light-emitting layer | 130(2) | 20 | 5Me-4,6mCzP2Pm:PCCP:GD270 | 0.8:0.2:0.05 |
| | Light-emitting layer | 130(1) | 20 | 5Me-4,6mCzP2Pm:PCCP:GD270 | 0.5:0.5:0.05 |
| | Hole-transport layer | 112 | 20 | PCCP | — |

TABLE 6-continued

| Layer | Reference numeral | Thickness (nm) | Material(s) | Weight ratio |
|---|---|---|---|---|
| Hole-injection layer | 111 | 30 | DBT3P-II:MoO$_3$ | 1:0.5 |
| Electrode | 101 | 70 | ITSO | — |

<Fabrication of Light-Emitting Elements>

Methods for fabricating light-emitting elements of this example are described below.

<<Fabrication of light-emitting element 8>>

The light-emitting element 8 was fabricated through the same steps as those for the light-emitting element 1 except for the steps of forming the hole-injection layer 111, the light-emitting layer 130, and the electron-transport layer 118.

As the hole-injection layer 111, DBT3P-II and molybdenum oxide (MoO$_3$) were deposited over the electrode 101 by co-evaporation such that the deposited layer had a weight ratio of DBT3P-II: MoO$_3$=1:0.5 to a thickness of 30 nm.

As the light-emitting layer 130 over the hole-transport layer 112, 4,8-bis[3-(9H-carbazol-9-yl)phenyl]-[1]benzofuro[3,2-d]pyrimidine (abbreviation: 4,8mCzP2Bfpm), PCCP, and GD270 (produced by Jilin Optical and Electronic Materials Co., Ltd.) were deposited by co-evaporation in a weight ratio of 4,8mCzP2Bfpm:PCCP:GD270=0.5:0.5:0.05 to a thickness of 20 nm, and successively, 4,8mCzP2Bfpm, PCCP, and GD270 were deposited by co-evaporation in a weight ratio of 4,8mCzP2Bfpm:PCCP:GD270=0.8:0.2:0.05 to a thickness of 10 nm. In the light-emitting layer 130, GD270 is the guest material (first organic compound), 4,8mCzP2Bfpm is the host material (second organic compound), and PCCP is the host material (third organic compound).

Next, as the electron-transport layer 118, 4,8mCzP2Bfpm and BPhen were sequentially deposited over the light-emitting layer 130 by evaporation to thicknesses of 10 nm and 15 nm, respectively.

<<Fabrication of Light-Emitting Elements 9 to 14>>

The light-emitting elements 9 to 14 were fabricated through the same steps as those for the light-emitting element 1 except for the steps of forming the light-emitting layer 130 and the electron-transport layer 118.

<<Fabrication of Light-Emitting Element 9>>

As the light-emitting layer 130 over the hole-transport layer 112, 4,8-bis[3-(dibenzothiophen-4-yl)phenyl]-[1]benzofuro[3,2-d]pyrimidine (abbreviation: 4,8mDBtP2Bfpm), PCCP, and GD270 were deposited by co-evaporation in a weight ratio of 4,8mCzP2Bfpm:PCCP:GD270=0.5:0.5:0.05 to a thickness of 20 nm, and successively, 4,8mDBtP2Bfpm, PCCP, and GD270 were deposited by co-evaporation in a weight ratio of 4,8mDBtP2Bfpm:PCCP:GD270=0.8:0.2:0.05 to a thickness of 10 nm. In the light-emitting layer 130, GD270 is the guest material (first organic compound), 4,8mDBtP2Bfpm is the host material (second organic compound), and PCCP is the host material (third organic compound).

Next, as the electron-transport layer 118, 4,8mDBtP2Bfpm and BPhen were sequentially deposited over the light-emitting layer 130 by evaporation to thicknesses of 10 nm and 15 nm, respectively.

<<Fabrication of Light-Emitting Element 10>>

As the light-emitting layer 130 over the hole-transport layer 112, 4-[3'-(dibenzothiophen-4-yl)biphenyl-3-yl]benzofuro[3,2-d]pyrimidine (abbreviation: 4mDBTBPBfpm-II), PCCP, and GD270 were deposited by co-evaporation in a weight ratio of 4mDBTBPBfpm-II: PCCP:GD270=0.5:0.5:0.05 to a thickness of 20 nm, and successively, 4mDBTBPBfpm-II, PCCP, and GD270 were deposited by co-evaporation in a weight ratio of 4mDBTBPBfpm-II: PCCP:GD270=0.8:0.2:0.05 to a thickness of 10 nm. In the light-emitting layer 130, GD270 is the guest material (first organic compound), 4mDBTBPBfpm-II is the host material (second organic compound), and PCCP is the host material (third organic compound).

Next, as the electron-transport layer 118, 4mDBTBPBfpm-II and BPhen were sequentially deposited over the light-emitting layer 130 by evaporation to thicknesses of 10 nm and 15 nm, respectively.

<<Fabrication of Light-Emitting Element 11>>

As the light-emitting layer 130 over the hole-transport layer 112, 4,6mCzP2Pm, PCCP, and GD270 were deposited by co-evaporation in a weight ratio of 4,6mCzP2Pm: PCCP:GD270=0.5:0.5:0.05 to a thickness of 20 nm, and successively, 4,6mCzP2Pm, PCCP, and GD270 were deposited by co-evaporation in a weight ratio of 4,6mCzP2Pm: PCCP:GD270=0.8:0.2:0.05 to a thickness of 10 nm. In the light-emitting layer 130, GD270 is the guest material (first organic compound), 4,6mCzP2Pm is the host material (second organic compound), and PCCP is the host material (third organic compound).

Next, as the electron-transport layer 118, 4,6mCzP2Pm and BPhen were sequentially deposited over the light-emitting layer 130 by evaporation to thicknesses of 10 nm and 15 nm, respectively.

<<Fabrication of Light-Emitting Element 12>>

As the light-emitting layer 130 over the hole-transport layer 112, 4,6-bis[3-(dibenzothiophen-4-yl)phenyl]pyrimidine (abbreviation: 4,6mDBTP2Pm-II), PCCP, and GD270 were deposited by co-evaporation in a weight ratio of 4,6mDBTP2Pm-II: PCCP:GD270=0.5:0.5:0.05 to a thickness of 20 nm, and successively, 4,6mDBTP2Pm-II, PCCP, and GD270 were deposited by co-evaporation in a weight ratio of 4,6mDBTP2Pm-II: PCCP:GD270=0.8:0.2:0.05 to a thickness of 10 nm. In the light-emitting layer 130, GD270 is the guest material (first organic compound), 4,6mDBTP2Pm-II is the host material (second organic compound), and PCCP is the host material (third organic compound).

Next, as the electron-transport layer 118, 4,6mDBTP2Pm-II and BPhen were sequentially deposited over the light-emitting layer 130 by evaporation to thicknesses of 10 nm and 15 nm, respectively.

<<Fabrication of Light-Emitting Element 13>>

As the light-emitting layer 130 over the hole-transport layer 112, 4,6mCzBP2Pm, PCCP, and GD270 were deposited by co-evaporation in a weight ratio of 4,6mCzBP2Pm: PCCP:GD270=0.5:0.5:0.05 to a thickness of 20 nm, and successively, 4,6mCzBP2Pm, PCCP, and GD270 were deposited by co-evaporation in a weight ratio of 4,6mCzBP2Pm: PCCP:GD270=0.8:0.2:0.05 to a thickness of 10 nm. In the light-emitting layer 130, GD270 is the guest material (first organic compound), 4,6mCzBP2Pm is the host material (second organic compound), and PCCP is the host material (third organic compound).

Then, as the electron-transport layer 118, 4,6mCzBP2Pm and Bphen were sequentially deposited over the light-emitting layer 130 by evaporation to thicknesses of 10 nm and 15 nm, respectively.

<<Fabrication of Light-Emitting Element 14>>

As the light-emitting layer 130 over the hole-transport layer 112, 5-methyl-4,6-bis[3-(9H-carbazol-9-yl)phenyl]pyrimidine (abbreviation: 5Me-4,6mCzP2Pm), PCCP, and GD270 were deposited by co-evaporation in a weight ratio of 5Me-4,6mCzP2Pm: PCCP:GD270=0.5:0.5:0.05 to a thickness of 20 nm, and successively, 5Me-4,6mCzP2Pm, PCCP, and GD270 were deposited by co-evaporation in a weight ratio of 5Me-4,6mCzP2Pm: PCCP:GD270=0.8:0.2: 0.05 to a thickness of 10 nm. In the light-emitting layer 130, GD270 is the guest material (first organic compound), 5Me-4,6mCzP2Pm is the host material (second organic compound), and PCCP is the host material (third organic compound).

Then, as the electron-transport layer 118, 5Me-4, 6mCzP2Pm and Bphen were sequentially deposited over the light-emitting layer 130 by evaporation to thicknesses of 10 nm and 15 nm, respectively.

<Characteristics of the Light-Emitting Elements>

Next, the characteristics of the fabricated light-emitting elements 8 to 14 were measured. The conditions of the measurement were similar to those in Example 1.

Figure 51A:
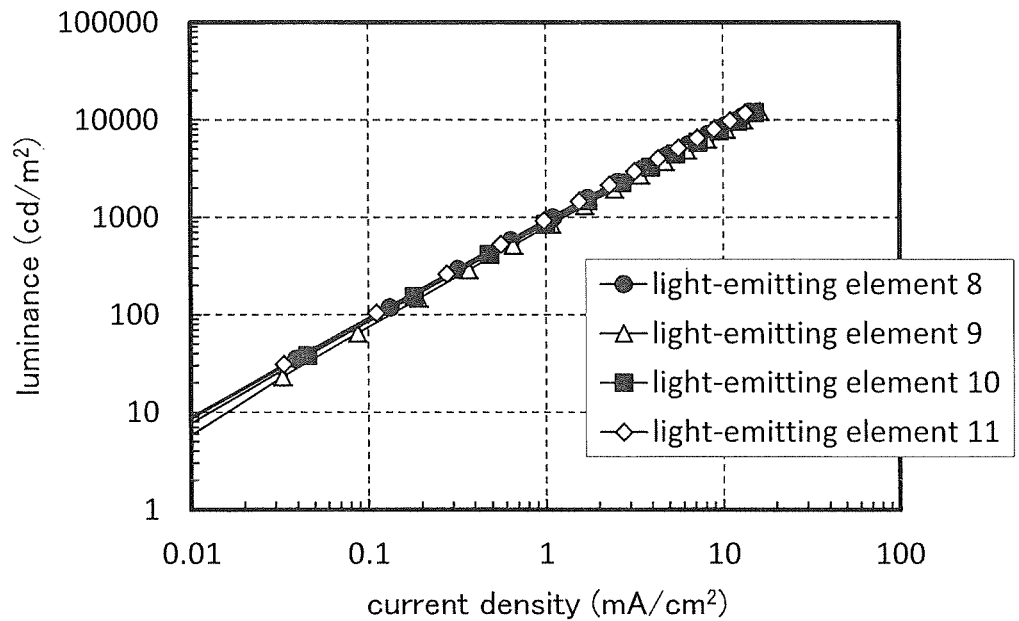
FIGS. 51A and 51B show luminance-current density characteristics of light-emitting elements in Example.
Figure 51B:
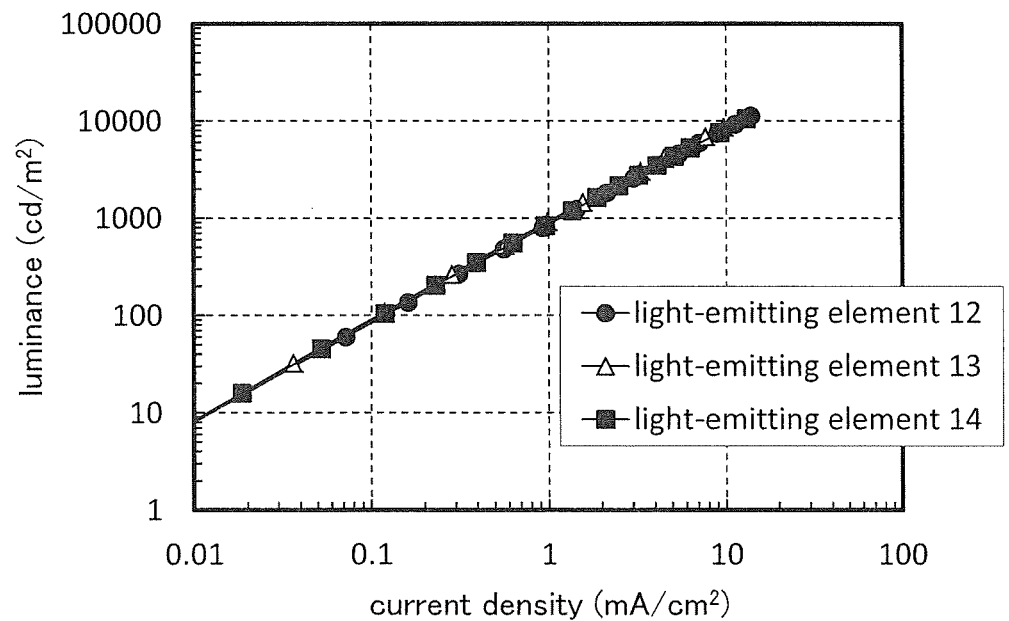
Figure 52A:
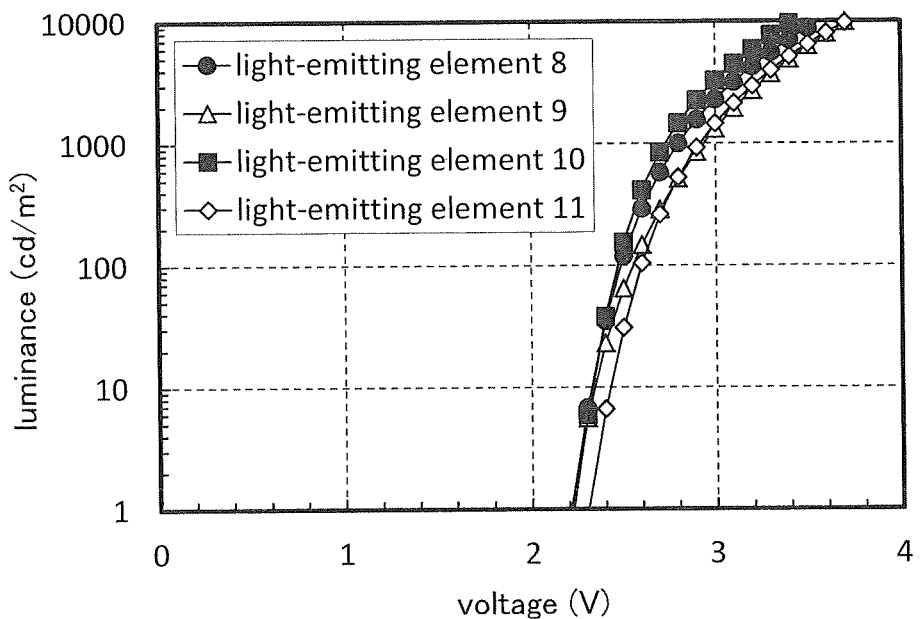
FIGS. 52A and 52B show luminance-voltage characteristics of light-emitting elements in Example.
Figure 52B:
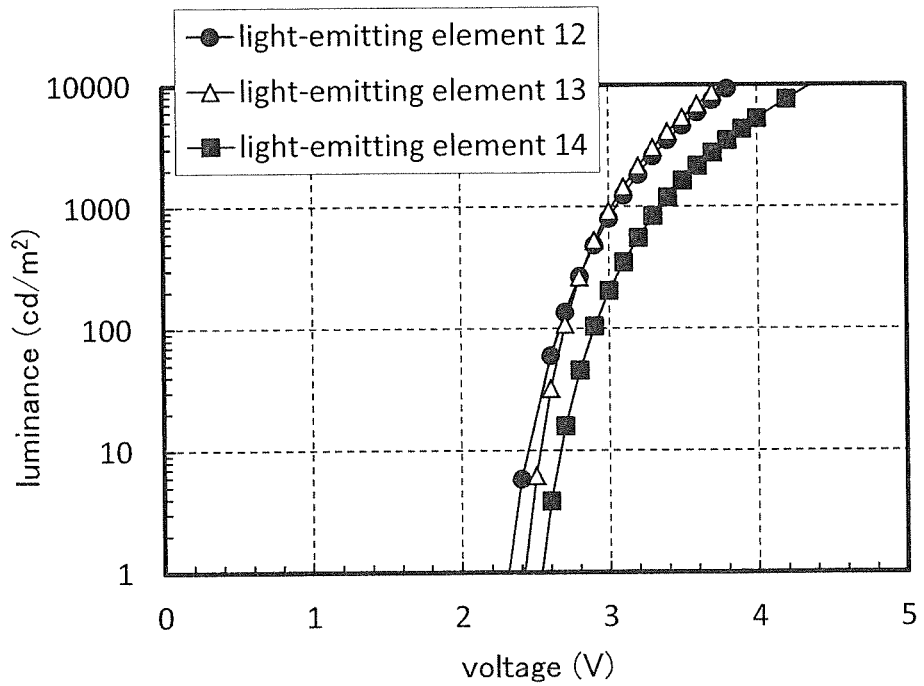
Figure 53A:
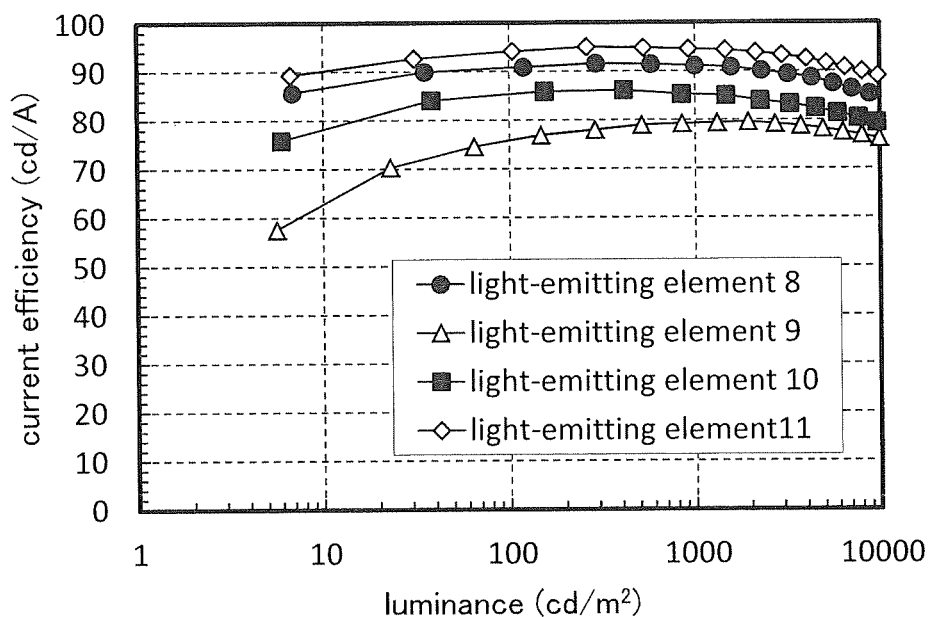
FIGS. 53A and 53B show current efficiency-luminance characteristics of light-emitting elements in Example.
Figure 53B:
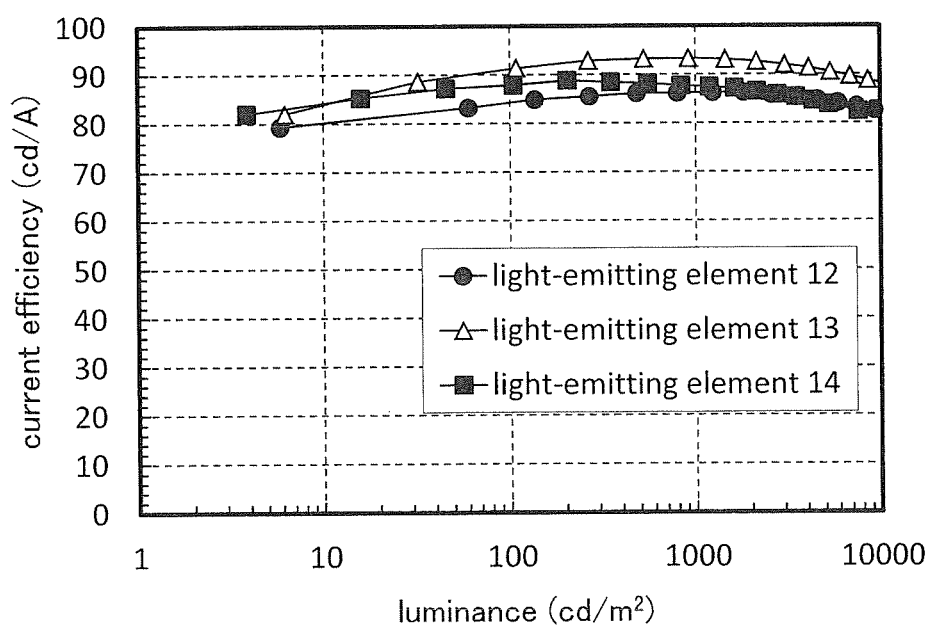
Figure 54A:
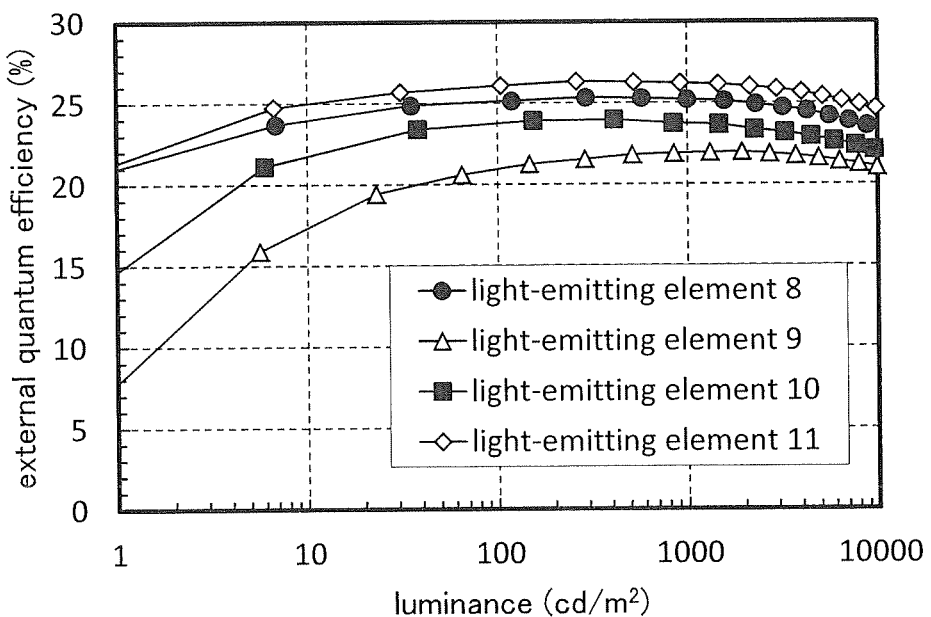
FIGS. 54A and 54B show external quantum efficiency-luminance characteristics of light-emitting elements in Example.
Figure 54B:
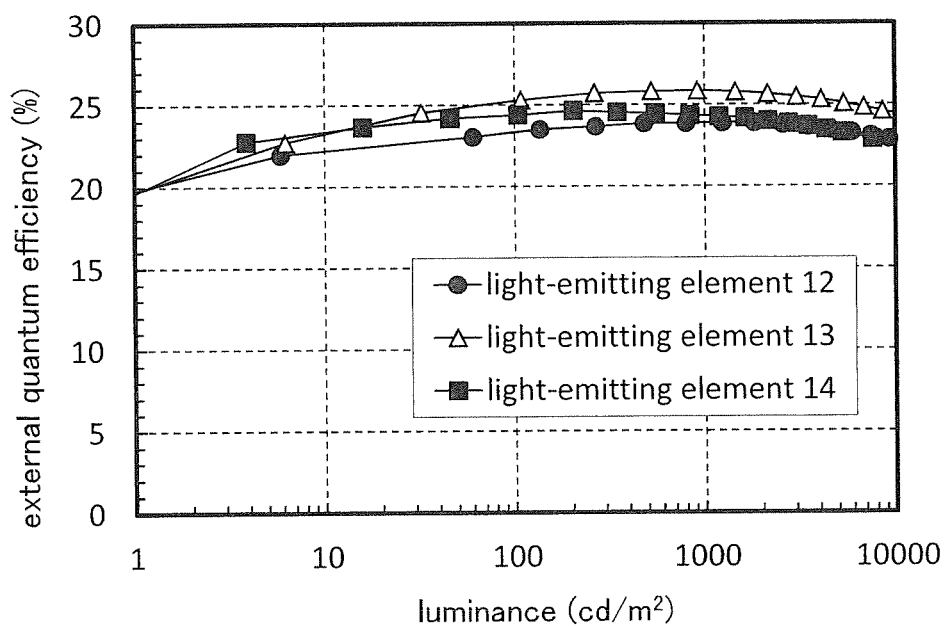
Figure 55A:
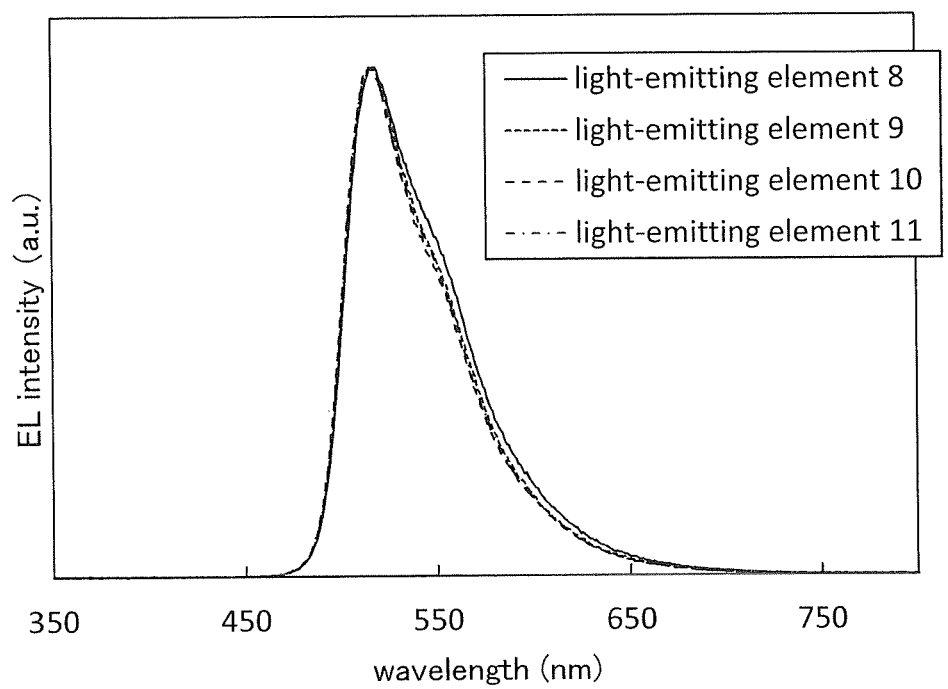
FIGS. 55A and 55B show electroluminescence spectra of light-emitting elements in Example.
Figure 55B:
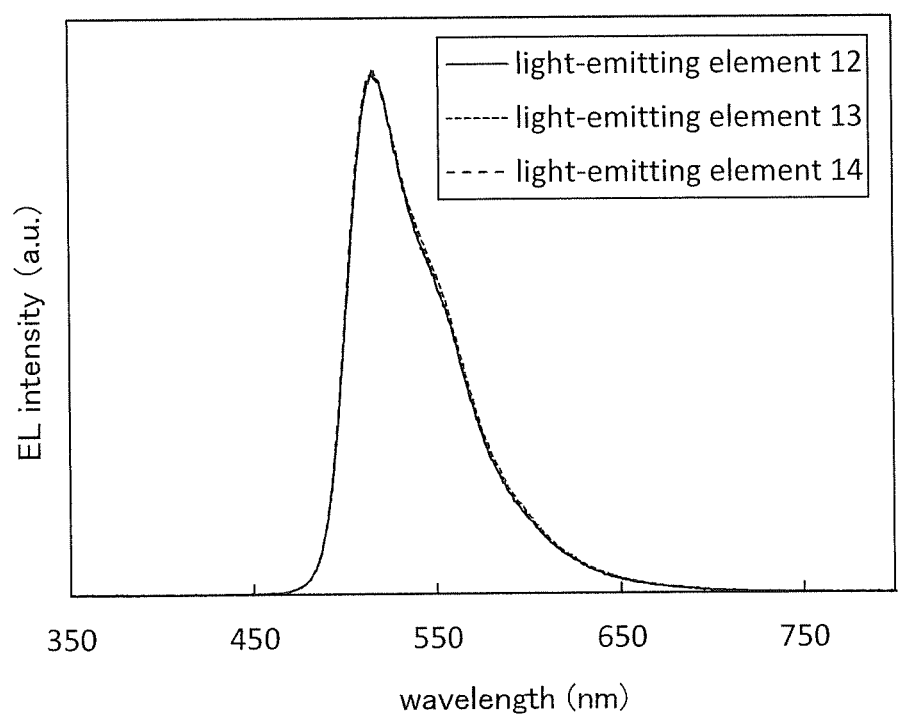
Figure 56A:
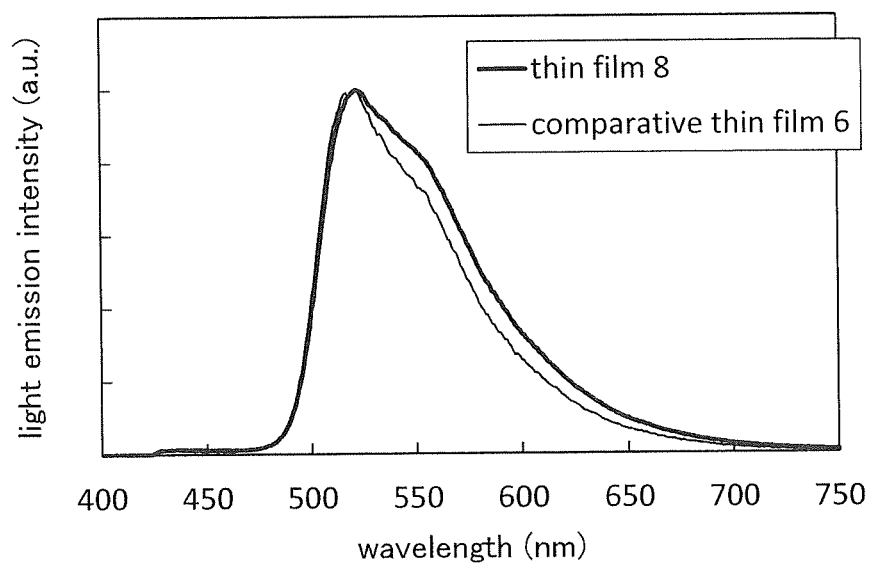
FIGS. 56A and 56B show the emission spectra of thin films in Example.
Figure 56B:
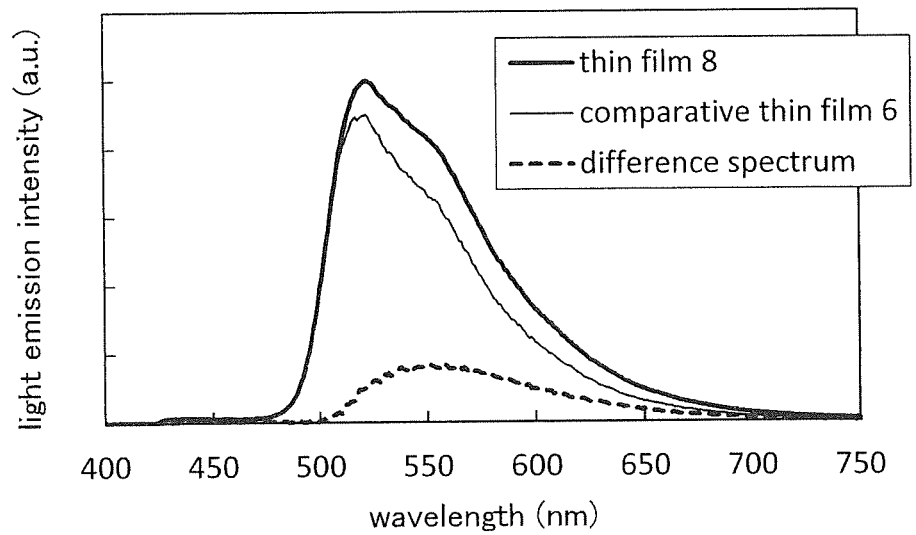
Figure 57A:
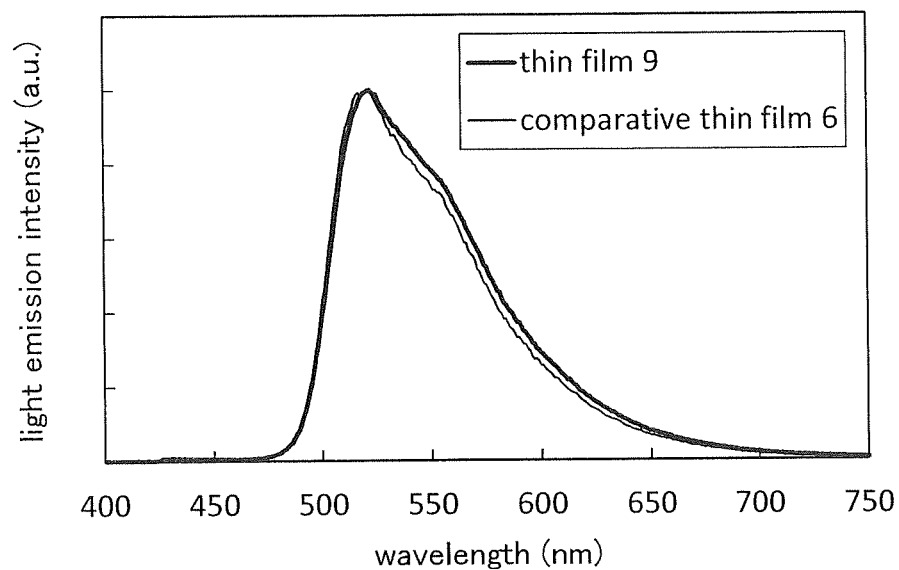
FIGS. 57A and 57B show the emission spectra of thin films in Example.
Figure 57B:
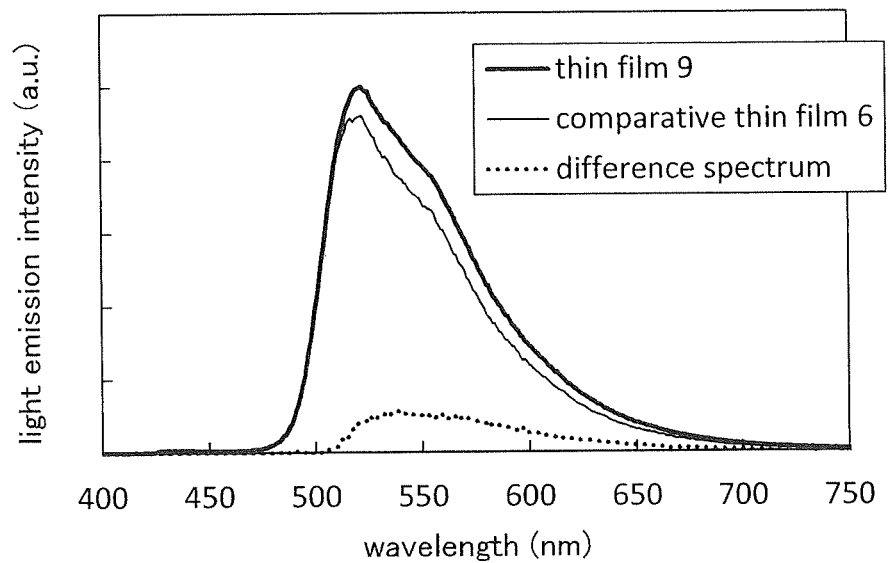
Figure 58A:
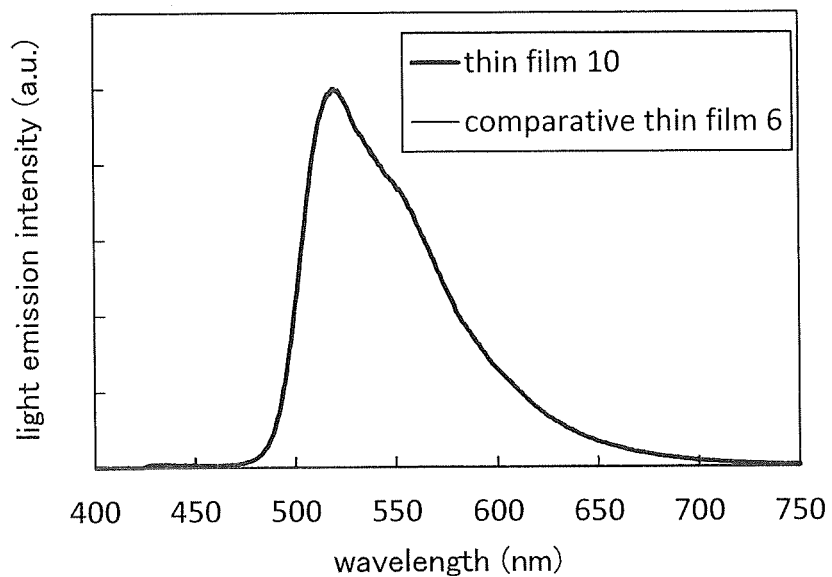
FIGS. 58A and 58B show the emission spectra of thin films in Example.
Figure 58B:
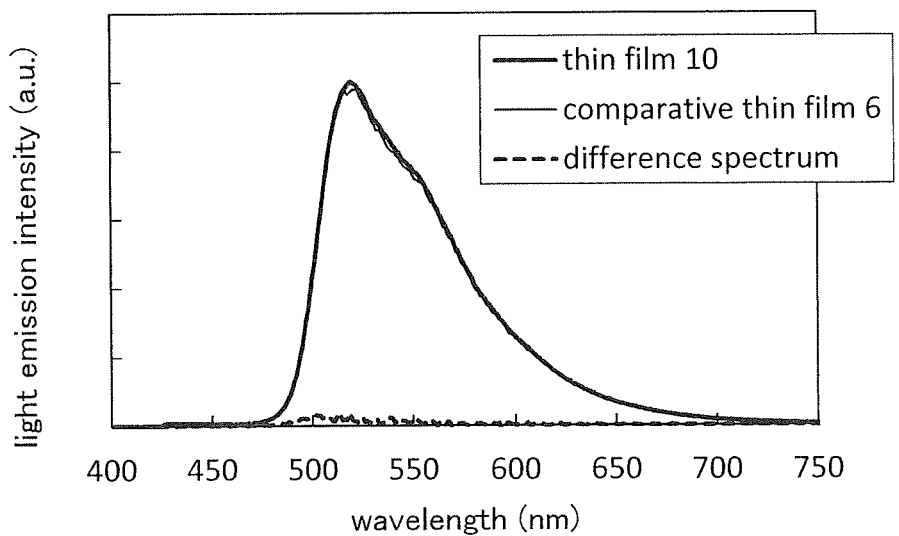
Figure 59A:
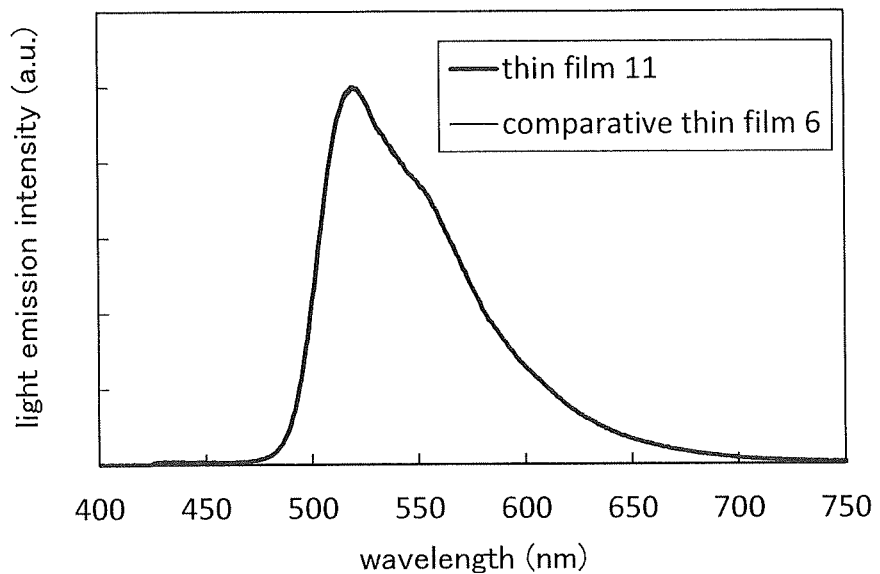
FIGS. 59A and 59B show the emission spectra of thin films in Example.
Figure 59B:
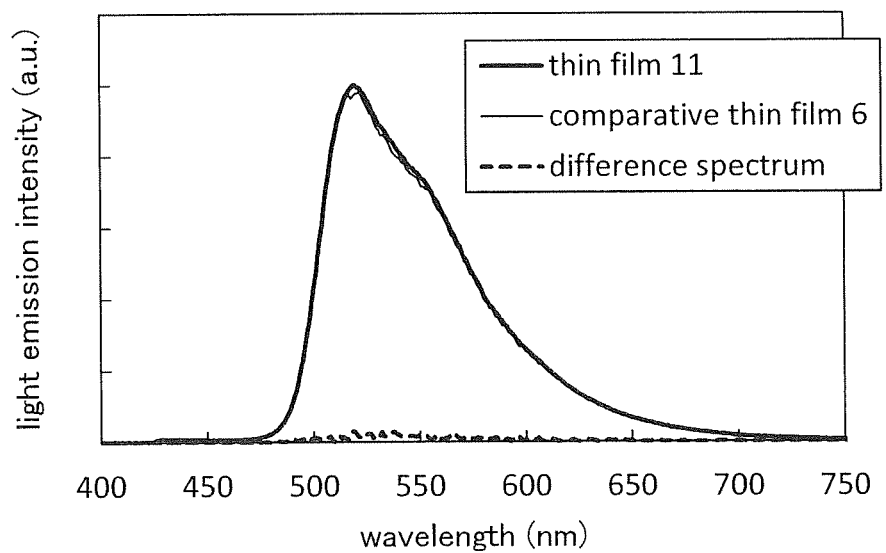
Figure 60A:
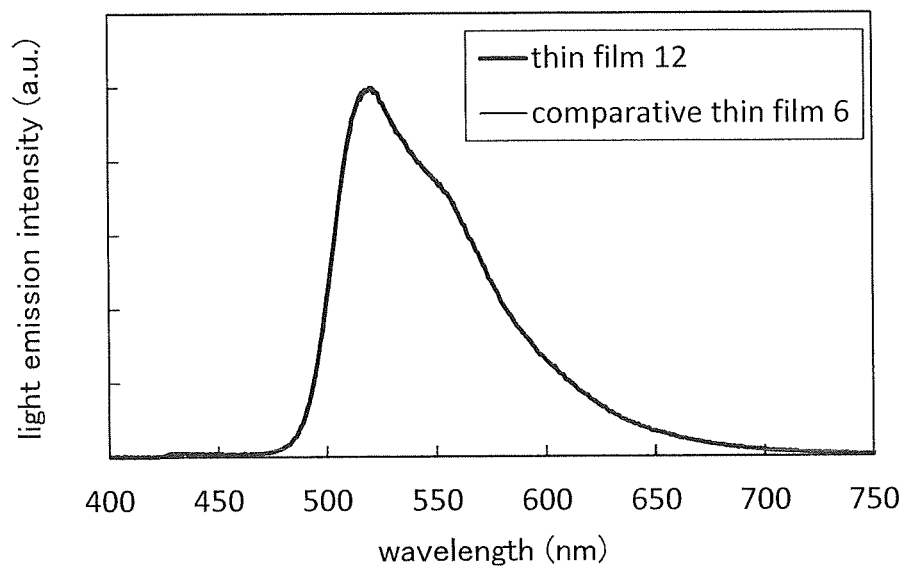
FIGS. 60A and 60B show the emission spectra of thin films in Example.
Figure 60B:
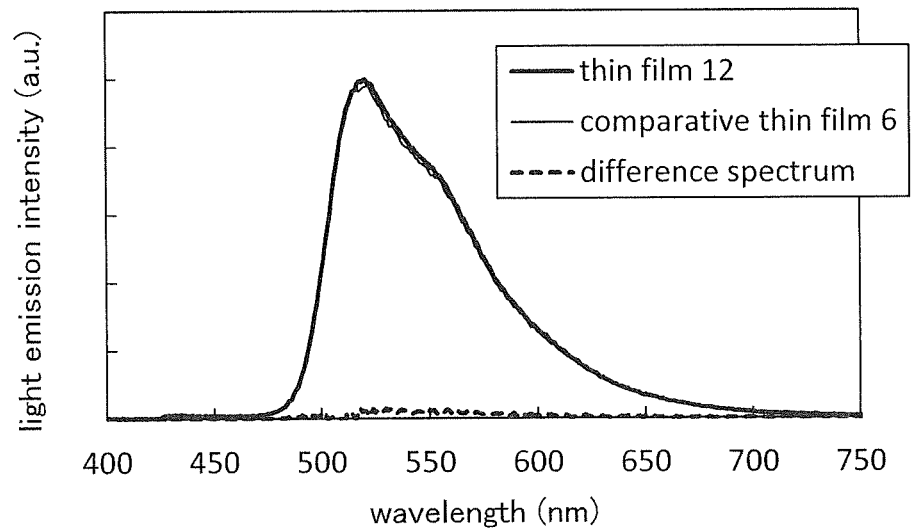
Figure 61A:
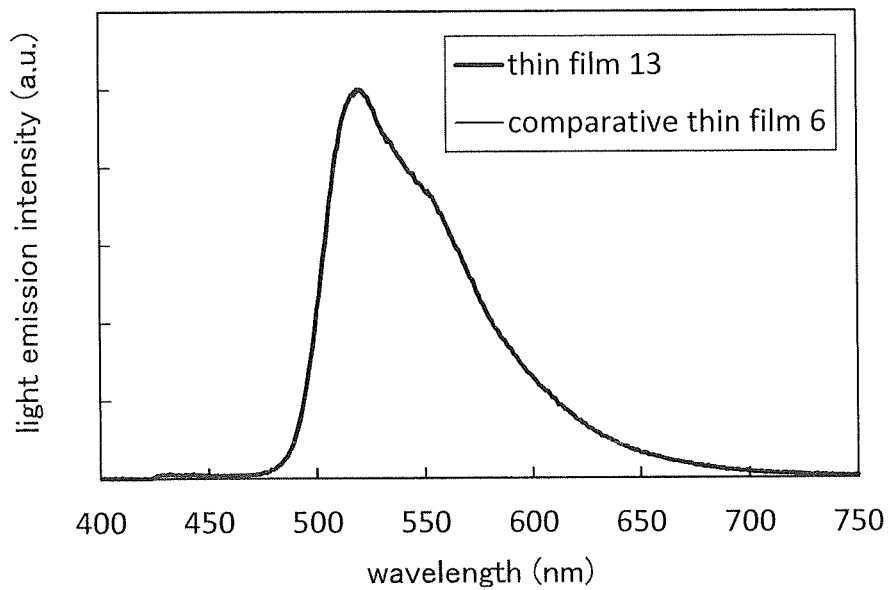
FIGS. 61A and 61B show the emission spectra of thin films in Example.
Figure 61B:
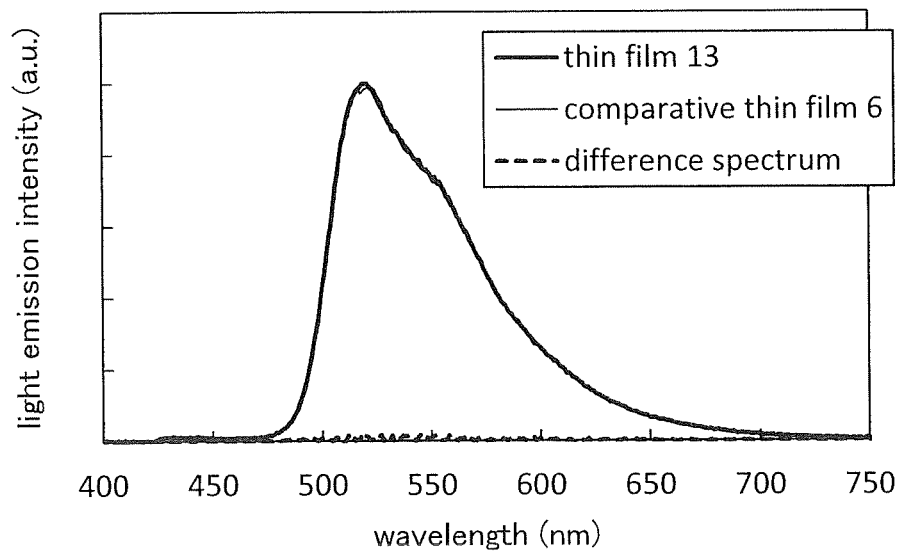
Figure 62A:
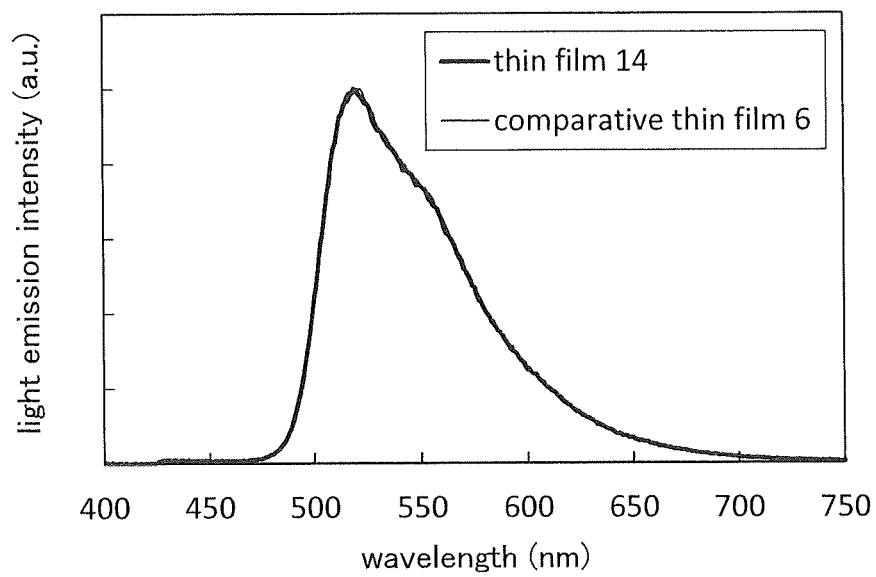
FIGS. 62A and 62B show the emission spectra of thin films in Example.
Figure 62B:
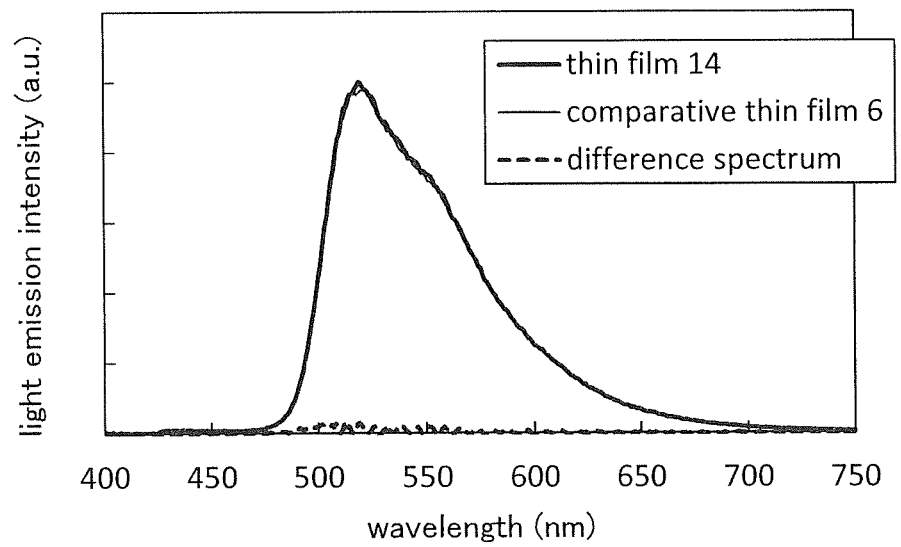

FIGS. 51A and 51B show luminance-current density characteristics of the light-emitting elements 8 to 14. FIGS. 52A and 52B show luminance-voltage characteristics thereof. FIGS. 53A and 53B show current efficiency-luminance characteristics thereof. FIGS. 54A and 54B show external quantum efficiency-luminance characteristics thereof. FIGS. 55A and 55B show electroluminescence spectra of the light-emitting elements 8 to 14 to which a current at a current density of 2.5 mA/cm$^2$ was supplied. The measurements of the light-emitting elements were performed at room temperature (in an atmosphere kept at 23° C.).

Furthermore, Table 7 shows the element characteristics of the light-emitting elements 8 to 14 at around 1000 cd/m$^2$.

The peak wavelengths on the shortest wavelength side of the electroluminescence spectra of the light-emitting elements 8 to 14 are 519 nm, 518 nm, 516 nm, 516 nm, 516 nm, 517 nm, and 517 nm, respectively, and light has a peak in a green wavelength range. The light emission originates from the guest material. The full widths at half maximum of the electroluminescence spectra of the light-emitting elements 8 to 14 are 64 nm, 60 nm, 60 nm, 60 nm, 58 nm, 59 nm, and 60 nm respectively.

Furthermore, the light emission start voltages (voltages at a luminance higher than 1 cd/m$^2$) of the light-emitting elements 8 to 14 are 2.3V, 2.3V, 2.3V, 2.4V, 2.4V, 2.5V, and 2.6V, respectively. This voltage is smaller than a voltage corresponding to an energy difference between the LUMO level and the HOMO level of the guest material of each of the light-emitting elements, which is described later. The results suggest in the light-emitting elements 8 to 14, carriers are not directly recombined in the guest material but are recombined in the material having a smaller energy gap.

The maximum external quantum efficiencies of the light-emitting elements 8 to 14 are 25.3%, 22.0%, 24.0%, 26.3%, 23.9%, 25.9%, 24.7%, and 24.7%, respectively, and the light-emitting elements 8 to 14 have high maximum external quantum efficiency exceeding 20%.

<Results of CV Measurement>

The electrochemical characteristics (oxidation reaction characteristics and reduction reaction characteristics) of the above compounds used for the light-emitting layers of the light-emitting elements and 4,4'-bis[3-(9H-carbazol-9-yl) phenyl]-2,2'-bipyridine (abbreviation: 4,4'mCzP2BPy) were measured by cyclic voltammetry (CV) measurement. Although chloroform was used as a solvent for the measurement of GD270, the measurement was performed in a manner similar to that described in Example 1.

Table 8 shows oxidation potentials and reduction potentials of the compounds obtained from the results of the CV measurement and HOMO levels and LUMO levels of the compounds calculated from the CV measurement results.

TABLE 7

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 8 | 2.80 | 1.10 | (0.302, 0.652) | 1001 | 91.1 | 102.3 | 25.2 |
| Light-emitting element 9 | 2.90 | 1.08 | (0.291, 0.659) | 853 | 79.3 | 85.9 | 21.9 |
| Light-emitting element 10 | 2.70 | 1.00 | (0.287, 0.660) | 849 | 85.3 | 99.3 | 23.7 |
| Light-emitting element 11 | 2.90 | 0.98 | (0.289, 0.660) | 926 | 94.6 | 102.5 | 26.2 |
| Light-emitting element 12 | 3.00 | 0.93 | (0.284, 0.663) | 799 | 86.2 | 90.3 | 23.9 |
| Light-emitting element 13 | 3.00 | 0.98 | (0.287, 0.661) | 918 | 93.3 | 97.7 | 25.8 |
| Light-emitting element 14 | 3.30 | 0.96 | (0.283, 0.662) | 838 | 87.7 | 83.5 | 24.3 |

TABLE 8

| Abbreviation | Oxidation potential (V) | Reduction potential (V) | HOMO level calculated from oxidation potential (eV) | LUMO level calculated from reduction potential (eV) |
| --- | --- | --- | --- | --- |
| GD270 | 0.37 | −2.59 | −5.31 | −2.36 |
| 4,8mCzP2Bfpm | 1.00 | −1.88 | −5.94 | −3.06 |
| 4,8mDBtP2Bfpm | 1.24 | −1.92 | −6.18 | −3.02 |
| 4mDBTBPBfpm-II | 1.28 | −1.98 | −6.22 | −2.96 |
| 4,6mCzP2Pm | 0.95 | −2.06 | −5.89 | −2.88 |
| 4,6mDBTP2Pm-II | 1.28 | −2.12 | −6.22 | −2.83 |
| 4,6mCzBP2Pm | 0.95 | −2.14 | −5.89 | −2.80 |
| 5Me-4,6mCzP2Pm | 0.97 | −2.22 | −5.91 | −2.73 |
| 4,4'mCzP2BPy | 1.00 | −2.29 | −5.94 | −2.66 |
| PCCP | 0.69 | −2.98 | −5.63 | −1.96 |

Note that as shown in Table 8, the HOMO level of the first organic compound (GD270) that is the guest material is higher than or equal to the HOMO level of each of the second organic compounds (4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm), which are the host materials. The LUMO level of the first organic compound (GD270) is higher than or equal to the LUMO level of each of the second organic compounds (4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm). Thus, in the case where the compounds are used for a light-emitting layer as in the light-emitting elements 8 to 14, electrons and holes that are carriers injected from a pair of electrodes are efficiently injected to the second organic compound (host material) and the first organic compound (guest material); thus, the combination of the second organic compound (host material) and the first organic compound (guest material) can form an exciplex.

In this case, in an exciplex formed by the first organic compound (GD270) and the second organic compound (4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm) has the LUMO level in the second organic compound and the HOMO level in the first organic compound.

<Emission Spectra of Thin Films>

Here, thin film samples including the first organic compound (guest material) and the second organic compounds (host materials) used for the light-emitting elements 8 to 14 were fabricated, and the emission spectra of the thin films were measured. Furthermore, for comparison, a comparative thin film sample including 4,4'mCzP2BPy, which that is an organic compound having a high LUMO level and the first organic compound (guest material) was fabricated.

As the thin film 8, 4,8mCzP2Bfpm and GD270 were deposited over a quartz substrate by co-evaporation in a weight ratio of 4,8mCzP2Bfpm: GD270=1:0.05 to a thickness of 50 nm. That is, the thin film 8 includes the compound used for the light-emitting layer 130 of the light-emitting element 8.

As the thin film 9, 4,8mDBTP2Bfpm and GD270 were deposited over a quartz substrate by co-evaporation in a weight ratio of 4,8mDBTP2Bfpm: GD270=1:0.05 to a thickness of 50 nm. That is, the thin film 9 includes the compound used for the light-emitting layer 130 of the light-emitting element 9.

As the thin film 10, 4mDBTBPBfpm-II and GD270 were deposited over a quartz substrate by co-evaporation in a weight ratio of 4mDBTBPBfpm-II: GD270=1:0.05 to a thickness of 50 nm. That is, the thin film 10 includes the compound used for the light-emitting layer 130 of the light-emitting element 10.

As the thin film 11, 4,6mCzP2Pm and GD270 were deposited over a quartz substrate by co-evaporation in a weight ratio of 4,6mCzP2Pm: GD270=1:0.05 to a thickness of 50 nm. That is, the thin film 11 includes the compound used for the light-emitting layer 130 of the light-emitting element 11.

As the thin film 12, 4,6mDBTP2Pm-II and GD270 were deposited over a quartz substrate by co-evaporation in a weight ratio of 4,6mDBTP2Pm-II: GD270=1:0.05 to a thickness of 50 nm. That is, the thin film 12 includes the compound used for the light-emitting layer 130 of the light-emitting element 12.

As the thin film 13, 4,6mCzBP2Pm and GD270 were deposited over a quartz substrate by co-evaporation in a weight ratio of 4,6mCzBP2Pm: GD270=1:0.05 to a thickness of 50 nm. That is, the thin film 13 includes the compound used for the light-emitting layer 130 of the light-emitting element 13.

As the thin film 14, 5Me-4,6mCzP2Pm and GD270 were deposited over a quartz substrate by co-evaporation in a weight ratio of 5Me-4,6mCzP2Pm: GD270=1:0.05 to a thickness of 50 nm. That is, the thin film 14 includes the compound used for the light-emitting layer 130 of the light-emitting element 14.

As the comparative thin film 6, 4,4'mCzP2BPy and GD270 were deposited over a quartz substrate by co-evaporation in a weight ratio of 4,4'mCzP2BPy: GD270=1:0.05 to a thickness of 50 nm.

The emission spectra of the fabricated thin films 8 to 14 and the fabricated comparative thin film 6 were measured. The emission spectra were measured in the following manner: each of the fabricated thin films was sandwiched between a bandpass filter (U-360 25 X 25 46-085, produced by Edmund Optics Japan Ltd.) and a longpass filter (425NM 25MM 84-742, produced by Edmund Optics Japan Ltd.), the thin film was irradiated with an LED light (NCSU033B, produced by NICHIA CORPORATION) from the bandpass filter side, and a multi-channel spectrometer (PMA-11, produced by Hamamatsu Photonics K.K.) was used from the longpass filter side. Measurement results are shown in FIGS. 56A and 56B, FIGS. 57A and 57B, FIGS. 58A and 58B, FIGS. 59A and 59B, FIGS. 60A and 60B, FIGS. 61A and 61B, and FIGS. 62A and 62B.

Note that the energy difference between the LUMO level of 4,4'mCzP2BPy and the HOMO level of GD270 is very large, and it can be said that the combination of 4,4'mCzP2BPy and GD270 does not easily form an exciplex. Thus, it can be said that in the fabricated comparative thin film 6, an exciplex is not formed by 4,4'mCzP2BPy and GD270 and the fabricated comparative thin film 6 exhibits light emission from GD270.

Emission spectra were measured, and as shown in FIG. 56A, FIG. 57A, FIG. 58A, FIG. 59A, FIG. 60A, FIG. 61A, and FIG. 62A, in the comparative thin film 6, the emission spectrum of green light from GD270, which is a phosphorescent compound, was observed. In each of the thin films 8 to 14, an emission spectrum that is slightly different from the emission spectrum of the comparative thin film 6 was observed.

Next, difference spectra obtained by subtracting the emission spectrum of the comparative thin film 6 from the emission spectrum of each of the thin films 8 to 14 are shown in FIG. 56B, FIG. 57B, FIG. 58B, FIG. 59B, FIG. 60B, FIG. 61B, and FIG. 62B. As a result, it was found that light emission from each of the thin films 8 to 14 includes light emission attributed to GD270 with a peak wavelength of 520 nm in addition to light emission that is different from light emission attributed to GD270. The percentages (area ratios) of the difference spectra with respect to the emission spectra of the thin films 8 to 14 (the spectrum of each of the thin films 8 to 14−the spectrum of the comparative thin film 6) were calculated to be 19.1%, 11.8%, 2.2%, 1.9%, 2.4%, 1.0%, and 1.2%, respectively.

The CV measurement results show that a combination of GD270 (the first organic compound) and any of 4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm (the second organic compounds) forms an exciplex. The energy differences between the LUMO levels of 4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm and the HOMO level of GD270 are 2.25 eV, 2.29 eV, 2.35 eV, 2.43 eV, 2.49 eV, 2.51 eV, and 2.59 eV, respectively. These energy differences substantially correspond to light emission energies calculated from the peak wavelengths of the difference spectra of the thin films 8 to 14, which are shown in FIG. 56B, FIG. 57B, FIG. 58B, FIG. 59B, FIG. 60B, FIG. 61B, and FIG. 62B. Thus, it can be said that the emission spectra observed in the thin films 8 to 14 include light emission attributed to GD270, which is the first organic compound, and in addition, light emission attributed to the exciplex formed by the first organic compound and the second organic compound.

<Relation 1 Between Percentages of Light Emission of Exciplexes and Characteristics of Light-Emitting Elements>

Accordingly, the percentages of light emission of the exciplexes in the thin films 8 to 14 were calculated to be 19.1%, 11.8%, 2.2%, 1.9%, 2.4%, 1.0%, and 1.2%, respectively. Next, the relation between the maximum external quantum efficiencies of the light-emitting elements 8 to 14 and the percentage of light emission of the exciplex to light emission from the thin films 8 to 14 is shown in FIG. 63.

Figure 63:
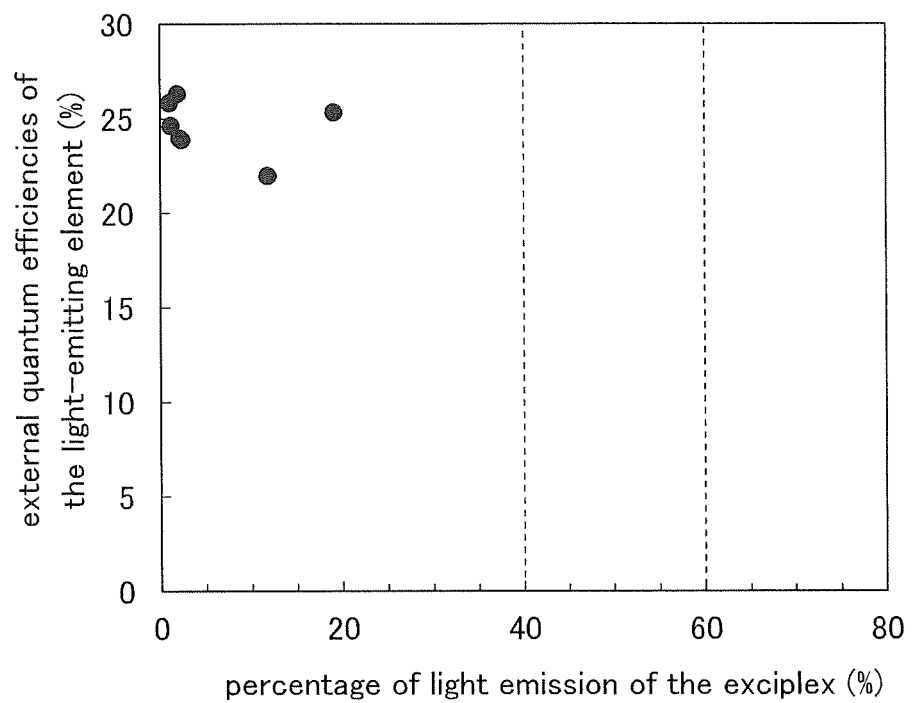
FIG. 63 shows the relation between the external quantum efficiency and the percentage of light emission of an exciplex in Example.

As shown in FIG. 63, the external quantum efficiencies of the light-emitting elements 8 to 14 including compounds included in the thin films 8 to 14 that have small percentages of light emission of the exciplexes are high. As in Example 1, a light-emitting element having a high external quantum efficiency can be provided in the case where the percentage of light emission of the exciplex to light emission from the light-emitting element is lower than or equal to 60%. Furthermore, as shown in FIG. 63, as in Example 1, the percentage of light emission of the exciplex to light emission from a light-emitting element is preferably higher than 0% and lower than or equal to 60%, further preferably higher than 0% and lower than or equal to 40%.

From FIGS. 56A and 56B to FIGS. 62A and 62B, the peak wavelength of light emission attributed to the first organic compound (GD270) in the thin films 8 to 14 and the comparative thin film 6 is 521 nm; thus, the light emission energy ($E_{G\_em}$) of the first organic compound (GD270) in the thin films 8 to 14 and the comparative thin film 6 was calculated to be 2.38 eV. Furthermore, the peak wavelengths of light emission attributed to the exciplexes formed by the first organic compound and the second organic compounds (4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm) are 551 nm, 538 nm, 503 nm, 538 nm, 524 nm, 532 nm, and 512 nm, respectively; thus, the light emission energies ($E_{Ex\_em}$) of the exciplexes formed by the first organic compound and the second organic compounds were calculated to be 2.25 eV, 2.30 eV, 2.47 eV, 2.30 eV, 2.37 eV, 2.33 eV, and 2.42 eV, respectively.

Figure 64:
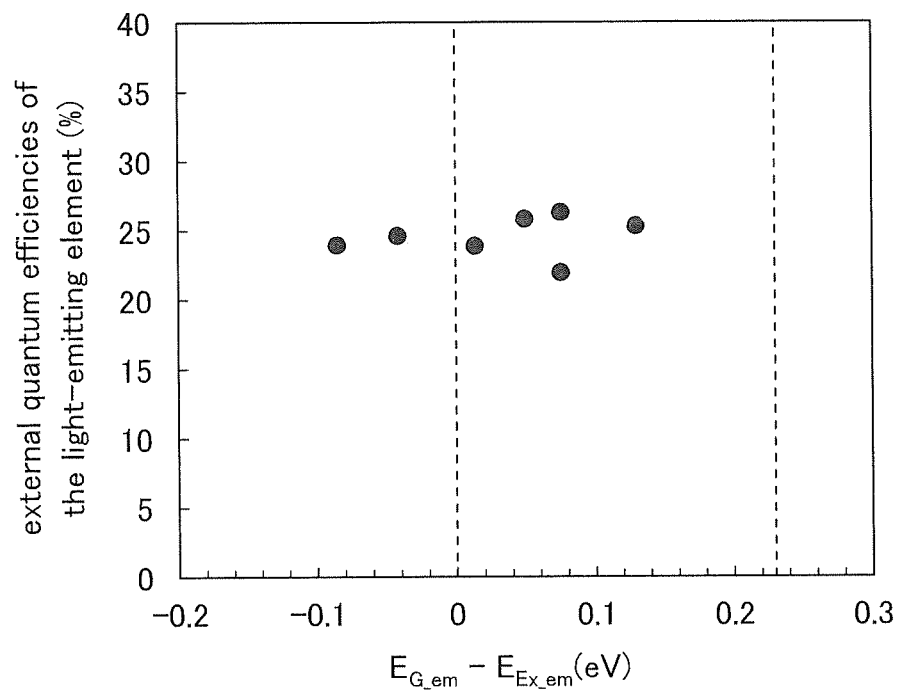
FIG. 64 shows the relation between the external quantum efficiency and the energy difference between a guest material and an exciplex in Example.

Here, the relation between the maximum external quantum efficiencies of the light-emitting elements 8 to 14 and $E_{G\_em}-E_{Ex\_em}$ is shown in FIG. 64. From FIG. 64, it can be said that in the case where $E_{G\_em}-E_{Ex\_em}$ is larger than 0 eV and smaller than or equal to 0.23 eV, high external quantum efficiency can be achieved. This is because, as in Example 1, a light-emitting element having a small percentage of light emission of the exciplex can be provided when $E_{G\_em}-E_{Ex\_em}$ is smaller than or equal to 0.23 eV. Furthermore, as in Example 1, it can be said that $E_{G\_em}-E_{Ex\_em}$ is preferably larger than 0 eV and smaller than or equal to 0.23 eV (0 eV<$E_{G\_em}-E_{Ex\_em}$≤0.23 eV), further preferably larger than 0 eV and smaller than or equal to 0.18 eV (0 eV<$E_{G\_em}-E_{Ex\_em}$≤0.18 eV).

<Absorption Spectra of Guest Material>

Figure 65:
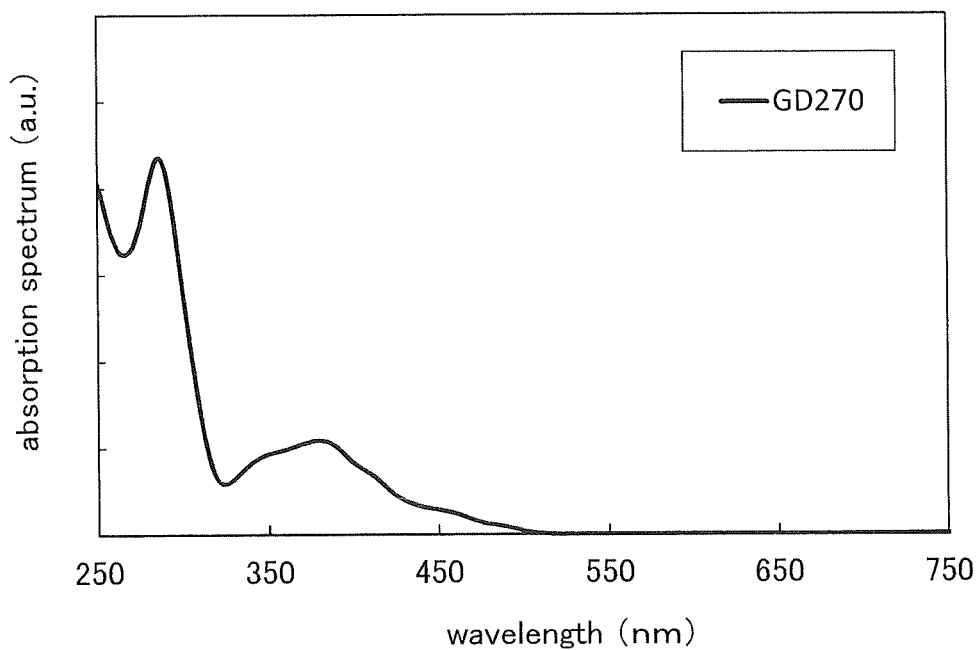
FIG. 65 shows an absorption spectrum of a guest material in Example.

Next, FIG. 65 shows the measurement results of the absorption spectrum of GD270, which is the guest material used for the light-emitting elements. The measurement was performed by a method similar to that in Example 1.

As shown in FIG. 65, the absorption edge on the lowest energy side (the longest wavelength side) of the absorption spectrum of GD270 is at around 480 nm. The absorption edge was obtained from data of the absorption spectrum, and the transition energy was estimated on the assumption of direct transition. As a result, the absorption edge of GD270 was 486 nm and the transition energy was calculated to be 2.55 eV. Since GD270 is a phosphorescent compound, the absorption edge on the lowest energy side is an absorption edge based on the transition to the triplet excited state. Accordingly, the T1 level of GD270 was calculated to be 2.55 eV from the absorption edge.

The T1 level of GD270, which is the first organic compound, is 2.55 eV, as described above. The T1 levels of the exciplexes formed by the second organic compounds (4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm) and GD270 are 2.25 eV, 2.30 eV, 2.47 eV, 2.30 eV, 2.37 eV, 2.33 eV, and 2.42 eV, respectively. Thus, the T1 level of GD270 is higher than or equal to the T1 level of the exciplex formed by any of the second organic compounds and GD270, and these energy levels are close to each other.

Therefore, the absorption band of the absorption spectrum of GD270 on the lowest energy side (the longest wavelength side) has a region that overlaps with the emission spectrum of the exciplex formed by any of the second organic compounds (4,8mCzP2Bfpm, 4,8mDBtP2Bfpm, 4mDBTBPBfpm-II, 4,6mCzP2Pm, 4,6mDBTP2Pm-II, 4,6mCzBP2Pm, and 5Me-4,6mCzP2Pm) and GD270, which means that in the light-emitting elements 8 to 14 including these exciplexes as the host materials, excitation energy can be transferred effectively to the guest material.

According to the above results, in GD270, the energy difference between the LUMO level and the HOMO level is larger than the energy calculated from the absorption edge by 0.4 eV Similarly, in GD270, the energy difference between the LUMO level and the HOMO level is larger than the light emission energy by 0.57 eV. Therefore, high energy corresponding to the energy difference between the LUMO level and the HOMO level is needed, that is, high voltage is needed when carriers injected from a pair of electrodes in the light-emitting element are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

<Relation 2 Between Percentage of Light Emission of Exciplexes and Characteristics of Light-Emitting Elements>

As described above, the transition energy ($E_{G\_abs}$) calculated from the absorption edge of the absorption spectrum of GD270, which is the guest material included in the thin films 8 to 14, was 2.55 eV Thus, in the thin films 8 to 14, $E_{G\_abs}$ is greater than $E_{Ex\_em}$.

Figure 66:
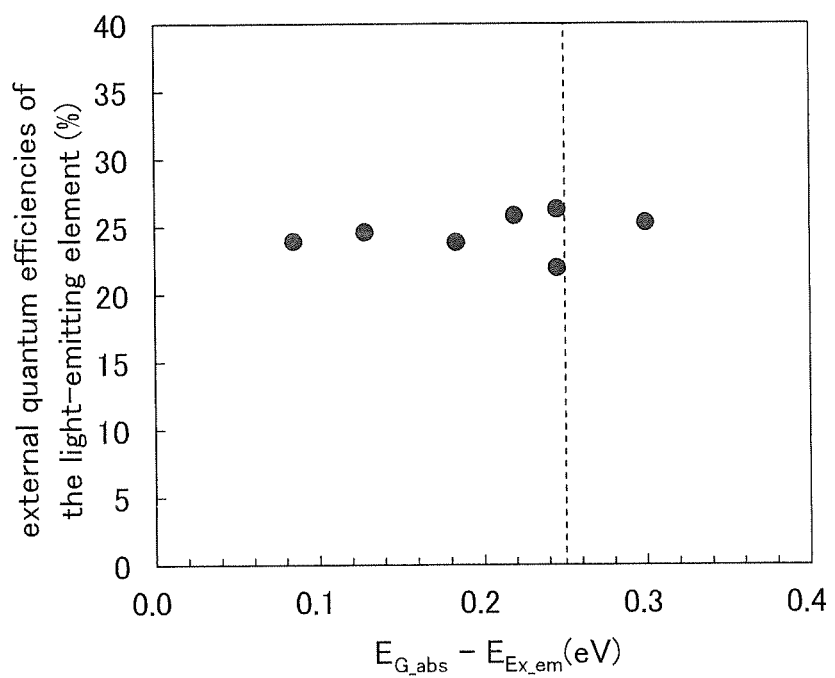
FIG. 66 shows the relation between the external quantum efficiency and the energy difference between a guest material and an exciplex in Example.

Here, the relation between the maximum external quantum efficiencies of the light-emitting elements 8 to 14 and $E_{G\_abs}-E_{Ex\_em}$ is shown in FIG. 66. FIG. 66 shows the relation between $E_{G\_abs}-E_{Ex\_em}$ of the thin films 8 to 14 and the external quantum efficiencies of the light-emitting elements 8 to 14. The light-emitting elements can have high external quantum efficiencies in the case where $E_{G\_abs}-E_{Ex\_em}$ is smaller than or equal to 0.3 eV, which is similar to Example 1. Thus, as in Example 1, it can be said that $E_{G\_abs}-E_{Ex\_em}$ is preferably larger than 0 eV and smaller than or equal to 0.30 eV (0 eV<$E_{G\_abs}-E_{Ex\_em}$≤0.30 eV), further preferably larger than 0 eV and smaller than or equal to 0.23 eV (0 eV<$E_{G\_abs}-E_{Ex\_em}$≤0.23 eV).

As has been described above, the excitation energy of each of the exciplexes formed in each of the thin films 8 to 14 substantially corresponds to the energy difference between the LUMO level of the second organic compound and the HOMO level of the first organic compound. The energy differences between the LUMO levels of the second organic compounds (host materials) and the HOMO level of the first organic compound (guest material) in the thin films 8 to 14 are 2.25 eV, 2.29 eV, 2.35 eV, 2.43 eV, 2.49 eV, 2.51 eV, and 2.59 eV, respectively. Thus, in the thin films 8 to 14, $E_{G\_abs}$ is equivalent to or greater than $\Delta E_{Ex}$.

Figure 67A:
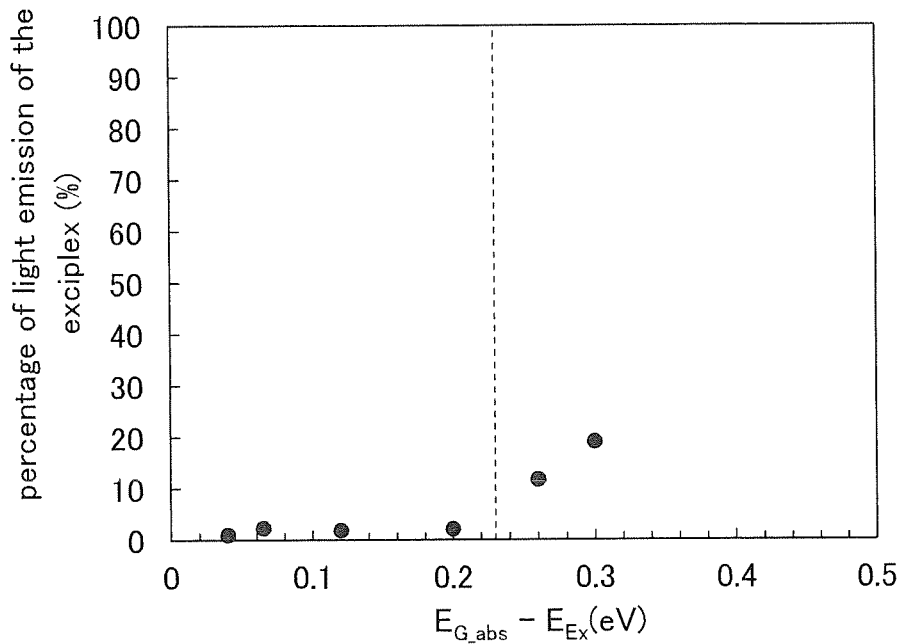
FIG. 67A shows the relation between the percentage of light emission of an exciplex and the energy difference between a guest material and the exciplex in Example.

The relation between the percentages of light emission of the exciplexes to light emission from the thin films 8 to 14 and $E_{G\_abs}-\Delta E_{Ex}$ is shown in FIG. 67A. From FIG. 67A, it was found that each of the thin films 8 to 14 has a small percentage of formation of the exciplex. From FIG. 67A, as in Example 1, it can be said that when $E_{G\_abs}-\Delta E_{Ex}$ is smaller than or equal to 0.23 eV, the percentage of light emission of the exciplex is decreased, and thus high emission efficiency can be obtained.

Figure 67B:
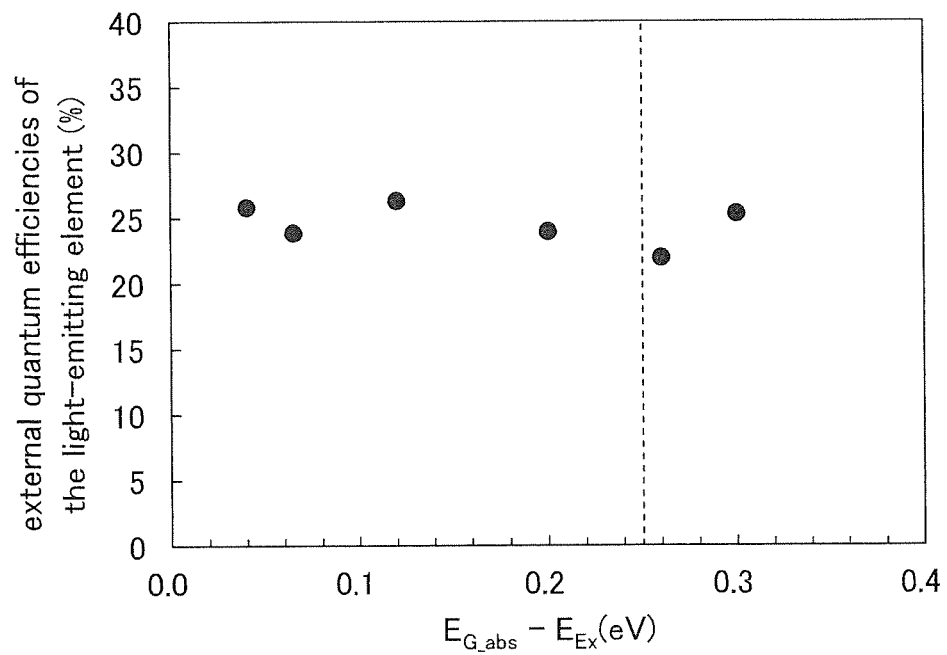
FIG. 67B shows the relation between the external quantum efficiency and the energy difference between the guest material and the exciplex in Example.

The relation between the maximum external quantum efficiencies of the light-emitting elements 8 to 14 and $E_{G\_abs}-\Delta E_{Ex}$ is shown in FIG. 67B. From FIG. 67B, it was found that in the case where $E_{G\_abs}-\Delta E_{Ex}$ of the thin films 8 to 14 is larger than 0 eV and smaller than or equal to 0.23 eV, high external quantum efficiency can be achieved. From FIG. 67B, as in Example 1, it can be said that $E_{G\_abs}-\Delta E_{Ex}$ is preferably larger than 0 eV and smaller than or equal to 0.23 eV (0 eV<$E_{G\_abs}-\Delta E_{Ex}$≤0.23 eV), further preferably larger than 0 eV and smaller than or equal to 0.18 eV (0 eV<$E_{G\_abs}-\Delta E_{Ex}$≤0.18 eV).

<Phosphorescence Spectra of Host Materials>

Next, to obtain the T1 levels of the host materials (the second and third organic compounds) included in the light-emitting elements 8 to 14, the thin film of each compound was formed over a quartz substrate by a vacuum evaporation method, and the emission spectra of the thin films were measured at a low temperature (10 K). The measurement method is similar to that in Example 1. Measurement results are shown in FIG. 68, FIG. 69, FIG. 70, FIG. 71, and FIG. 72. Example 1 can be referred to for the T1 levels of 4,6mCzP2Pm, 4,6mCzBP2Pm, and PCCP.

Figure 68:
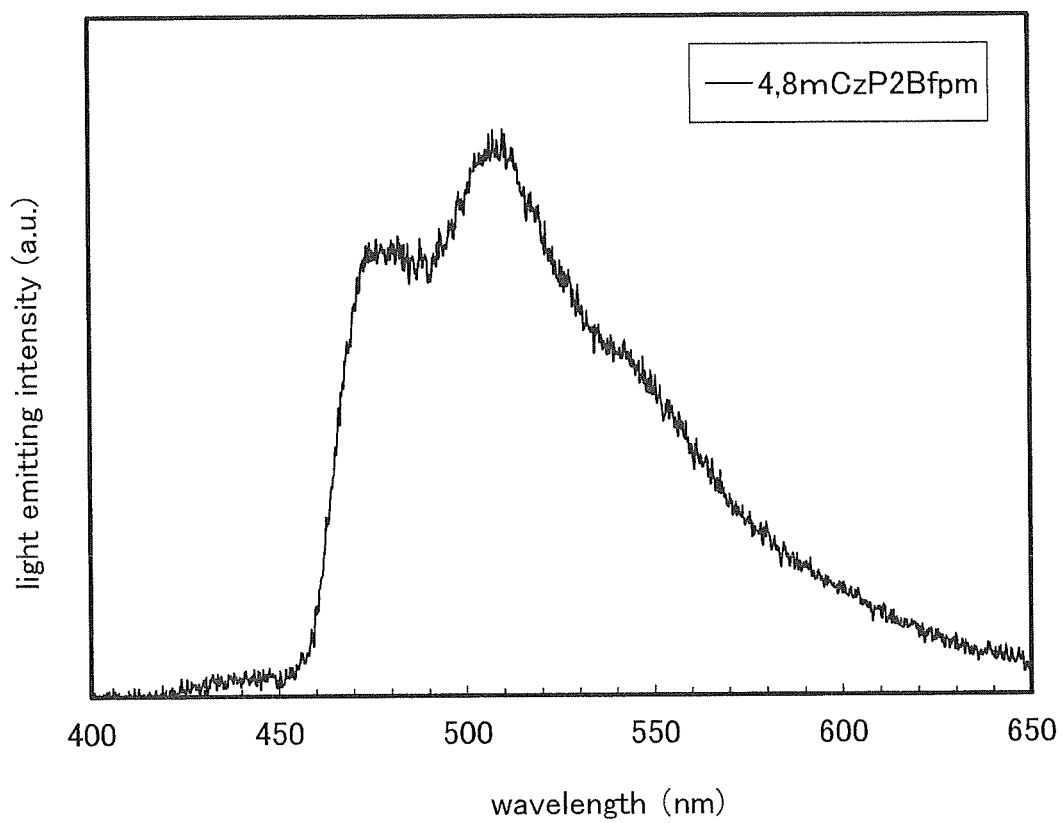
FIG. 68 shows the emission spectra of a thin film in Example.

As shown in FIG. 68, the phosphorescent component of the emission spectrum of 4,8mCzP2Bfpm has a peak (including a shoulder) on the shortest wavelength side at 477 nm. Accordingly, the T1 level of 4,8mCzP2Bfpm was calculated to be 2.60 eV.

Figure 69:
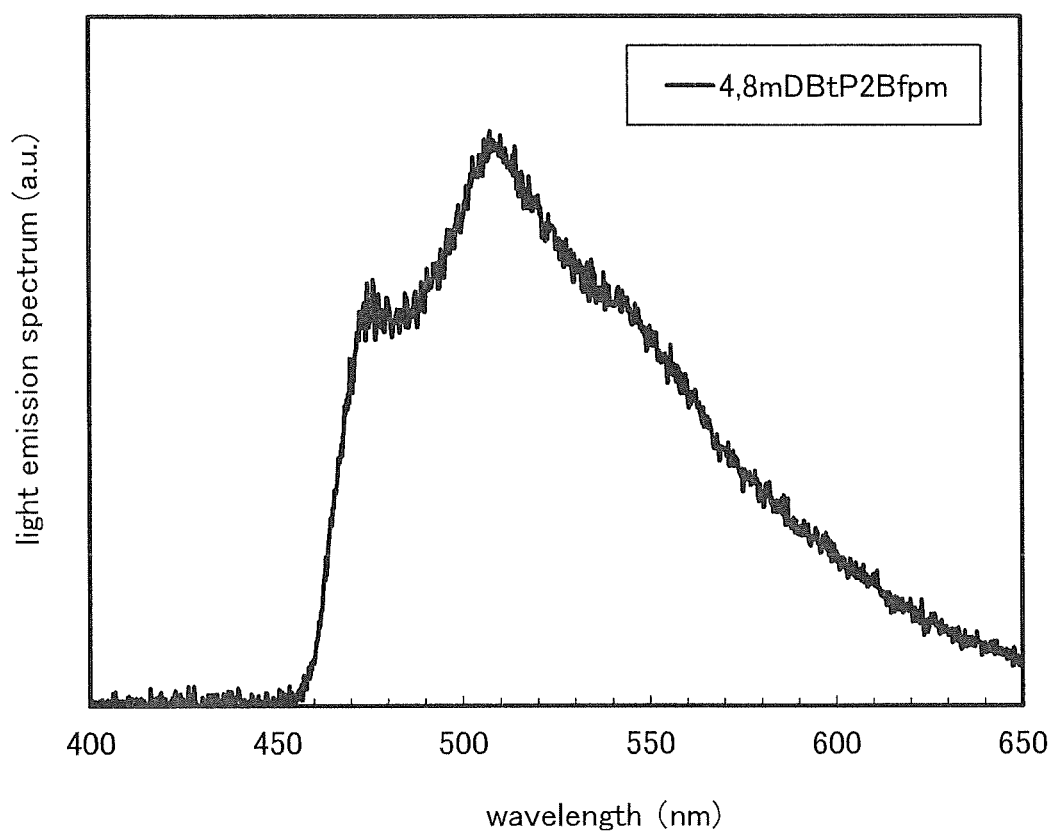
FIG. 69 shows the emission spectra of a thin film in Example.

As shown in FIG. 69, the phosphorescent component of the emission spectrum of 4,8mDBtP2Bfpm has a peak (including a shoulder) on the shortest wavelength side at 475 nm. Accordingly, the T1 level of 4,8mDBtP2Bfpm was calculated to be 2.61 eV.

Figure 70:
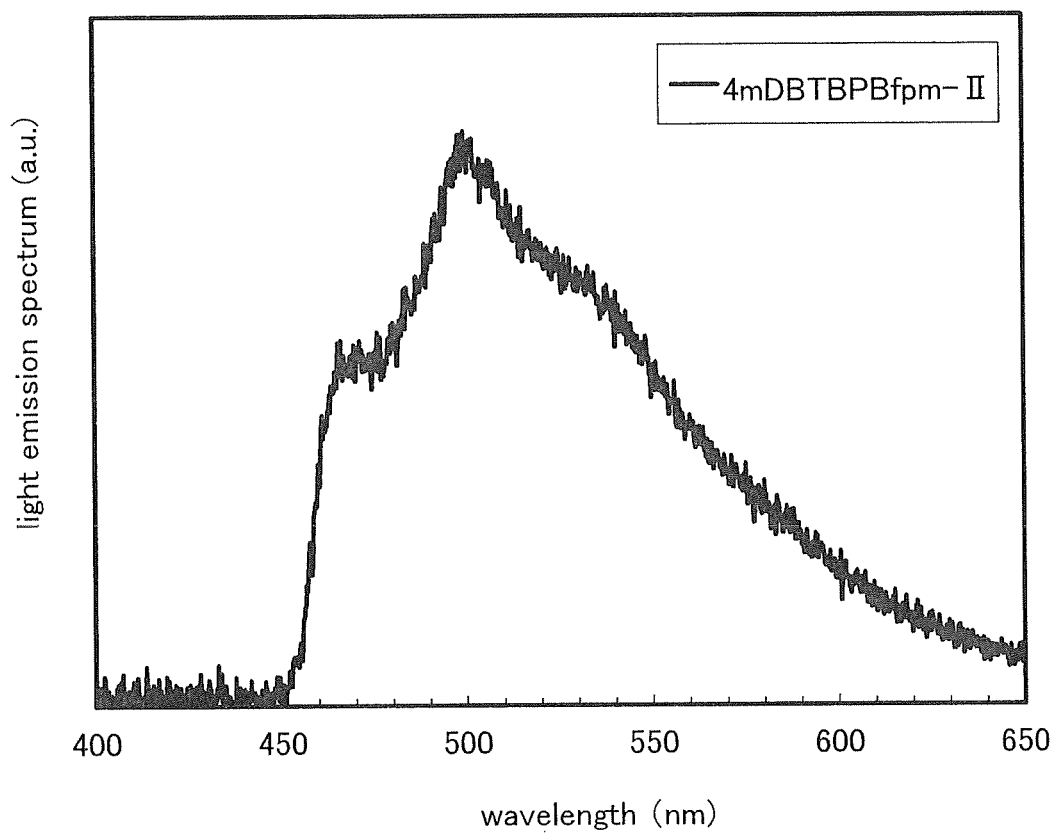
FIG. 70 shows the emission spectra of a thin film in Example.

As shown in FIG. 70, the phosphorescent component of the emission spectrum of 4mDBTBPBfpm-II has a peak (including a shoulder) on the shortest wavelength side at 465 nm. Accordingly, the T1 level of 4mDBTBPBfpm-II was calculated to be 2.67 eV.

Figure 71:
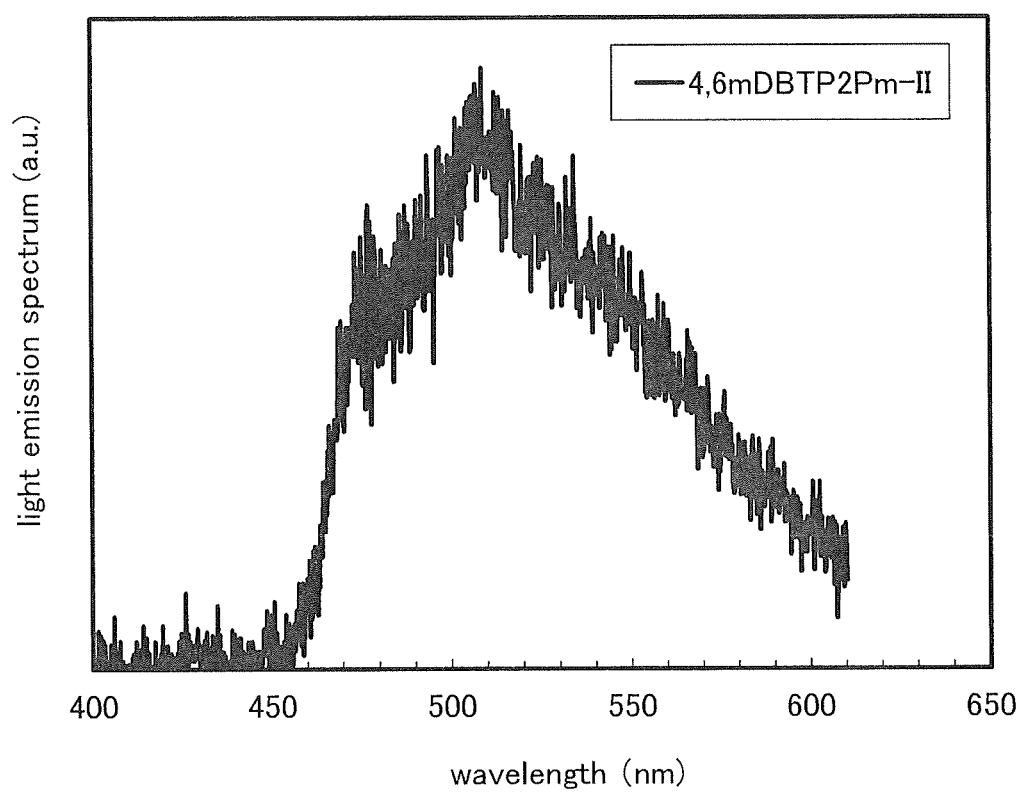
FIG. 71 shows the emission spectra of a thin film in Example.

As shown in FIG. 71, the phosphorescent component of the emission spectrum of 4,6mDBTP2Pm-II has a peak (including a shoulder) on the shortest wavelength side at 473 nm. Accordingly, the T1 level of 4,6mDBTP2Pm-II was calculated to be 2.62 eV.

Figure 72:
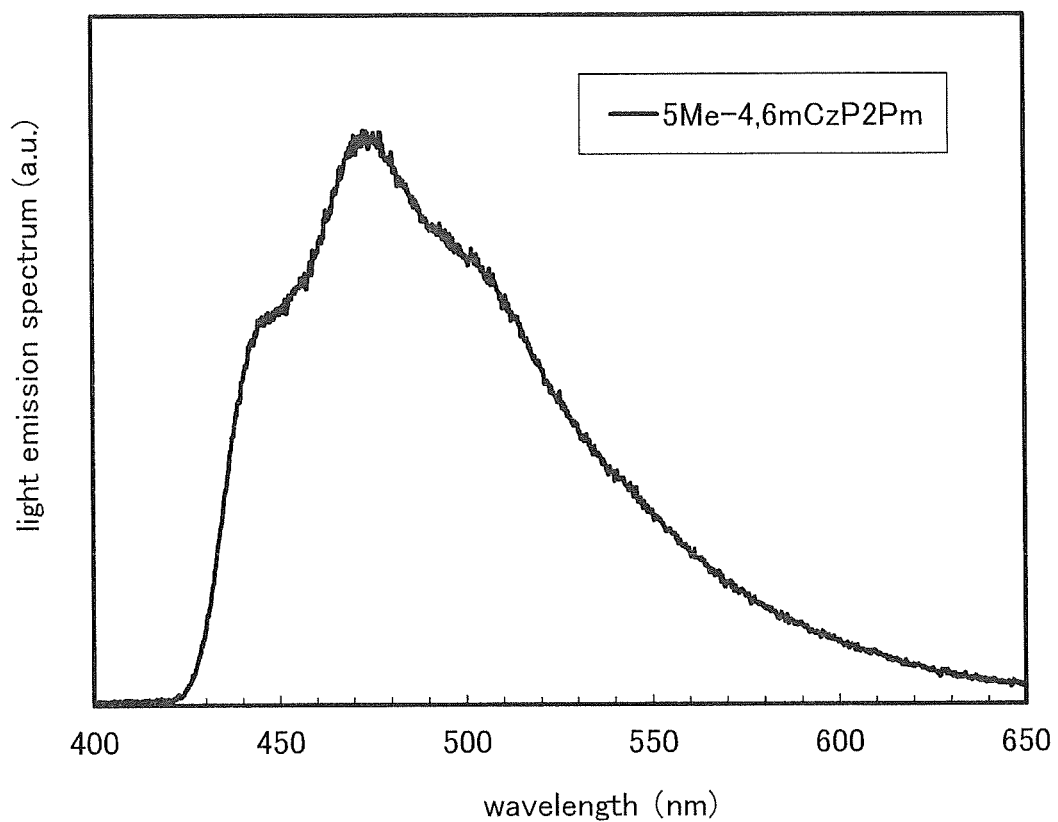
FIG. 72 shows the emission spectra of a thin film in Example.
Figure 73:
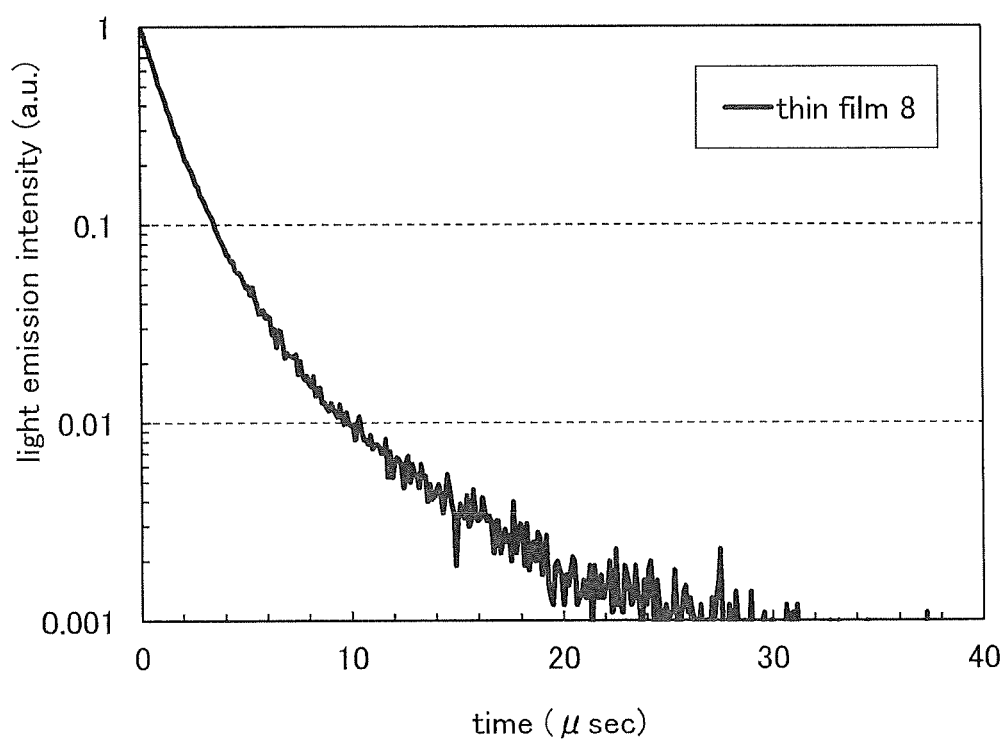
FIG. 73 shows transient emission characteristics of thin films in Example.
Figure 74:
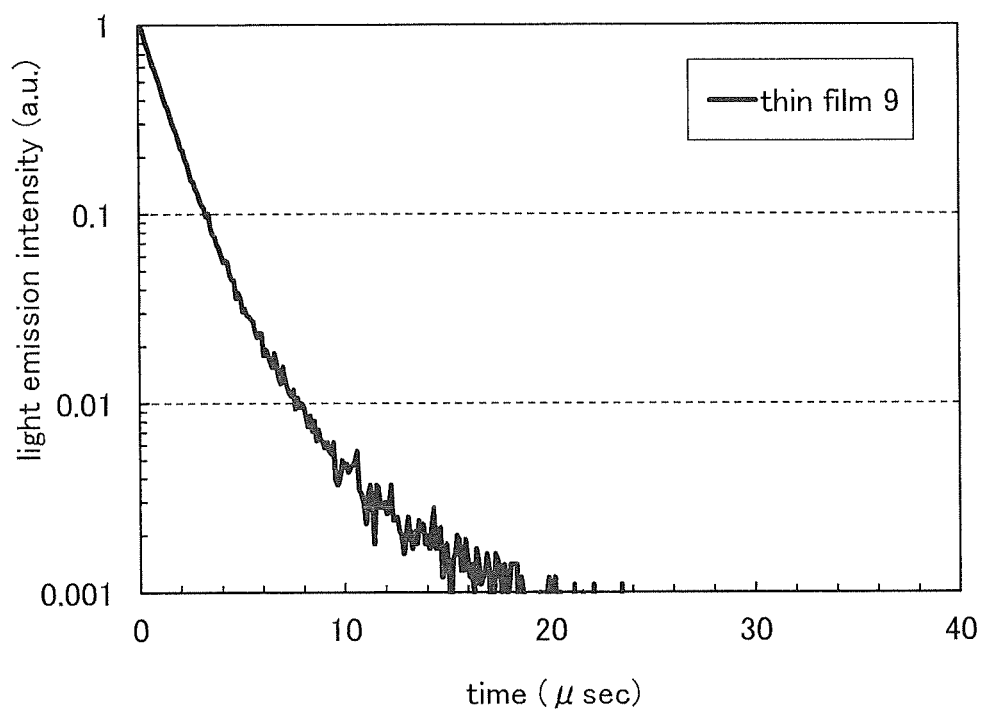
FIG. 74 shows transient emission characteristics of thin films in Example.
Figure 75:
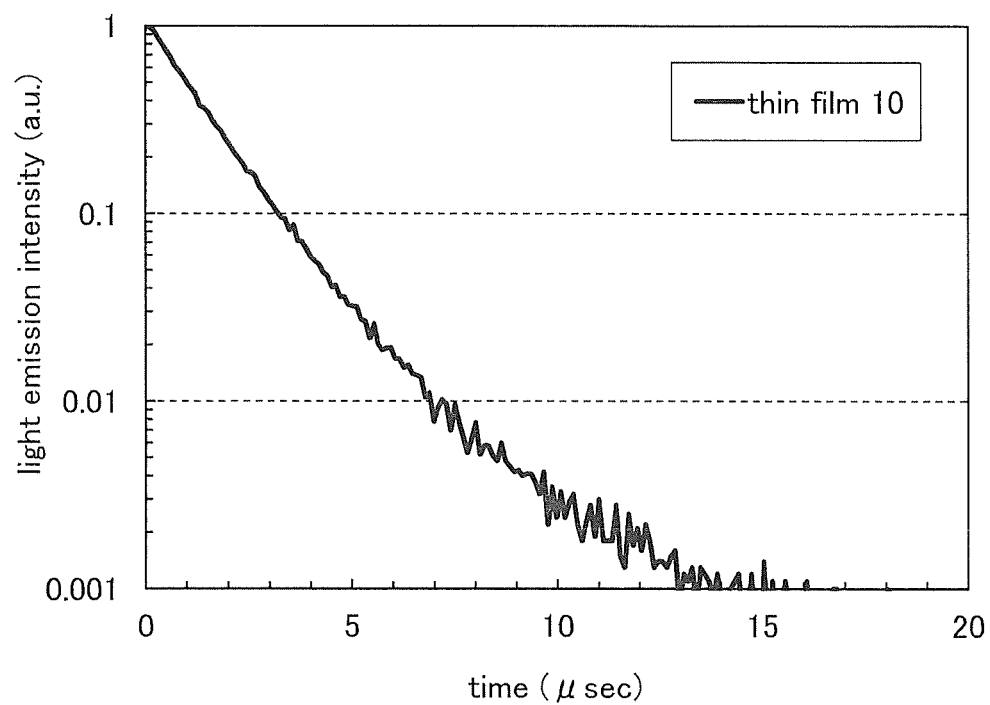
FIG. 75 shows transient emission characteristics of thin films in Example.
Figure 76:
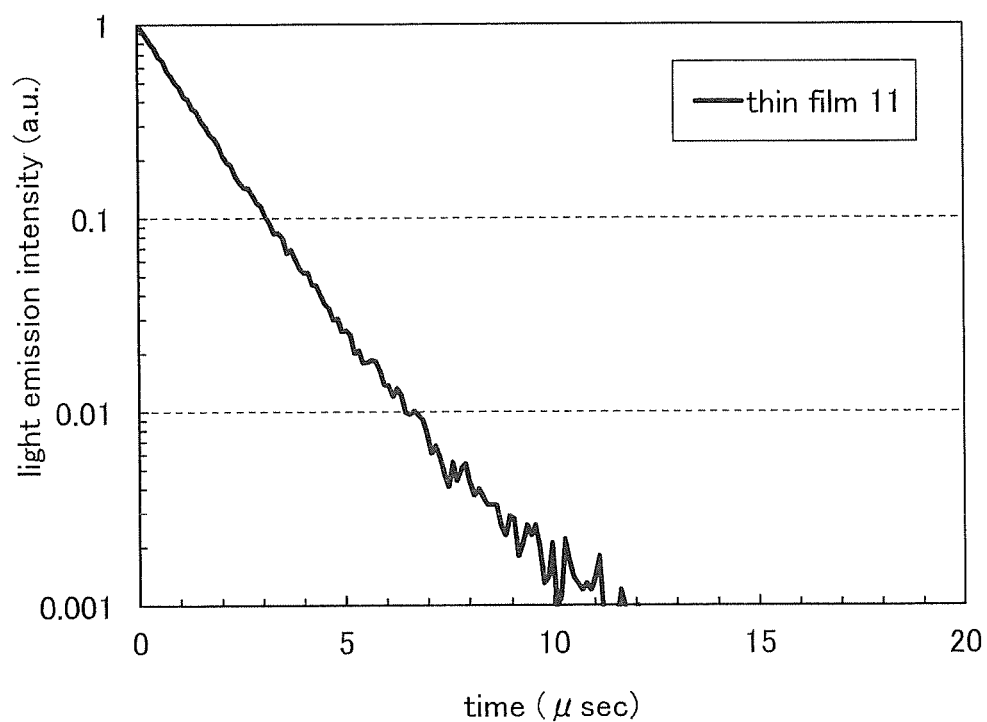
FIG. 76 shows transient emission characteristics of thin films in Example.
Figure 77:
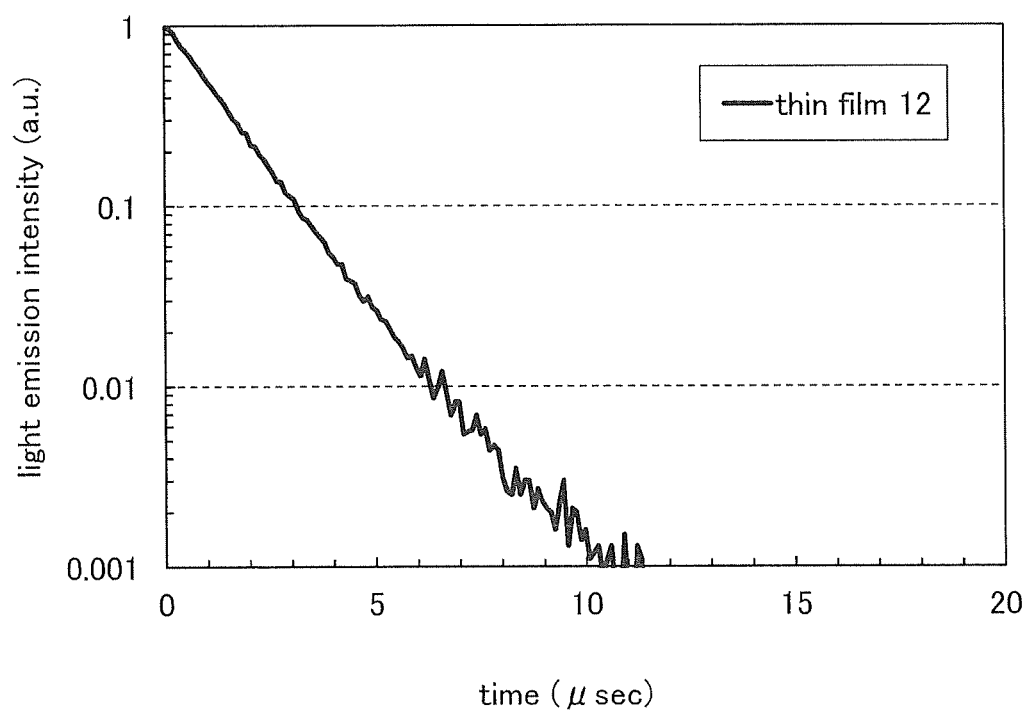
FIG. 77 shows transient emission characteristics of thin films in Example.
Figure 78:
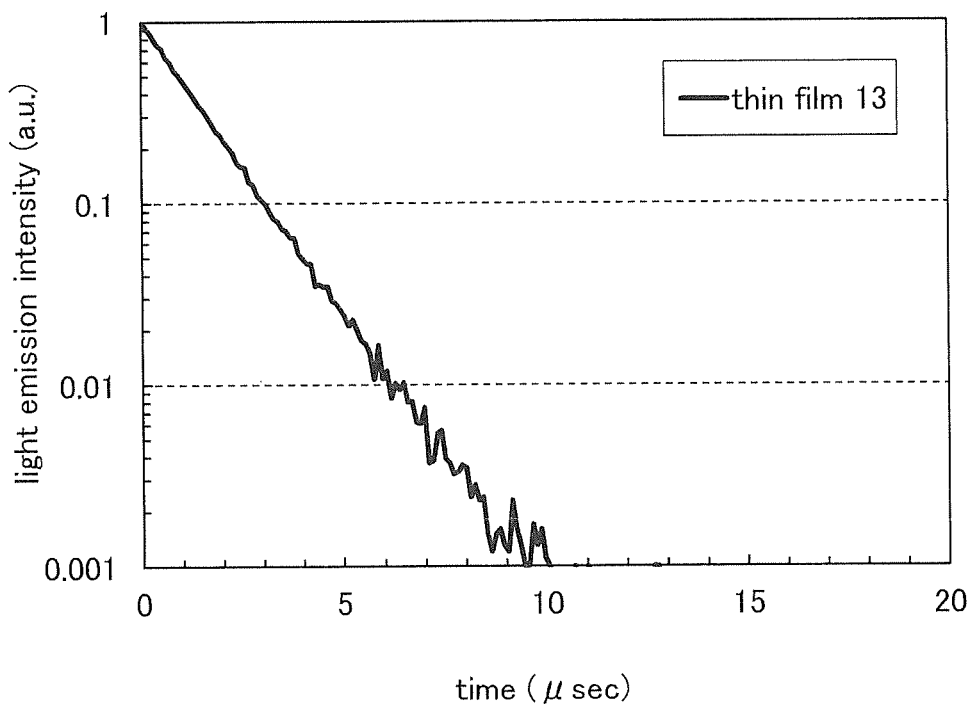
FIG. 78 shows transient emission characteristics of thin films in Example.
Figure 79:
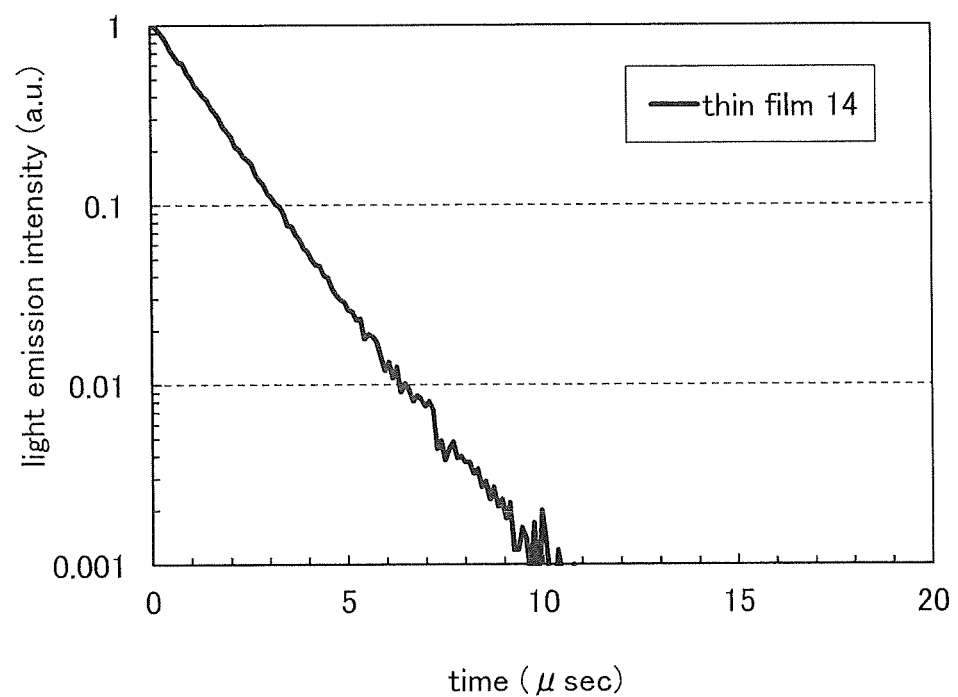
FIG. 79 shows transient emission characteristics of thin films in Example.

As shown in FIG. 72, the phosphorescent component of the emission spectrum of 5Me-4,6mCzP2Pm has a peak (including a shoulder) on the shortest wavelength side at 446 nm. Accordingly, the T1 level of 5Me-4,6mCzP2Pm was calculated to be 2.78 eV.

Accordingly, in the light-emitting elements 8 to 14, the T1 levels of the host materials (the second and third organic compounds) are higher than or equal to the T1 level of the guest material (the first organic compound) and higher than or equal to the T1 level of the exciplex formed by the first organic compound and any of the second organic compounds. Therefore, the second and third organic compounds in the light-emitting elements 8 to 14 have the T1 levels high enough for host materials.

<Time-Resolved Emission Measurement>

Next, transient emission characteristics of the thin films 8 to 14 were measured using time-resolved emission measurement. The measurement was performed by a method similar to that in Example 1.

The measured transient emission characteristics of the thin films 8 to 14 are shown in FIG. 73 to FIG. 79, respectively.

It was found that the transient emission characteristics of each of the thin the thin films 8 to 14 include a delayed emission component in addition to a prompt emission component.

Times in which the emission intensity is reduced to 1% (hereinafter also referred to as 1% emission lifetime) in the transient emission characteristics of the thin films 8 to 14 are 10.5 μs, 8.0 μs, 7.3 μs, 6.8 μs, 6.7 μs, 6.6 μs, and 6.6 μs, respectively.

Figure 80A:
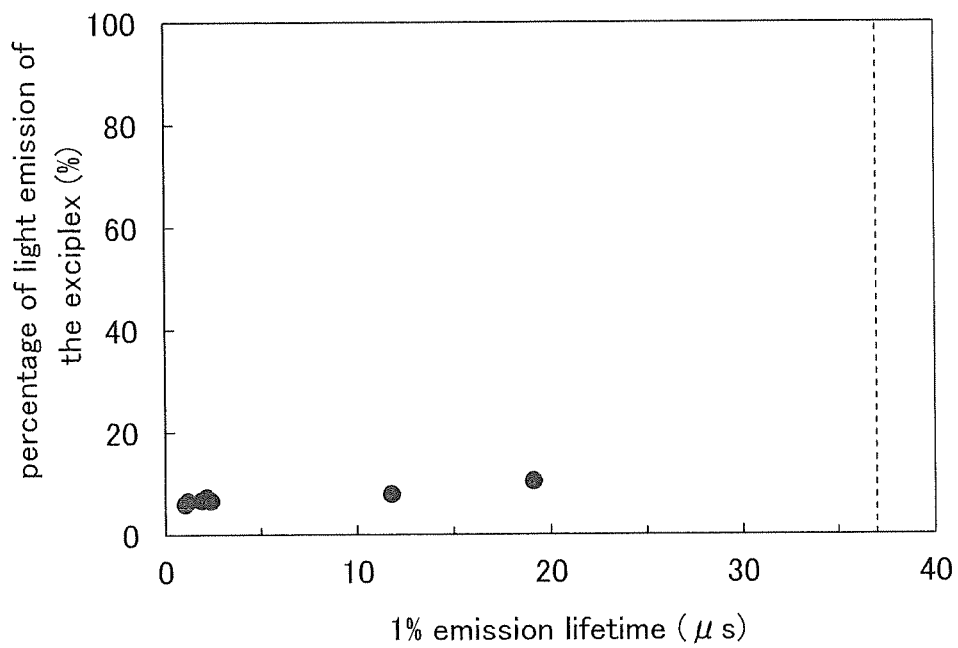
FIG. 80A shows the relation between the percentage of light emission of an exciplex and an emission lifetime in Example.

The relation between the percentages of light emission of the exciplexes to light emission from the thin films 8 to 14 and the 1% emission lifetime in the transient emission characteristics is shown in FIG. 80A. FIG. 80A shows that the thin films 8 to 14 each having a small percentage of light emission of the exciplex have short emission lifetimes. From FIG. 80A, as in Example 1, it can be said that when the 1% emission lifetime is shorter than or equal to 37 μs, the percentage of light emission of the exciplex is decreased, and thus high emission efficiency can be obtained.

Figure 80B:
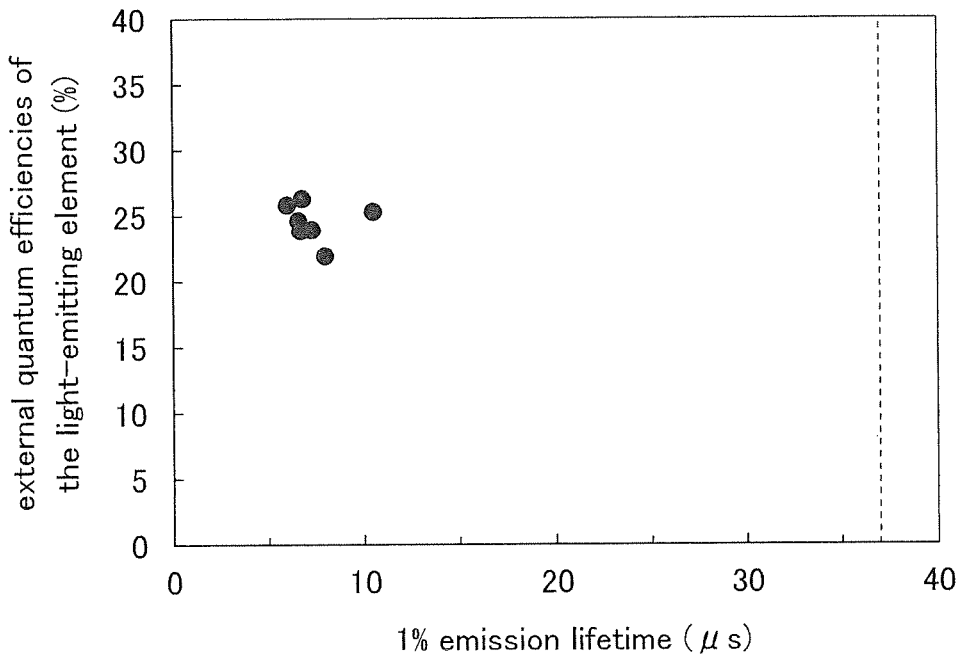
FIG. 80B shows the relation between the external quantum efficiency and an emission lifetime in Example.

The relation between the maximum external quantum efficiencies of the light-emitting elements 8 to 14 and the 1% emission lifetime in the transient emission characteristics of the thin films 8 to 14 is shown in FIG. 80B. From FIG. 80B, it was found that high external quantum efficiency can be achieved in the case where the 1% emission lifetime is shorter than or equal to 37 is. From FIG. 80B, as in Example 1, it can be said that the 1% emission lifetime is preferably smaller than or equal to 30 μs because the light-emitting element can have high external quantum efficiency. Accordingly, the 1% emission lifetime is preferably shorter than or equal to 37 μs, further preferably shorter than or equal to 30 μs.

With one embodiment of the present invention, even in the case where the guest material that exhibits green light is used, a light-emitting element with high emission efficiency can be provided. In addition, with one embodiment of the present invention, a light-emitting element with low driving voltage and reduced power consumption can be provided.

Example 3

In this example, examples of fabricating light-emitting elements of embodiments of the present invention and characteristics of the light-emitting elements are described. The structure of each of the light-emitting elements fabricated in this example is the same as that illustrated in FIG. 1. Table 9 and Table 10 show the detailed structures of the elements. In addition, structures and abbreviations of compounds used here are given below.

[Chemical Formula 25]

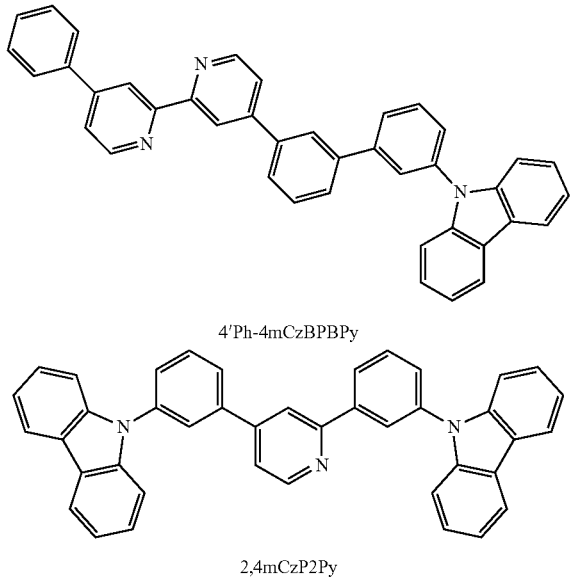

4'Ph-4mCzBPBPy 2,4mCzP2Py

-continued

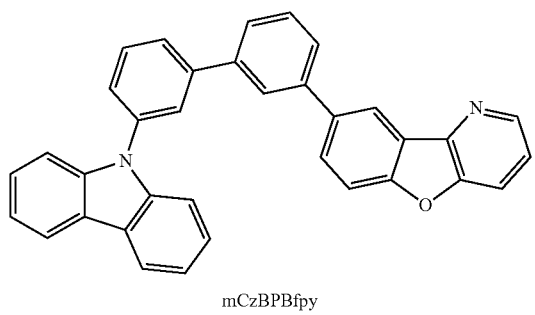

mCzBPBfpy

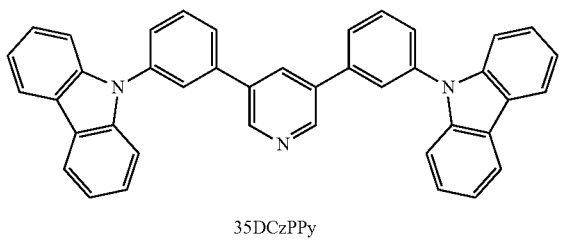

35DCzPPy

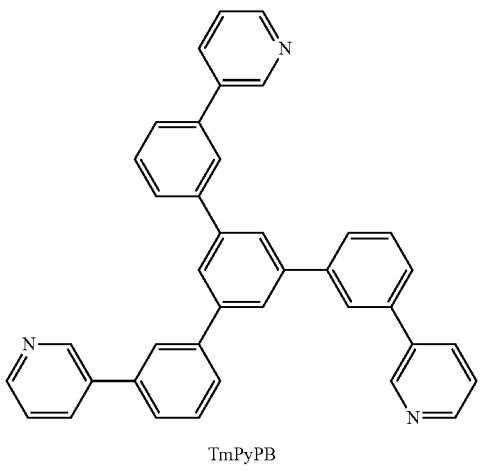

TmPyPB

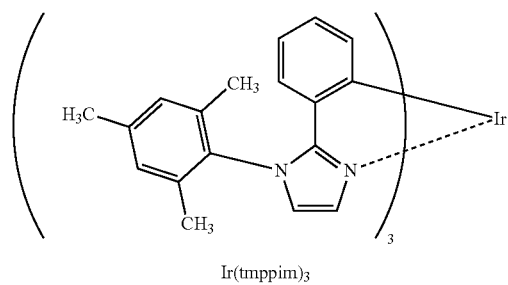

Ir(tmppim)$_3$

TABLE 9

| | Layer | Reference numeral | Thickness (nm) | Material(s) | Weight ratio |
|---|---|---|---|---|---|
| Light-emitting element 15 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 130(2) | 10 | 4,6mCzP2Pm:Ir(tmppim)$_3$ | 1:0.06 |
| | Light-emitting layer | 130(1) | 30 | 4,6mCzP2Pm:PCCP:Ir(tmppim)$_3$ | 1:0.5:0.06 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 16 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzBP2Pm | — |
| | Light-emitting layer | 130(2) | 10 | 4,6mCzBP2Pm:Ir(tmppim)$_3$ | 1:0.06 |
| | Light-emitting layer | 130(1) | 30 | 4,6mCzBP2Pm:PCCP:Ir(tmppim)$_3$ | 1:0.5:0.06 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 17 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,4'mCzP2BPy | — |
| | Light-emitting layer | 130(2) | 10 | 4,4'mCzP2BPy:Ir(tmppim)$_3$ | 1:0.06 |
| | Light-emitting layer | 130(1) | 30 | 4,4'mCzP2BPy:PCCP:Ir(tmppim)$_3$ | 1:0.5:0.06 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |
| Light-emitting element 18 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4'Ph-4mCzBPBPy | — |
| | Light-emitting layer | 130(2) | 10 | 4'Ph-4mCzBPBPy:Ir(tmppim)$_3$ | 1:0.06 |
| | Light-emitting layer | 130(1) | 30 | 4'Ph-4mCzBPBPy:Ir(tmppim)$_3$ | 1:0.5:0.06 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITSO | — |

TABLE 10

| | Layer | Reference numeral | Thickness (nm) | Material(s) | Weight ratio |
|---|---|---|---|---|---|
| Light-emitting element 19 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 2,4mCzP2Py | — |
| | Light-emitting layer | 130(2) | 10 | 2,4mCzP2Py:Ir(tmppim)$_3$ | 1:0.06 |
| | Light-emitting layer | 130(1) | 30 | 2,4mCzP2Py:PCCP:Ir(tmppim)$_3$ | 1:0.5:0.06 |
| | Hole-transport layer | 112 | 20 | PCCP | — |

TABLE 10-continued

|  | Layer | Reference numeral | Thickness (nm) | Material(s) | Weight ratio |
|---|---|---|---|---|---|
|  | Hole-injection layer | 111 | 30 | DBT3P-II:MoO$_3$ | 1:0.5 |
|  | Electrode | 101 | 70 | ITSO | — |
| Light-emitting element 20 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | mCzBPBfpy | — |
|  | Light-emitting layer | 130(2) | 10 | mCzBPBfpy:Ir(tmppim)$_3$ | 1:0.06 |
|  | Light-emitting layer | 130(1) | 30 | mCzBPBfpy:PCCP:Ir(tmppim)$_3$ | 1:0.5:0.06 |
|  | Hole-transport layer | 112 | 20 | PCCP | — |
|  | Hole-injection layer | 111 | 30 | DBT3P-II:MoO$_3$ | 1:0.5 |
|  | Electrode | 101 | 70 | ITSO | — |
| Light-emitting element 21 | Electrode | 102 | 200 | Al | — |
|  | Electron-injection layer | 119 | 1 | LiF | — |
|  | Electron-transport layer | 118(2) | 15 | BPhen | — |
|  |  | 118(1) | 10 | 35DCzPPy | — |
|  | Light-emitting layer | 130(2) | 10 | 35DCzPPy:Ir(tmppim)$_3$ | 1:0.06 |
|  | Light-emitting layer | 130(1) | 30 | 35DCzPPy:PCCP:Ir(tmppim)$_3$ | 1:0.5:0.06 |
|  | Hole-transport layer | 112 | 20 | PCCP | — |
|  | Hole-injection layer | 111 | 30 | DBT3P-II:MoO$_3$ | 1:0.5 |
|  | Electrode | 101 | 70 | ITSO | — |

<<Fabrication of Light-Emitting Elements 15 to 21>>

Methods for fabricating light-emitting elements of this example are described below. The light-emitting elements 15 to 21 were fabricated through the same steps as those for the light-emitting element 8 except for the steps of forming the light-emitting layer 130 and the electron-transport layer 118.

<<Fabrication of Light-Emitting Element 15>>

As the light-emitting layer 130 over the hole-transport layer 112, 4,6mCzP2Pm, PCCP, and tris{3-(2,4,6-trimethylphenyl)-4H-imidazol-3-yl-κN$^2$}phenyl-κCirridium(III) (abbreviation: Ir(tmppim)$_3$) were deposited by co-evaporation in a weight ratio of 4,6mCzP2Pm: PCCP: Ir(tmppim)$_3$=0.5:0.5:0.06 to a thickness of 30 nm, and successively, 4,6mCzP2Pm and Ir(tmppim)$_3$ were deposited by co-evaporation in a weight ratio of 4,6mCzP2Pm: Ir(tmppim)$_3$-1:0.06 to a thickness of 10 nm. In the light-emitting layer 130, Ir(tmppim)$_3$ is the guest material (first organic compound), 4,6mCzP2Pm is the host material (second organic compound), and PCCP is the host material (third organic compound).

Next, as the electron-transport layer 118, 4,6mCzP2Pm and BPhen were sequentially deposited over the light-emitting layer 130 by evaporation to thicknesses of 10 nm and 15 nm, respectively.

<<Fabrication of Light-Emitting Element 16>>

As the light-emitting layer 130 over the hole-transport layer 112, 4,6mCzBP2Pm and Ir(tmppim)$_3$ were deposited by co-evaporation in a weight ratio of 4,6mCzBP2Pm: PCCP: Ir(tmppim)$_3$=0.5:0.5:0.06 to a thickness of 30 nm, and successively, 4,6mCzBP2Pm and Ir(tmppim)$_3$ were deposited by co-evaporation in a weight ratio of 4,6mCzBP2Pm: Ir(tmppim)$_3$-1:0.06 to a thickness of 10 nm. In the light-emitting layer 130, Ir(tmppim)$_3$ is the guest material (first organic compound), 4,6mCzBP2Pm is the host material (second organic compound), and PCCP is the host material (third organic compound).

Then, as the electron-transport layer 118, 4,6mCzBP2Pm and Bphen were sequentially deposited over the light-emitting layer 130 by evaporation to thicknesses of 10 nm and 15 nm, respectively.

<<Fabrication of Light-Emitting Element 17>>

As the light-emitting layer 130 over the hole-transport layer 112, 4,4'mCzP2BPy, PCCP, and Ir(tmppim)$_3$ were deposited by co-evaporation in a weight ratio of 4,4'mCzP2BPy: PCCP: Ir(tmppim)$_3$=0.5:0.5:0.06 to a thickness of 30 nm, and successively, 4,4'mCzP2Bpy and Ir(tmppim)$_3$ were deposited by co-evaporation in a weight ratio of 4,4'mCzP2BPy: Ir(tmppim)$_3$=1:0.06 to a thickness of 10 nm. In the light-emitting layer 130, Ir(tmppim)$_3$ is the guest material (first organic compound), 4,4'mCzP2BPy is the host material (second organic compound), and PCCP is the host material (third organic compound).

Then, as the electron-transport layer 118, 4,4'mCzP2BPy and Bphen were sequentially deposited over the light-emitting layer 130 by evaporation to thicknesses of 10 nm and 15 nm, respectively.

<<Fabrication of Light-Emitting Element 18>>

As the light-emitting layer 130 over the hole-transport layer 112, 9-{3-[4'-phenyl-(2,2'-bipyridin)-4-yl]-phenyl}-9H-carbazole (abbreviation: 4'Ph-4mCzBPBPy), PCCP, and Ir(tmppim)$_3$ were deposited by co-evaporation in a weight ratio of 4'Ph-4mCzBPBPy: PCCP: Ir(tmppim)$_3$-1:0.5:0.06 to a thickness of 30 nm, and successively, 4'Ph-4mCzBPBPy and Ir(tmppim)$_3$ were deposited by co-evaporation in a weight ratio of 4'Ph-4mCzBPBPy: Ir(tmppim)$_3$=1:0.06 to a thickness of 10 nm. In the light-emitting layer 130, Ir(tmppim)$_3$ is the guest material (first organic compound), 4'Ph-4mCzBPBPy is the host material (second organic compound), and PCCP is the host material (third organic compound).

Then, as the electron-transport layer 118, 4'Ph-4mCzBPBPy and Bphen were sequentially deposited over the light-emitting layer 130 by evaporation to thicknesses of 10 nm and 15 nm, respectively.

<<Fabrication of Light-Emitting Element 19>>

As the light-emitting layer 130 over the hole-transport layer 112, 9,9'-(2,4-pyridinediyl-3,1-phenylene)bis-9H-carbazole (abbreviation: 2,4mCzP2Py), PCCP, and Ir(tmppim)$_3$ were deposited by co-evaporation in a weight ratio of 2,4mCzP2Py: PCCP: Ir(tmppim)$_3$=1:0.5:0.06 to a thickness of 30 nm, and successively, 2,4mCzP2Py and Ir(tmppim)$_3$ were deposited by co-evaporation in a weight ratio of 2,4mCzP2Py: Ir(tmppim)$_3$=1:0.06 to a thickness of 10 nm. In the light-emitting layer 130, Ir(tmppim)$_3$ is the guest material (first organic compound), 2,4mCzP2Py is the host material (second organic compound), and PCCP is the host material (third organic compound).

Then, as the electron-transport layer 118, 2,4mCzP2Py and Bphen were sequentially deposited over the light-emitting layer 130 by evaporation to thicknesses of 10 nm and 15 nm, respectively.

<<Fabrication of Light-Emitting Element 20>>

As the light-emitting layer 130 over the hole-transport layer 112, 8-[3'-(9H-carbazol-9-yl)biphenyl-3-yl]benzo[4,5]furo[3,2-b]pyridine (abbreviation: mCzBPBfpy), PCCP, and Ir(tmppim)$_3$ were deposited by co-evaporation in a weight ratio of mCzBPBfpy: PCCP: Ir(tmppim)$_3$=1:0.5:0.06 to a thickness of 30 nm, and successively, mCzBPBfpy and Ir(tmppim)$_3$ were deposited by co-evaporation in a weight ratio of mCzBPBfpy: Ir(tmppim)$_3$=1:0.06 to a thickness of 10 nm. In the light-emitting layer 130, Ir(tmppim)$_3$ is the guest material (first organic compound), mCzBPBfpy is the host material (second organic compound), and PCCP is the host material (third organic compound).

Then, as the electron-transport layer 118, mCzBPBfpy and Bphen were sequentially deposited over the light-emitting layer 130 by evaporation to thicknesses of 10 nm and 15 nm, respectively.

<<Fabrication of Light-Emitting Element 21>>

As the light-emitting layer 130 over the hole-transport layer 112, 35DCzPPy, PCCP, and Ir(tmppim)$_3$ were deposited by co-evaporation in a weight ratio of 35DCzPPy: PCCP: Ir(tmppim)$_3$=1:0.5:0.06 to a thickness of 30 nm, and successively, 35DCzPPy and Ir(tmppim)$_3$ were deposited by co-evaporation in a weight ratio of 35DCzPPy: Ir(tmppim)$_3$=1:0.06 to a thickness of 10 nm. In the light-emitting layer 130, Ir(tmppim)$_3$ is the guest material (first organic compound), 35DCzPPy is the host material (second organic compound), and PCCP is the host material (third organic compound).

Then, as the electron-transport layer 118, 35DCzPPy and Bphen were sequentially deposited over the light-emitting layer 130 by evaporation to thicknesses of 10 nm and 15 nm, respectively.

<Characteristics of the Light-Emitting Elements>

Next, the characteristics of the fabricated light-emitting elements 15 to 21 were measured. The measurement was performed by a method similar to that in Example 1.

Figure 81A:
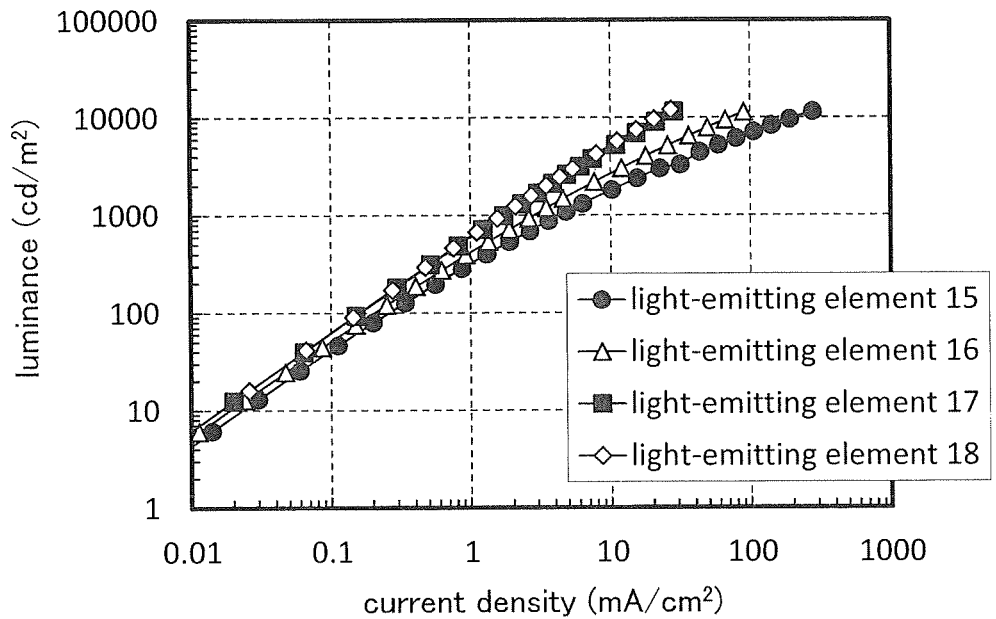
FIGS. 81A and 81B show the luminance-current density characteristics of light-emitting elements in Example.
Figure 81B:
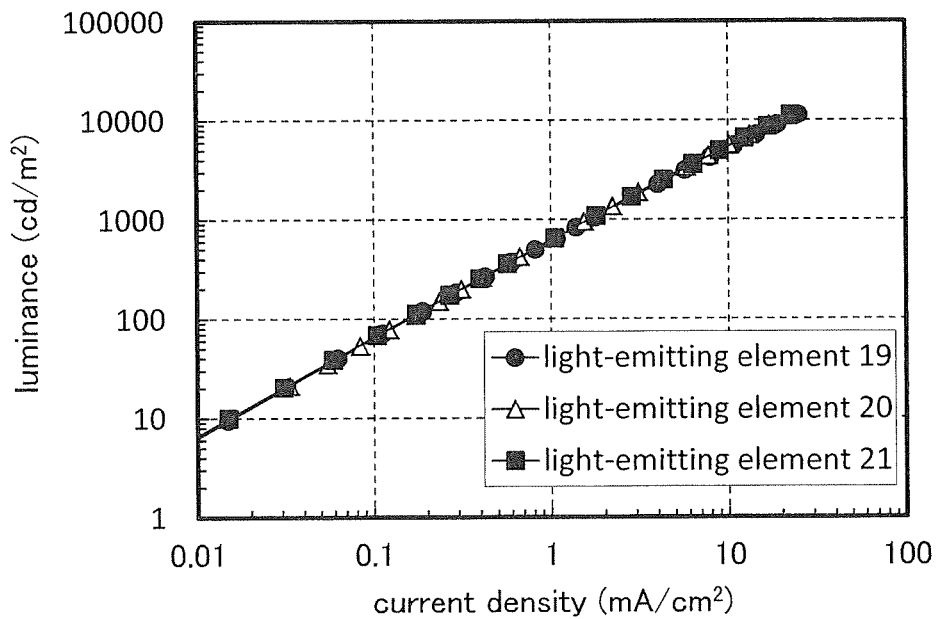
Figure 82A:
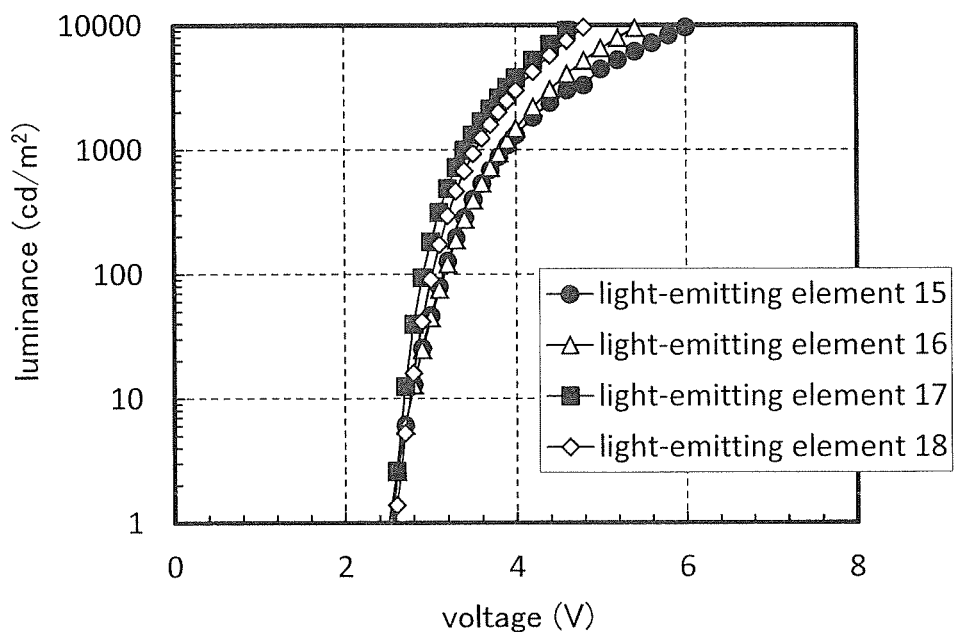
FIGS. 82A and 82B show the luminance-voltage characteristics of light-emitting elements in Example.
Figure 82B:
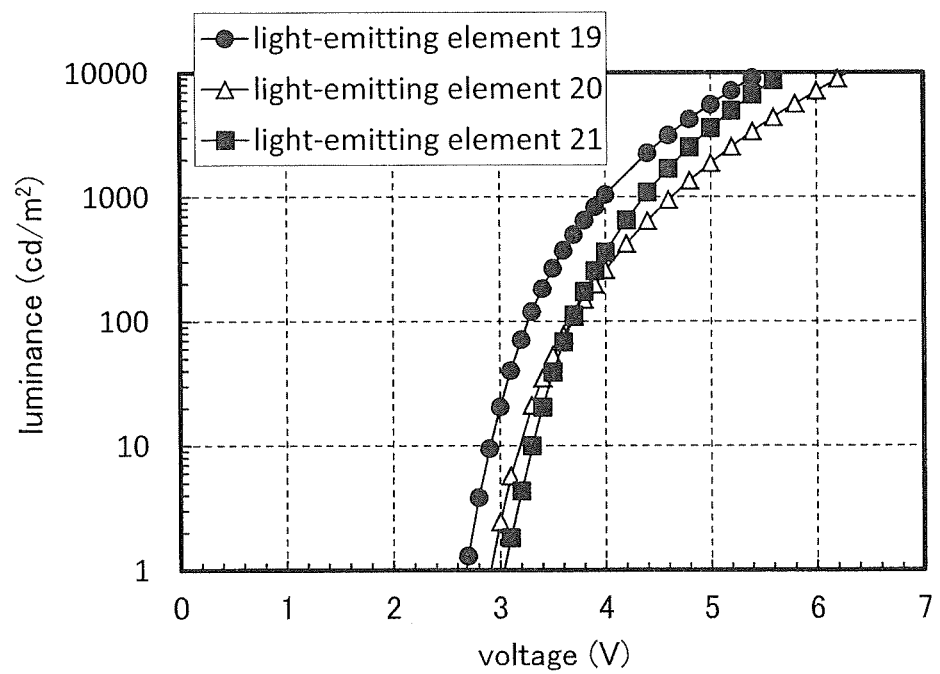
Figure 83A:
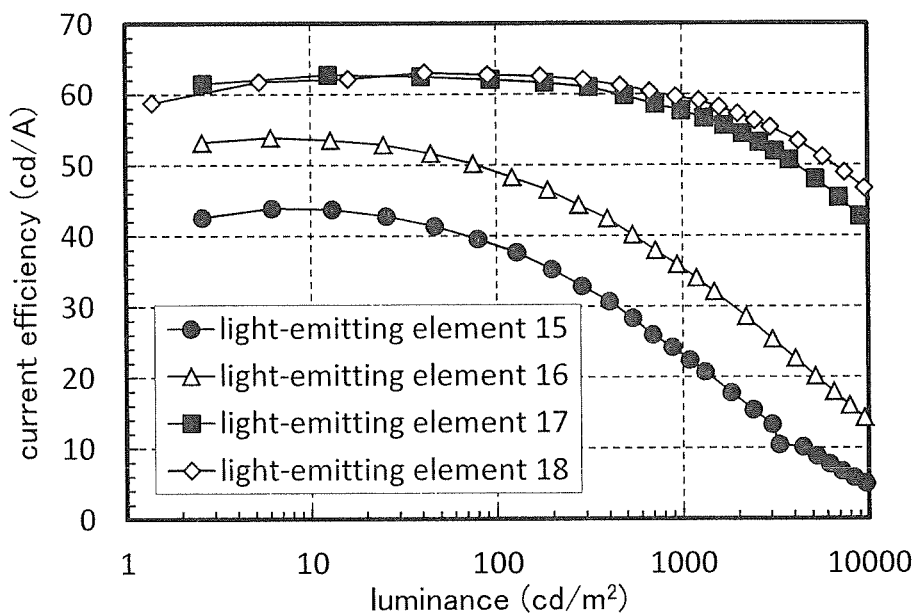
FIGS. 83A and 83B show the current efficiency-luminance characteristics of light-emitting elements in Example.
Figure 83B:
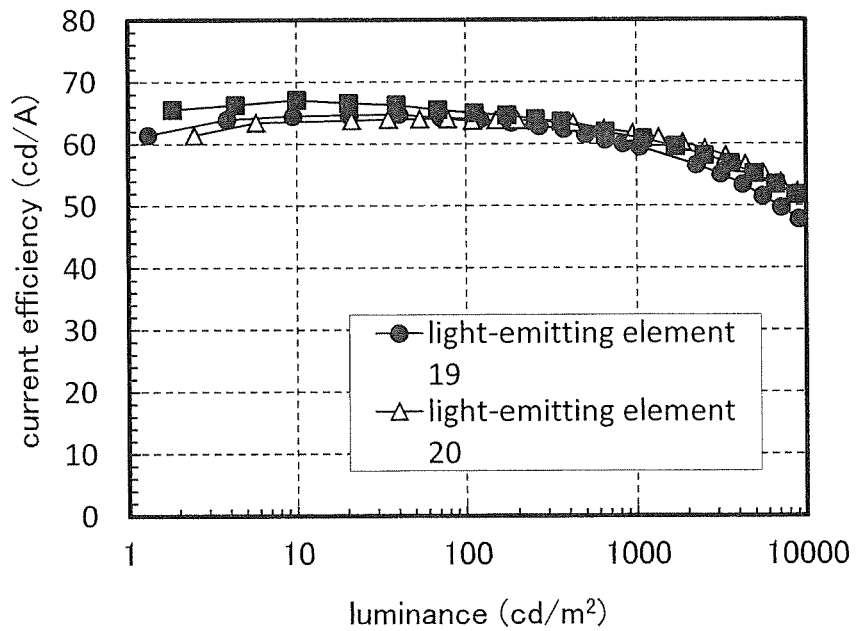
Figure 84A:
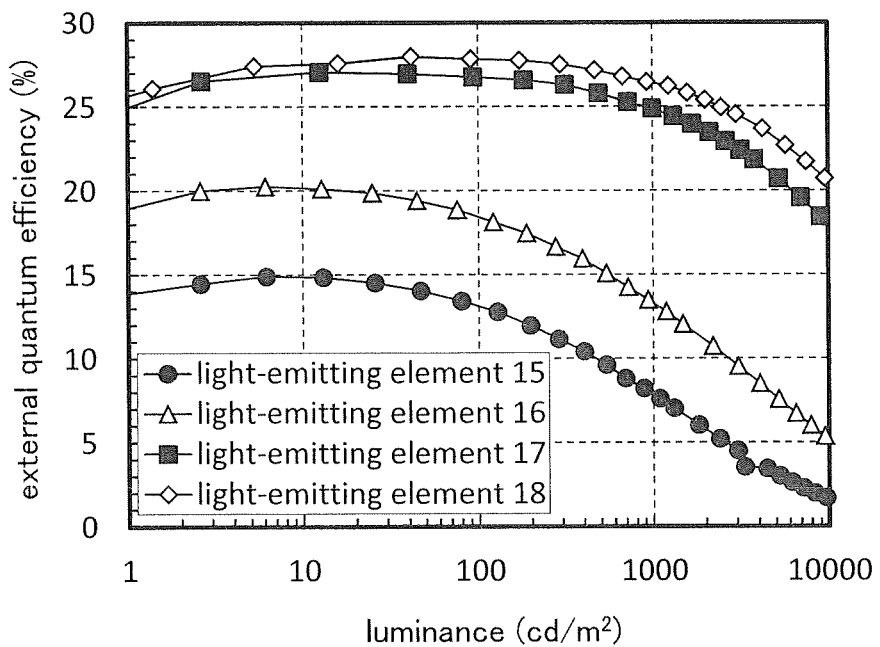
FIGS. 84A and 84B show the external quantum efficiency-luminance characteristics of light-emitting elements in Example.
Figure 84B:
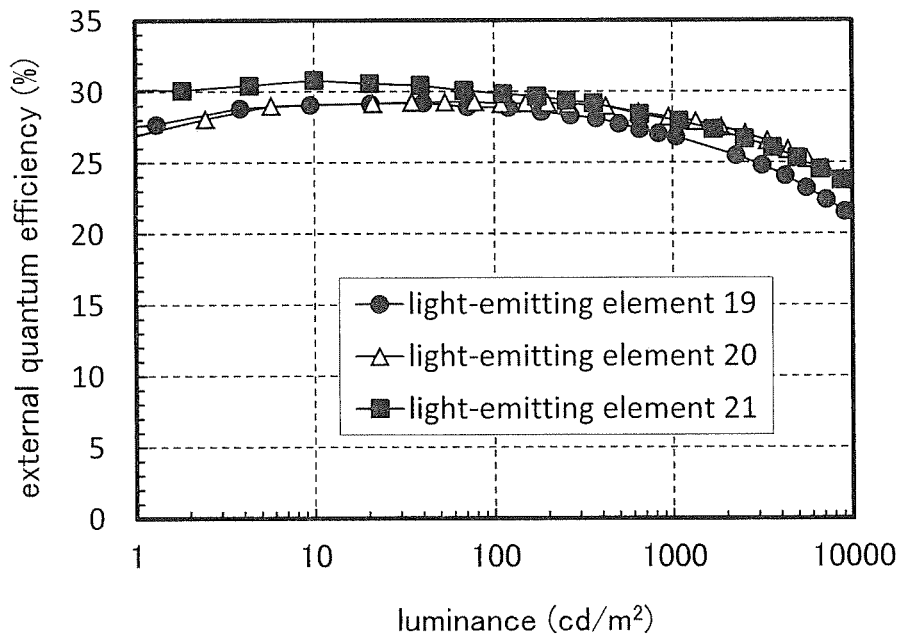
Figure 85A:
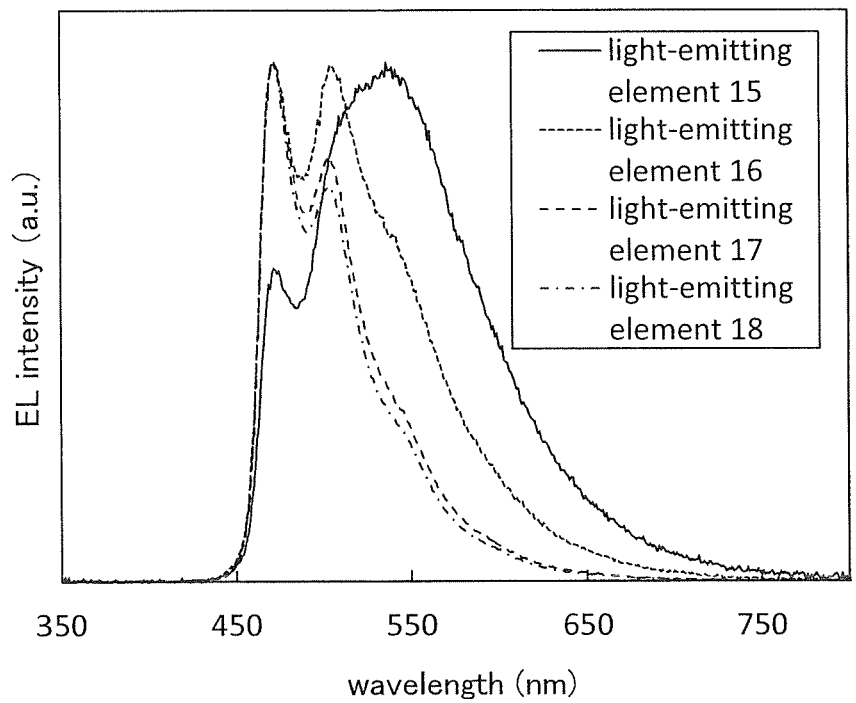
FIGS. 85A and 85B show the electroluminescence spectra of light-emitting elements in Example.
Figure 85B:
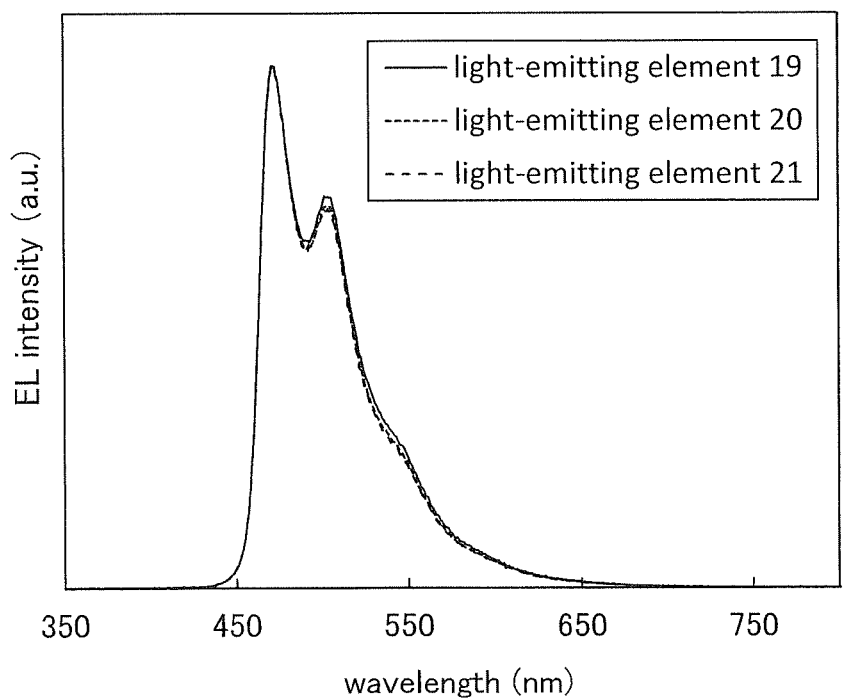
Figure 86A:
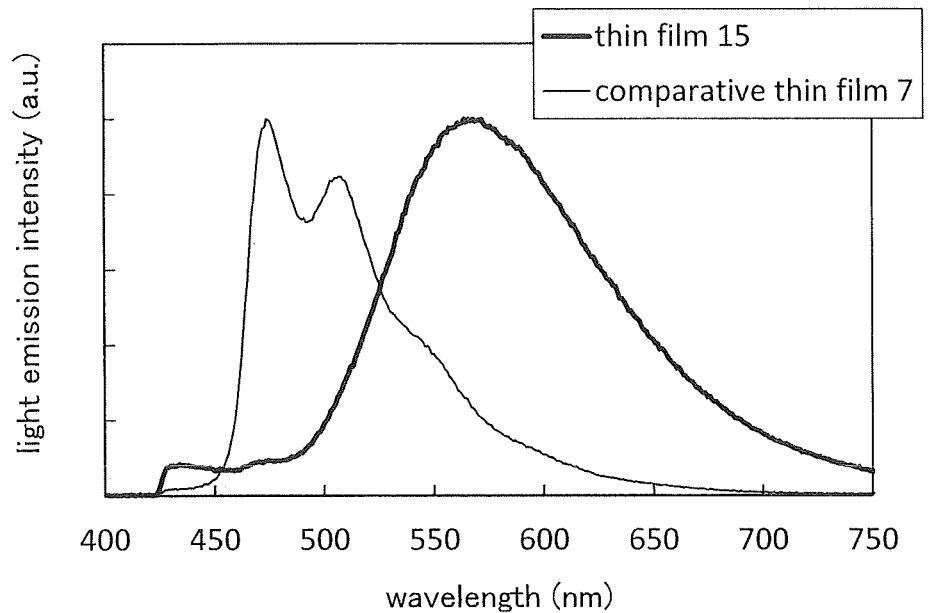
FIGS. 86A and 86B show emission spectra of thin films in Example.
Figure 86B:
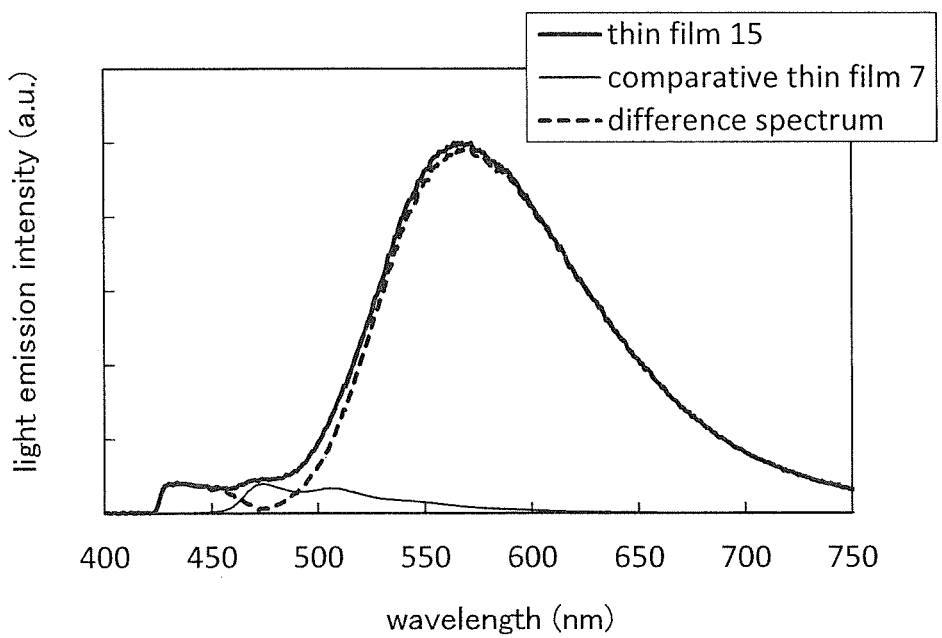
Figure 87A:
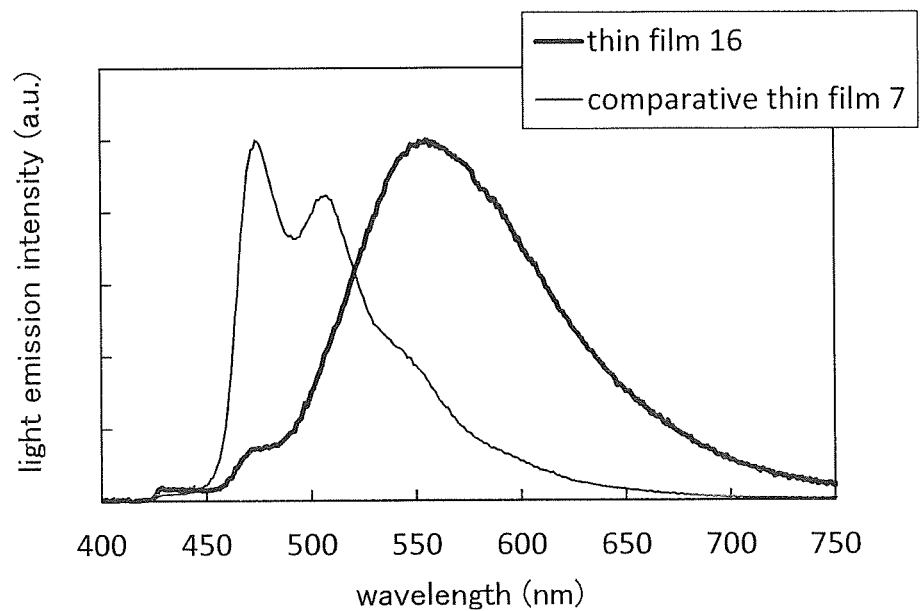
FIGS. 87A and 87B show emission spectra of thin films in Example.
Figure 87B:
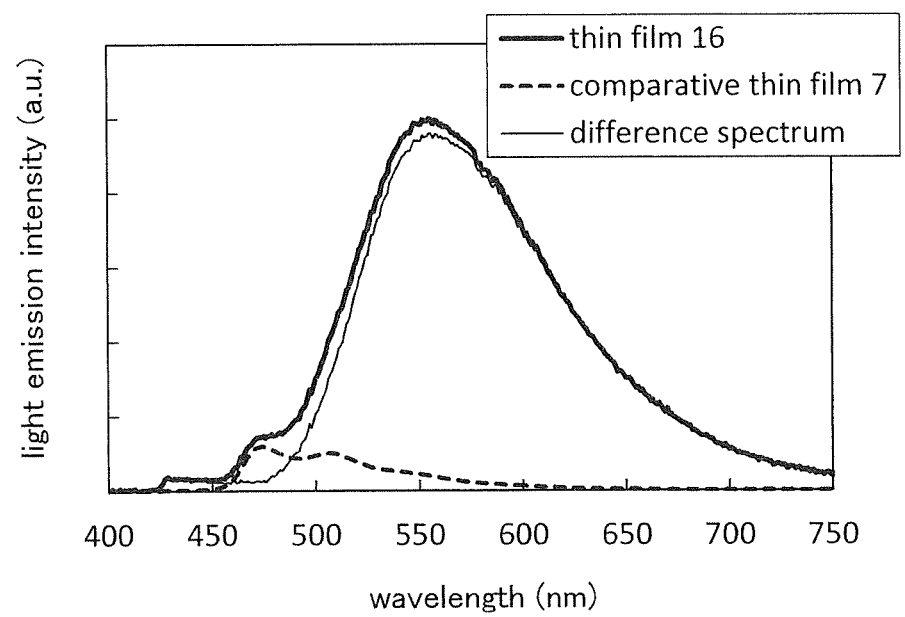
Figure 88A:
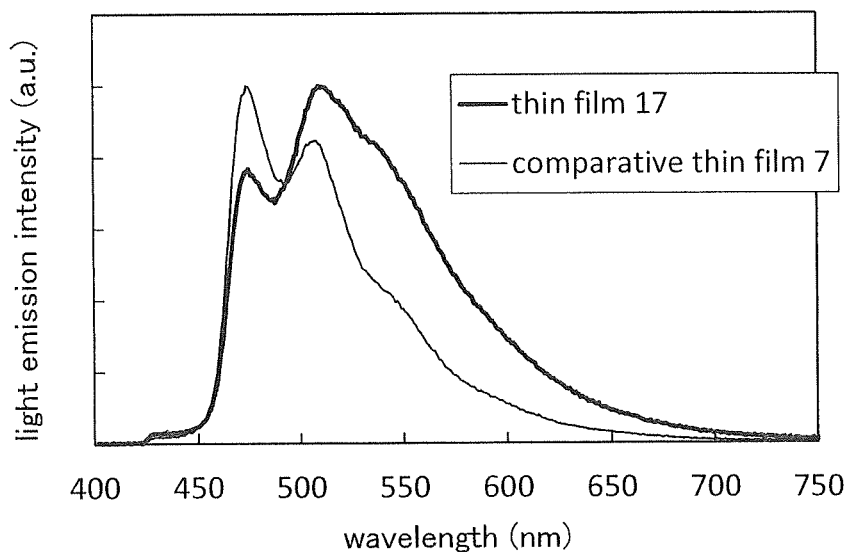
FIGS. 88A and 88B show emission spectra of thin films in Example.
Figure 88B:
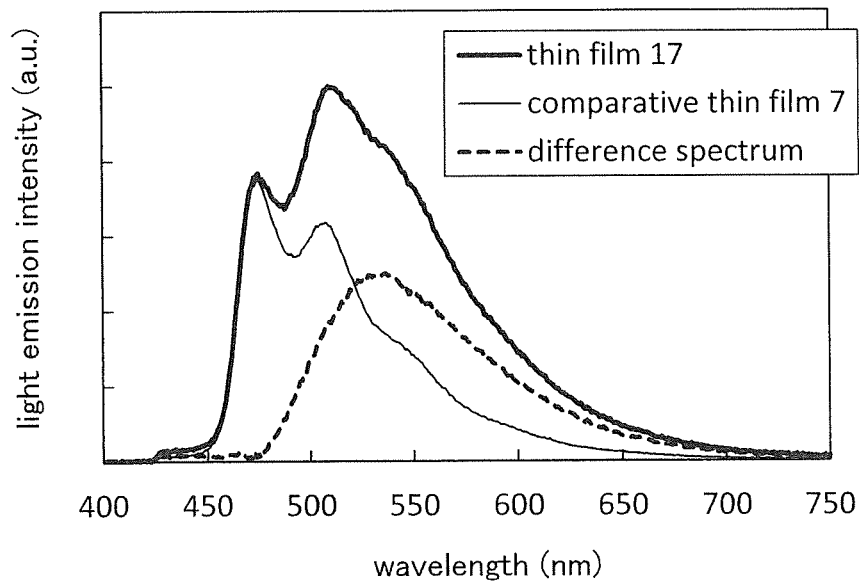
Figure 89A:
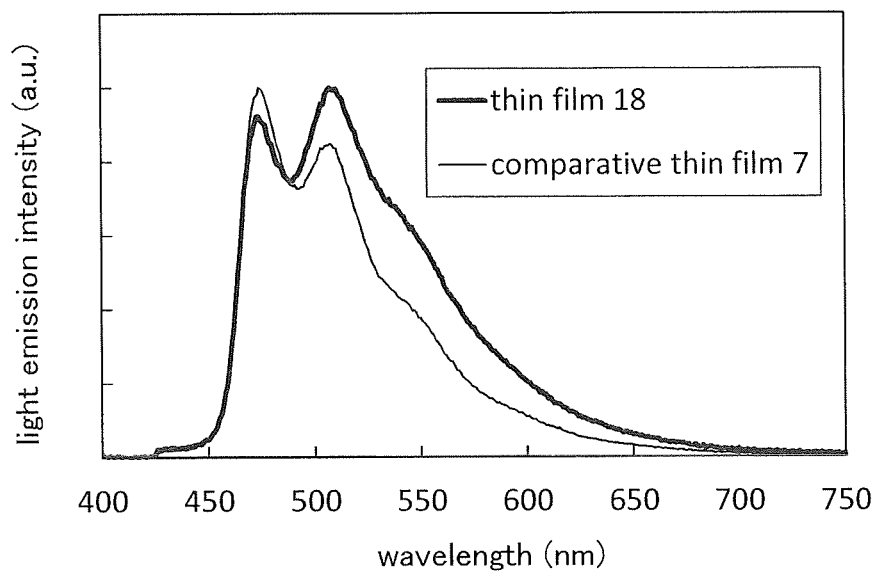
FIGS. 89A and 89B show emission spectra of thin films in Example.
Figure 89B:
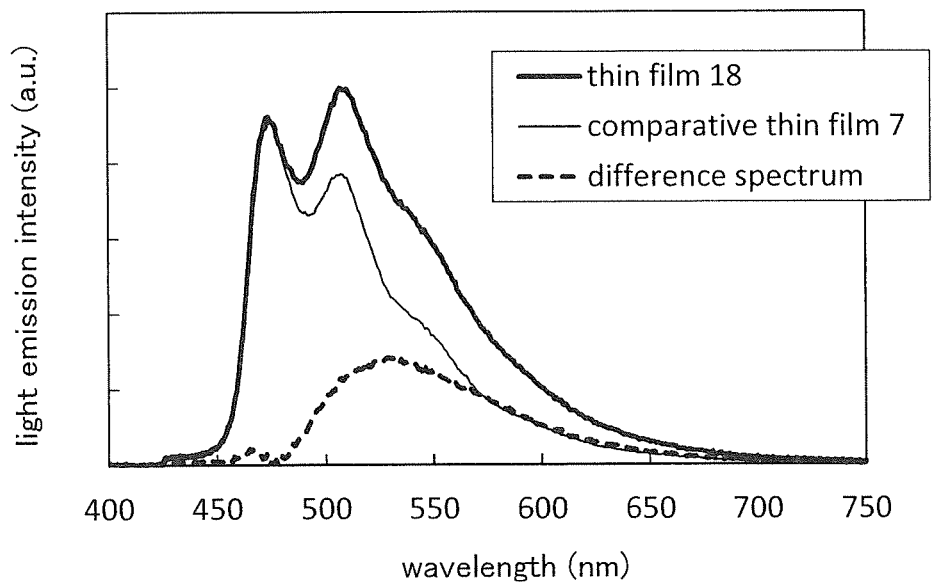
Figure 90A:
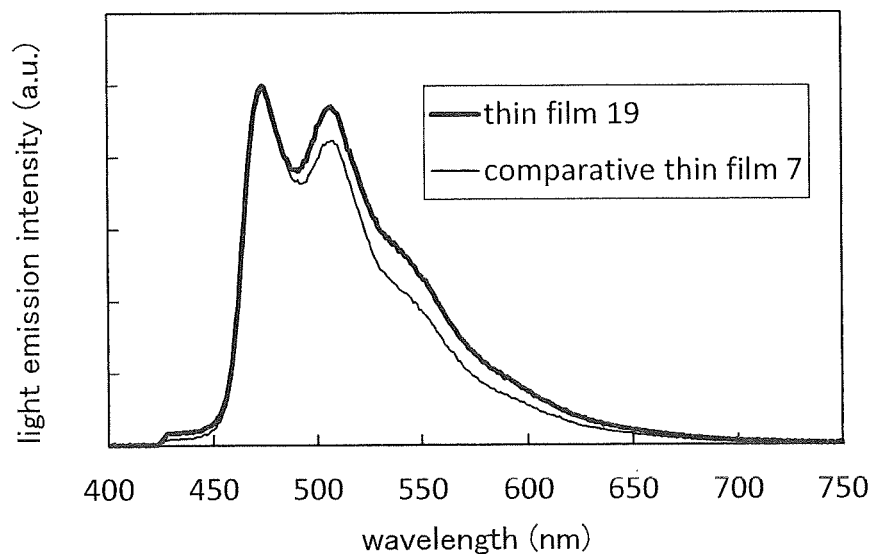
FIGS. 90A and 90B show emission spectra of thin films in Example.
Figure 90B:
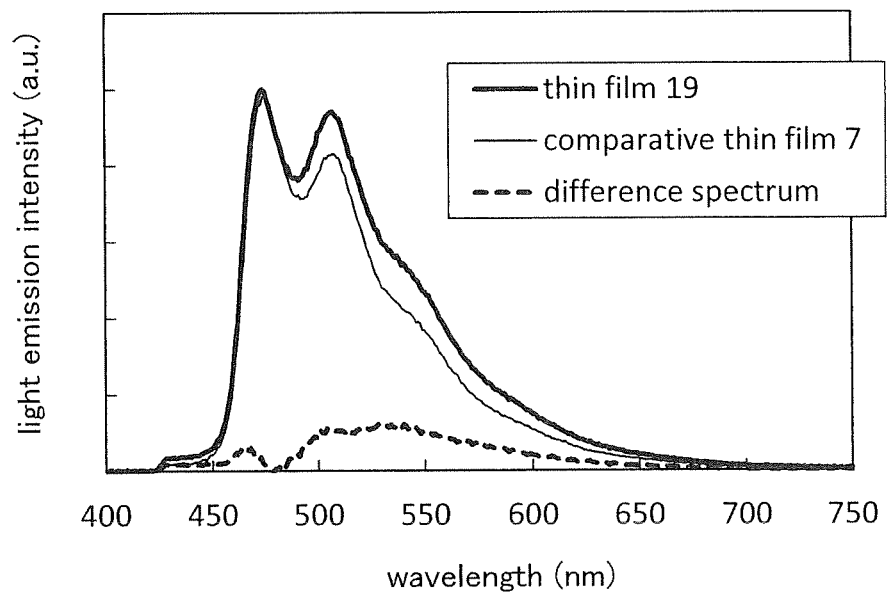
Figure 91A:
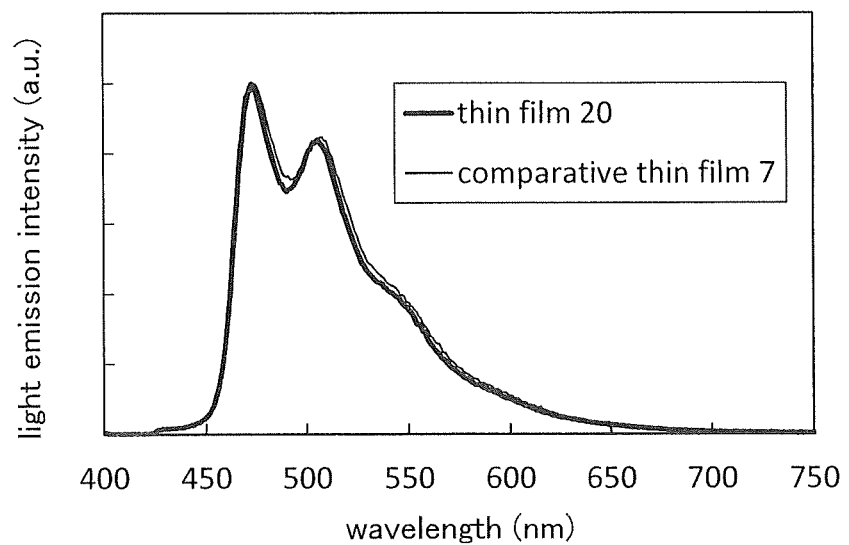
FIGS. 91A and 91B show emission spectra of thin films in Example.
Figure 91B:
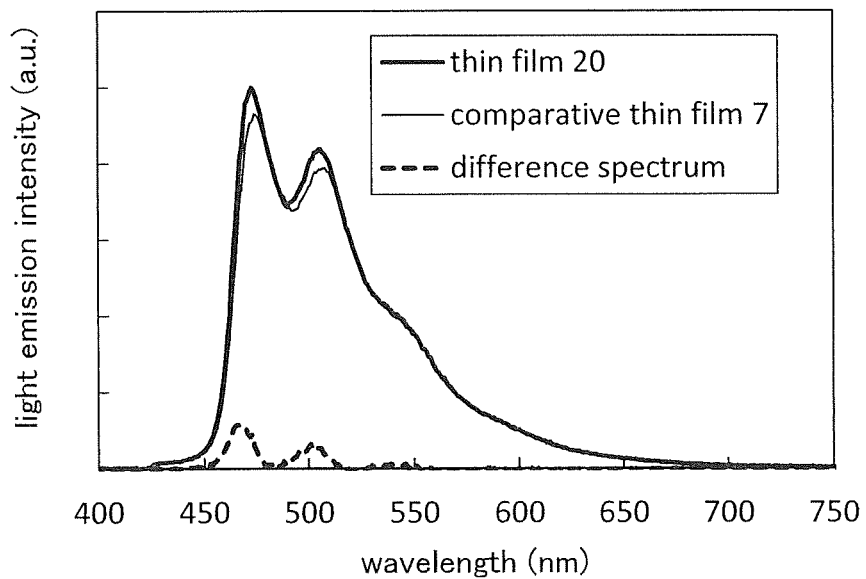
Figure 92A:
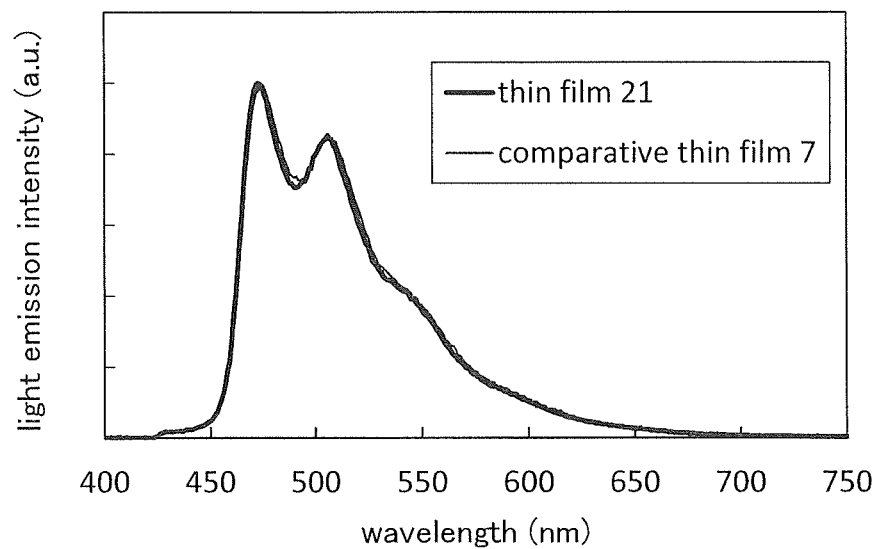
FIGS. 92A and 92B show emission spectra of thin films in Example.
Figure 92B:
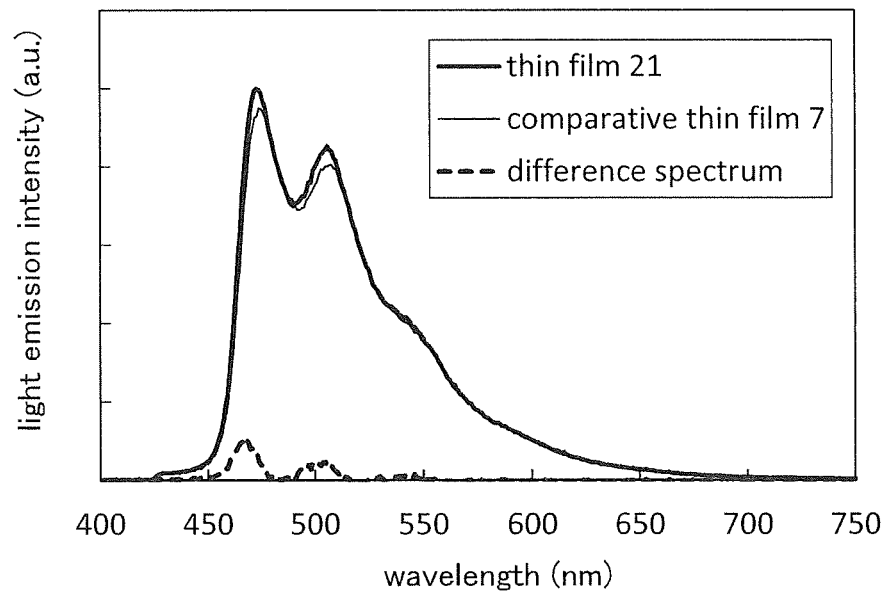

FIGS. 81A and 81B show luminance-current density characteristics of the light-emitting elements 15 to 21. FIGS. 82A and 82B show luminance-voltage characteristics thereof. FIGS. 83A and 83B show current efficiency-luminance characteristics thereof. FIGS. 84A and 84B show external quantum efficiency-luminance characteristics thereof. FIGS. 85A and 85B show electroluminescence spectra of the light-emitting elements 15 to 21 to which a current at a current density of 2.5 mA/cm$^2$ was supplied. The measurements of the light-emitting elements were performed at room temperature (in an atmosphere kept at 23° C.).

Table 11 shows element characteristics of the light-emitting elements 15 to 21 at around 1000 cd/m$^2$.

TABLE 11

|  | Voltage (V) | Current density (mA/cm2) | CIE chromaticity (x, y) | Luminance (cd/m2) | Current efficiency (cd/A) | Power efficiency (lm/W) | External quantum efficiency (%) |
|---|---|---|---|---|---|---|---|
| Light-emitting element 15 | 3.90 | 4.84 | (0.321, 0.519) | 1090 | 22.5 | 18.1 | 7.6 |
| Light-emitting element 16 | 3.80 | 2.60 | (0.246, 0.469) | 937 | 36.0 | 29.7 | 13.5 |
| Light-emitting element 17 | 3.40 | 1.72 | (0.190, 0.412) | 993 | 57.7 | 53.3 | 24.9 |
| Light-emitting element 18 | 3.50 | 1.56 | (0.185, 0.399) | 929 | 59.7 | 53.6 | 26.4 |
| Light-emitting element 19 | 4.00 | 1.76 | (0.181, 0.392) | 1047 | 59.5 | 46.8 | 26.8 |
| Light-emitting element 20 | 4.60 | 1.54 | (0.178, 0.385) | 949 | 61.8 | 42.2 | 28.2 |
| Light-emitting element 21 | 4.40 | 1.79 | (0.177, 0.384) | 1089 | 60.9 | 43.5 | 27.9 |

The peak wavelengths on the shortest wavelength side of the electroluminescence spectra of the light-emitting elements 15 to 21 are 471 nm, 472 nm, 473 nm, 472 nm, 472 nm, 472 nm, and 472 nm, respectively, and light has a peak in a blue wavelength range. The light emission originates from the guest material. The full widths at half maximum of the electroluminescence spectra of the light-emitting elements 15 to 21 are 129 nm, 94 nm, 60 nm, 57 nm, 57 nm, 56 nm, and 55 nm, respectively, and the electroluminescence spectra of the light-emitting elements 15 and 17 had spectrum shapes broader than those of the light-emitting elements 18 to 21. In particular, the electroluminescence spectrum of each of the light-emitting elements 15 and 16 has a broad spectrum shape, and indicates light emission attributed to Ir(iPrpim)$_3$, which is the guest material, and broad light emission in a wavelength range of green to yellow.

Furthermore, the light emission start voltages (voltages at a luminance higher than 1 cd/m$^2$) of the light-emitting elements 15 to 21 are 2.6 V, 2.6 V, 2.6 V, 2.6 V, 2.7 V, 3.0 V, and 3.1 V, respectively. This voltage is smaller than a voltage corresponding to an energy difference between the LUMO level and the HOMO level of the guest material of each of the light-emitting elements, which is described later. The results suggest in the light-emitting elements 15 to 21, carriers are not directly recombined in the guest material but are recombined in the material having a smaller energy gap.

The driving voltages in a high luminance region of the light-emitting elements 15 to 18 are lower than those of the light-emitting elements 19 to 21.

The maximum external quantum efficiencies of the light-emitting elements 15 to 21 are 14.9%, 20.3%, 27.1%, 28.0%, 29.2%, 29.3%, and 30.8%, respectively, and the light-emitting elements 17 to 21 have high maximum external quantum efficiencies of greater than 25%.

<Results of CV Measurement>

Next, the electrochemical characteristics (oxidation reaction characteristics and reduction reaction characteristics) of the compounds used in the fabricated light-emitting elements and 1,3,5-tri[3-(3-pyridyl)phenyl]benzene (abbreviation: TmPyPB), which is described later, were measured by cyclic voltammetry (CV) measurement. The measurement was performed in a manner similar to that described in Example 1.

Table 12 shows oxidation potentials and reduction potentials of the compounds obtained from the results of the CV measurement and HOMO levels and LUMO levels of the compounds calculated from the results of the CV measurement. Although chloroform was used as a solvent for the measurement of Ir(tmppim)$_3$, the measurement was performed in a manner similar to that described in Example 1.

TABLE 12

| Abbreviation | Oxidation potential (V) | Reduction potential (V) | HOMO level calculated from oxidation potential (eV) | LUMO level calculated from reduction potential (eV) |
| --- | --- | --- | --- | --- |
| Ir(tmppim)$_3$ | 0.60 | −2.76 | −5.54 | −2.19 |
| 4,6mCzP2Pm | 0.95 | −2.06 | −5.89 | −2.88 |
| 4,6mCzBP2Pm | 0.95 | −2.14 | −5.89 | −2.80 |
| 4,4'mCzP2BPy | 1.00 | −2.29 | −5.94 | −2.66 |
| 4'Ph-4mCzBPBPy | 0.99 | −2.35 | −5.93 | −2.59 |
| 2,4mCzP2Py | 0.94 | −2.37 | −5.88 | −2.57 |
| mCzBPBfpy | 0.95 | −2.48 | −5.89 | −2.47 |
| 35DCzPPy | 0.96 | −2.56 | −5.90 | −2.39 |
| TmPyPB | — | −2.72 | — | −2.23 |
| PCCP | 0.69 | −2.98 | −5.63 | −1.96 |

As shown in Table 12, the HOMO level of the first organic compound (Ir(tmppim)$_3$), which is the guest material, is higher than or equal to those of the second organic compounds (4,6mCzP2Pm, 4,6mCzBP2Pm, 4,4'mCzP2BPy, 4'Ph-4mCzBPBPy, 2,4mCzP2Py, mCzBPBfpy, and 35DCzPPy), which are the host materials used for the light-emitting elements 15 to 21, and the LUMO level of the first organic compound (Ir(tmppim)$_3$) is higher than or equal to those of the second organic compounds (4,6mCzP2Pm, 4,6mCzBP2Pm, 4,4'mCzP2BPy, 4'Ph-4mCzBPBPy, 2,4mCzP2Py, mCzBPBfpy, and 35DCzPPy). Thus, in the case where the compounds are used for a light-emitting layer as in the light-emitting elements 15 to 21, electrons and holes that are carriers injected from a pair of electrodes are efficiently injected to a second organic compound (host material) and a first organic compound (guest material); thus, the combination of the second organic compound (host material) and the first organic compound (guest material) can form an exciplex. In an exciplex formed by the first organic compound (Ir(tmppim)$_3$) and any of the second organic compounds (4,6mCzP2Pm, 4,6mCzBP2Pm, 4,4'mCzP2BPy, 4'Ph-4mCzBPBPy, 2,4mCzP2Py, mCzBPBfpy, and 35DCzPPy) has the LUMO level in the second organic compound and the HOMO level in the first organic compound.

<Emission Spectra of Thin Films>

Here, thin film samples including the first organic compound (guest material) and the second organic compounds (host materials) used for the light-emitting elements 15 to 21 were fabricated, and the emission spectra of the thin film were measured. In addition, as the comparative thin film 7, a thin film including TmPyPB and Ir(tmppim)$_3$ was fabricated. TmPyPB has a high LUMO level, and thus probably does not form an exciplex with Ir(tmppim)$_3$.

As the thin film 15, 4,6mCzP2Pm and Ir(tmppim)$_3$ were deposited over a quartz substrate by co-evaporation in a weight ratio of 4,6mCzP2Pm: Ir(tmppim)$_3$=1:0.06 to a thickness of 50 nm. That is, the thin film 15 includes the compound used for the light-emitting layer 130 of the light-emitting element 15.

As the thin film 16, 4,6mCzBP2Pm and Ir(tmppim)$_3$ were deposited over a quartz substrate by co-evaporation in a weight ratio of 4,6mCzBP2Pm: Ir(tmppim)$_3$=1:0.06 to a thickness of 50 nm. That is, the thin film 16 includes the compound used for the light-emitting layer 130 of the light-emitting element 16.

As the thin film 17, 4,4'mCzP2BPy and Ir(tmppim)$_3$ were deposited over a quartz substrate by co-evaporation in a weight ratio of 4,4'mCzP2BPy: Ir(tmppim)$_3$=1:0.06 to a thickness of 50 nm. That is, the thin film 17 includes the compound used for the light-emitting layer 130 of the light-emitting element 17.

As the thin film 18, 4'Ph-4mCzBPBPy and Ir(tmppim)$_3$ were deposited over a quartz substrate by co-evaporation in a weight ratio of 4'Ph-4mCzBPBPy: Ir(tmppim)$_3$=1:0.06 to a thickness of 50 nm. That is, the thin film 18 includes the compound used for the light-emitting layer 130 of the light-emitting element 18.

As the thin film 19, 2,4mCzP2Py and Ir(tmppim)$_3$ were deposited over a quartz substrate by co-evaporation in a weight ratio of 2,4mCzP2Py: Ir(tmppim)$_3$=1:0.06 to a thickness of 50 nm. That is, the thin film 19 includes the compound used for the light-emitting layer 130 of the light-emitting element 19.

As the thin film 20, mCzBPBfpy and Ir(tmppim)$_3$ were deposited over a quartz substrate by co-evaporation in a weight ratio of mCzBPBfpy: Ir(tmppim)$_3$=1:0.06 to a thickness of 50 nm. That is, the thin film 20 includes the compound used for the light-emitting layer 130 of the light-emitting element 20.

As the thin film 21, 35DCzPPy and Ir(tmppim)$_3$ were deposited over a quartz substrate by co-evaporation in a weight ratio of 35DCzPPy: Ir(tmppim)$_3$=1:0.06 to a thickness of 50 nm. That is, the thin film 21 includes the compound used for the light-emitting layer 130 of the light-emitting element 21.

As the comparative thin film 7, TmPyPB and Ir(tmppim)$_3$ were deposited over a quartz substrate by co-evaporation in a weight ratio of TmPyPB: Ir(tmppim)$_3$=1:0.06 to a thickness of 50 nm.

The emission spectra of the fabricated thin films 15 to 21 and the fabricated comparative thin film 7 were measured. The emission spectra were measured in a manner similar to that in Example 2. Measurement results are shown in FIGS. 86A and 86B, FIGS. 87A and 87B, FIGS. 88A and 88B, FIGS. 89A and 89B, FIGS. 90A and 90B, FIGS. 91A and 91B, and FIGS. 92A and 92B.

Note that as described above, the energy difference between the LUMO level of TmPyPB and the HOMO level of Ir(tmppim)$_3$ is very large, and it can be said that the combination of TmPyPB and Ir(tmppim)$_3$ does not easily form an exciplex. Thus, it can be said that in the fabricated comparative thin film 7, an exciplex is not formed by TmPyPB and Ir(tmppim)$_3$ and the fabricated comparative thin film 7 includes light emission from Ir(tmppim)$_3$.

Emission spectra were measured, and as shown in FIG. 86A, FIG. 87A, FIG. 88A, FIG. 89A, FIG. 90A, FIG. 91A, and FIG. 92A, in the comparative thin film 7, the emission spectrum of blue from Ir(tmppim)$_3$, which is a phosphorescent compound, was observed. In each of the thin films 15 to 18, an emission spectrum that is different from the emission spectrum of the comparative thin film 7 was observed. In each of the thin films 19 to 21, an emission spectrum that is slightly different from the emission spectrum of the comparative thin film 7 was observed.

Next, difference spectra obtained by subtracting the emission spectrum of the comparative thin film 7 from the emission spectrum of each of the thin films 15 to 21 are shown in FIG. 86B, FIG. 87B, FIG. 88B, FIG. 89B, FIG. 90B, FIG. 91B, and FIG. 92B. As a result, it was found that light emission from each of the thin films 15 to 21 includes light emission attributed to Ir(tmppim)$_3$ with peak wavelengths of 471 nm and 502 nm in addition to light emission that is different from Ir(tmppim)$_3$. The percentages (area ratios) of the difference spectra with respect to the emission spectra of the thin films 15 to 21 (the spectrum of each of the thin films 15 to 21–the spectrum of the comparative thin film 7) are 95.4%, 92.7%, 47.0%, 28.7%, 14.5%, 3.2%, and 2.8%, respectively.

The CV measurement results show that the combination of Ir(tmppim)$_3$ (first organic compound) and any of 4,6mCzP2Pm, 4,6mCzBP2Pm, 4,4'mCzP2BPy, 4'Ph-4mCzBPBPy, 2,4mCzP2Py, mCzBPBfpy, and 35DCzPPy (second organic compound) forms an exciplex. The energy differences between the LUMO levels of 4,6mCzP2Pm, 4,6mCzBP2Pm, 4,4'mCzP2BPy, 4'Ph-4mCzBPBPy 2,4mCzP2Py, mCzBPBfpy, and 35DCzPPy and the HOMO level of Ir(tmppim)$_3$ are 2.17 eV, 2.25 eV, 2.40 eV, 2.46 eV, 2.48 eV, 2.59 eV, and 2.67 eV, respectively. This energy difference substantially corresponds to light emission energy calculated from the peak wavelength of the difference spectrum of the difference spectra of the thin films 15 to 21, which is shown in FIG. 86B, FIG. 87B, FIG. 88B, FIG. 89B, FIG. 90B, FIG. 91B, and FIG. 92B. Thus, it can be said that the emission spectra observed in the thin films 15 to 21 include light emission attributed to Ir(tmppim)$_3$, which is the first organic compound, and in addition, light emission attributed to the exciplex formed by the first organic compound and the second organic compound.

<Relation 1 Between Percentage of Light Emission of Exciplexes and Characteristics of Light-Emitting Elements>

Accordingly, the percentages of light emission of the exciplexes in the thin films 15 to 21 were calculated to be 95.4%, 92.7%, 47.0%, 28.7%, 14.5%, 3.2%, and 2.8%, respectively. Next, the relation between the maximum external quantum efficiencies of the light-emitting elements 15 to 21 and the percentage of light emission of the exciplex to light emission from the thin films 15 to 21 is shown in FIG. 93.

Figure 93:
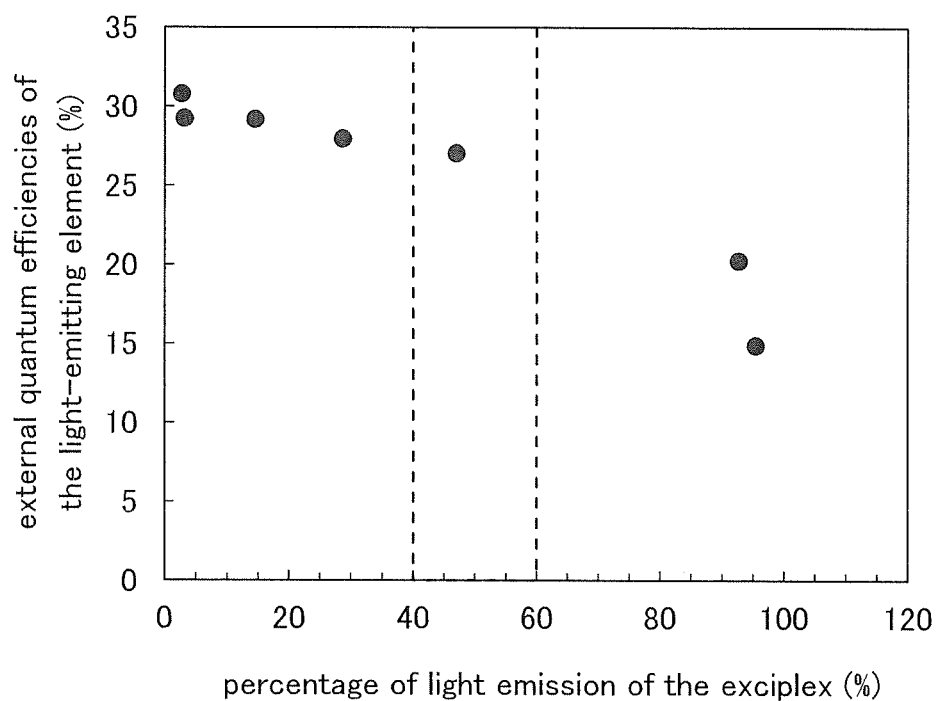
FIG. 93 shows the relation between the external quantum efficiency and the percentage of light emission of an exciplex in Example.

As shown in FIG. 93, the external quantum efficiencies of the light-emitting elements 17 to 21 including compounds included in the thin films 17 to 21 that have small percentages of light emission of the exciplexes are high, and the external quantum efficiencies of the light-emitting elements 15 and 16 including compounds included in the thin films 15 and 16 that have large percentages of light emission of the exciplexes are low. As in Example 1, a light-emitting element having a high external quantum efficiency can be provided in the case where the percentage of light emission of the exciplex to light emission from the light-emitting element is lower than or equal to 60%. Furthermore, as shown in FIG. 93, as in Example 1, the percentage of light emission of the exciplex to light emission from a light-emitting element is preferably higher than 0% and lower than or equal to 60%, further preferably higher than 0% and lower than or equal to 40%.

From FIGS. 86A and 86B to FIGS. 92A and 92B, the peak wavelengths of light emission attributed to the exciplexes formed by the first organic compound and the second organic compounds are 569 nm, 557 nm, 531 nm, 535 nm, 534 nm, 458 nm, and 469 nm, respectively, and thus the light emission energies ($E_{Ex\_em}$) of the exciplexes formed by the first organic compound and the second organic compounds were calculated to be 2.18 eV, 2.23 eV, 2.34 eV, 2.32 eV, 2.32 eV, 2.71 eV, and 2.64 eV, respectively.

<Absorption Spectra of Guest Material>

Figure 94:
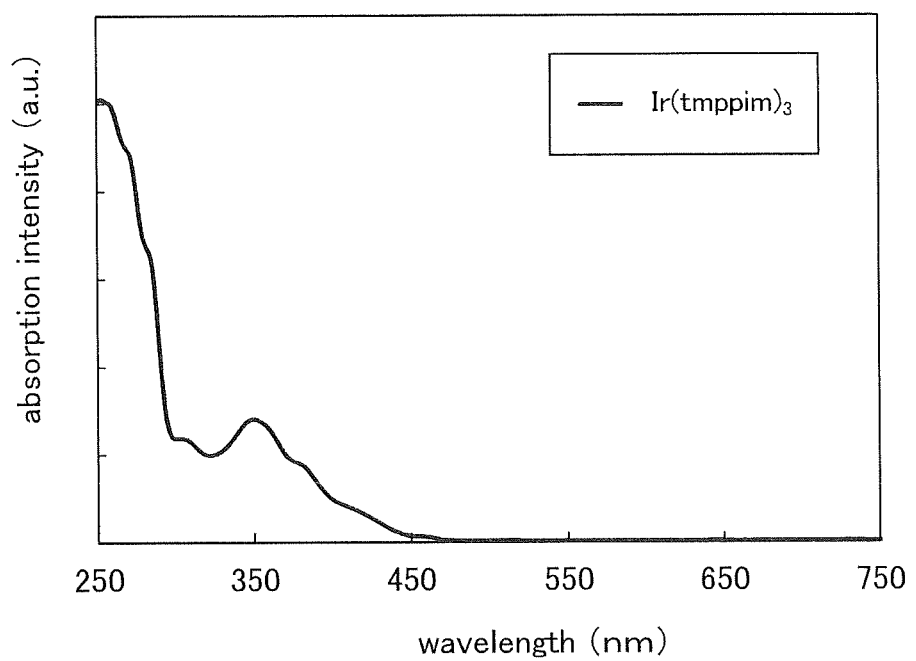
FIG. 94 shows an absorption spectrum of a guest material in Example.

Next, FIG. 94 shows the measurement results of the absorption spectrum of Ir(tmppim)$_3$, which is the guest material used for the light-emitting elements. The measurement was performed by a method similar to that in Example 1.

As shown in FIG. 94, the absorption edge on the lowest energy side (the longest wavelength side) of the absorption spectrum of Ir(tmppim)$_3$ is at around 440 nm. The absorption edge was obtained from data of the absorption spectrum, and the transition energy was estimated on the assumption of direct transition. As a result, the absorption edge of Ir(tmppim)$_3$ was 438 nm and the transition energy was calculated to be 2.83 eV Since Ir(tmppim)$_3$ is a phosphorescent compound, the absorption edge on the lowest energy side is an absorption edge based on the transition to the triplet excited state. Accordingly, the T1 level of Ir(tmppim)$_3$ was calculated to be 2.83 eV from the absorption edge.

The CV measurement results show that the combination of Ir(tmppim)$_3$ and any of the second organic compounds (4,6mCzP2Pm, 4,6mCzBP2Pm, 4,4'mCzP2BPy, 4'Ph-4mCzBPBPy 2,4mCzP2Py, mCzBPBfpy, and 35DCzPPy) forms an exciplex. The T1 levels of the exciplexes are 2.18 eV, 2.23 eV, 2.34 eV, 2.32 eV, 2.32 eV, 2.71 eV, and 2.64 eV, respectively. Thus, the T1 level of Ir(tmppim)$_3$ is higher than or equal to that of the exciplex formed by any of the second organic compounds and Ir(tmppim)$_3$.

The absorption band of the absorption spectrum of Ir(tmppim)$_3$ on the lowest energy side (the longest wavelength side) has a region that overlaps with the emission spectrum of the exciplex formed by any of the second organic compounds (4,6mCzP2Pm, 4,6mCzBP2Pm, 4,4'mCzP2BPy, 4'Ph-4mCzBPBPy, 2,4mCzP2Py, mCzBPBfpy, and 35DCzPPy) and Ir(tmppim)$_3$, which means that in the light-emitting elements 15 to 21 including these exciplexes as the host materials, excitation energy can be transferred effectively to the guest material.

According to the above results, in Ir(tmppim)$_3$, the energy difference between the LUMO level and the HOMO level is larger than the energy calculated from the absorption edge by 0.49 eV. Similarly, in Ir(tmppim)$_3$, the energy difference between the LUMO level and the HOMO level is greater than the light emission energy by 0.69 eV Therefore, high energy corresponding to the energy difference between the LUMO level and the HOMO level is needed, that is, high voltage is needed when carriers injected from a pair of electrodes in the light-emitting element are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

<Relation 2 Between Percentage of Light Emission of Exciplexes and Characteristics of Light-Emitting Elements>

As described above, the transition energy ($E_{G\_abs}$) calculated from the absorption edges of the absorption spectra of Ir(tmppim)$_3$, which is the guest material included in the thin films 15 to 21, were calculated to be 2.83 eV Thus, in the thin films 15 to 21, $E_{G\_abs}$ is greater than $E_{EX\_em}$.

Figure 95A:
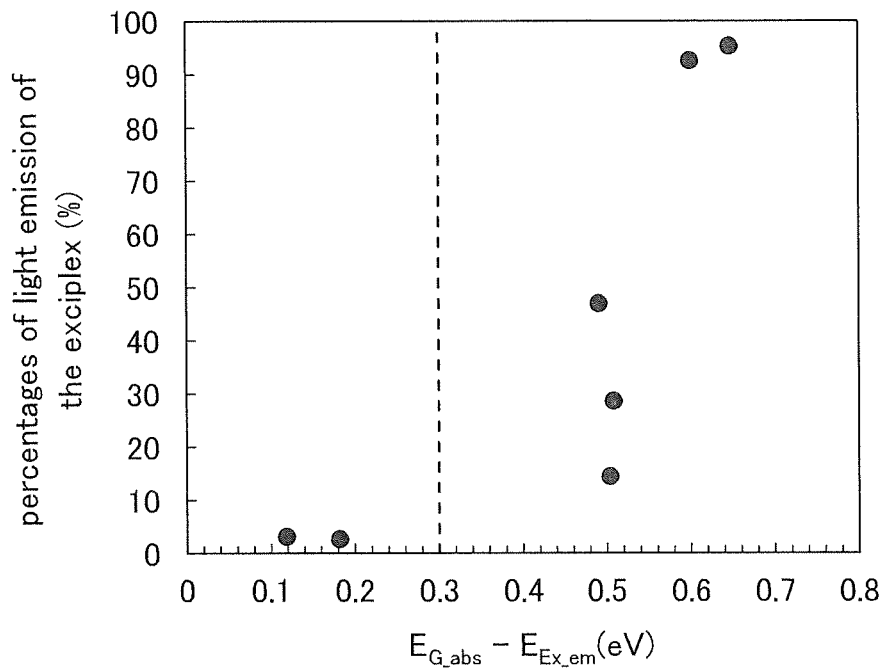
FIG. 95A shows the relation between the percentage of light emission of an exciplex- and the energy difference between a guest material and the exciplex in Example.

The relation between the percentages of light emission of the exciplexes to light emission from the thin films 15 to 21 and $E_{G\_abs}-E_{Ex\_em}$ is shown in FIG. 95A. From FIG. 95A, it was found that as in Example 1, the percentage of light emission of the exciplex is changed depending on the range of $E_{G\_abs}-E_{Ex\_em}$. Thus, as in Example 1, it can be said that when $E_{G\_abs}-E_{Ex\_em}$ is smaller than or equal to 0.30 eV, the percentage of light emission of the exciplex is decreased, and high emission efficiency can be obtained.

Figure 95B:
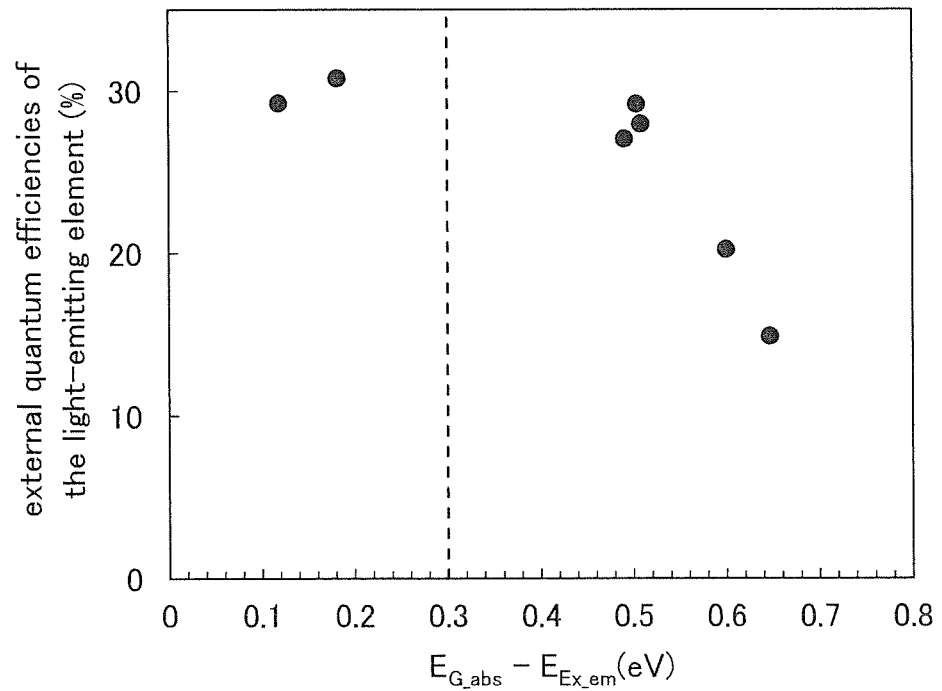
FIG. 95B shows the relation between the external quantum efficiency and the energy difference between the guest material- and the exciplex in Example.

Furthermore, the relation between the maximum external quantum efficiencies of the light-emitting elements 15 to 21 and $E_{G\_abs}-E_{Ex\_em}$ is shown in FIG. 95B. FIG. 95B shows the relation between $E_{G\_abs}-E_{Ex\_em}$ of the thin films 15 to 21 and the external quantum efficiencies of the light-emitting elements 15 to 21. The light-emitting elements can have high external quantum efficiencies in the case where $E_{G\_abs}-E_{Ex\_em}$ is larger than 0 eV and smaller than or equal to 0.23 eV, which is similar to Example 1. Thus, as in Example 1, it can be said that $E_{G\_abs}-E_{Ex\_em}$ is preferably larger than 0 eV and smaller than or equal to 0.30 eV (0 eV<$E_{G\_abs}-E_{Ex\_em}$≤0.30 eV), further preferably larger than 0 eV and smaller than or equal to 0.23 eV (0 eV<$E_{G\_abs}-E_{Ex\_em}$≤0.23 eV).

As has been described above, the excitation energy of each of the exciplexes formed in each of the thin films 15 to 21 substantially corresponds to the energy difference between the LUMO level of the second organic compound and the HOMO level of the first organic compound. The energy differences between the LUMO levels of the second organic compounds (host materials) and the HOMO level of the first organic compound (guest material) in the thin films 15 to 21 are 2.17 eV, 2.25 eV, 2.40 eV, 2.46 eV, 2.48 eV, 2.59 eV, and 2.67 eV, respectively. Thus, in the thin films 15 to 21, $E_{G\_abs}$ is greater than $\Delta E_{Ex}$.

Figure 96A:
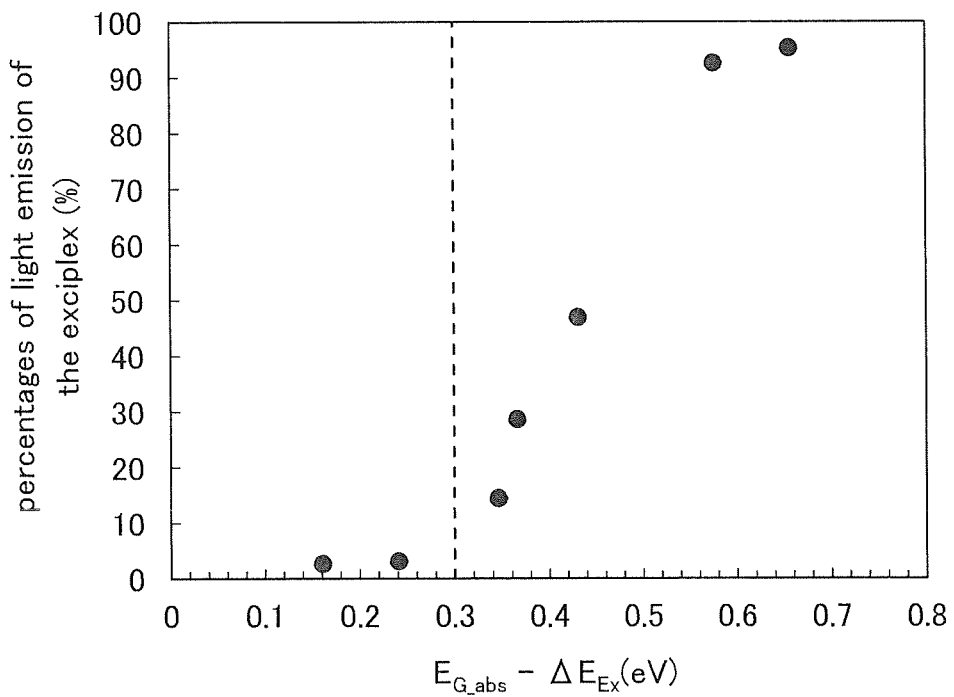
FIG. 96A shows the relation between the percentage of light emission of an exciplex- and the energy difference between a guest material and the exciplex in Example.

From FIG. 96A, it was found that each of the thin films 20 and 21 has a small percentage of formation of the exciplex. From FIG. 96A, as in Example 1, it can be said that when $E_{G\_abs}-\Delta E_{Ex}$ is smaller than or equal to 0.23 eV, the percentage of light emission of the exciplex is decreased, and high emission efficiency can be obtained.

Figure 96B:
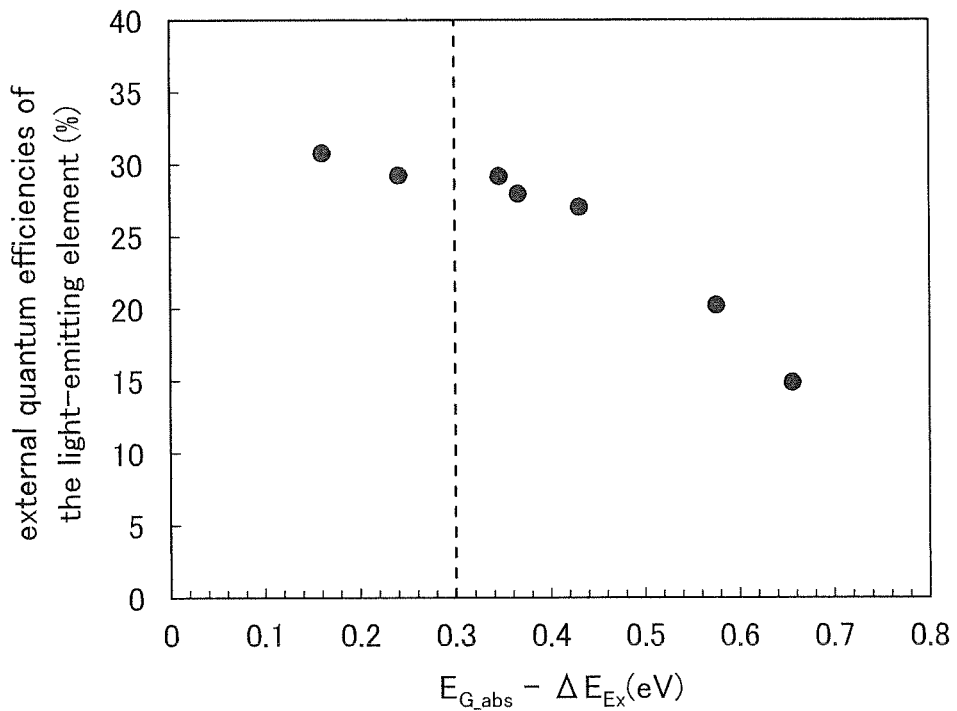
FIG. 96B shows the relation between the external quantum efficiency and the energy difference between the guest material- and the exciplex in Example.

The relation between the maximum external quantum efficiencies of the light-emitting elements 15 to 21 and $E_{G\_abs}-\Delta E_{Ex}$ is shown in FIG. 96B. From FIG. 96B, it was found that in the case where $E_{G\_abs}-\Delta E_{Ex}$ of the thin films 15 to 21 is larger than 0 eV and smaller than or equal to 0.23 eV, high external quantum efficiency can be achieved. From FIG. 96B, as in Example 1, it can be said that $E_{G\_abs}-\Delta E_{Ex}$ is preferably larger than 0 eV and smaller than or equal to 0.23 eV (0 eV<$E_{G\_abs}-\Delta E_{Ex}$≤0.23 eV), further preferably larger than 0 eV and smaller than or equal to 0.18 eV (0 eV<$E_{G\_abs}-\Delta E_{Ex}$≤0.18 eV).

Reference Example 1

In this reference example, a method for synthesizing tris{2-[4-(4-cyano-2,6-diisobutylphenyl)-5-(2-methylphenyl)-4H-1,2,4-triazol-3-yl-κN$^2$]phenyl-κC}iridium(III) (abbreviation: Ir(mpptz-diBuCNp)$_3$), which is the organometallic complex used as the guest material in Example 1, is described.

Synthesis Example 1

Step 1: Synthesis of 4-Amino-3,5-Diisobutylbenzonitrile

Into a 1000 mL three-neck flask were put 9.4 g (50 mmol) of 4-amino-3,5-dichlorobenzonitrile, 26 g (253 mmol) of isobutylboronic acid, 54 g (253 mmol) of tripotassium phosphate, 2.0 g (4.8 mmol) of 2-dicyclohexylphosphino-2',6'-dimethoxybiphenyl (S-phos), and 500 mL of toluene. The atmosphere in the flask was replaced with nitrogen, and this mixture was degassed while being stirred under reduced pressure. After the degassing, 0.88 g (0.96 mmol) of tris(dibenzylideneacetone)palladium(0) was added, and the mixture was stirred under a nitrogen stream at 130° C. for 8 hours to be reacted. Toluene was added to the reacted solution, and the solution was filtered through a filter aid in which Celite, aluminum oxide, and Celite were stacked in this order. The obtained filtrate was concentrated to give an oily substance. The obtained oily substance was purified by silica gel column chromatography. Toluene was used as a developing solvent. The resulting fraction was concentrated to give 10 g of a yellow oily substance in a yield of 87%. The obtained yellow oily substance was identified as 4-amino-3,5-diisobutylbenzonitrile by nuclear magnetic resonance (NMR) spectroscopy. The synthesis scheme of Step 1 is shown in (a-1) below.

[Chemical Formula 26]

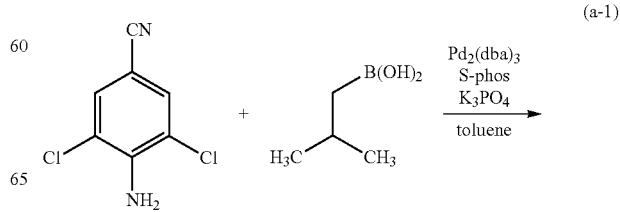

-continued

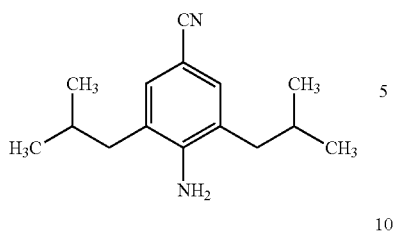

Step 2: Synthesis of Hmpptz-diBuCNp

Into a 300 mL three-neck flask were put 11 g (48 mmol) of 4-amino-3,5-diisobutylbenzonitrile synthesized in Step 1, 4.7 g (16 mmol) of N-(2-methylphenyl)chloromethylidene-N-phenylchloromethylidenehydrazine, and 40 mL of N,N-dimethylaniline, and the mixture was stirred under a nitrogen stream at 160° C. for 7 hours to be reacted. After the reaction, the reacted solution was added to 300 mL of 1M hydrochloric acid and stirring was performed for 3 hours. Ethyl acetate was added to this mixture, and the aqueous layer was subjected to extraction with ethyl acetate. The organic layer and the obtained solution of the extract were combined, and washed with a saturated aqueous solution of sodium hydrogen carbonate and then with saturated saline, and anhydrate magnesium sulfate was added to the organic layer for drying. The obtained mixture was subjected to gravity filtration, and the filtrate was concentrated to give an oily substance. The obtained oily substance was purified by silica gel column chromatography. As a developing solvent, a 5:1 hexane-ethyl acetate mixed solvent was used. The obtained fraction was concentrated to give a solid. Hexane was added to the obtained solid, and the mixture was irradiated with ultrasonic waves and then subjected to suction filtration to give 2.0 g of a white solid in a yield of 28%. The obtained white solid was identified as 4-(4-cyano-2,6-diisobutylphenyl)-3-(2-methylphenyl)-5-phenyl-4H-1,2,4-triazole (abbreviation: Hmpptz-diBuCNp) by nuclear magnetic resonance (NMR) spectroscopy. The synthesis scheme of Step 2 is shown in (b-1) below.

[Chemical Formula 27]

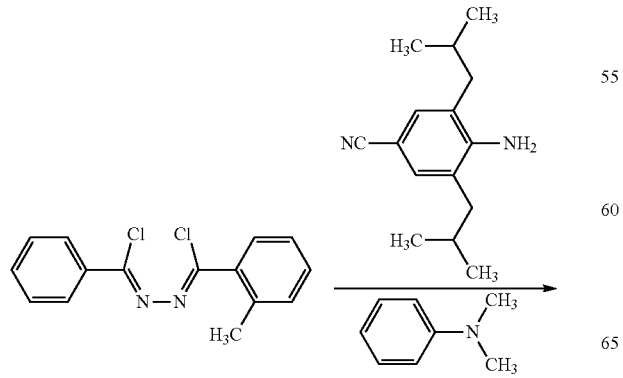

(b-1)

-continued

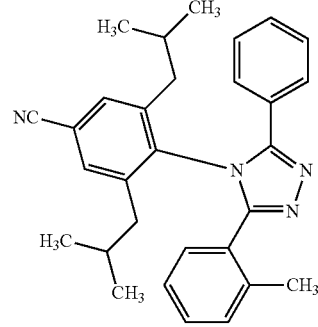

Hmpptz-diBuCNp

Step 3: Synthesis of Ir(mpptz-diBuCNp)$_3$

Into a reaction container provided with a three-way cock were put 2.0 g (4.5 mmol) of Hmpptz-diBuCNp synthesized in Step 2 and 0.44 g (0.89 mmol) of tris(acetylacetonato)iridium(III), and the mixture was stirred under an argon stream at 250° C. for 43 hours to be reacted. The obtained reaction mixture was added to dichloromethane, and an insoluble matter was removed. The obtained filtrate was concentrated to give a solid. The obtained solid was purified by silica gel column chromatography. As a developing solvent, dichloromethane was used. The obtained fraction was concentrated to give a solid. The obtained solid was recrystallized from ethyl acetate/hexane, so that 0.32 g of a yellow solid was obtained in a yield of 23%. Then 0.31 g of the obtained yellow solid was purified by a train sublimation method. The purification by sublimation was performed by heating at 310° C. under a pressure of 2.6 Pa with an argon flow rate of 5.0 mL/min for 19 hours. After the purification by sublimation, 0.26 g of a yellow solid was obtained at a collection rate of 84%. The synthesis scheme of Step 3 is shown in (c-1) below.

[Chemical Formula 28]

(c-1)

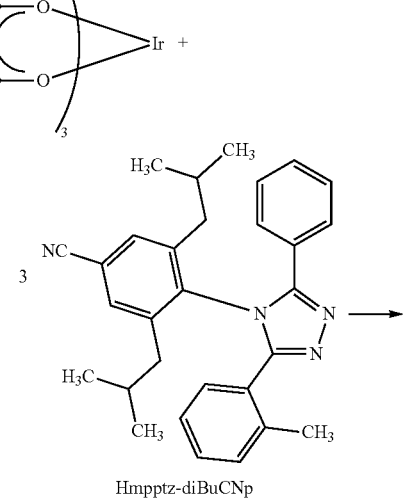

Hmpptz-diBuCNp

-continued

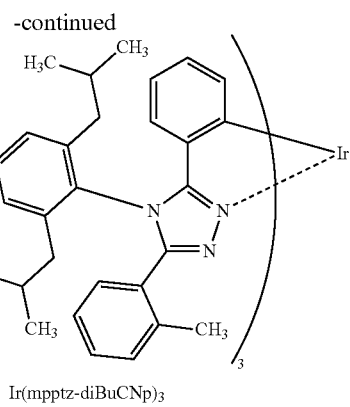

Ir(mpptz-diBuCNp)₃

The protons (¹H) of the yellow solid obtained in Step 3 were measured by a nuclear magnetic resonance (NMR) spectroscopy. The obtained values are shown below. These results reveal that Ir(mpptz-diBuCNp)₃ was obtained in this synthesis example.

¹H-NMR δ (CDCl₃): 0.33 (d, 18H), 0.92 (d, 18H), 1.51-1.58 (m, 3H), 1.80-1.88 (m, 6H), 2.10-2.15 (m, 6H), 2.26-2.30 (m, 3H), 2.55 (s, 9H), 6.12 (d, 3H), 6.52 (t, 3H), 6.56 (d, 3H), 6.72 (t, 3H), 6.83 (t, 3H), 6.97 (d, 3H), 7.16 (t, 3H), 7.23 (d, 3H), 7.38 (s, 3H), 7.55 (s, 3H).

Reference Example 2

In this reference example, a method for synthesizing tris{2-[1-(4-cyano-2,6-diisobutylphenyl)-1H-imidazol-2-yl-κN³]phenyl-κC}iridium(III) (abbreviation: Ir(pim-diBuCNp)₃), which is the organometallic complex used as the guest material in Example 3, is described.

Synthesis Example 2

Step 1: Synthesis of 1-(4-cyano-2,6-diisobutylphenyl)-2-phenyl-4,5-dihydro-1H-imidazole Into a 1000 mL three-neck flask were put 22 g (117 mmol) of N-(2-chloroethyl)benzamide and 260 mL of dehydrated xylene. To this mixed solution was added 33 g (158 mmol) of phosphorus pentachloride, and the mixture was heated and stirred at 140° C. for one hour to be reacted. After the reaction, the mixture was cooled down to room temperature, a mixed solution of 28 g (120 mmol) of 4-amino-3,5-diisobutylbenzonitrile and 60 mL of dehydrated xylene was dropped thereinto, and heating and stirring were performed at 140° C. for 5 hours. This reaction mixture was slowly added to 500 mL of water and stirring was performed at room temperature for 30 minutes. To this mixture was added chloroform. The obtained solution of the extract was slowly added to a 1M sodium hydroxide aqueous solution and the mixture was stirred at room temperature for 30 minutes. An aqueous layer and an organic layer of this mixture were separated. The obtained solution of the extract was washed with a saturated aqueous solution of sodium hydrogen carbonate, and then washed with saturated saline. After the washing, anhydrous magnesium sulfate was added to the organic layer for drying, and the resulting mixture was subjected to gravity filtration to give a filtrate. The obtained filtrate was condensed to give a solid. A mixed solvent of ethyl acetate and hexane was added to the solid, the mixture was subjected to suction filtration, whereby 33 g of a white solid was obtained in a yield of 79%. The obtained white solid was identified as 1-(4-cyano-2,6-diisobutylphenyl)-2-phenyl-4,5-dihydro-1H-imidazole by nuclear magnetic resonance (NMR) spectroscopy. The synthesis scheme of Step 1 is shown in (a-2) below.

[Chemical Formula 29]

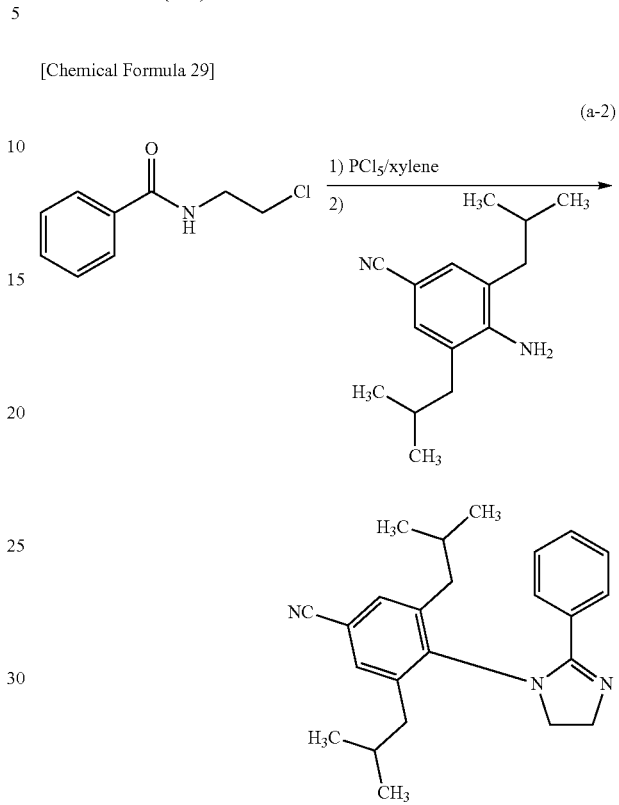

(a-2)

Step 2: Synthesis of Hpim-diBuCNp

Into a 200 mL three-neck flask were put 15 g (42 mmol) of 1-(4-cyano-2,6-diisobutylphenyl)-2-phenyl-4,5-dihydro-1H-imidazole synthesized in Step 1 and acetonitrile. To the mixed solution was added a powder obtained by putting 13 g (84 mmol) of potassium permanganate and 29 g of aluminum oxide in a mortar and grinding them, and the mixture was stirred at room temperature for 17 hours to be reacted. This reaction mixture was subjected to suction filtration through Celite. The obtained filtrate was concentrated to give an oily substance. Toluene was added to the obtained oily substance, and the mixture was filtered through a filter aid in which Celite, aluminum oxide, and Celite were stacked in this order. The obtained filtrate was concentrated to give an oily substance. The obtained oily substance was purified by silica gel column chromatography. As a developing solvent, a 5:1 hexane-ethyl acetate mixed solvent was used. The obtained fraction was concentrated to give 8.0 g of a colorless oily substance in a yield of 53%. The obtained colorless oily substance was identified as 1-(4-cyano-2,6-diisobutylphenyl)-2-phenyl-1H-imidazole (abbreviation: Hpim-diBuCNp) by nuclear magnetic resonance (NMR) spectroscopy. The synthesis scheme of Step 2 is shown in (b-2) below.

[Chemical Formula 30]

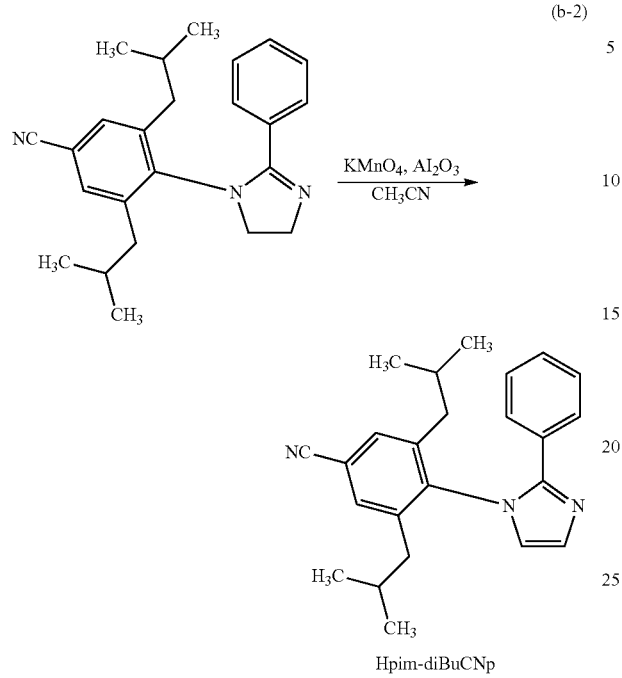

Hpim-diBuCNp

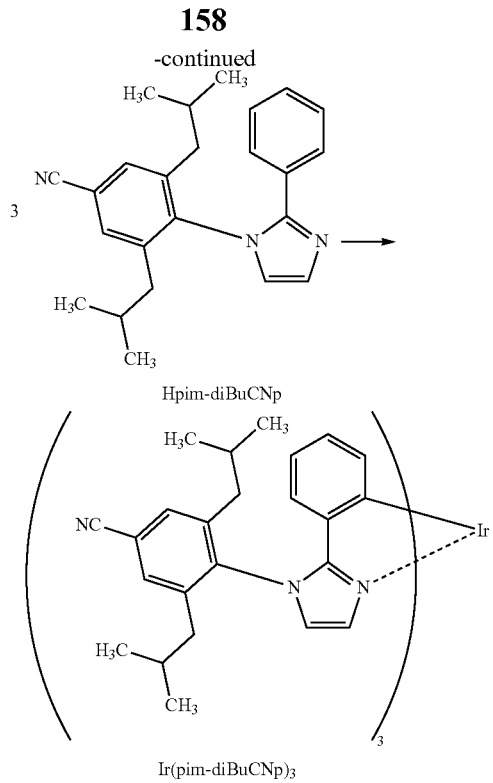

Ir(pim-diBuCNp)₃

Step 3: Synthesis of Ir(pim-diBuCNp)₃

Into a reaction container provided with a three-way cock were put 5.0 g (14 mmol) of Hpim-diBuCNp synthesized in Step 2 and 1.4 g (2.8 mmol) of tris(acetylacetonato)iridium (III), and the mixture was heated under an argon stream at 250° C. for 38 hours to be reacted. Toluene was added to the obtained reaction mixture, and an insoluble matter was removed. The obtained filtrate was concentrated to give a solid. The obtained solid was purified by silica gel column chromatography. As a developing solvent, first, toluene was used. Next, a 9:1 toluene-ethyl acetate mixed solvent was used. The obtained fraction was concentrated to give a solid. The obtained solid was recrystallized from ethyl acetate/hexane, so that 0.6 g of a yellow solid was obtained in a yield of 18%. Then, 0.6 g of the obtained yellow solid was purified by a train sublimation method. The purification by sublimation was performed by heating at 280° C. under a pressure of 2.6 Pa with an argon flow rate of 5.0 mL/min for 17 hours. After the purification by sublimation, 0.4 g of a yellow solid was obtained at a collection rate of 67%. The synthesis scheme of Step 3 is shown in (c-2) below.

[Chemical Formula 31]

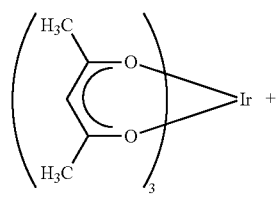

The protons (¹H) of the yellow solid obtained in Step 3 were measured by a nuclear magnetic resonance (NMR) spectroscopy. The obtained values are shown below. These results reveal that Ir(pim-diBuCNp)₃ was obtained in this synthesis example.

¹H-NMR δ (CDCl₃): 0.43 (d, 9H), 0.56 (d, 9H), 0.79 (t, 18H), 1.42-1.50 (m, 3H), 1.73-1.81 (m, 3H), 1.97-2.02 (m, 3H), 2.12-2.17 (m, 3H), 2.24-2.29 (m, 3H), 2.46-2.50 (m, 3H), 6.05 (d, 3H), 6.40 (t, 3H), 6.59 (t, 3H), 6.71-6.76 (m, 9H), 7.54 (d, 6H).

Reference Example 3

In this reference example, a method for synthesizing 9-{3-[4'-phenyl-(2,2'-bipyridin)-4-yl]-phenyl}-9H-carbazole (abbreviation: 4'Ph-4mCzBPBPy), which is the organic compound that is represented by Structural Formula (500) and is used as the host material in Example 3, is described.

Synthesis Example 3

Step 1: Synthesis of 9-{3-[4'-phenyl-(2,2'-bipyridin)-4-yl]-phenyl}-9H-carbazole Into a 100 mL three-neck flask were put 1.2 g (3.9 mmol) of 4-bromo-4'-phenyl-2,2'-bipyridine and 1.4 g (3.9 mmol) of 3-[3-(9H-carbazol-9-yl)phenyl]phenylboronic acid. Then, 3.9 mL of a 2M sodium carbonate aqueous solution, 19 mL of toluene, and 6.5 mL of ethanol were added to this mixture, and the mixture was degassed by being stirred under reduced pressure. To this mixture was added 90 mg (78.0 μmol) of tetrakis(triphenylphosphine)palladium(0) in two steps, and stirring was performed at 90° C. under a nitrogen stream for 16 hours. After the stirring, water was added to this mixture and the aqueous layer was subjected to extraction with chloroform. The obtained solution of the extract and an organic layer were combined, and the mixture was washed with water and saturated brine. Then, moisture was adsorbed with magnesium sulfate. This mixture was separated by gravity filtration, and the obtained filtrate was concentrated to give a brown oily substance. The oily substance was purified by silica gel column chromatography (as the developing solvent, a 1:10 ethyl acetate-hexane mixed solvent was used, and then a 10:1 chloroform-ethyl acetate mixed solvent was used). The obtained fraction was concentrated to give a pale yellow solid. Toluene was added to this solid to dissolve this solid, this solution was dropped with chloroform and suction-filtrated through Celite and alumina, and the filtrate was concentrated to give a pale yellow solid. This solid was recrystallized from ethyl acetate (20 mL) to give 1.3 g of a white solid, which was the object of the synthesis, in a yield of 62%. A synthesis scheme of Step 1 is shown in (a-3).

[Chemical Formula 32]

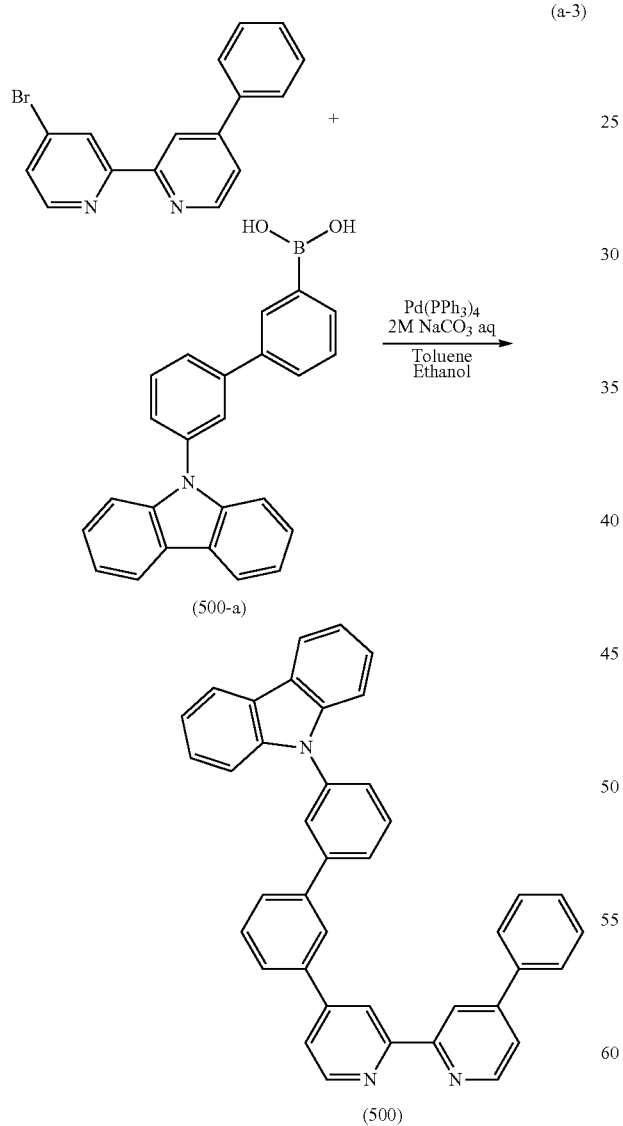

By a train sublimation method, 1.3 g of the white solid obtained in Step 1 was purified twice at 240° C. (in first purification) and 225° C. (in second purification) under a pressure of 2.7 Pa with a flow rate of argon gas of 5 mL/min. After the purification by sublimation, 0.71 g of a colorless transparent glassy solid was obtained at a collection rate of 54%.

As the organic compound used in the light-emitting element of one embodiment of the present invention, the following organic compounds can be favorably used: 5-{3-[4'-phenyl-(2,2'-bipyridin)-4-yl]-phenyl}-5H-benzofuro[3,2-c]carbazole (abbreviation: 4'Ph-4mBFcPBPy), which is represented by Structural Formula (501), and 5-{3-[4'-phenyl-(2,2'-bipyridin)-4-yl]-phenyl}-5H-benzothio[3,2-c]carbazole (abbreviation: 4'Ph-4mBTcPBPy), which is represented by Structural Formula (502).

[Chemical Formula 33]

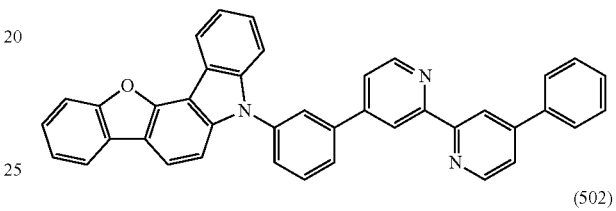

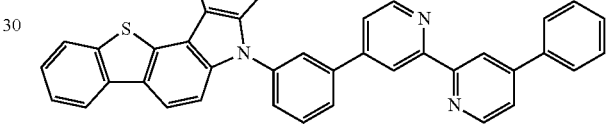

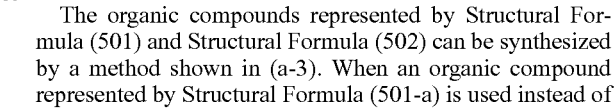

The organic compounds represented by Structural Formula (501) and Structural Formula (502) can be synthesized by a method shown in (a-3). When an organic compound represented by Structural Formula (501-a) is used instead of the organic compound represented by Structural Formula (500-a) in (a-3), the organic compound represented by Structural Formula (501) can be synthesized. Similarly, when an organic compound represented by Structural Formula (502-a) is used instead of the organic compound represented by Structural Formula (500-a) in (a-3), the organic compound represented by Structural Formula (502) can be synthesized.

[Chemical Formula 34]

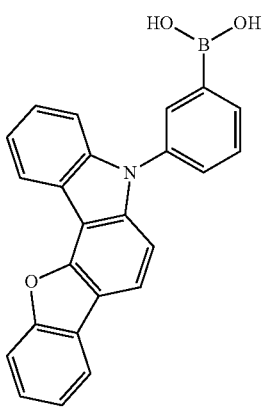

-continued

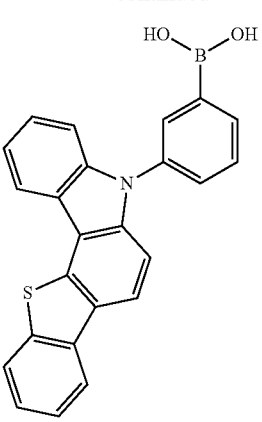

(502-a)

REFERENCE NUMERALS

100: EL layer, 101: electrode, 101a: conductive layer, 101b: conductive layer, 102: electrode, 103: electrode, 103a: conductive layer, 103b: conductive layer, 104: electrode, 104a: conductive layer, 104b: conductive layer, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 123B: light-emitting layer, 123G: light-emitting layer, 123R: light-emitting layer, 130: light-emitting layer, 131: guest material, 132: host material, 133: host material, 136: exciplex, 138: exciplex, 140: light-emitting layer, 140a: light-emitting layer, 140b: light-emitting layer, 145: partition wall, 150: light-emitting element, 200: substrate, 220: substrate, 221B: region, 221G: region, 221R: region, 222B: region, 222G: region, 222R: region, 223: light-blocking layer, 224B: optical element, 224G: optical element, 224R: optical element, 250: light-emitting element, 260: light-emitting element, 262a: light-emitting element, 262b: light-emitting element, 600: display device, 601: signal line driver circuit portion, 602: pixel portion, 603: scan line driver circuit portion, 604: sealing substrate, 605: sealant, 607: region, 608: wiring, 609: FPC, 610: element substrate, 611: transistor, 612: transistor, 613: lower electrode, 614: partition wall, 616: EL layer, 617: upper electrode, 618: light-emitting element, 621: optical element, 622: light-blocking layer, 623: transistor, 624: transistor, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: lower electrode, 1024G: lower electrode, 1024R: lower electrode, 1025: partition wall, 1026: upper electrode, 1028: EL layer, 1029: sealing layer, 1031: sealing substrate, 1032: sealant, 1033: base material, 1034B: coloring layer, 1034G: coloring layer, 1034R: coloring layer, 1035: light-blocking layer, 1036: overcoat layer, 1037: interlayer insulating film, 1040: pixel portion, 1041: driver circuit portion, 1042: peripheral portion, 3000: light-emitting device, 3001: substrate, 3003: substrate, 3005: light-emitting element, 3007: sealing region, 3009: sealing region, 3011: region, 3013: region, 3018: desiccant, 8000: display module, 8001: upper cover, 8002: lower cover, 8003: FPC, 8004: touch sensor, 8005: FPC, 8006: display device, 8009: frame, 8010: printed board, 8011: battery, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, and 9201: portable information terminal.

This application is based on Japanese Patent Application serial No. 2016-101787 filed with Japan Patent Office on May 20, 2016, the entire contents of which are hereby incorporated by reference.

The invention claimed is:
1. A light-emitting element comprising:
  a light-emitting layer comprising:
    a first organic compound; and
    a second organic compound,
  wherein one of the first organic compound and the second organic compound has a LUMO level higher than or equal to a LUMO level of the other of the first organic compound and the second organic compound, and has a HOMO level higher than or equal to a HOMO level of the other of the first organic compound and the second organic compound,
  wherein a combination of the first organic compound and the second organic compound forms a first exciplex,
  wherein the first organic compound is configured to convert triplet excitation energy into light emission,
  wherein light emission from the light-emitting layer includes light emission from the first organic compound and light emission from the first exciplex,
  wherein a percentage of the light emission from the first exciplex to the light emission from the light-emitting layer is greater than 0% and less than or equal to 60%,
  wherein the light-emitting layer further comprises a third organic compound,
  wherein one of the LUMO level of the second organic compound and a LUMO level of the third organic compound is higher than or equal to the other of the LUMO level of the second organic compound and the LUMO level of the third organic compound,
  wherein one of the HOMO level of the second organic compound and a HOMO level of the third organic compound is higher than or equal to the other of the HOMO level of the second organic compound and the HOMO level of the third organic compound,
  wherein a combination of the second organic compound and the third organic compound forms a second exciplex, and
  wherein a lowest triplet excitation energy level of the second exciplex is higher than or equal to a lowest triplet excitation energy level of the first exciplex.
2. The light-emitting element according to claim 1,
  wherein a lowest triplet excitation energy level of the second organic compound is higher than or equal to a lowest triplet excitation energy level of the first organic compound, and
  wherein the lowest triplet excitation energy level of the first organic compound is higher than or equal to a lowest triplet excitation energy level of the first exciplex.
3. The light-emitting element according to claim 1,
  wherein a lowest triplet excitation energy level of the second organic compound and a lowest triplet excitation energy level of the third organic compound are higher than or equal to a lowest triplet excitation energy level of the second exciplex, and wherein the lowest triplet excitation energy level of the second exciplex is higher than or equal to a lowest triplet excitation energy level of the first organic compound.

4. The light-emitting element according to claim 1, wherein one of the second organic compound and the third organic compound is configured to transport a hole, and wherein the other of the second organic compound and the third organic compound is configured to transport an electron.

5. The light-emitting element according to claim 4, wherein the one of the second organic compound and the third organic compound comprises at least one of a π-electron rich heteroaromatic ring skeleton and an aromatic amine skeleton, and wherein the other of the second organic compound and the third organic compound comprises a π-electron deficient heteroaromatic ring skeleton.

6. The light-emitting element according to claim 1, wherein the light emission from the light-emitting layer comprises an emission component whose time in which emission intensity is reduced to lower than or equal to 1% is shorter than or equal to 37 µs.

7. The light-emitting element according to claim 1, wherein the first organic compound comprises iridium, wherein the first organic compound comprises a ligand coordinated to the iridium, wherein the ligand comprises a nitrogen-containing five-membered heterocyclic skeleton, and wherein the second organic compound comprises a π-electron deficient heteroaromatic ring skeleton.

\* \* \* \* \*